（12) United States Patent
Fiedler et al.

(10) Patent No.: US 10,711,191 B2
(45) Date of Patent: *Jul. 14, 2020

(54) PHOSPHOR, METHOD FOR PRODUCING A PHOSPHOR AND USE OF A PHOSPHOR

(71) Applicants: OSRAM Opto Semiconductors GmbH, Regensburg (DE); OSRAM GmbH, Munich (DE)

(72) Inventors: Tim Fiedler, Munich (DE); Daniel Bichler, Augsburg (DE); Stefan Lange, Augsburg (DE); Rebecca Römer, Regensburg (DE); Frank Jermann, Koenigsbrunn (DE); Frauke Thienel, Munich (DE); Barbara Huckenbeck, Augsburg (DE); Alexander Baumgartner, Donaustauf (DE); Vera Stöppelkamp, Augsburg (DE); Norbert Bönisch, Koenigsbrunn (DE); Hailing Cui, Regensburg (DE)

(73) Assignees: OSRAM Opto Semiconductors GmbH, Regensburg (DE); OSRAM GmbH, Munich (DE)

( * ) Notice: Subject to any disclaimer, the term of this patent is extended or adjusted under 35 U.S.C. 154(b) by 321 days.

This patent is subject to a terminal disclaimer.

(21) Appl. No.: 15/649,385

(22) Filed: Jul. 13, 2017

(65) Prior Publication Data
US 2017/0306224 A1    Oct. 26, 2017

Related U.S. Application Data

(63) Continuation of application No. 15/094,702, filed on Apr. 8, 2016, now Pat. No. 9,719,013, which is a (Continued)

(30) Foreign Application Priority Data
Oct. 8, 2013 (DE) .......... 10 2013 220 315
Oct. 30, 2013 (DE) .......... 10 2013 222 144
(Continued)

(51) Int. Cl.
C09K 11/77    (2006.01)
C09K 11/08    (2006.01)
(Continued)

(52) U.S. Cl.
CPC ...... *C09K 11/7721* (2013.01); *C09K 11/0883* (2013.01); *C09K 11/646* (2013.01);
(Continued)

(58) Field of Classification Search
CPC .......... C09K 11/7721; C09K 11/0883; C09K 11/7734; C09K 11/7774; H01L 33/502; H01L 27/322
See application file for complete search history.

(56) References Cited

U.S. PATENT DOCUMENTS 7,258,816 B2    8/2007  Tamaki et al.
7,476,337 B2*   1/2009  Sakane .............. C09K 11/0883
                                                        252/301.4 F
(Continued)

FOREIGN PATENT DOCUMENTS

CN    102252247 A    11/2011
DE    102010062465 A1    6/2012
(Continued)

OTHER PUBLICATIONS

Ahmetov, N.S., "Inorganic Chemistry," Second Edition, Processed and Additioned, Table 54, Moscow, 1975, 4 pages with translation.
(Continued)

Primary Examiner — C Melissa Koslow
(74) Attorney, Agent, or Firm — Slater Matsil, LLP

(57) ABSTRACT

A phosphor and a lighting device are disclosed. In an embodiment a lighting device includes a first phosphor disposed in a beam path of the primary radiation source, wherein the first phosphor has the formula $Sr(Sr_aM_{1-a})Si_2Al_2(N,X)_6$:D,A,B,E,G,L, wherein element M is selected
(Continued)

from Ca, Ba, Mg or combinations thereof, wherein element D is one or more elements selected from Mn, Ce, Pr, Nd, Sm, Eu, Tb, Dy, Ho, Er, Tm, alkali metals or Yb, wherein element A is selected from divalent metals different than those of the elements M and D, wherein element B is selected from trivalent metals, wherein element E is selected from monovalent metals, wherein element G is selected from tetravalent elements, wherein element L is selected from trivalent elements, wherein element X is selected from O or halogen, and wherein a parameter a is between 0.6 and 1.0.

18 Claims, 145 Drawing Sheets

Related U.S. Application Data continuation of application No. PCT/EP2014/071544, filed on Oct. 8, 2014.

(30) Foreign Application Priority Data

| | | |
|---|---|---|
| Mar. 4, 2014 | (DE) | 10 2014 102 853 |
| Apr. 17, 2014 | (DE) | 10 2014 105 589 |
| Jun. 5, 2014 | (DE) | 10 2014 107 984 |
| Jun. 23, 2014 | (DE) | 10 2014 108 759 |
| Jul. 17, 2014 | (DE) | 10 2014 110 058 |

(51) Int. Cl.
 C09K 11/64 (2006.01)
 H01L 27/32 (2006.01)
 H01L 33/50 (2010.01)

(52) U.S. Cl.
 CPC ...... *C09K 11/7728* (2013.01); *C09K 11/7734* (2013.01); *C09K 11/7774* (2013.01); *H01L 27/322* (2013.01); *H01L 33/502* (2013.01); *H01L 2224/48091* (2013.01); *H01L 2224/48247* (2013.01); *H01L 2224/73265* (2013.01)

(56) References Cited

U.S. PATENT DOCUMENTS

| | | | |
|---|---|---|---|
| 7,544,309 B2 | 6/2009 | Juestel et al. | |
| 7,951,308 B2 | 5/2011 | Tamaki et al. | |
| 8,119,028 B2 | 2/2012 | Le Toquin | |
| 8,203,259 B2 | 6/2012 | Juang et al. | |
| 8,206,611 B2 | 6/2012 | Hirosaki et al. | |
| 8,274,215 B2 | 9/2012 | Liu et al. | |
| 8,409,470 B2 * | 4/2013 | Hirosaki | C01B 21/0602 252/301.4 F |
| 8,814,621 B2 | 8/2014 | Seibel, II | |
| 8,858,835 B2 | 10/2014 | Okada et al. | |
| 8,951,440 B2 | 2/2015 | Liu et al. | |
| 9,004,701 B2 | 4/2015 | Berben et al. | |
| 9,074,755 B2 | 7/2015 | Finsterbusch et al. | |
| 9,170,423 B2 | 10/2015 | Mehl | |
| 9,719,013 B2 * | 8/2017 | Fiedler | C09K 11/7728 |
| 9,719,014 B2 * | 8/2017 | Fiedler | C09K 11/7728 |
| 9,725,646 B2 * | 8/2017 | Fiedler | C09K 11/7728 |
| 10,170,453 B2 * | 1/2019 | Stoll | H01L 25/0753 |
| 10,233,388 B2 * | 3/2019 | Romer | H01L 33/44 |
| 10,243,115 B2 * | 3/2019 | Pust | H01L 33/08 |
| 2006/0033083 A1 | 2/2006 | Sakane et al. | |
| 2006/0255710 A1 | 11/2006 | Mueller-Mach et al. | |
| 2007/0007494 A1 | 1/2007 | Hirosaki et al. | |
| 2009/0134775 A1 | 5/2009 | Watanabe et al. | |
| 2010/0123104 A1 | 5/2010 | Collins et al. | |
| 2011/0248624 A1 | 10/2011 | Kishimoto et al. | |
| 2012/0256163 A1 | 10/2012 | Yoon et al. | |
| 2012/0305958 A1 | 12/2012 | Seibel, II et al. | |
| 2012/0306355 A1 | 12/2012 | Seibel, II | |
| 2013/0001628 A1 | 1/2013 | Yamakawa et al. | |
| 2013/0140490 A1 | 6/2013 | Fujinaga et al. | |
| 2013/0168605 A1 | 7/2013 | Li et al. | |
| 2013/0168606 A1 | 7/2013 | Hirosaki et al. | |
| 2013/0207535 A1 | 8/2013 | Hirosaki et al. | |
| 2013/0301237 A1 | 11/2013 | Finsterbusch et al. | |
| 2014/0369025 A1 | 12/2014 | Mehl | |
| 2015/0124428 A1 | 5/2015 | Hadrath et al. | |
| 2015/0204492 A1 | 7/2015 | Bichler et al. | |
| 2015/0275082 A1 | 10/2015 | Hirosaki et al. | |
| 2016/0010812 A1 | 1/2016 | Kroell et al. | |

FOREIGN PATENT DOCUMENTS

| | | |
|---|---|---|
| DE | 102011002961 A1 | 7/2012 |
| DE | 102012201790 A1 | 8/2013 |
| DE | 102012209172 A1 | 12/2013 |
| DE | 102012212436 A1 | 1/2014 |
| DE | 102012213467 A1 | 2/2014 |
| EP | 1696016 A1 | 8/2006 |
| EP | 2135920 A1 | 12/2009 |
| EP | 2241607 A2 | 10/2010 |
| EP | 2428544 A1 | 3/2012 |
| EP | 2574652 A2 | 4/2013 |
| JP | 2006008721 A | 1/2006 |
| JP | 2011233511 A | 11/2011 |
| JP | 2012077288 A | 4/2012 |
| JP | 2012512307 A | 5/2012 |
| KR | 20050062623 A | 6/2005 |
| KR | 20120026459 A | 3/2012 |
| WO | 03080764 A1 | 10/2003 |
| WO | 2004055910 A1 | 7/2004 |
| WO | 2005052087 A1 | 6/2005 |
| WO | 2010074963 A1 | 7/2010 |
| WO | 2011098164 A1 | 8/2011 |
| WO | 2011142880 A1 | 11/2011 |
| WO | 2012009455 A1 | 1/2012 |
| WO | 2012076296 A2 | 6/2012 |
| WO | 2012166837 A1 | 12/2012 |
| WO | 2012166841 A1 | 12/2012 |
| WO | 2013110495 A2 | 8/2013 |
| WO | WO 2014/202464 | * 12/2014 |

OTHER PUBLICATIONS

Ishlinsky, A.Y. et al., "Great Encyclopedic Dictionary, Polytechnical," Moscow, Russia, 2000, 3 pages with translation.

Watanabe, H.et al., "Synthetic Method and Luminescence Properties of SrxCa1-xAlSiN3:Eu2+ Mixed Nitride Phosphors," Journal of The Electrochemical Society, vol. 155 (3), 2008, pp. F31-F36.

Bronka, H. et al., "Luminescent Materials," Römpp Chemical Dictionary, https://roempp.thieme.de, Feb. 2012, 5 pages.

Li, Y.Q. et al., "Yellow-Orange-Emitting CaAlSiN3:Ce3+ Phosphor: Structure, Photoluminescence, and Application in White LEDs," Chemical Materials, vol. 20, 2008, pp. 6704-6714.

Li, Y.Q. et al., "Crystal, Electronic Structures and Photoluminescence Properties of Rare-earth Doped LiSi2N3," Journal of Solid State Chemistry, vol. 182, 2009, pp. 301-311.

Watanabe, H. et al. "Nitridation of AEAlSi for Production of AEAlSiN3:Eu2+ Nitride Phosphors (AE=Ca, Sr)," XP-002630044, Journal of the American Ceramic Society, vol. 92, No. 3, Mar. 2009, pp. 641-648.

Oh, J.H. et al., "New Paradigm of Multi-chip White LEDs: Combination of an InGaN Blue LED and Full Down-converted Phosphor-converted LEDs," Optics Express, vol. 19, No. S3, May 9, 2011, pp. A270-A279.

Oh, J.R. et al., "Full Down-conversion of Amber-emitting Phosphor-converted Light-emitting Diodes with Powder Phosphors and a Long-wave Pass Filter," Optics Express, vol. 18, No. 11, May 24, 2011, pp. 11063-11072.

Oh, J.R. et al., "The Realization of a Whole Palette of Colors in a Green Gap by Monochromatic Phosphor-converted Light-emitting Diodes," Optics Express, vol. 19, No. 5, Feb. 28, 2011, pp. 4188-4198.

(56) References Cited

OTHER PUBLICATIONS

Uheda, K. et al., "Host Lattice Materials in the System Ca3N2-AIN-Si3N4 for White Light Emitting Diode", Physica Status Solidi (a). vol. 203, Issue 11, 2006, pp. 2712-2717.
Uheda, K. et al., "Luminescence Properties of a Red Phosphor, CaAlSiN3:Eu2+, for White Light-Emitting Diodes," Electrochemical and Solid-State Letters, vol. 9, 2006, pp. H22-H25.
Watanabe, H. et al., "Crystal Structure and Luminescence Properties of SrxCa1-xAlSiN3:Eu2+ Mixed Nitride Phosphors," Journal of Alloys and Compounds, vol. 475, 2009, pp. 434-439.
Watanabe, H. et al., "Crystal Structure and Luminescence of Sr0.99Eu0.01AlSiN3," Journal of Solid State Chemistry, vol. 181, 2008, pp. 1848-1852.
Yen, W.M. et al., "Second Edition Phosphor Handbook," CRC Press, Dec. 1, 2006, 5 pages.

\* cited by examiner

|  | x | y | ldom/nm | FWHM/nm | QI | QE | LER | B |
|---|---|---|---|---|---|---|---|---|
| (Sr0.7Ca0.3)AlSiN3:Eu (0.4%) | 0.628 | 0.370 | 600.5 | 86.7 | 100% | 100% | 100% | 100% |
| (Sr0.8Ca0.2)AlSiN3:Eu (0.6%) | 0.628 | 0.371 | 600.3 | 86.5 | 99% | 110% | 101% | 111% |
| Sr(Sr0.8Ca0.2)Si2Al2N6:Eu (0.8%) | 0.626 | 0.372 | 600.1 | 79.5 | 99% | 113% | 110% | 125% |
| (Sr0.6Ca0.4)AlSiN3:Eu (0.4%) | 0.639 | 0.359 | 603.1 | 87.2 | 100% | 100% | 100% | 100% |
| Sr(Sr0.8Ca0.2)Si2Al2N6:Eu (1.2%) | 0.637 | 0.362 | 602.4 | 80.4 | 99% | 113% | 111% | 126% |

FIG 5

| comment | Blue LED $\lambda_{dom}$/nm | Green Phosphor | Red Phosphor | $\lambda_{dom}$/nm (red phosphor) | phosphor concentration | ratio green/red | CIE x | CIE y | CCT/K | CRI | rel. eff. |
|---|---|---|---|---|---|---|---|---|---|---|---|
| Comparative example 1 | 446 | (Lu, Ce)$_3$(Al, Ga)$_5$O$_{12}$ (25% Ga, 2.5% Ce) | (Ca, Sr, Ba)$_2$Si$_5$N$_8$ (10% Ca, 47% Sr, 50% Ba, 3% Eu) | 601.5 | 15.5% | 4.45:1 | 0.461 | 0.408 | 2669 | 79 | 100.0% |
| Comparative example 3 | 446 | (Lu, Ce)$_3$(Al, Ga)$_5$O$_{12}$ (25% Ga, 2.5% Ce) | (Sr, Ca)AlSiN$_3$ (80% Sr, 0.5% Eu) | 599.4 | 18.0% | 2.5:1 | 0.459 | 0.416 | 2754 | 80 | 101.4% |
| Comparative example 4 | 446 | (Lu, Ce)$_3$(Al, Ga)$_5$O$_{12}$ (25% Ga, 2.5% Ce) | (Sr, Ca)AlSiN$_3$ (80% Sr, 0.6% Eu) | 600.3 | 16.8% | 2.6:1 | 0.461 | 0.408 | 2655 | 81 | 101.5% |
| Inventive example 1 | 446 | (Lu, Ce)$_3$(Al, Ga)$_5$O$_{12}$ (25% Ga, 2.5% Ce) | Sr(Sr$_{0.8}$Ca$_{0.2}$)Si$_2$Al$_2$N$_6$:Eu (0.8% Eu) | 600.1 | 16.7% | 3.7:1 | 0.462 | 0.411 | 2681 | 79 | 110.4% |

FIG 7

| comment | Blue LED $\lambda_{dom}$/nm | Green Phosphor | Red Phosphor | $\lambda_{dom}$/nm (red phosphor) | phosphor concentration | ratio green/red | CIE x | CIE y | CCT/K | CRI | rel. eff. |
|---|---|---|---|---|---|---|---|---|---|---|---|
| Comparative example 1 | 446 | (Lu, Ce)$_3$(Al, Ga)$_5$O$_{12}$ (25% Ga, 2.5% Ce) | (Ca, Sr, Ba)$_2$Si$_5$N$_8$ (10% Ca, 47% Sr, 50% Ba, 3% Eu) | 601.5 | 15.5% | 4.45:1 | 0.461 | 0.408 | 2669 | 79 | 100.0% |
| Comparative example 3 | 446 | (Lu, Ce)$_3$(Al, Ga)$_5$O$_{12}$ (25% Ga, 2.5% Ce) | (Sr, Ca)AlSiN$_3$ (80% Sr, 0.5% Eu) | 599.4 | 18.0% | 2.5:1 | 0.459 | 0.416 | 2754 | 80 | 101.4% |
| Comparative example 4 | 446 | (Lu, Ce)$_3$(Al, Ga)$_5$O$_{12}$ (25% Ga, 2.5% Ce) | (Sr, Ca)AlSiN$_3$ (80% Sr, 0.6% Eu) | 600.3 | 16.8% | 2.6:1 | 0.461 | 0.408 | 2655 | 81 | 101.5% |
| Inventive example 2 | 446 | (Lu, Ce)$_3$(Al, Ga)$_5$O$_{12}$ (25% Ga, 2.5% Ce) | Sr(Sr$_{0.8}$Ca$_{0.2}$)Si$_2$Al$_2$N$_6$:Eu (1.2% Eu) | 602.4 | 16.5% | 5.5:1 | 0.462 | 0.408 | 2649 | 82 | 105.8% |

Uncoated
Before degradation test

Uncoated
After degradation test

Coated
Before degradation test

FIG 11b
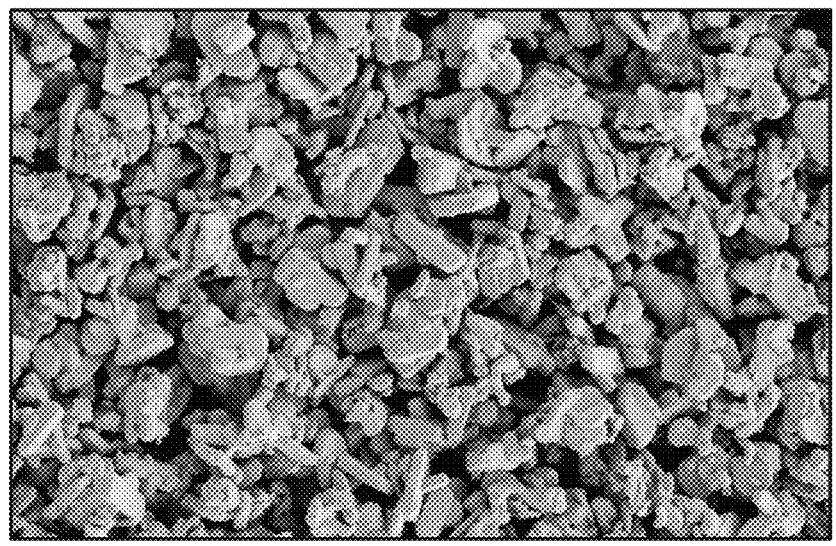
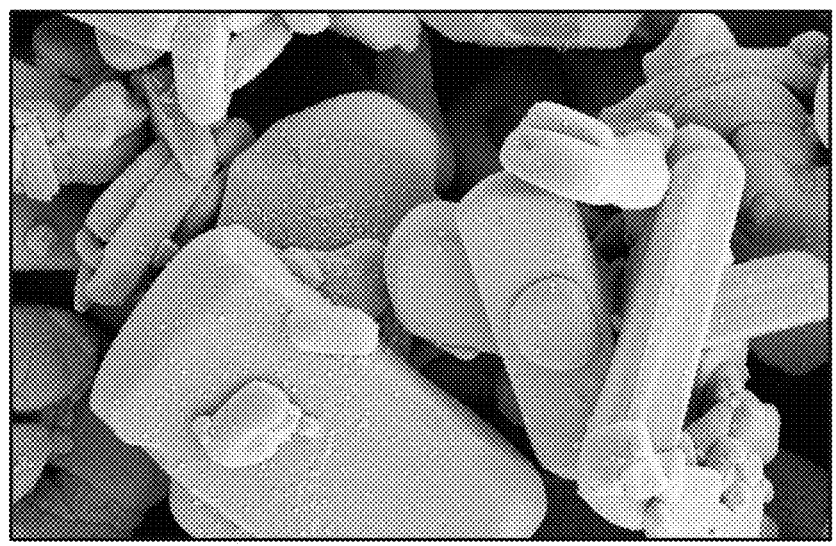
Coated
After degradation test

FIG 19

Structural data from the ICSD database; some compounds in the $Cmc2_1$ space group, all in the $NaSiO_3$ structure type

| Formula | $a$ (Å) | $b$ (Å) | $c$ (Å) | Bibliographic data |
|---|---|---|---|---|
| $Ca(Al_{0.54}Si_{1.38})N_3$ | 9.7558 | 5.6473 | 5.0524 | Chem. Mater. (1.1989-(2008) 20, p6704-p6714) |
| $(Ca_{0.98}Ce_{0.01}Li_{0.01})(Al_{0.6}Si_{1.3})N_3$ | 9.795 | 5.6465 | 5.0590 | Chem. Mater. (1.1989-(2008) 20, p6704-p6714) |
| $(Sr_{0.2}Ca_{0.8})(AlSi)N_3$ | 9.813 | 5.6667 | 5.08378 | Journal of Alloys Compd. (2009), 475, p434-439 |
| $(Sr_{0.5}Ca_{0.5})(AlSi)N_3$ | 9.8297 | 5.6879 | 5.1085 | Journal of Alloys Compd. (2009), 475, p434-439 |
| $(Sr_{0.846}Ca_{0.211})(AlSi)N_3$ | 9.8152 | 5.73644 | 5.14905 | Journal of Alloys Compd. (2009), 475, p434-439 |
| $Li_{0.94}Ca_{0.04}Eu_{0.01}Al_{0.04}Si_{1.90}N_3$ | 9.2204 | 5.3107 | 4.7861 | Journal of Sol. State Chem. (2009), 182 (2), p301-311 |
| $Sr_{0.962}(AlSi)N_3$ | 9.8087 | 5.756 | 5.16614 | Journal of Alloys Compd. (2009), 475, p434-439 |
| $(Sr_{0.99}Eu_{0.01})(AlSi)N_3$ | 9.843 | 5.7603 | 5.177 | Journal of Sol. State Chem. (2009), 181 (8), p1848-1852 |

Single crystal diffractometry solution of the novel structure $Sr(Sr_\alpha Ca_{1-\alpha})Si_2Al_2N_6$

| Details of the x-ray crystallography solution | |
|---|---|
| Lattice parameters | |
| $a$ | 574.93(3) pm |
| $b$ | 516.35(3) pm |
| $c$ | 1138.1(2) pm |
| $\beta$ | 120.341(2)° |
| Formula units Z | 2 |
| Radiation | Mo $K_a$, $\lambda$=71.073 pm |
| Measured/independent reflections | 8331/2053 |
| Measured section of reciprocal space | $-8<h<8; -7<k<8; -16<l<17$ |
| $R_{obs}/{^w}R_{obs}$ | 6.46%/11.38% |
| GoF | 1.97 |

FIG 22

Distances in the novel structure
$Sr(Sr_aCa_{1-a})Si_2Al_2N_6$

| Important interatomic distances in the novel structure $Sr(Sr_\alpha Ca_{1-\alpha})Si_2Al_2N_6$ | | | | | | | | |
|---|---|---|---|---|---|---|---|---|
| $Si_1/Al_1$- | N1 | 175 pm | $Si_2/Al_2$- | N1 | 202 pm | $Si_3/Al_3$- | N1 | 169 pm |
| | N2 | 181 pm | | N2 | 176 pm | | N3 | 194 pm |
| | N3 | 188 pm | | N4 | 178 pm | | N4 | 183 pm |
| | N5 | 182 pm | | N6 | 171 pm | | N5 | 167 pm |
| $Si_4/Al_4$- | N2 | 187 pm | $Sr_1$ | N1 | 259 pm | $Sr_2/Ca_2$ | N2 | 250 pm |
| | N3 | 159 pm | | N3 | 263 pm | | N4 | 281 pm |
| | N4 | 202 pm | | N5_1 | 264 pm | | N6_1 | 253 pm |
| | N6 | 192 pm | | N5_2 | 270 pm | | N6_2 | 272 pm |
| | | | | N5_3 | 277 pm | | N6_3 | 263 pm |
| | | | | N5_4 | 297 pm | | | |

FIG 23

Crystallographic parameters (single crystallography)

Crystallographic data of Sr(Sr$_{0.624}$Ca$_{0.376}$)Si$_2$Al$_2$N$_6$

Space group: $P2_1$
Crystal system: monoclinic
Structure type: Sr(Sr$_a$Ca$_{1-a}$)Si$_2$Al$_2$N$_6$
Lattice parameters:
$a = 574.93$ pm
$b = 516.35$ pm
$c = 1138.1$ pm
$\beta = 120.341°$

| Atom | Wyck. | s.o.f. | x | y | z | $B/10^4$pm$^2$ |
|---|---|---|---|---|---|---|
| Al1 | 2a | 0.5000 | 0.0349 | 0.9764 | 0.1792 | 0.6948 |
| Al2 | 2a | 0.5000 | 0.0324 | 0.9720 | 0.6794 | 0.6948 |
| Al3 | 2a | 0.5000 | 0.6773 | 0.9855 | 0.8289 | 0.6948 |
| Al4 | 2a | 0.5000 | 0.6615 | 0.0037 | 0.3226 | 0.6948 |
| Si1 | 2a | 0.5000 | 0.0349 | 0.9764 | 0.1792 | 0.6948 |
| Si2 | 2a | 0.5000 | 0.0324 | 0.9720 | 0.6794 | 0.6948 |
| Si3 | 2a | 0.5000 | 0.6773 | 0.9855 | 0.8289 | 0.6948 |
| Si4 | 2a | 0.5000 | 0.6615 | 0.0037 | 0.3226 | 0.6948 |
| N1 | 2a | 1.0000 | 0.1210 | 0.6520 | 0.2134 | 0.8212 |
| N2 | 2a | 1.0000 | 0.0830 | 0.6350 | 0.7224 | 0.8212 |
| N3 | 2a | 1.0000 | 0.6260 | 0.6260 | 0.7640 | 0.8212 |
| N4 | 2a | 1.0000 | 0.6620 | 0.6440 | 0.2575 | 0.8212 |
| N5 | 2a | 1.0000 | 0.7950 | 0.9920 | 0.9950 | 0.0212 |
| N6 | 2a | 1.0000 | 0.7870 | 0.0170 | 0.5132 | 0.8212 |
| Sr1 | 2a | 1.0000 | 0.6806 | 0.4874 | 0.0004 | 1.0264 |
| Sr2 | 2a | 0.6240 | 0.6894 | 0.4982 | 0.5016 | 1.0264 |
| Ca2 | 2a | 0.3760 | 0.6894 | 0.4982 | 0.5016 | 1.0264 |

Crystallographic data of Sr$_{0.99}$Eu$_{0.01}$AlSiN$_3$, known from the litterature (Structure database ICSD 41-9410)

Space group: $Cmc2_1$
Crystal system: orthorhombic
Structure type: NaSiO$_3$
Lattice parameters:
$a = 984.3$ pm
$b = 576.03$ pm
$c = 517.7$ pm

| Atom | Wyck. | s.o.f. | x | y | z | $B/10^4$pm$^2$ |
|---|---|---|---|---|---|---|
| Al1 | 8b | 0.5000 | 0.1777 | 0.1518 | 0.0256 | 1.113 |
| Si1 | 8b | 0.5000 | 0.1777 | 0.1518 | 0.0256 | 1.113 |
| N1 | 4a | 1.0000 | 0.0000 | 0.2919 | 0.5064 | 1.492 |
| N2 | 8b | 1.0000 | 0.2714 | 0.1117 | 0.3531 | 1.713 |
| Sr1 | 4a | 0.9900 | 0.0000 | 0.1847 | 0.0000 | 0.829 |
| Eu1 | 4a | 0.0100 | 0.0000 | 0.1847 | 0.0000 | 0.829 |

Crystallographic data/location parameters of the novel phosphor of the invention (left) - and as a comparison the crystallographic data/location parameters of the phosphor SrAlSiN$_3$, known from the literature (on the right).

Fig a) Phosphor of the invention
$Sr(Sr_\alpha Ca_{1-\alpha})Si_2Al_2N_6$:Eu, view of the layers Fig b) Phosphor of the invention
$Sr(Sr_\alpha Ca_{1-\alpha})Si_2Al_2N_6$:Eu,
*[010]* viewing direction Fig c) literature-known phosphor SCASN

FIG 39a

| Experiment | Composition $Ca_{1-x}Sr_xAlSiN_3:yEu$ or $Sr(Sr_aCa_{1-a})Si_2Al_2N_6:yEu$ (a=2x-1) | | Weights/g | | | | | | | | | | Optical characterization | |
|---|---|---|---|---|---|---|---|---|---|---|---|---|---|---|
| | y | x | $Ca_3N_2$ | $Sr_3N_2$ | $AlF_3$ | $SrF_2$ | $BaF_2$ | $Li_2B_4O_7$ | $LiBF_4$ | $Si_3N_4$ | AlN | $Eu_2O_3$ | Total | CIE x | CIE y |
| FH 005_13 | 0,6% | 0,8 | 2,746 | 21,552 | 0,875 | 0,436 | 0 | 0 | 0 | 12,993 | 11,104 | 0,293 | 50 | 0,632 | 0,365 |
| FH 006_13 | 0,6% | 0,8 | 2,730 | 21,428 | 0,290 | 1,301 | 0 | 0 | 0 | 12,918 | 11,040 | 0,292 | 50 | 0,632 | 0,365 |
| FH 007_13 | 0,6% | 0,8 | 2,729 | 21,416 | 0,232 | 1,387 | 0 | 0 | 0 | 12,911 | 11,034 | 0,292 | 50 | 0,634 | 0,364 |
| FH 008_13 | 0,6% | 0,8 | 2,748 | 21,564 | 0,934 | 0,349 | 0 | 0 | 0 | 13,000 | 11,111 | 0,294 | 50 | 0,632 | 0,365 |
| FH 009_13 | 0,6% | 0,8 | 2,738 | 21,492 | 1,163 | 0 | 0 | 0 | 0 | 12,957 | 11,357 | 0,293 | 50 | 0,631 | 0,366 |
| FH 010_13 | 0,6% | 0,8 | 2,646 | 20,769 | 1,124 | 1,682 | 0 | 0 | 0 | 12,521 | 10,975 | 0,283 | 50 | 0,631 | 0,366 |
| FH 011_13 | 0,6% | 0,8 | 2,574 | 20,202 | 1,641 | 2,454 | 0 | 0 | 0 | 12,179 | 10,676 | 0,275 | 50 | 0,633 | 0,364 |
| FH 012_13 | 0,6% | 0,8 | 2,506 | 19,665 | 2,129 | 3,185 | 0 | 0 | 0 | 11,855 | 10,392 | 0,268 | 50 | 0,632 | 0,364 |
| FH 013_13 | 0,6% | 0,8 | 2,731 | 21,434 | 0 | 0 | 0 | 0 | 1,295 | 12,922 | 11,326 | 0,292 | 50 | 0,635 | 0,363 |
| FH 014_13 | 0,6% | 0,8 | 2,735 | 21,463 | 0,581 | 0 | 0 | 0 | 0,648 | 12,939 | 11,342 | 0,292 | 50 | 0,633 | 0,364 |
| FH 015_13 | 0,6% | 0,8 | 2,719 | 21,340 | 0,000 | 0,864 | 0 | 0 | 0,645 | 12,865 | 11,277 | 0,290 | 50 | 0,634 | 0,364 |
| FH 016_13 | 0,6% | 0,8 | 2,725 | 21,389 | 0,387 | 0,578 | 0 | 0 | 0,432 | 12,895 | 11,303 | 0,291 | 50 | 0,633 | 0,364 |
| FH 029_13 | 0,6% | 0,8 | 2,671 | 20,961 | 0 | 0 | 2,369 | 0 | 0 | 12,637 | 11,077 | 0,285 | 50 | 0,633 | 0,366 |
| FH 030_13 | 0,6% | 0,8 | 2,704 | 21,223 | 0,574 | 0 | 1,199 | 0 | 0 | 12,795 | 11,215 | 0,289 | 50 | 0,631 | 0,366 |
| FH 031_13 | 0,6% | 0,8 | 2,689 | 21,103 | 0,000 | 0,854 | 1,193 | 0 | 0 | 12,722 | 11,152 | 0,287 | 50 | 0,630 | 0,367 |
| FH 032_13 | 0,6% | 0,8 | 2,701 | 21,195 | 0,000 | 0 | 1,198 | 0 | 0,640 | 12,778 | 11,200 | 0,289 | 50 | 0,636 | 0,361 |
| FH 037_13 | 0,4% | 0,6 | 5,741 | 16,896 | 0,305 | 1,368 | 0 | 0 | 0 | 13,581 | 11,905 | 0,204 | 50 | 0,636 | 0,360 |
| FH 038_13 | 0,4% | 0,6 | 5,738 | 16,886 | 0,244 | 1,458 | 0 | 0 | 0 | 13,573 | 11,897 | 0,204 | 50 | 0,635 | 0,361 |
| FH 039_13 | 0,4% | 0,6 | 5,776 | 16,999 | 0,920 | 0,459 | 0 | 0 | 0 | 13,664 | 11,977 | 0,206 | 50 | 0,637 | 0,359 |
| FH 040_13 | 0,4% | 0,6 | 5,779 | 17,009 | 0,982 | 0,367 | 0 | 0 | 0 | 13,672 | 11,984 | 0,206 | 50 | 0,638 | 0,358 |

FIG 39b

| Experiment | Composition $Ca_{1-x}Sr_xAlSiN_3:yEu$ or $Sr(Sr_aCa_{1-a})Si_2Al_2N_6:yEu$ (a=2x-1) | | Weights/g | | | | | | | | | | Optical characterization | |
|---|---|---|---|---|---|---|---|---|---|---|---|---|---|---|
| | y | x | $Ca_3N_2$ | $Sr_3N_2$ | $AlF_3$ | $SrF_2$ | $BaF_2$ | $Li_2B_4O_7$ | $LiBF_4$ | $Si_3N_4$ | AlN | $Eu_2O_3$ | Total | CIE x | CIE y |
| FH_041_13 | 0.4% | 0.6 | 5,793 | 17,048 | 0,000 | 0 | 0 | 0 | 1,239 | 13,703 | 12,011 | 0,206 | 50 | 0,636 | 0,359 |
| FH_042_13 | 0.4% | 0.6 | 5,793 | 17,049 | 0,615 | 0 | 0 | 0 | 0,620 | 13,704 | 12,012 | 0,206 | 50 | 0,640 | 0,356 |
| FH_043_13 | 0.4% | 0.6 | 5,758 | 16,946 | 0 | 0,915 | 0 | 0 | 0,616 | 13,621 | 11,940 | 0,205 | 50 | 0,639 | 0,357 |
| FH_044_13 | 0.4% | 0.6 | 5,785 | 17,025 | 0 | 0 | 0 | 0,619 | 0,686 | 13,685 | 11,995 | 0,206 | 50 | 0,642 | 0,354 |
| FH_046_13 | 0.4% | 0.6 | 5,747 | 16,913 | 0 | 1,205 | 0 | 0,418 | 0 | 13,595 | 11,917 | 0,205 | 50 | 0,639 | 0,358 |
| FH_047_13 | 0.4% | 0.6 | 5,737 | 16,885 | 0 | 1,458 | 0 | 0,245 | 0 | 13,573 | 11,897 | 0,204 | 50 | 0,639 | 0,358 |
| FH_048_13 | 0.4% | 0.6 | 5,782 | 17,017 | 0 | 0 | 0 | 0,421 | 0,905 | 13,679 | 11,990 | 0,206 | 50 | 0,640 | 0,356 |
| FH_049_13 | 0.4% | 0.6 | 5,780 | 17,011 | 0 | 0 | 0 | 0,247 | 1,096 | 13,674 | 11,986 | 0,206 | 50 | 0,640 | 0,356 |
| FH_050_13 | 0.4% | 0.6 | 5,793 | 17,050 | 0,809 | 0 | 0 | 0,421 | 0 | 13,707 | 12,013 | 0,206 | 50 | 0,639 | 0,357 |
| FH_051_13 | 0.4% | 0.6 | 5,793 | 17,049 | 0,984 | 0 | 0 | 0,248 | 0 | 13,707 | 12,013 | 0,206 | 50 | 0,639 | 0,358 |
| FH_052_13 | 0.4% | 0.6 | 5,770 | 16,980 | 0,408 | 0,611 | 0 | 0,411 | 0 | 13,651 | 11,964 | 0,205 | 50 | 0,639 | 0,358 |
| FH_053_13 | 0.4% | 0.6 | 5,725 | 17,196 | 0,486 | 0,728 | 0 | 0,245 | 0 | 13,545 | 11,871 | 0,204 | 50 | 0,639 | 0,358 |
| FH_058_13 | 0.4% | 0.6 | 5,704 | 17,134 | 0,906 | 0,606 | 0 | 0,122 | 0 | 13,496 | 11,828 | 0,203 | 50 | 0,636 | 0,360 |
| FH_059_13 | 0.4% | 0.6 | 5,753 | 17,280 | 0,000 | 1,100 | 0 | 0,123 | 0 | 13,611 | 11,929 | 0,205 | 50 | 0,637 | 0,360 |
| FH_060_13 | 0.4% | 0.6 | 5,793 | 17,049 | 1,107 | 0,000 | 0 | 0,124 | 0 | 13,707 | 12,013 | 0,206 | 50 | 0,638 | 0,358 |
| FH_061_13 | 0.4% | 0.6 | 5,722 | 17,186 | 0,818 | 0,548 | 0 | 0,122 | 0 | 13,537 | 11,864 | 0,204 | 50 | 0,638 | 0,359 |
| FH_064_13 | 0.8% | 0.8 | 2,791 | 21,907 | 0,119 | 0 | 0 | 0 | 0 | 13,209 | 11,577 | 0,398 | 50 | 0,634 | 0,364 |
| FH_065_13 | 1.0% | 0.8 | 2,786 | 21,863 | 0,118 | 0 | 0 | 0 | 0 | 13,183 | 11,554 | 0,496 | 50 | 0,638 | 0,360 |
| FH_066_13 | 1.2% | 0.8 | 2,780 | 21,820 | 0,118 | 0 | 0 | 0 | 0 | 13,157 | 11,531 | 0,594 | 50 | 0,641 | 0,357 |
| FH_067_13 | 1.2% | 0.9 | 1,354 | 23,908 | 0,115 | 0 | 0 | 0 | 0 | 12,814 | 11,230 | 0,579 | 50 | 0,633 | 0,366 |

FIG 39c

| Experiment | Composition $Ca_{1-x}Sr_xAlSiN_3:yEu$ or $Sr(Sr_aCa_{1-a})Si_2Al_2N_6:yEu$ ($a=2x-1$) | | Weights/g | | | | | | | | | Optical characterization | |
|---|---|---|---|---|---|---|---|---|---|---|---|---|---|
| | y | x | $Ca_3N_2$ | $Sr_3N_2$ | $AlF_3$ | $SrF_2$ | $BaF_2$ | $Li_2B_4O_7$ | $LiBF_4$ | $Si_3N_4$ | AlN | $Eu_2O_3$ | Total | CIE x | CIE y |
| FH 068_13 | 1,2% | 0,875 | 1,704 | 23,397 | 0,116 | 0 | 0 | 0 | 0 | 12,898 | 11,304 | 0,582 | 50 | 0,636 | 0,362 |
| FH 069_13 | 1,2% | 0,85 | 2,058 | 22,878 | 0,117 | 0 | 0 | 0 | 0 | 12,983 | 11,378 | 0,586 | 50 | 0,640 | 0,358 |
| FH 070_13 | 1,2% | 0,825 | 2,417 | 22,353 | 0,117 | 0 | 0 | 0 | 0 | 13,069 | 11,454 | 0,590 | 50 | 0,642 | 0,356 |
| FH 079_13 | 1,2% | 0,925 | 1,009 | 24,413 | 0,114 | 0 | 0 | 0 | 0 | 12,731 | 11,158 | 0,575 | 50 | 0,628 | 0,370 |
| FH 080_13 | 1,2% | 0,95 | 0,668 | 24,912 | 0,114 | 0 | 0 | 0 | 0 | 12,649 | 11,086 | 0,571 | 50 | 0,626 | 0,372 |
| FH 081_13 | 1,5% | 0,8 | 2,772 | 21,756 | 0,118 | 0 | 0 | 0 | 0 | 13,118 | 11,497 | 0,740 | 50 | 0,645 | 0,353 |
| FH 082_13 | 2,0% | 0,8 | 2,759 | 21,649 | 0,117 | 0 | 0 | 0 | 0 | 13,053 | 11,440 | 0,982 | 50 | 0,654 | 0,345 |
| TF 88/12 | 0,5% | 0,7 | 8,632 | 39,518 | 0,244 | 0 | 0 | 0 | 0 | 27,227 | 23,866 | 0,512 | 100 | 0,635 | 0,364 |
| TF 93/12 | 0,6% | 0,8 | 5,594 | 43,903 | 0,238 | 0 | 0 | 0 | 0 | 26,468 | 23,200 | 0,598 | 100 | 0,638 | 0,361 |
| TF 99/12 | 0,5% | 0,7 | 8,632 | 39,518 | 0,244 | 0 | 0 | 0 | 0 | 27,227 | 23,866 | 0,512 | 100 | 0,632 | 0,366 |
| TF 100/12 | 0,6% | 0,8 | 5,594 | 43,903 | 0,238 | 0 | 0 | 0 | 0 | 26,468 | 23,200 | 0,598 | 100 | 0,628 | 0,371 |
| TF 103/12 | 0,5% | 0,8 | 5,600 | 43,947 | 0,238 | 0 | 0 | 0 | 0 | 26,494 | 23,223 | 0,499 | 100 | 0,624 | 0,375 |
| TF 131/12 | 0,6% | 0,9 | 2,724 | 48,097 | 0,231 | 0 | 0 | 0 | 0 | 25,774 | 22,592 | 0,582 | 100 | 0,622 | 0,377 |
| TF 132/12 | 0,7% | 0,9 | 2,721 | 48,050 | 0,231 | 0 | 0 | 0 | 0 | 25,749 | 22,570 | 0,678 | 100 | 0,624 | 0,375 |
| TF 133/12 | 0,8% | 0,9 | 2,719 | 48,004 | 0,231 | 0 | 0 | 0 | 0 | 25,724 | 22,548 | 0,774 | 100 | 0,626 | 0,372 |
| TF 161/12 | 1,0% | 0,9 | 2,713 | 47,911 | 0,230 | 0 | 0 | 0 | 0 | 25,674 | 22,505 | 0,966 | 100 | 0,635 | 0,364 |
| TF 162/12 | 1,2% | 0,9 | 2,708 | 47,818 | 0,231 | 0 | 0 | 0 | 0 | 25,625 | 22,461 | 1,157 | 100 | 0,637 | 0,362 |
| TF 163/12 | 0,6% | 0,85 | 4,140 | 46,028 | 0,235 | 0 | 0 | 0 | 0 | 26,116 | 22,892 | 0,590 | 100 | 0,624 | 0,374 |
| TF 168/12 | 0,9% | 0,9 | 2,716 | 47,957 | 0,231 | 0 | 0 | 0 | 0 | 25,699 | 22,527 | 0,870 | 100 | 0,629 | 0,370 |
| TF 169/12 | 1,2% | 0,95 | 1,337 | 49,826 | 0,227 | 0 | 0 | 0 | 0 | 25,295 | 22,173 | 1,142 | 100 | 0,631 | 0,368 |

FIG 39d

| Experiment | Composition $Ca_{1-x}Sr_xAlSiN_3:yEu$ or $Sr(Sr_aCa_{1-a})Si_2Al_2N_6:yEu$ (a=2x-1) | | AEM Content | Si:Al ratio | Weights/g | | | | | | | | |
|---|---|---|---|---|---|---|---|---|---|---|---|---|---|
| | y | x | | | $Ca_3N_2$ | $Sr_3N_2$ | $BaN_x$ | $AlF_3$ | $SrF_2$ | $BaF_2$ | $Li_2B_4O_7$ | $LiBF_4$ | $LiF$ |
| FH 005_13 | 0,6% | 0,8 | 1 | 1,0:0,975 | 2,746 | 21,552 | 0 | 0,875 | 0,436 | 0 | 0 | 0 | 0 |
| FH 006_13 | 0,6% | 0,8 | 1 | 1,0:0,975 | 2,730 | 21,428 | 0 | 0,290 | 1,301 | 0 | 0 | 0 | 0 |
| FH 007_13 | 0,6% | 0,8 | 1 | 1,0:0,975 | 2,729 | 21,416 | 0 | 0,232 | 1,387 | 0 | 0 | 0 | 0 |
| FH 008_13 | 0,6% | 0,8 | 1 | 1,0:0,975 | 2,748 | 21,564 | 0 | 0,934 | 0,349 | 0 | 0 | 0 | 0 |
| FH 009_13 | 0,6% | 0,8 | 1 | 1:1 | 2,738 | 21,492 | 0 | 1,163 | 0 | 0 | 0 | 0 | 0 |
| FH 010_13 | 0,6% | 0,8 | 1 | 1:1 | 2,646 | 20,769 | 0 | 1,124 | 1,682 | 0 | 0 | 0 | 0 |
| FH 011_13 | 0,6% | 0,8 | 1 | 1:1 | 2,574 | 20,202 | 0 | 1,641 | 2,454 | 0 | 0 | 0 | 0 |
| FH 012_13 | 0,6% | 0,8 | 1 | 1:1 | 2,506 | 19,665 | 0 | 2,129 | 3,185 | 0 | 0 | 0 | 0 |
| FH 013_13 | 0,6% | 0,8 | 1 | 1:1 | 2,731 | 21,434 | 0 | 0 | 0 | 0 | 0 | 1,295 | 0 |
| FH 014_13 | 0,6% | 0,8 | 1 | 1:1 | 2,735 | 21,463 | 0 | 0,581 | 0 | 0 | 0 | 0,648 | 0 |
| FH 015_13 | 0,6% | 0,8 | 1 | 1:1 | 2,719 | 21,340 | 0 | 0,000 | 0,864 | 0 | 0 | 0,645 | 0 |
| FH 016_13 | 0,6% | 0,8 | 1 | 1:1 | 2,725 | 21,389 | 0 | 0,387 | 0,578 | 0 | 0 | 0,432 | 0 |
| FH 029_13 | 0,6% | 0,8 | 1 | 1:1 | 2,671 | 20,961 | 0 | 0 | 0 | 2,369 | 0 | 0 | 0 |
| FH 030_13 | 0,6% | 0,8 | 1 | 1:1 | 2,704 | 21,223 | 0 | 0,574 | 0 | 1,199 | 0 | 0 | 0 |
| FH 031_13 | 0,6% | 0,8 | 1 | 1:1 | 2,689 | 21,103 | 0 | 0,000 | 0,854 | 1,193 | 0 | 0 | 0 |
| FH 032_13 | 0,6% | 0,8 | 1 | 1:1 | 2,701 | 21,195 | 0 | 0,000 | 0 | 1,198 | 0 | 0 | 0 |
| FH 037_13 | 0,4% | 0,6 | 1 | 1:1 | 5,741 | 16,896 | 0 | 0,305 | 1,368 | 0 | 0 | 0,640 | 0 |
| FH 038_13 | 0,4% | 0,6 | 1 | 1:1 | 5,738 | 16,886 | 0 | 0,244 | 1,458 | 0 | 0 | 0 | 0 |
| FH 039_13 | 0,4% | 0,6 | 1 | 1:1 | 5,776 | 16,999 | 0 | 0,920 | 0,459 | 0 | 0 | 0 | 0 |

FIG 39e

| | Weights/g | | | | | | | | | | | | Optical characterization | |
|---|---|---|---|---|---|---|---|---|---|---|---|---|---|---|
| Li₃N | Mn₂O₃ | CuO | Zn₃N₂ | La₂O₃ | Si₃N₄ | Graphite | AlN | Eu₂O₃ | EuN | CeO₂ | SiO₂ | Total | CIE x | CIE y |
| 0 | 0 | 0 | 0 | 0 | 12,993 | 0 | 11,104 | 0,293 | 0 | 0 | 0 | 50 | 0,632 | 0,365 |
| 0 | 0 | 0 | 0 | 0 | 12,918 | 0 | 11,040 | 0,292 | 0 | 0 | 0 | 50 | 0,632 | 0,365 |
| 0 | 0 | 0 | 0 | 0 | 12,911 | 0 | 11,034 | 0,292 | 0 | 0 | 0 | 50 | 0,634 | 0,364 |
| 0 | 0 | 0 | 0 | 0 | 13,000 | 0 | 11,111 | 0,294 | 0 | 0 | 0 | 50 | 0,632 | 0,365 |
| 0 | 0 | 0 | 0 | 0 | 12,957 | 0 | 11,357 | 0,293 | 0 | 0 | 0 | 50 | 0,631 | 0,366 |
| 0 | 0 | 0 | 0 | 0 | 12,521 | 0 | 10,975 | 0,283 | 0 | 0 | 0 | 50 | 0,631 | 0,366 |
| 0 | 0 | 0 | 0 | 0 | 12,179 | 0 | 10,676 | 0,275 | 0 | 0 | 0 | 50 | 0,633 | 0,364 |
| 0 | 0 | 0 | 0 | 0 | 11,855 | 0 | 10,392 | 0,268 | 0 | 0 | 0 | 50 | 0,632 | 0,364 |
| 0 | 0 | 0 | 0 | 0 | 12,922 | 0 | 11,326 | 0,292 | 0 | 0 | 0 | 50 | 0,635 | 0,363 |
| 0 | 0 | 0 | 0 | 0 | 12,939 | 0 | 11,342 | 0,292 | 0 | 0 | 0 | 50 | 0,633 | 0,364 |
| 0 | 0 | 0 | 0 | 0 | 12,865 | 0 | 11,277 | 0,290 | 0 | 0 | 0 | 50 | 0,634 | 0,364 |
| 0 | 0 | 0 | 0 | 0 | 12,895 | 0 | 11,303 | 0,291 | 0 | 0 | 0 | 50 | 0,633 | 0,364 |
| 0 | 0 | 0 | 0 | 0 | 12,637 | 0 | 11,077 | 0,285 | 0 | 0 | 0 | 50 | 0,633 | 0,364 |
| 0 | 0 | 0 | 0 | 0 | 12,795 | 0 | 11,215 | 0,289 | 0 | 0 | 0 | 50 | 0,631 | 0,366 |
| 0 | 0 | 0 | 0 | 0 | 12,722 | 0 | 11,152 | 0,287 | 0 | 0 | 0 | 50 | 0,630 | 0,367 |
| 0 | 0 | 0 | 0 | 0 | 12,778 | 0 | 11,200 | 0,289 | 0 | 0 | 0 | 50 | 0,636 | 0,361 |
| 0 | 0 | 0 | 0 | 0 | 13,581 | 0 | 11,905 | 0,204 | 0 | 0 | 0 | 50 | 0,636 | 0,360 |
| 0 | 0 | 0 | 0 | 0 | 13,573 | 0 | 11,897 | 0,204 | 0 | 0 | 0 | 50 | 0,635 | 0,361 |
| 0 | 0 | 0 | 0 | 0 | 13,664 | 0 | 11,977 | 0,206 | 0 | 0 | 0 | 50 | 0,637 | 0,359 |

FIG 39f

| Experiment | Composition $Ca_{1-x}Sr_xAlSiN_3:yEu$ or $Sr(Sr_aCa_{1-a})Si_2Al_2N_6:yEu$ (a=2x-1) | | AEM Content | Si:Al ratio | Weights/g | | | | | | | | |
|---|---|---|---|---|---|---|---|---|---|---|---|---|---|
| | y | x | | | $Ca_3N_2$ | $Sr_3N_2$ | $BaN_x$ | $AlF_3$ | $SrF_2$ | $BaF_2$ | $Li_2B_4O_7$ | $LiBF_4$ | $LiF$ |
| FH 040_13 | 0.4% | 0.6 | 1 | 1:1 | 5.779 | 17.009 | 0 | 0.982 | 0.367 | 0 | 0 | 0 | 0 |
| FH 041_13 | 0.4% | 0.6 | 1 | 1:1 | 5.793 | 17.048 | 0 | 0.000 | 0 | 0 | 0 | 1.239 | 0 |
| FH 042_13 | 0.4% | 0.6 | 1 | 1:1 | 5.793 | 17.049 | 0 | 0.615 | 0 | 0 | 0 | 0.620 | 0 |
| FH 043_13 | 0.4% | 0.6 | 1 | 1:1 | 5.758 | 16.946 | 0 | 0 | 0.915 | 0 | 0.619 | 0.616 | 0 |
| FH 044_13 | 0.4% | 0.6 | 1 | 1:1 | 5.785 | 17.025 | 0 | 0 | 0 | 0 | 0.418 | 0.686 | 0 |
| FH 046_13 | 0.4% | 0.6 | 1 | 1:1 | 5.747 | 16.913 | 0 | 0 | 1.205 | 0 | 0.245 | 0 | 0 |
| FH 047_13 | 0.4% | 0.6 | 1 | 1:1 | 5.737 | 16.885 | 0 | 0 | 1.458 | 0 | 0.421 | 0 | 0 |
| FH 048_13 | 0.4% | 0.6 | 1 | 1:1 | 5.782 | 17.017 | 0 | 0 | 0 | 0 | 0.247 | 0.905 | 0 |
| FH 049_13 | 0.4% | 0.6 | 1 | 1:1 | 5.780 | 17.011 | 0 | 0 | 0 | 0 | 0.421 | 1.096 | 0 |
| FH 050_13 | 0.4% | 0.6 | 1 | 1:1 | 5.793 | 17.050 | 0 | 0.809 | 0 | 0 | 0.248 | 0 | 0 |
| FH 051_13 | 0.4% | 0.6 | 1 | 1:1 | 5.793 | 17.049 | 0 | 0.984 | 0 | 0 | 0.411 | 0 | 0 |
| FH 052_13 | 0.4% | 0.6 | 1 | 1:1 | 5.770 | 16.980 | 0 | 0.408 | 0.611 | 0 | 0.245 | 0 | 0 |
| FH 053_13 | 0.4% | 0.6 | 1 | 1:1 | 5.725 | 17.196 | 0 | 0.486 | 0.728 | 0 | 0.122 | 0 | 0 |
| FH 058_13 | 0.4% | 0.6 | 1 | 1:1 | 5.704 | 17.134 | 0 | 0.906 | 0.606 | 0 | 0.123 | 0 | 0 |
| FH 059_13 | 0.4% | 0.6 | 1 | 1:1 | 5.753 | 17.280 | 0 | 0.000 | 1.100 | 0 | 0.124 | 0 | 0 |
| FH 060_13 | 0.4% | 0.6 | 1 | 1:1 | 5.793 | 17.049 | 0 | 1.107 | 0.000 | 0 | 0.122 | 0 | 0 |
| FH 061_13 | 0.4% | 0.6 | 1 | 1:1 | 5.722 | 17.186 | 0 | 0.818 | 0.548 | 0 | 0 | 0 | 0 |
| FH 064_13 | 0.8% | 0.8 | 1 | 1:1 | 2.791 | 21.907 | 0 | 0.119 | 0 | 0 | 0 | 0 | 0 |
| FH 065_13 | 1.0% | 0.8 | 1 | 1:1 | 2.786 | 21.863 | 0 | 0.118 | 0 | 0 | 0 | 0 | 0 |

FIG 39g

| | | | | | | Weights/g | | | | | | | | Optical characterization | |
|---|---|---|---|---|---|---|---|---|---|---|---|---|---|---|---|
| Li₃N | Mn₂O₃ | CuO | Zn₃N₂ | La₂O₃ | Si₃N₄ | Graphite | AlN | Eu₂O₃ | EuN | CeO₂ | SiO₂ | Total | CIE x | CIE y |
| 0 | 0 | 0 | 0 | 0 | 13,672 | 0 | 11,984 | 0,206 | 0 | 0 | 0 | 50 | 0,638 | 0,358 |
| 0 | 0 | 0 | 0 | 0 | 13,703 | 0 | 12,011 | 0,206 | 0 | 0 | 0 | 50 | 0,636 | 0,359 |
| 0 | 0 | 0 | 0 | 0 | 13,704 | 0 | 12,012 | 0,206 | 0 | 0 | 0 | 50 | 0,640 | 0,356 |
| 0 | 0 | 0 | 0 | 0 | 13,621 | 0 | 11,940 | 0,205 | 0 | 0 | 0 | 50 | 0,639 | 0,357 |
| 0 | 0 | 0 | 0 | 0 | 13,685 | 0 | 11,995 | 0,206 | 0 | 0 | 0 | 50 | 0,642 | 0,354 |
| 0 | 0 | 0 | 0 | 0 | 13,595 | 0 | 11,917 | 0,205 | 0 | 0 | 0 | 50 | 0,639 | 0,358 |
| 0 | 0 | 0 | 0 | 0 | 13,573 | 0 | 11,897 | 0,204 | 0 | 0 | 0 | 50 | 0,639 | 0,358 |
| 0 | 0 | 0 | 0 | 0 | 13,679 | 0 | 11,990 | 0,206 | 0 | 0 | 0 | 50 | 0,640 | 0,356 |
| 0 | 0 | 0 | 0 | 0 | 13,674 | 0 | 11,986 | 0,206 | 0 | 0 | 0 | 50 | 0,640 | 0,356 |
| 0 | 0 | 0 | 0 | 0 | 13,707 | 0 | 12,013 | 0,206 | 0 | 0 | 0 | 50 | 0,639 | 0,357 |
| 0 | 0 | 0 | 0 | 0 | 13,707 | 0 | 12,013 | 0,205 | 0 | 0 | 0 | 50 | 0,639 | 0,358 |
| 0 | 0 | 0 | 0 | 0 | 13,651 | 0 | 11,964 | 0,204 | 0 | 0 | 0 | 50 | 0,639 | 0,358 |
| 0 | 0 | 0 | 0 | 0 | 13,545 | 0 | 11,871 | 0,203 | 0 | 0 | 0 | 50 | 0,639 | 0,358 |
| 0 | 0 | 0 | 0 | 0 | 13,496 | 0 | 11,828 | 0,205 | 0 | 0 | 0 | 50 | 0,636 | 0,360 |
| 0 | 0 | 0 | 0 | 0 | 13,611 | 0 | 11,929 | 0,206 | 0 | 0 | 0 | 50 | 0,637 | 0,360 |
| 0 | 0 | 0 | 0 | 0 | 13,707 | 0 | 12,013 | 0,204 | 0 | 0 | 0 | 50 | 0,638 | 0,358 |
| 0 | 0 | 0 | 0 | 0 | 13,537 | 0 | 11,864 | 0,398 | 0 | 0 | 0 | 50 | 0,638 | 0,359 |
| 0 | 0 | 0 | 0 | 0 | 13,209 | 0 | 11,577 | 0,398 | 0 | 0 | 0 | 50 | 0,634 | 0,364 |
| 0 | 0 | 0 | 0 | 0 | 13,183 | 0 | 11,554 | 0,496 | 0 | 0 | 0 | 50 | 0,638 | 0,360 |

FIG 39h

| Experiment | Composition $Ca_{1-x}Sr_xAlSiN_3:yEu$ or $Sr(Sr_aCa_{1-a})Si_2Al_2N_6:yEu$ $(a=2x-1)$ | | AEM Content | Si:Al ratio | Weights/g | | | | | | | | |
|---|---|---|---|---|---|---|---|---|---|---|---|---|---|
| | y | x | | | $Ca_3N_2$ | $Sr_3N_2$ | BaNx | $AlF_3$ | $SrF_2$ | $BaF_2$ | $Li_2B_4O_7$ | $LiBF_4$ | LiF |
| FH 066_13 | 1,2% | 0,8 | 1 | 1:1 | 2,780 | 21,820 | 0 | 0,118 | 0 | 0 | 0 | 0 | 0 |
| FH 067_13 | 1,2% | 0,9 | 1 | 1:1 | 1,354 | 23,908 | 0 | 0,115 | 0 | 0 | 0 | 0 | 0 |
| FH 068_13 | 1,2% | 0,875 | 1 | 1:1 | 1,704 | 23,397 | 0 | 0,116 | 0 | 0 | 0 | 0 | 0 |
| FH 069_13 | 1,2% | 0,85 | 1 | 1:1 | 2,058 | 22,878 | 0 | 0,117 | 0 | 0 | 0 | 0 | 0 |
| FH 070_13 | 1,2% | 0,825 | 1 | 1:1 | 2,417 | 22,353 | 0 | 0,117 | 0 | 0 | 0 | 0 | 0 |
| FH 079_13 | 1,2% | 0,925 | 1 | 1:1 | 1,009 | 24,413 | 0 | 0,114 | 0 | 0 | 0 | 0 | 0 |
| FH 080_13 | 1,2% | 0,95 | 1 | 1:1 | 0,668 | 24,912 | 0 | 0,114 | 0 | 0 | 0 | 0 | 0 |
| FH 081_13 | 1,5% | 0,8 | 1 | 1:1 | 2,772 | 21,756 | 0 | 0,118 | 0 | 0 | 0 | 0 | 0 |
| FH 082_13 | 2,0% | 0,8 | 1 | 1:1 | 2,759 | 21,649 | 0 | 0,117 | 0 | 0 | 0 | 0 | 0 |
| TF 88/12 | 0,5% | 0,7 | 1 | 1:1 | 8,632 | 39,518 | 0 | 0,244 | 0 | 0 | 0 | 0 | 0 |
| TF 93/12 | 0,6% | 0,8 | 1 | 1:1 | 5,594 | 43,903 | 0 | 0,238 | 0 | 0 | 0 | 0 | 0 |
| TF 99/12 | 0,5% | 0,7 | 1 | 1:1 | 8,632 | 39,518 | 0 | 0,244 | 0 | 0 | 0 | 0 | 0 |
| TF 100/12 | 0,6% | 0,8 | 1 | 1:1 | 5,594 | 43,903 | 0 | 0,238 | 0 | 0 | 0 | 0 | 0 |
| TF 103/12 | 0,5% | 0,8 | 1 | 1:1 | 5,600 | 43,947 | 0 | 0,238 | 0 | 0 | 0 | 0 | 0 |
| TF 131/12 | 0,6% | 0,9 | 1 | 1:1 | 2,724 | 48,097 | 0 | 0,231 | 0 | 0 | 0 | 0 | 0 |
| TF 132/12 | 0,7% | 0,9 | 1 | 1:1 | 2,721 | 48,050 | 0 | 0,231 | 0 | 0 | 0 | 0 | 0 |
| TF 133/12 | 0,8% | 0,9 | 1 | 1:1 | 2,719 | 48,004 | 0 | 0,231 | 0 | 0 | 0 | 0 | 0 |
| TF 161/12 | 1,0% | 0,9 | 1 | 1:1 | 2,713 | 47,911 | 0 | 0,231 | 0 | 0 | 0 | 0 | 0 |
| TF 162/12 | 1,2% | 0,9 | 1 | 1:1 | 2,708 | 47,818 | 0 | 0,230 | 0 | 0 | 0 | 0 | 0 |

FIG 39i

| Li$_3$N | Mn$_2$O$_3$ | CuO | Zn$_3$N$_2$ | La$_2$O$_3$ | Si$_3$N$_4$ | Graphite | AlN | Eu$_2$O$_3$ | EuN | CeO$_2$ | SiO$_2$ | Total | CIE x | CIE y |
|---|---|---|---|---|---|---|---|---|---|---|---|---|---|---|
| | | | | | | | | | | | | | Optical characterization | |
| | | | | | Weights/g | | | | | | | | | |
| 0 | 0 | 0 | 0 | 0 | 13,157 | 0 | 11,531 | 0,594 | 0 | 0 | 0 | 50 | 0,641 | 0,357 |
| 0 | 0 | 0 | 0 | 0 | 12,814 | 0 | 11,230 | 0,579 | 0 | 0 | 0 | 50 | 0,633 | 0,366 |
| 0 | 0 | 0 | 0 | 0 | 12,898 | 0 | 11,304 | 0,582 | 0 | 0 | 0 | 50 | 0,636 | 0,362 |
| 0 | 0 | 0 | 0 | 0 | 12,983 | 0 | 11,378 | 0,586 | 0 | 0 | 0 | 50 | 0,640 | 0,358 |
| 0 | 0 | 0 | 0 | 0 | 13,069 | 0 | 11,454 | 0,590 | 0 | 0 | 0 | 50 | 0,642 | 0,356 |
| 0 | 0 | 0 | 0 | 0 | 12,731 | 0 | 11,158 | 0,575 | 0 | 0 | 0 | 50 | 0,628 | 0,370 |
| 0 | 0 | 0 | 0 | 0 | 12,649 | 0 | 11,086 | 0,571 | 0 | 0 | 0 | 50 | 0,626 | 0,372 |
| 0 | 0 | 0 | 0 | 0 | 13,118 | 0 | 11,497 | 0,740 | 0 | 0 | 0 | 50 | 0,645 | 0,353 |
| 0 | 0 | 0 | 0 | 0 | 13,053 | 0 | 11,440 | 0,982 | 0 | 0 | 0 | 50 | 0,654 | 0,345 |
| 0 | 0 | 0 | 0 | 0 | 27,227 | 0 | 23,866 | 0,512 | 0 | 0 | 0 | 100 | 0,635 | 0,364 |
| 0 | 0 | 0 | 0 | 0 | 26,468 | 0 | 23,200 | 0,598 | 0 | 0 | 0 | 100 | 0,638 | 0,361 |
| 0 | 0 | 0 | 0 | 0 | 27,227 | 0 | 23,866 | 0,512 | 0 | 0 | 0 | 100 | 0,632 | 0,366 |
| 0 | 0 | 0 | 0 | 0 | 26,468 | 0 | 23,223 | 0,598 | 0 | 0 | 0 | 100 | 0,628 | 0,371 |
| 0 | 0 | 0 | 0 | 0 | 26,494 | 0 | 22,592 | 0,499 | 0 | 0 | 0 | 100 | 0,624 | 0,375 |
| 0 | 0 | 0 | 0 | 0 | 25,774 | 0 | 22,570 | 0,582 | 0 | 0 | 0 | 100 | 0,622 | 0,377 |
| 0 | 0 | 0 | 0 | 0 | 25,749 | 0 | 22,548 | 0,678 | 0 | 0 | 0 | 100 | 0,624 | 0,375 |
| 0 | 0 | 0 | 0 | 0 | 25,724 | 0 | 22,505 | 0,774 | 0 | 0 | 0 | 100 | 0,626 | 0,372 |
| 0 | 0 | 0 | 0 | 0 | 25,674 | 0 | 22,461 | 0,966 | 0 | 0 | 0 | 100 | 0,635 | 0,364 |
| 0 | 0 | 0 | 0 | 0 | 25,625 | 0 | 22,461 | 1,157 | 0 | 0 | 0 | 100 | 0,637 | 0,362 |

FIG 39j

| Experiment | Composition $Ca_{1-x}Sr_xAlSiN_3$:yEu or $Sr(Sr_aCa_{1-a})Si_2Al_2N_6$:yEu (a=2x-1)  | | AEM Content | Si:Al ratio | Weights/g | | | | | | | | |
|---|---|---|---|---|---|---|---|---|---|---|---|---|---|
| | y | x | | | $Ca_3N_2$ | $Sr_3N_2$ | $BaN_x$ | $AlF_3$ | $SrF_2$ | $BaF_2$ | $Li_2B_4O_7$ | $LiBF_4$ | $LiF$ |
| TF 163/12 | 0,6% | 0,85 | 1 | 1:1 | 4,140 | 46,028 | 0 | 0,235 | 0 | 0 | 0 | 0 | 0 |
| TF 168/12 | 0,9% | 0,9 | 1 | 1:1 | 2,716 | 47,957 | 0 | 0,231 | 0 | 0 | 0 | 0 | 0 |
| TF 169/12 | 1,2% | 0,95 | 1 | 1:1 | 1,337 | 49,826 | 0 | 0,227 | 0 | 0 | 0 | 0 | 0 |
| FH 086_13 | 1,2% | 0,9 | 1 | 1:1 | 4,062 | 71,725 | 0 | 0,345 | 0 | 0 | 0 | 0 | 0 |
| FH 095_13 | 1,2% | 0,9 | 1 | 1:1 | 1,311 | 23,146 | 0 | 0,111 | 0 | 0 | 0 | 0 | 0 |
| FH 096_13 | 1,2% | 0,9 | 1 | 1:1 | 1,354 | 23,908 | 0 | 0,115 | 0 | 0 | 0 | 0 | 0 |
| FH 097_13 | 1,2% | 0,9 | 1 | 1:1 | 1,354 | 23,908 | 0 | 0,115 | 0 | 0 | 0 | 0 | 0 |
| FH 098_13 | 1,2% | 0,9 | 1 | 1:1 | 1,354 | 23,908 | 0 | 0,115 | 0 | 0 | 0 | 0 | 0 |
| FH 099_13 | 1,2% | 0,9 | 1 | 1:1 | 1,325 | 23,391 | 0 | 0 | 0 | 0 | 0,567 | 0,628 | 0 |
| FH 100_13 | 1,2% | 0,9 | 1 | 1:1 | 1,354 | 29,905 | 0 | 0 | 0 | 0 | 0,058 | 0,064 | 0 |
| FH 101_13 | 1,2% | 0,9 | 1 | 1:1 | 1,354 | 23,902 | 0 | 0 | 0 | 0 | 0 | 0,128 | 0 |
| FH 102_13 | 1,2% | 0,9 | 1 | 1:1 | 1,354 | 23,908 | 0 | 0 | 0 | 0 | 0,116 | 0 | 0 |
| FH 105_13 | 1,2% | 0,9 | 1 | 1:1 | 4,061 | 71,706 | 0 | 0 | 0 | 0 | 0 | 0,385 | 0 |
| Thi 800_13 | 1,2% | 0,99 | 1,1 | 1:1 | 1,417 | 25,028 | 0 | 0 | 0 | 0 | 0 | 0,122 | 0 |
| Thi 801_13 | 1,2% | 0,9 | 1 | 1:1 | 1,354 | 23,902 | 0 | 0 | 0 | 0 | 0 | 0,128 | 0 |
| Thi 802_13 | 1,2% | 0,9 | 1 | 1:1:0,9 | 1,349 | 23,826 | 0 | 0 | 0 | 0 | 0 | 0,128 | 0 |
| Thi 803_13 | 1,2% | 0,81 | 0,9 | 0,9:1,1 | 1,287 | 22,732 | 0 | 0 | 0 | 0 | 0 | 0,136 | 0 |
| Thi 804_13 | 1,2% | 0,945 | 1,05 | 0,9:1,1 | 1,391 | 24,555 | 0 | 0 | 0 | 0 | 0 | 0,126 | 0 |
| Thi 805_13 | 1,2% | 0,855 | 0,95 | 0,95:1,05 | 1,321 | 23,333 | 0 | 0 | 0 | 0 | 0 | 0,132 | 0 |

FIG 39k

Weights/g

| Li₃N | Mn₂O₃ | CuO | Zn₃N₂ | La₂O₃ | Si₃N₄ | Graphite | AlN | Eu₂O₃ | EuN | CeO₂ | SiO₂ | Total | CIE x | CIE y |
|---|---|---|---|---|---|---|---|---|---|---|---|---|---|---|
| 0 | 0 | 0 | 0 | 0 | 26,116 | 0 | 22,892 | 0,590 | 0 | 0 | 0 | 100 | 0,624 | 0,374 |
| 0 | 0 | 0 | 0 | 0 | 25,699 | 0 | 22,527 | 0,870 | 0 | 0 | 0 | 100 | 0,629 | 0,370 |
| 0 | 0 | 0 | 0 | 0 | 25,295 | 0 | 22,173 | 1,142 | 0 | 0 | 0 | 100 | 0,631 | 0,368 |
| 0 | 0 | 0 | 0 | 0 | 38,442 | 0 | 33,691 | 1,736 | 0 | 0 | 0 | 150 | 0,634 | 0,364 |
| 0 | 0 | 0 | 0 | 0 | 12,406 | 0 | 10,872 | 0,560 | 0 | 0 | 1,593 | 50 | 0,635 | 0,363 |
| 0 | 0 | 0 | 0 | 0 | 12,814 | 0 | 11,230 | 0,579 | 0 | 0 | 0 | 50 | 0,637 | 0,361 |
| 0 | 0 | 0 | 0 | 0 | 12,814 | 0 | 11,230 | 0,579 | 0 | 0 | 0 | 50 | 0,635 | 0,363 |
| 0 | 0 | 0 | 0 | 0 | 12,814 | 0 | 11,230 | 0,579 | 0 | 0 | 0 | 50 | 0,639 | 0,359 |
| 0 | 0 | 0 | 0 | 0 | 12,537 | 0 | 10,987 | 0,566 | 0 | 0 | 0 | 50 | 0,638 | 0,359 |
| 0 | 0 | 0 | 0 | 0 | 12,812 | 0 | 11,229 | 0,578 | 0 | 0 | 0 | 50 | 0,637 | 0,362 |
| 0 | 0 | 0 | 0 | 0 | 12,810 | 0 | 11,227 | 0,578 | 0 | 0 | 0 | 50 | 0,636 | 0,362 |
| 0 | 0 | 0 | 0 | 0 | 12,814 | 0 | 11,230 | 0,579 | 0 | 0 | 0 | 50 | 0,634 | 0,364 |
| 0 | 0 | 0 | 0 | 0 | 38,431 | 0 | 33,682 | 1,735 | 0 | 0 | 0 | 150 | 0,636 | 0,363 |
| 0 | 0 | 0 | 0 | 0 | 12,194 | 0 | 10,687 | 0,551 | 0 | 0 | 0 | 50 | 0,634 | 0,365 |
| 0 | 0 | 0 | 0 | 0 | 12,810 | 0 | 11,227 | 0,578 | 0 | 0 | 0 | 50 | 0,637 | 0,362 |
| 0 | 0 | 0 | 0 | 0 | 14,047 | 0 | 10,073 | 0,577 | 0 | 0 | 0 | 50 | 0,639 | 0,360 |
| 0 | 0 | 0 | 0 | 0 | 12,183 | 0 | 13,051 | 0,611 | 0 | 0 | 0 | 50 | 0,636 | 0,362 |
| 0 | 0 | 0 | 0 | 0 | 11,280 | 0 | 12,083 | 0,566 | 0 | 0 | 0 | 50 | 0,633 | 0,365 |
| 0 | 0 | 0 | 0 | 0 | 12,506 | 0 | 12,114 | 0,594 | 0 | 0 | 0 | 50 | 0,637 | 0,361 |

FIG 39I

| Experiment | Composition $Ca_{1-x}Sr_xAlSiN_3:yEu$ or $Sr(Sr_aCa_{1-a})Si_2Al_2N_6:yEu$ (a=2x-1) | | AEM Content | Si:Al ratio | Weights/g | | | | | | | | |
|---|---|---|---|---|---|---|---|---|---|---|---|---|---|
| | y | x | | | $Ca_3N_2$ | $Sr_3N_2$ | $BaN_x$ | $AlF_3$ | $SrF_2$ | $BaF_2$ | $Li_2B_4O_7$ | $LiBF_4$ | LiF |
| Thi 806_13 | 1,2% | 0,945 | 1,05 | 1,05:0,95 | 1,384 | 24,411 | 0 | 0 | 0 | 0 | 0 | 0,125 | 0 |
| Thi 807_13 | 1,2% | 0,81 | 0,9 | 1,1:0,9 | 1,279 | 22,581 | 0 | 0 | 0 | 0 | 0 | 0,135 | 0 |
| TF 808_13 | 1,2% | 0,855 | 0,95 | 1:1 | 1,319 | 23,295 | 0 | 0 | 0 | 0 | 0 | 0,132 | 0 |
| TF 809_13 | 1,2% | 0,99 | 1,1 | 0,9:1,1 | 1,422 | 25,104 | 0 | 0 | 0 | 0 | 0 | 0,123 | 0 |
| TF 810_13 | 1,2% | 0,99 | 1,1 | 1,1:0,9 | 1,413 | 24,953 | 0 | 0 | 0 | 0 | 0 | 0,122 | 0 |
| TF 811_13 | 1,2% | 0,855 | 0,95 | 1,05:0,95 | 1,317 | 23,257 | 0 | 0 | 0 | 0 | 0 | 0,132 | 0 |
| TF 812_13 | 1,2% | 0,99 | 1,1 | 0,95:1,05 | 1,420 | 25,066 | 0 | 0 | 0 | 0 | 0 | 0,122 | 0 |
| TF 813_13 | 1,2% | 0,99 | 1,1 | 1,05:0,95 | 1,415 | 24,990 | 0 | 0 | 0 | 0 | 0 | 0,122 | 0 |
| TF 814_13 | 1,2% | 0,9 | 1,0 | 0,9:1,1 | 1,358 | 23,978 | 0 | 0 | 0 | 0 | 0 | 0,129 | 0 |
| TF 815_13 | 1,2% | 0,945 | 1,1 | 0,95:1,05 | 1,388 | 24,517 | 0 | 0 | 0 | 0 | 0 | 0,125 | 0 |
| Thi 816_13 | 1,2% | 0,81 | 0,9 | 0,95:1,05 | 1,285 | 22,694 | 0 | 0 | 0 | 0 | 0 | 0,135 | 0 |
| Thi 817_13 | 1,2% | 0,945 | 1,1 | 1:1 | 1,386 | 24,479 | 0 | 0 | 0 | 0 | 0 | 0,125 | 0 |
| Thi 818_13 | 1,2% | 0,81 | 0,9 | 1,05:0,95 | 1,281 | 22,618 | 0 | 0 | 0 | 0 | 0 | 0,135 | 0 |
| Thi 819_13 | 1,2% | 0,855 | 1,0 | 0,9:1,1 | 1,324 | 23,371 | 0 | 0 | 0 | 0 | 0 | 0,132 | 0 |
| Thi 820_13 | 1,2% | 0,945 | 1,1 | 1,1:0,9 | 1,382 | 24,403 | 0 | 0 | 0 | 0 | 0 | 0,125 | 0 |
| Thi 821_13 | 1,2% | 0,81 | 0,9 | 1:1 | 1,283 | 22,656 | 0 | 0 | 0 | 0 | 0 | 0,135 | 0 |
| Thi 822_13 | 1,2% | 0,9 | 1,0 | 0,95:1,05 | 1,356 | 23,940 | 0 | 0 | 0 | 0 | 0 | 0,129 | 0 |
| Thi 823_13 | 1,2% | 0,855 | 1,0 | 1,1:0,9 | 1,315 | 23,220 | 0 | 0 | 0 | 0 | 0 | 0,131 | 0 |
| Thi 824_13 | 1,2% | 0,9 | 1,0 | 1,05:0,95 | 1,351 | 23,864 | 0 | 0 | 0 | 0 | 0 | 0,128 | 0 |

FIG 39m

| Li₃N | Mn₂O₃ | CuO | Zn₃N₂ | La₂O₃ | Si₃N₄ | Graphite | AlN | Eu₂O₃ | EuN | CeO₂ | SiO₂ | Total | CIE x | CIE y |
|---|---|---|---|---|---|---|---|---|---|---|---|---|---|---|
| | | | | | | Weights/g | | | | | | | Optical characterization | |
| 0 | 0 | 0 | 0 | 0 | 13,099 | 0 | 10,387 | 0,563 | 0 | 0 | 0 | 50 | 0,640 | 0,359 |
| 0 | 0 | 0 | 0 | 0 | 14,792 | 0 | 10,601 | 0,607 | 0 | 0 | 0 | 50 | 0,640 | 0,358 |
| 0 | 0 | 0 | 0 | 0 | 13,142 | 0 | 11,518 | 0,593 | 0 | 0 | 0 | 50 | 0,637 | 0,362 |
| 0 | 0 | 0 | 0 | 0 | 11,008 | 0 | 11,792 | 0,552 | 0 | 0 | 0 | 50 | 0,637 | 0,361 |
| 0 | 0 | 0 | 0 | 0 | 13,374 | 0 | 9,590 | 0,549 | 0 | 0 | 0 | 50 | 0,637 | 0,362 |
| 0 | 0 | 0 | 0 | 0 | 13,777 | 0 | 10,925 | 0,592 | 0 | 0 | 0 | 50 | 0,637 | 0,361 |
| 0 | 0 | 0 | 0 | 0 | 11,602 | 0 | 11,239 | 0,551 | 0 | 0 | 0 | 50 | 0,635 | 0,364 |
| 0 | 0 | 0 | 0 | 0 | 12,785 | 0 | 10,138 | 0,550 | 0 | 0 | 0 | 50 | 0,636 | 0,363 |
| 0 | 0 | 0 | 0 | 0 | 11,566 | 0 | 12,389 | 0,580 | 0 | 0 | 0 | 50 | 0,637 | 0,361 |
| 0 | 0 | 0 | 0 | 0 | 11,888 | 0 | 11,516 | 0,565 | 0 | 0 | 0 | 50 | 0,634 | 0,364 |
| 0 | 0 | 0 | 0 | 0 | 12,839 | 0 | 12,437 | 0,610 | 0 | 0 | 0 | 50 | 0,636 | 0,362 |
| 0 | 0 | 0 | 0 | 0 | 12,495 | 0 | 10,951 | 0,564 | 0 | 0 | 0 | 50 | 0,634 | 0,364 |
| 0 | 0 | 0 | 0 | 0 | 14,143 | 0 | 11,215 | 0,608 | 0 | 0 | 0 | 50 | 0,640 | 0,358 |
| 0 | 0 | 0 | 0 | 0 | 11,867 | 0 | 12,711 | 0,595 | 0 | 0 | 0 | 50 | 0,635 | 0,364 |
| 0 | 0 | 0 | 0 | 0 | 13,702 | 0 | 9,825 | 0,562 | 0 | 0 | 0 | 50 | 0,642 | 0,356 |
| 0 | 0 | 0 | 0 | 0 | 13,492 | 0 | 11,825 | 0,609 | 0 | 0 | 0 | 50 | 0,638 | 0,360 |
| 0 | 0 | 0 | 0 | 0 | 12,189 | 0 | 11,807 | 0,579 | 0 | 0 | 0 | 50 | 0,634 | 0,364 |
| 0 | 0 | 0 | 0 | 0 | 14,410 | 0 | 10,333 | 0,591 | 0 | 0 | 0 | 50 | 0,638 | 0,360 |
| 0 | 0 | 0 | 0 | 0 | 13,430 | 0 | 10,649 | 0,577 | 0 | 0 | 0 | 50 | 0,637 | 0,362 |

FIG 39n

| Experiment | Composition $Ca_{1-x}Sr_xAlSiN_3:yEu$ or $Sr(Sr_aCa_{1-a})Si_2Al_2N_6:yEu$ (a=2x-1) | | AEM Content | Si:Al ratio | Weights/g | | | | | | | | |
|---|---|---|---|---|---|---|---|---|---|---|---|---|---|
| | y | x | | | $Ca_3N_2$ | $Sr_3N_2$ | $BaN_x$ | $AlF_3$ | $SrF_2$ | $BaF_2$ | $Li_2B_4O_7$ | $LiBF_4$ | LiF |
| Thi 825_13 | 1,2% | 0,855 | 1,0 | 0,95:1,05 | 1,321 | 23,333 | 0 | 0 | 0 | 0 | 0 | 0,132 | 0 |
| TF 826_13 | 1,2% | 0,945 | 1,1 | 1,05:0,95 | 1,384 | 24,441 | 0 | 0 | 0 | 0 | 0 | 0,125 | 0 |
| TF 827_13 | 1,2% | 0,81 | 0,9 | 1,1:0,9 | 1,279 | 22,581 | 0 | 0 | 0 | 0 | 0 | 0,135 | 0 |
| Thi 828_13 | 1,2% | 0,9 | 1,0 | 1:1 | 1,354 | 23,902 | 0 | 0 | 0 | 0 | 0 | 0,128 | 0 |
| Thi 829_13 | 1,5% | 0,9 | 1,0 | 1:1 | 1,350 | 23,833 | 0 | 0 | 0 | 0 | 0 | 0,128 | 0 |
| Thi 830_13 | 1,7% | 0,9 | 1,0 | 1:1 | 1,347 | 23,787 | 0 | 0 | 0 | 0 | 0 | 0,128 | 0 |
| Thi 831_13 | 2,0% | 0,9 | 1,0 | 1:1 | 1,343 | 23,720 | 0 | 0 | 0 | 0 | 0 | 0,127 | 0 |
| TF 832_13 | 1,2% | 0,855 | 1,0 | 0,95:1,05 | 3,964 | 69,999 | 0 | 0 | 0 | 0 | 0 | 0,396 | 0 |
| TF 833_13 | 1,2% | 0,81 | 0,9 | 0,95:1,05 | 3,856 | 68,082 | 0 | 0 | 0 | 0 | 0 | 0,406 | 0 |
| TF 834_13 | 1,2% | 0,855 | 1,0 | 0,95:1,05 | 3,964 | 69,999 | 0 | 0 | 0 | 0 | 0 | 0,396 | 0 |
| TF 835_13 | 1,2% | 0,81 | 0,9 | 0,95:1,05 | 3,856 | 68,082 | 0 | 0 | 0 | 0 | 0 | 0,406 | 0 |
| TF 836_13 | 1,2% | 0,855 | 1,0 | 0,9:1,1 | 3,971 | 70,113 | 0 | 0 | 0 | 0 | 0 | 0,396 | 0 |
| TF 837_13 | 1,2% | 0,9 | 1,0 | 1:1 | 4,061 | 71,706 | 0 | 0 | 0 | 0 | 0 | 0,385 | 0 |
| Thi 838_13 | 2,2% | 0,9 | 1,0 | 1:1 | 1,341 | 23,674 | 0 | 0 | 0 | 0 | 0 | 0,127 | 0 |
| Thi 839_13 | 2,5% | 0,9 | 1,0 | 1:1 | 1,337 | 23,606 | 0 | 0 | 0 | 0 | 0 | 0,127 | 0 |
| Thi 840_13 | 2,7% | 0,9 | 1,0 | 1:1 | 1,334 | 23,561 | 0 | 0 | 0 | 0 | 0 | 0,127 | 0 |
| Thi 841_13 | 3,0% | 0,9 | 1,0 | 1:1 | 1,331 | 23,494 | 0 | 0 | 0 | 0 | 0 | 0,126 | 0 |
| Thi 842_13 | 1,2% | 0,9 | 1,0 | 0,95:1,05 | 1,356 | 23,940 | 0 | 0 | 0 | 0 | 0 | 0,129 | 0 |
| Thi 843_13 | 1,7% | 0,9 | 1,0 | 0,95:1,05 | 1,349 | 23,825 | 0 | 0 | 0 | 0 | 0 | 0,128 | 0 |

FIG 39o

| Li₃N | Mn₂O₃ | CuO | Zn₃N₂ | La₂O₃ | Si₃N₄ | Graphite | AlN | Eu₂O₃ | EuN | CeO₂ | SiO₂ | Total | CIE x | CIE y |
|---|---|---|---|---|---|---|---|---|---|---|---|---|---|---|
| 0 | 0 | 0 | 0 | 0 | 12,506 | 0 | 12,114 | 0,594 | 0 | 0 | 0 | 50 | 0,635 | 0,363 |
| 0 | 0 | 0 | 0 | 0 | 13,099 | 0 | 10,387 | 0,563 | 0 | 0 | 0 | 50 | 0,635 | 0,363 |
| 0 | 0 | 0 | 0 | 0 | 14,792 | 0 | 10,607 | 0,607 | 0 | 0 | 0 | 50 | 0,638 | 0,360 |
| 0 | 0 | 0 | 0 | 0 | 12,810 | 0 | 11,227 | 0,578 | 0 | 0 | 0 | 50 | 0,638 | 0,361 |
| 0 | 0 | 0 | 0 | 0 | 12,774 | 0 | 11,195 | 0,721 | 0 | 0 | 0 | 50 | 0,641 | 0,357 |
| 0 | 0 | 0 | 0 | 0 | 12,749 | 0 | 11,173 | 0,815 | 0 | 0 | 0 | 50 | 0,642 | 0,356 |
| 0 | 0 | 0 | 0 | 0 | 12,712 | 0 | 11,141 | 0,957 | 0 | 0 | 0 | 50 | 0,648 | 0,351 |
| 0 | 0 | 0 | 0 | 0 | 37,517 | 0 | 36,341 | 1,783 | 0 | 0 | 0 | 150 | -- | -- |
| 0 | 0 | 0 | 0 | 0 | 38,516 | 0 | 37,310 | 1,830 | 0 | 0 | 0 | 150 | 0,640 | 0,359 |
| 0 | 0 | 0 | 0 | 0 | 37,517 | 0 | 36,341 | 1,783 | 0 | 0 | 0 | 150 | 0,635 | 0,363 |
| 0 | 0 | 0 | 0 | 0 | 38,516 | 0 | 37,310 | 1,830 | 0 | 0 | 0 | 150 | 0,636 | 0,362 |
| 0 | 0 | 0 | 0 | 0 | 35,600 | 0 | 38,134 | 1,786 | 0 | 0 | 0 | 150 | 0,634 | 0,364 |
| 0 | 0 | 0 | 0 | 0 | 38,431 | 0 | 33,682 | 1,735 | 0 | 0 | 0 | 150 | 0,636 | 0,363 |
| 0 | 0 | 0 | 0 | 0 | 12,688 | 0 | 11,120 | 1,050 | 0 | 0 | 0 | 50 | 0,652 | 0,347 |
| 0 | 0 | 0 | 0 | 0 | 12,652 | 0 | 11,088 | 1,190 | 0 | 0 | 0 | 50 | 0,653 | 0,346 |
| 0 | 0 | 0 | 0 | 0 | 12,628 | 0 | 11,067 | 1,283 | 0 | 0 | 0 | 50 | 0,651 | 0,348 |
| 0 | 0 | 0 | 0 | 0 | 12,592 | 0 | 11,036 | 1,421 | 0 | 0 | 0 | 50 | 0,653 | 0,346 |
| 0 | 0 | 0 | 0 | 0 | 12,189 | 0 | 11,807 | 0,579 | 0 | 0 | 0 | 50 | 0,633 | 0,365 |
| 0 | 0 | 0 | 0 | 0 | 12,131 | 0 | 11,751 | 0,817 | 0 | 0 | 0 | 50 | 0,642 | 0,357 |

FIG 39p

| Experiment | Composition $Ca_{1-x}Sr_xAlSiN_3:yEu$ or $Sr(Sr_aCa_{1-a})Si_2Al_2N_6:yEu$ ($a=2x-1$) | | AEM Content | Si:Al ratio | Weights/g | | | | | | | | |
|---|---|---|---|---|---|---|---|---|---|---|---|---|---|
| | y | x | | | $Ca_3N_2$ | $Sr_3N_2$ | $BaN_x$ | $AlF_3$ | $SrF_2$ | $BaF_2$ | $Li_2B_4O_7$ | $LiBF_4$ | $LiF$ |
| Thi 844_13 | 2,2% | 0,9 | 1,0 | 0,95:1,05 | 1,343 | 23,711 | 0 | 0 | 0 | 0 | 0 | 0,127 | 0 |
| Thi 845_13 | 2,7% | 0,9 | 1,0 | 0,95:1,05 | 1,336 | 23,598 | 0 | 0 | 0 | 0 | 0 | 0,127 | 0 |
| TF 846_13 | 2,0% | 0,92 | 1,0 | 1:1 | 1,069 | 24,121 | 0 | 0 | 0 | 0 | 0 | 0,127 | 0 |
| TF 847_13 | 2,0% | 0,94 | 1,0 | 1:1 | 0,798 | 24,520 | 0 | 0 | 0 | 0 | 0 | 0,126 | 0 |
| TF 848_13 | 2,0% | 0,96 | 1,0 | 1:1 | 0,529 | 24,914 | 0 | 0 | 0 | 0 | 0 | 0,125 | 0 |
| TF 849_13 | 2,0% | 0,98 | 1,0 | 1:1 | 0,263 | 25,304 | 0 | 0 | 0 | 0 | 0 | 0,125 | 0 |
| TF 850_14 | 3,0% | 0,91 | 1,0 | 1:1 | 1,194 | 23,695 | 0 | 0 | 0 | 0 | 0 | 0,126 | 0 |
| TF 851_14 | 3,0% | 0,92 | 1,0 | 1:1 | 1,059 | 23,894 | 0 | 0 | 0 | 0 | 0 | 0,126 | 0 |
| TF 852_14 | 3,0% | 0,93 | 1,0 | 1:1 | 0,924 | 24,092 | 0 | 0 | 0 | 0 | 0 | 0,125 | 0 |
| TF 853_14 | 3,0% | 0,94 | 1,0 | 1:1 | 0,790 | 24,290 | 0 | 0 | 0 | 0 | 0 | 0,125 | 0 |
| Thi 854_14 | 3,2% | 0,9 | 1,0 | 1:1 | 1,328 | 23,450 | 0 | 0 | 0 | 0 | 0 | 0,126 | 0 |
| Thi 855_14 | 3,5% | 0,9 | 1,0 | 1:1 | 1,324 | 23,383 | 0 | 0 | 0 | 0 | 0 | 0,126 | 0 |
| Thi 856_14 | 3,7% | 0,9 | 1,0 | 1:1 | 1,322 | 23,339 | 0 | 0 | 0 | 0 | 0 | 0,125 | 0 |
| Thi 857_14 | 4,0% | 0,9 | 1,0 | 1:1 | 1,318 | 23,274 | 0 | 0 | 0 | 0 | 0 | 0,125 | 0 |
| TF 858_14 | 3,0% | 0,91 | 1,0 | 1:1 | 1,194 | 23,695 | 0 | 0 | 0 | 0 | 0 | 0,126 | 0 |
| TF 859_14 | 3,0% | 0,92 | 1,0 | 1:1 | 1,059 | 23,894 | 0 | 0 | 0 | 0 | 0 | 0,126 | 0 |
| TF 860_14 | 3,0% | 0,93 | 1,0 | 1:1 | 0,924 | 24,092 | 0 | 0 | 0 | 0 | 0 | 0,125 | 0 |
| TF 861_14 | 3,0% | 0,94 | 1,0 | 1:1 | 0,790 | 24,290 | 0 | 0 | 0 | 0 | 0 | 0,125 | 0 |
| Thi 862_14 | 1,2% | 0,9 | 1,0 | 1:1 | 1,212 | 23,772 | 0,407 | 0 | 0 | 0 | 0 | 0,128 | 0 |

FIG 39q

| | Weights/g | | | | | | | | | | | | | Optical characterization | |
|---|---|---|---|---|---|---|---|---|---|---|---|---|---|---|---|
| Li₃N | Mn₂O₃ | CuO | Zn₃N₂ | La₂O₃ | Si₃N₄ | Graphite | AlN | Eu₂O₃ | EuN | CeO₂ | SiO₂ | Total | CIE x | CIE y |
| 0 | 0 | 0 | 0 | 0 | 12,073 | 0 | 11,694 | 1,052 | 0 | 0 | 0 | 50 | 0,648 | 0,351 |
| 0 | 0 | 0 | 0 | 0 | 12,015 | 0 | 11,639 | 1,285 | 0 | 0 | 0 | 50 | 0,652 | 0,347 |
| 0 | 0 | 0 | 0 | 0 | 12,647 | 0 | 11,084 | 0,952 | 0 | 0 | 0 | 50 | 0,643 | 0,356 |
| 0 | 0 | 0 | 0 | 0 | 12,582 | 0 | 11,027 | 0,947 | 0 | 0 | 0 | 50 | 0,644 | 0,355 |
| 0 | 0 | 0 | 0 | 0 | 12,518 | 0 | 10,971 | 0,942 | 0 | 0 | 0 | 50 | 0,638 | 0,360 |
| 0 | 0 | 0 | 0 | 0 | 12,455 | 0 | 10,916 | 0,937 | 0 | 0 | 0 | 50 | 0,613 | 0,369 |
| 0 | 0 | 0 | 0 | 0 | 12,560 | 0 | 11,008 | 1,418 | 0 | 0 | 0 | 50 | 0,653 | 0,346 |
| 0 | 0 | 0 | 0 | 0 | 12,528 | 0 | 10,980 | 1,414 | 0 | 0 | 0 | 50 | 0,652 | 0,347 |
| 0 | 0 | 0 | 0 | 0 | 12,486 | 0 | 10,952 | 1,410 | 0 | 0 | 0 | 50 | 0,653 | 0,345 |
| 0 | 0 | 0 | 0 | 0 | 12,464 | 0 | 10,924 | 1,407 | 0 | 0 | 0 | 50 | 0,654 | 0,345 |
| 0 | 0 | 0 | 0 | 0 | 12,568 | 0 | 11,015 | 1,153 | 0 | 0 | 0 | 50 | 0,656 | 0,343 |
| 0 | 0 | 0 | 0 | 0 | 12,533 | 0 | 10,984 | 1,650 | 0 | 0 | 0 | 50 | 0,658 | 0,341 |
| 0 | 0 | 0 | 0 | 0 | 12,509 | 0 | 10,963 | 1,741 | 0 | 0 | 0 | 50 | 0,659 | 0,340 |
| 0 | 0 | 0 | 0 | 0 | 12,474 | 0 | 10,932 | 1,877 | 0 | 0 | 0 | 50 | 0,660 | 0,339 |
| 0 | 0 | 0 | 0 | 0 | 12,560 | 0 | 11,008 | 1,418 | 0 | 0 | 0 | 50 | 0,658 | 0,341 |
| 0 | 0 | 0 | 0 | 0 | 12,528 | 0 | 10,980 | 1,414 | 0 | 0 | 0 | 50 | 0,652 | 0,347 |
| 0 | 0 | 0 | 0 | 0 | 12,496 | 0 | 10,952 | 1,410 | 0 | 0 | 0 | 50 | 0,652 | 0,347 |
| 0 | 0 | 0 | 0 | 0 | 12,464 | 0 | 10,924 | 1,407 | 0 | 0 | 0 | 50 | 0,650 | 0,349 |
| 0 | 0 | 0 | 0 | 0 | 12,741 | 0 | 11,166 | 0,575 | 0 | 0 | 0 | 50 | 0,634 | 0,365 |

FIG 39r

| Experiment | Composition Ca$_{1-x}$Sr$_x$AlSiN$_3$:yEu or Sr(Sr$_a$Ca$_{1-a}$)Si$_2$Al$_2$N$_6$:yEu (a=2x-1) | | AEM Content | Si:Al ratio | Weights/g | | | | | | | | |
|---|---|---|---|---|---|---|---|---|---|---|---|---|---|
| | y | x | | | Ca$_3$N$_2$ | Sr$_3$N$_2$ | BaNx | AlF$_3$ | SrF$_2$ | BaF$_2$ | Li$_2$B$_4$O$_7$ | LiBF$_4$ | LiF |
| Thi 863_14 | 1,2% | 0,9 | 1,0 | 1:1 | 0,932 | 23,515 | 1,208 | 0 | 0 | 0 | 0 | 0,126 | 0 |
| Thi 864_14 | 1,2% | 0,9 | 1,0 | 1:1 | 0,659 | 23,264 | 1,992 | 0 | 0 | 0 | 0 | 0,125 | 0 |
| Thi 865_14 | 1,2% | 0,9 | 1,0 | 1:1 | 1,354 | 23,902 | 0 | 0 | 0 | 0 | 0 | 0,128 | 0 |
| Thi 866_14 | 2,0% | 0,9 | 1,0 | 1:1 | 4,030 | 71,157 | 0 | 0 | 0 | 0 | 0 | 0,382 | 0 |
| Thi 867_14 | 2,0% | 0,92 | 1,0 | 1:1 | 3,207 | 72,364 | 0 | 0 | 0 | 0 | 0 | 0,38 | 0 |
| Thi 868_14 | 2,0% | 0,95 | 1,0 | 1:1 | 1,989 | 74,152 | 0 | 0 | 0 | 0 | 0 | 0,377 | 0 |
| TF 869_14 | 2,0% | 0,9 | 1,0 | 1:1 | 1,343 | 23,719 | 0 | 0 | 0 | 0 | 0 | 0,127 | 0 |
| TF 870_14 | 2,0% | 0,9 | 1,0 | 1:1 | 1,343 | 23,719 | 0 | 0 | 0 | 0 | 0 | 0,127 | 0 |
| TF 871_14 | 2,0% | 0,9 | 1,0 | 1:1 | 1,343 | 23,719 | 0 | 0 | 0 | 0 | 0 | 0,127 | 0 |
| TF 872_14 | 2,0% | 0,9 | 1,0 | 1:1 | 1,343 | 23,719 | 0 | 0 | 0 | 0 | 0 | 0,127 | 0 |
| TF 873_14 | 2,0% | 0,9 | 1,0 | 1:1 | 1,338 | 23,634 | 0 | 0 | 0 | 0 | 0 | 0,127 | 0 |
| TF 874_14 | 2,0% | 0,92 | 1,0 | 1:1 | 1,069 | 24,121 | 0 | 0 | 0 | 0 | 0 | 0,126 | 0 |
| TF 875_14 | 2,5% | 0,92 | 1,0 | 0,95:1,05 | 1,064 | 24,007 | 0 | 0 | 0 | 0 | 0 | 0,126 | 0 |
| TF 876_14 | 2,0% | 0,93 | 1,0 | 1:1 | 0,933 | 24,321 | 0 | 0 | 0 | 0 | 0 | 0,126 | 0 |
| Thi 877_14 | 2,0% | 0,92 | 1,0 | 1:1 | 3,207 | 72,364 | 0 | 0 | 0 | 0 | 0 | 0,38 | 0 |
| Thi 878_14 | 2,0% | 0,93 | 1,0 | 1:1 | 2,799 | 72,963 | 0 | 0 | 0 | 0 | 0 | 0,379 | 0 |
| Thi 879_14 | 2,0% | 0,9 | 1,0 | 1:1 | 4,036 | 71,269 | 0 | 0 | 0 | 0 | 0 | 0,383 | 0 |
| Thi 880_14 | 4,2% | 0,9 | 1,0 | 1:1 | 1,316 | 23,230 | 0 | 0 | 0 | 0 | 0 | 0,125 | 0 |
| Thi 881_14 | 4,5% | 0,9 | 1,0 | 1:1 | 1,312 | 23,165 | 0 | 0 | 0 | 0 | 0 | 0,124 | 0 |

FIG 39s

| | Weights/g | | | | | | | | | | | | Optical characterization | |
|---|---|---|---|---|---|---|---|---|---|---|---|---|---|---|
| Li₃N | Mn₂O₃ | CuO | Zn₃N₂ | La₂O₃ | Si₃N₄ | Graphite | AlN | Eu₂O₃ | EuN | CeO₂ | SiO₂ | Total | CIE x | CIE y |
| 0 | 0 | 0 | 0 | 0 | 12,603 | 0 | 11,046 | 0,569 | 0 | 0 | 0 | 50 | 0,637 | 0,361 |
| 0 | 0 | 0 | 0 | 0 | 12,469 | 0 | 10,928 | 0,563 | 0 | 0 | 0 | 50 | 0,627 | 0,368 |
| 0 | 0 | 0 | 0 | 0 | 12,810 | 0 | 11,227 | 0,578 | 0 | 0 | 0 | 50 | 0,636 | 0,363 |
| 0 | 0 | 0 | 0 | 0 | 38,137 | 0 | 33,424 | 2,870 | 0 | 0 | 0 | 150 | 0,645 | 0,353 |
| 0 | 0 | 0 | 0 | 0 | 37,941 | 0 | 33,252 | 2,855 | 0 | 0 | 0 | 150 | 0,645 | 0,354 |
| 0 | 0 | 0 | 0 | 0 | 37,651 | 0 | 32,998 | 2,833 | 0 | 0 | 0 | 150 | 0,642 | 0,357 |
| 0 | 0 | 0 | 0 | 0 | 12,712 | 0 | 11,141 | 0,957 | 0 | 0 | 0 | 50 | 0,645 | 0,353 |
| 0 | 0 | 0 | 0 | 0 | 12,712 | 0 | 11,141 | 0,957 | 0 | 0 | 0 | 50 | 0,645 | 0,353 |
| 0 | 0 | 0 | 0 | 0 | 12,712 | 0 | 11,414 | 0,957 | 0 | 0 | 0 | 50 | 0,646 | 0,352 |
| 0 | 0 | 0 | 0 | 0 | 12,712 | 0 | 11,414 | 1,132 | 0 | 0 | 0 | 50 | 0,646 | 0,353 |
| 0 | 0 | 0 | 0 | 0 | 12,667 | 0 | 11,102 | 0,952 | 0 | 0 | 0 | 50 | 0,647 | 0,351 |
| 0 | 0 | 0 | 0 | 0 | 12,647 | 0 | 11,084 | 1,184 | 0 | 0 | 0 | 50 | 0,643 | 0,356 |
| 0 | 0 | 0 | 0 | 0 | 12,587 | 0 | 11,032 | 0,949 | 0 | 0 | 0 | 50 | 0,647 | 0,352 |
| 0 | 0 | 0 | 0 | 0 | 12,615 | 0 | 11,056 | 2,855 | 0 | 0 | 0 | 50 | 0,641 | 0,357 |
| 0 | 0 | 0 | 0 | 0 | 37,941 | 0 | 33,252 | 2,848 | 0 | 0 | 0 | 150 | 0,644 | 0,354 |
| 0 | 0 | 0 | 0 | 0 | 37,844 | 0 | 33,167 | 2,874 | 0 | 0 | 0 | 150 | 0,643 | 0,356 |
| 0 | 0 | 0 | 0 | 0 | 36,287 | 0 | 35,151 | 1,967 | 0 | 0 | 0 | 150 | 0,646 | 0,353 |
| 0 | 0 | 0 | 0 | 0 | 12,450 | 0 | 10,915 | 2,102 | 0 | 0 | 0 | 50 | 0,661 | 0,338 |
| 0 | 0 | 0 | 0 | 0 | 12,415 | 0 | 10,881 | 2,102 | 0 | 0 | 0 | 50 | 0,662 | 0,337 |

FIG 39t

| Experiment | Composition $Ca_{1-x}Sr_xAlSiN_3:yEu$ or $Sr(Sr_aCa_{1-a})Si_2Al_2N_6:yEu$ (a = 2x-1) | | AEM Content | Si:Al ratio | Weights/g | | | | | | | | |
|---|---|---|---|---|---|---|---|---|---|---|---|---|---|
| | y | x | | | $Ca_3N_2$ | $Sr_3N_2$ | $BaN_x$ | $AlF_3$ | $SrF_2$ | $BaF_2$ | $Li_2B_4O_7$ | $LiBF_4$ | $LiF$ |
| Thi 882_14 | 4,7% | 0,9 | 1,0 | 1:1 | 1,309 | 23,122 | 0 | 0 | 0 | 0 | 0 | 0,124 | 0 |
| Thi 883_14 | 5,0% | 0,9 | 1,0 | 1:1 | 1,306 | 23,057 | 0 | 0 | 0 | 0 | 0 | 0,124 | 0 |
| Thi 884_14 | 2,5% | 0,93 | 1,0 | 1:1 | 2,786 | 72,618 | 0 | 0 | 0 | 0 | 0 | 0,377 | 0 |
| Thi 885_14 | 3,0% | 0,93 | 1,0 | 1:1 | 2,773 | 72,277 | 0 | 0 | 0 | 0 | 0 | 0,376 | 0 |
| Thi 886_14 | 2,0% | 0,94 | 1,0 | 1:1 | 2,393 | 73,559 | 0 | 0 | 0 | 0 | 0 | 0,378 | 0 |
| TF 887_14 | 0,8% | 0,93 | 1,0 | 1:1 | 0,944 | 24,601 | 0 | 0 | 0 | 0 | 0 | 0,128 | 0 |
| TF 888_14 | 0,4% | 0,93 | 1,0 | 1:1 | 0,916 | 23,868 | 0 | 0 | 0 | 0 | 0 | 0,124 | 0 |
| TF 889_14 | 2,0% | 0,9 | 1,0 | 1:1 | 1,202 | 23,591 | 0 | 0 | 0 | 0 | 0 | 0,127 | 0 |
| TF 890_41 | 0,0% | 0,9 | 1,0 | 1:1 | 1,357 | 23,950 | 0 | 0 | 0 | 0 | 0 | 0,129 | 0 |
| TF 891_14 | 2,0% | 0,94 | 1,0 | 1:1 | 0,928 | 24,455 | 0 | 0 | 0 | 0 | 0 | 0,126 | 0 |
| TF 892_14 | 2,0% | 0,95 | 1,0 | 1:1 | 0,923 | 24,587 | 0,404 | 0 | 0 | 0 | 0 | 0,125 | 0 |
| TF 893_14 | 2,0% | 0,97 | 1,0 | 1:1 | 0,914 | 24,847 | 0 | 0 | 0 | 0 | 0 | 0,124 | 0 |
| TF 894_14 | 0,8% | 0,93 | 1,0 | 1:1 | 0,944 | 24,601 | 0 | 0 | 0 | 0 | 0 | 0,128 | 0 |
| TF 895_14 | 1,2% | 0,93 | 1,0 | 1:1 | 0,940 | 24,507 | 0 | 0 | 0 | 0 | 0 | 0,127 | 0 |
| TF 896_14 | 2,5% | 0,93 | 1,0 | 1:1 | 0,929 | 24,206 | 0 | 0 | 0 | 0 | 0 | 0,126 | 0 |
| TF 897_14 | 2,5% | 0,93 | 1,0 | 1:1 | 0,920 | 23,980 | 0 | 0 | 0 | 0 | 0 | 0,125 | 0 |
| TF 898_14 | 2,5% | 0,93 | 1,0 | 1:1 | 2,789 | 72,618 | 0 | 0 | 0 | 0 | 0 | 0,377 | 0 |
| TF 899_14 | 2,5% | 0,93 | 1,0 | 1:1 | 2,786 | 72,618 | 0 | 0 | 0 | 0 | 0 | 0,377 | 0 |
| TF 900_14 | 2,5% | 0,93 | 1,0 | 1:1 | 2,786 | 72,618 | 0 | 0 | 0 | 0 | 0 | 0,377 | 0 |

FIG 39u

| | | | | | | Weights/g | | | | | | | | Optical characterization | |
|---|---|---|---|---|---|---|---|---|---|---|---|---|---|---|---|
| Li$_3$N | Mn$_2$O$_3$ | CuO | Zn$_3$N$_2$ | La$_2$O$_3$ | Si$_3$N$_4$ | Graphite | AlN | Eu$_2$O$_3$ | EuN | CeO$_2$ | SiO$_2$ | Total | CIE x | CIE y |
| 0 | 0 | 0 | 0 | 0 | 12,392 | 0 | 10,861 | 2,191 | 0 | 0 | 0 | 50 | 0,663 | 0,336 |
| 0 | 0 | 0 | 0 | 0 | 12,358 | 0 | 10,831 | 2,325 | 0 | 0 | 0 | 50 | 0,664 | 0,334 |
| 0 | 0 | 0 | 0 | 0 | 37,665 | 0 | 33,101 | 3,543 | 0 | 0 | 0 | 150 | 0,649 | 0,349 |
| 0 | 0 | 0 | 0 | 0 | 37,488 | 0 | 32,855 | 4,231 | 0 | 0 | 0 | 150 | 0,652 | 0,347 |
| 0 | 0 | 0 | 0 | 0 | 37,747 | 0 | 33,072 | 2,840 | 0 | 0 | 0 | 150 | 0,643 | 0,355 |
| 0 | 0 | 0 | 0 | 0 | 12,760 | 0 | 11,183 | 0,384 | 0 | 0 | 0 | 50 | 0,622 | 0,377 |
| 0 | 0 | 0 | 0 | 0 | 12,380 | 0 | 10,850 | 1,863 | 0 | 0 | 0 | 50 | 0,607 | 0,391 |
| 0 | 0 | 0 | 0 | 0 | 12,644 | 0 | 11,081 | 0,951 | 0 | 0 | 0 | 50 | 0,644 | 0,355 |
| 0 | 0 | 0 | 0 | 0 | 12,838 | 0 | 11,251 | 0,000 | 0 | 0,472 | 0 | 50 | 0,452 | 0,524 |
| 0 | 0 | 0 | 0 | 0 | 12,549 | 0 | 10,998 | 0,944 | 0 | 0 | 0 | 50 | 0,642 | 0,356 |
| 0 | 0 | 0 | 0 | 0 | 12,484 | 0 | 10,941 | 0,939 | 0 | 0 | 0 | 50 | 0,641 | 0,358 |
| 0 | 0 | 0 | 0 | 0 | 12,356 | 0 | 10,829 | 0,930 | 0 | 0 | 0 | 50 | 0,640 | 0,358 |
| 0 | 0 | 0 | 0 | 0 | 12,760 | 0 | 11,183 | 0,384 | 0 | 0 | 0 | 50 | 0,622 | 0,376 |
| 0 | 0 | 0 | 0 | 0 | 12,711 | 0 | 11,140 | 0,574 | 0 | 0 | 0 | 50 | 0,631 | 0,367 |
| 0 | 0 | 0 | 0 | 0 | 12,555 | 0 | 11,003 | 1,181 | 0 | 0 | 0 | 50 | 0,648 | 0,351 |
| 0 | 0 | 0 | 0 | 0 | 12,428 | 0 | 10,900 | 1,638 | 0 | 0 | 0 | 50 | 0,654 | 0,344 |
| 0 | 0 | 0 | 0 | 0 | 37,665 | 0 | 33,010 | 3,543 | 0 | 0 | 0 | 150 | 0,659 | 0,340 |
| 0 | 0 | 0 | 0 | 0 | 37,665 | 0 | 33,010 | 3,543 | 0 | 0 | 0 | 150 | 0,649 | 0,350 |
| 0 | 0 | 0 | 0 | 0 | 37,665 | 0 | 33,010 | 3,543 | 0 | 0 | 0 | 150 | 0,650 | 0,349 |

FIG 39v

| Experiment | Composition $Ca_{1-x}Sr_xAlSiN_3:yEu$ or $Sr(Sr_aCa_{1-a})Si_2Al_2N_6:yEu$ $(a=2x-1)$ | | AEM Content | Si:Al ratio | Weights/g | | | | | | | | |
|---|---|---|---|---|---|---|---|---|---|---|---|---|---|
| | y | x | | | $Ca_3N_2$ | $Sr_3N_2$ | $BaN_x$ | $AlF_3$ | $SrF_2$ | $BaF_2$ | $Li_2B_4O_7$ | $LiBF_4$ | LiF |
| Thi 901_14 | 2,5% | 0,93 | 1,0 | 1:1 | 2,786 | 72,618 | 0 | 0 | 0 | 0 | 0 | 0,377 | 0 |
| Thi 902_14 | 3,0% | 0,93 | 1,0 | 1:1 | 2,773 | 72,277 | 0 | 0 | 0 | 0 | 0 | 0,376 | 0 |
| Thi 903_14 | 3,0% | 0,93 | 1,0 | 1:1 | 4,030 | 71,157 | 0 | 0 | 0 | 0 | 0 | 0,382 | 0 |
| Thi 904_14 | 3,0% | 0,93 | 1,0 | 1:1 | 2,773 | 72,277 | 0 | 0 | 0 | 0 | 0 | 0,376 | 0 |
| Thi 905_14 | 3,0% | 0,94 | 1,0 | 1:1 | 2,371 | 72,869 | 0 | 0 | 0 | 0 | 0 | 0,375 | 0 |
| Thi 906_14 | 3,0% | 0,96 | 1,0 | 1:1 | 1,572 | 74,044 | 0 | 0 | 0 | 0 | 0 | 0,373 | 0 |
| TF 907_14 | 0,1% | 0,93 | 1,0 | 1:1 | 0,950 | 24,768 | 0 | 0 | 0 | 0 | 0 | 0,129 | 0 |
| TF 908_14 | 0,2% | 0,93 | 1,0 | 1:1 | 0,949 | 24,744 | 0 | 0 | 0 | 0 | 0 | 0,129 | 0 |
| Thi 017_14 | 1,5% | 0,9 | 1,0 | 1:1 | 1,330 | 23,479 | 0 | 0 | 0 | 0 | 0 | 0,126 | 0 |
| Thi 018_14 | 2,0% | 0,8 | 0,9 | 1:1 | 1,350 | 21,195 | 0 | 0 | 0 | 0 | 0 | 0,128 | 0 |
| Thi 019_14 | 0,0% | 0,9 | 1,0 | 1:1 | 1,358 | 23,972 | 0 | 0 | 0 | 0 | 0 | 0,129 | 0 |
| Thi 020_14 | 3,0% | 0,93 | 0,9 | 1:1 | 0,924 | 24,092 | 0 | 0 | 0 | 0 | 0 | 0,125 | 0 |
| Thi 021_14 | 2,0% | 0,8 | 0,9 | 1:1 | 1,356 | 21,285 | 0 | 0 | 0 | 0 | 0 | 0,129 | 0 |
| Thi 022_14 | 2,0% | 0,8 | 0,9 | 1:1 | 1,360 | 21,342 | 0 | 0 | 0 | 0 | 0 | 0,129 | 0 |
| Thi 023_14 | 3,0% | 0,9 | 1,0 | 1:1 | 1,382 | 24,408 | 0 | 0 | 0 | 0 | 0 | 0,131 | 0 |
| Thi 024_14 | 3,0% | 0,93 | 1,0 | 1:1 | 0,924 | 24,092 | 0 | 0,187 | 0 | 0 | 0 | 0,125 | 0 |
| Thi 025_14 | 2,0% | 0,9 | 1,0 | 1:1 | 1,342 | 23,690 | 0 | 0 | 0 | 0 | 0 | 0 | 0 |
| Thi 026_14 | 2,0% | 0,9 | 1,0 | 1:1 | 1,347 | 23,780 | 0 | 0 | 0 | 0 | 0 | 0 | 0 |
| Thi 027_14 | 2,0% | 0,9 | 1,0 | 1:1 | 1,346 | 23,763 | 0 | 0 | 0 | 0 | 0 | 0 | 0,035 |

FIG 39w

| | Weights/g | | | | | | | | | | | | | Optical characterization | |
|---|---|---|---|---|---|---|---|---|---|---|---|---|---|---|---|
| Li$_3$N | Mn$_2$O$_3$ | CuO | Zn$_3$N$_2$ | La$_2$O$_3$ | Si$_3$N$_4$ | Graphite | AlN | Eu$_2$O$_3$ | EuN | CeO$_2$ | SiO$_2$ | Total | CIE x | CIE y |
| 0 | 0 | 0 | 0 | 0 | 37.665 | 0 | 33.010 | 3.543 | 0 | 0 | 0 | 150 | 0.650 | 0.349 |
| 0 | 0 | 0 | 0 | 0 | 37.488 | 0 | 32.855 | 4.231 | 0 | 0 | 0 | 150 | 0.654 | 0.345 |
| 0 | 0 | 0 | 0 | 0 | 38.137 | 0 | 33.424 | 2.870 | 0 | 0 | 0 | 150 | 0.646 | 0.352 |
| 0 | 0 | 0 | 0 | 0 | 37.488 | 0 | 32.855 | 4.231 | 0 | 0 | 0 | 150 | 0.653 | 0.346 |
| 0 | 0 | 0 | 0 | 0 | 37.939 | 0 | 32.772 | 4.221 | 0 | 0 | 0 | 150 | 0.653 | 0.346 |
| 0 | 0 | 0 | 0 | 0 | 37.204 | 0 | 32.607 | 4.199 | 0 | 0 | 0 | 150 | — | — |
| 0.047 | 0 | 0 | 0 | 0 | 12.846 | 0 | 11.259 | 0.048 | 0 | 0 | 0 | 50 | 0.582 | 0.412 |
| 0.159 | 0 | 0 | 0 | 0 | 12.834 | 0 | 11.248 | 0.097 | 0 | 0.695 | 0 | 50 | 0.593 | 0.403 |
| 0 | 0.434 | 0 | 0 | 0 | 12.584 | 0 | 11.023 | 0.710 | 0 | 0 | 0 | 50 | 0.638 | 0.360 |
| 0 | 0 | 2.183 | 0 | 0 | 12.780 | 0 | 11.200 | 0.962 | 0 | 0 | 0 | 50 | 0.640 | 0.353 |
| 0 | 0 | 0 | 2.056 | 0 | 12.848 | 0 | 11.260 | 0.000 | 0 | 0 | 0 | 50 | 0.573 | 0.423 |
| 0 | 0 | 0 | 0 | 2.226 | 12.496 | 0 | 10.952 | 1.410 | 0 | 0 | 0 | 50 | 0.650 | 0.349 |
| 0 | 0 | 0 | 0 | 0 | 12.834 | 0 | 11.248 | 0.966 | 0 | 0 | 0 | 50 | 0.646 | 0.352 |
| 0 | 0 | 0 | 0 | 0 | 12.868 | 0 | 11.278 | 0.968 | 0 | 0 | 0 | 50 | 0.648 | 0.350 |
| 0 | 0 | 0 | 0 | 0 | 10.465 | 0.671 | 11.465 | 1.477 | 0 | 0 | 0 | 50 | 0.656 | 0.343 |
| 0 | 0 | 0 | 0 | 0 | 12.496 | 0 | 10.952 | 1.410 | 0 | 0 | 0 | 50 | 0.650 | 0.349 |
| 0 | 0 | 0 | 0 | 0 | 12.697 | 0 | 11.128 | 0.955 | 0 | 0 | 0 | 50 | 0.645 | 0.353 |
| 0 | 0 | 0 | 0 | 0 | 12.745 | 0 | 11.170 | 0.959 | 0 | 0 | 0 | 50 | 0.644 | 0.355 |
| 0 | 0 | 0 | 0 | 0 | 12.736 | 0 | 11.162 | 0.958 | 0 | 0 | 0 | 50 | 0.645 | 0.354 |

FIG 39x

| Experiment | Composition $Ca_{1-x}Sr_xAlSiN_3:yEu$ or $Sr(Sr_aCa_{1-a})Si_2Al_2N_6:yEu$ (a=2x-1) | | AEM Content | Si:Al ratio | Weights/g | | | | | | | | |
|---|---|---|---|---|---|---|---|---|---|---|---|---|---|
| | y | x | | | $Ca_3N_2$ | $Sr_3N_2$ | $BaN_x$ | $AlF_3$ | $SrF_2$ | $BaF_2$ | $Li_2B_4O_7$ | $LiBF_4$ | LiF |
| Thi 028_14 | 2,0% | 0,9 | 1,0 | 1:1 | 1,343 | 23,713 | 0 | 0 | 0 | 0 | 0 | 0 | 0,141 |
| TF 909_14 | 0,6% | 0,93 | 1,0 | 1:1 | 0,946 | 24,649 | 0 | 0 | 0 | 0 | 0 | 0,128 | 0 |
| TF 910_14 | 2,0% | 0,93 | 1,0 | 1:1 | 0,934 | 24,347 | 0 | 0 | 0 | 0 | 0 | 0,128 | 0 |
| TF 911_14 | 10,0% | 0,93 | 1,0 | 1:1 | 0,891 | 21,978 | 0 | 0 | 0 | 0 | 0 | 0,121 | 0 |
| TF 912_14 | 20,0% | 0,93 | 1,0 | 1:1 | 0,861 | 18,812 | 0 | 0 | 0 | 0 | 0 | 0,117 | 0 |
| Thi 913_14 | 3,0% | 0,93 | 1,0 | 0,99:1,01 | 2,774 | 72,299 | 0 | 0 | 0 | 0 | 0 | 0,376 | 0 |
| Thi 914_14 | 3,0% | 0,93 | 1,0 | 0,98:1,02 | 2,775 | 72,322 | 0 | 0 | 0 | 0 | 0 | 0,376 | 0 |
| Thi 915_14 | 3,0% | 0,93 | 1,0 | 1:1,01 | 2,767 | 72,119 | 0 | 0 | 0 | 0 | 0 | 0,375 | 0 |
| Thi 916_14 | 3,0% | 0,93 | 1,0 | 1:1 | 2,773 | 72,277 | 0 | 0 | 0 | 0 | 0 | 0,376 | 0 |
| Thi 030_14 | 3,0% | 0,93 | 1,0 | 1:1 | 2,773 | 72,277 | 0 | 0 | 0 | 0 | 0 | 0,376 | 0 |
| TF 917_14 | 3,0% | 0,93 | 1,0 | 1:0,98 | 2,785 | 72,595 | 0 | 0 | 0 | 0 | 0 | 0,377 | 0 |
| TF 918_14 | 3,0% | 0,93 | 1,0 | 1,03:0,97 | 2,770 | 72,210 | 0 | 0 | 0 | 0 | 0 | 0,375 | 0 |
| Thi 919_14 | 3,0% | 0,93 | 1,0 | 0,99:1,01 | 2,774 | 72,299 | 0 | 0 | 0 | 0 | 0 | 0,376 | 0 |
| Thi 920_14 | 3,0% | 0,93 | 1,0 | 0,98:1,02 | 2,775 | 72,322 | 0 | 0 | 0 | 0 | 0 | 0,376 | 0 |
| Thi 921_14 | 3,0% | 0,93 | 1,0 | 0,995:1,005 | 2,773 | 72,288 | 0 | 0 | 0 | 0 | 0 | 0,376 | 0 |
| Thi 032_14 | 3,0% | 0,91 | 0,98 | 1:1 | 0,925 | 23,599 | 0 | 0 | 0 | 0 | 0 | 0,125 | 0 |
| Thi 033_14 | 3,0% | 0,92 | 0,99 | 1:1 | 0,921 | 23,750 | 0 | 0 | 0 | 0 | 0 | 0,125 | 0 |
| Thi 034_14 | 3,0% | 0,9 | 1,0 | 1:1 | 1,333 | 23,538 | 0 | 0 | 0 | 0 | 0 | 0,126 | 0 |
| Thi 035_14 | 3,0% | 0,93 | 1,0 | 0,99:1,01 | 0,925 | 24,100 | 0 | 0 | 0 | 0 | 0 | 0,125 | 0 |

FIG 39y

| Li₃N | Mn₂O₃ | CuO | Zn₃N₂ | La₂O₃ | Si₃N₄ | Graphite | AlN | Eu₂O₃ | EuN | CeO₂ | SiO₂ | Total | CIE x | CIE y |
|---|---|---|---|---|---|---|---|---|---|---|---|---|---|---|
| 0 | 0 | 0 | 0 | 0 | 12,709 | 0 | 11,138 | 0,956 | 0 | 0 | 0 | 50 | 0,647 | 0,352 |
| 0 | 0 | 0 | 0 | 0 | 12,875 | 0 | 11,205 | 0,289 | 0 | 0 | 0 | 50 | 0,614 | 0,383 |
| 0 | 0 | 0 | 0 | 0 | 12,628 | 0 | 11,068 | 0,896 | 0 | 0 | 0 | 50 | 0,644 | 0,354 |
| 0 | 0 | 0 | 0 | 0 | 12,047 | 0 | 10,558 | 2,266 | 2,138 | 0 | 0 | 50 | 0,675 | 0,324 |
| 0 | 0 | 0 | 0 | 0 | 11,634 | 0 | 10,196 | 2,189 | 6,193 | 0 | 0 | 50 | 0,687 | 0,311 |
| 0 | 0 | 0 | 0 | 0 | 37,125 | 0 | 33,194 | 4,233 | 0 | 0 | 0 | 150 | 0,652 | 0,347 |
| 0 | 0 | 0 | 0 | 0 | 36,761 | 0 | 33,533 | 4,234 | 0 | 0 | 0 | 150 | 0,652 | 0,347 |
| 0 | 0 | 0 | 0 | 0 | 37,406 | 0 | 33,111 | 4,222 | 0 | 0 | 0 | 150 | 0,652 | 0,347 |
| 0 | 0 | 0 | 0 | 0 | 37,488 | 0 | 32,855 | 4,231 | 0 | 0 | 0 | 150 | 0,650 | 0,348 |
| 0 | 0 | 0 | 0 | 0 | 37,488 | 0 | 32,855 | 4,231 | 0 | 0 | 0 | 150 | 0,652 | 0,347 |
| 0 | 0 | 0 | 0 | 0 | 37,653 | 0 | 32,340 | 4,250 | 0 | 0 | 0 | 150 | 0,653 | 0,346 |
| 0 | 0 | 0 | 0 | 0 | 38,577 | 0 | 31,840 | 4,227 | 0 | 0 | 0 | 150 | 0,652 | 0,347 |
| 0 | 0 | 0 | 0 | 0 | 37,125 | 0 | 33,194 | 4,233 | 0 | 0 | 0 | 150 | 0,651 | 0,348 |
| 0 | 0 | 0 | 0 | 0 | 36,761 | 0 | 33,533 | 4,234 | 0 | 0 | 0 | 150 | 0,652 | 0,347 |
| 0 | 0 | 0 | 0 | 0 | 37,306 | 0 | 33,024 | 4,232 | 0 | 0 | 0 | 150 | 0,653 | 0,346 |
| 0,031 | 0 | 0 | 0 | 0,436 | 12,509 | 0 | 10,963 | 1,412 | 0 | 0 | 0 | 50 | 0,648 | 0,349 |
| 0 | 0 | 0 | 0 | 0,434 | 12,452 | 0,032 | 10,913 | 1,406 | 0 | 0 | 0 | 50 | 0,646 | 0,352 |
| 0 | 0 | 0 | 0 | 0 | 12,489 | 0 | 11,056 | 1,424 | 0 | 0 | 0 | 50 | 0,656 | 0,343 |
| 0 | 0 | 0 | 0 | 0 | 12,375 | 0 | 11,065 | 1,411 | 0 | 0 | 0 | 50 | 0,652 | 0,346 |

FIG 39z

| Experiment | Composition $Ca_{1-x}Sr_xAlSiN_3:yEu$ or $Sr(Sr_aCa_{1-a})Si_2Al_2N_6:yEu$ (a=2x-1) | | AEM Content | Si:Al ratio | Weights/g | | | | | | | | |
|---|---|---|---|---|---|---|---|---|---|---|---|---|---|
| | y | x | | | $Ca_3N_2$ | $Sr_3N_2$ | $BaN_x$ | $AlF_3$ | $SrF_2$ | $BaF_2$ | $Li_2B_4O_7$ | $LiBF_4$ | LiF |
| TF 922_14 | 3,0% | 0,93 | 1,0 | 0,985:1 | 2,783 | 72,549 | 0 | 0 | 0 | 0 | 0 | 0,377 | 0 |
| TF 923_14 | 3,0% | 0,93 | 1,0 | 0,985:0,985 | 2,792 | 72,789 | 0 | 0 | 0 | 0 | 0 | 0,378 | 0 |
| TF 924_14 | 3,0% | 0,93 | 1,0 | 1:0,985 | 2,782 | 72,515 | 0 | 0 | 0 | 0 | 0 | 0,377 | 0 |
| Thi 925_14 | 3,0% | 0,93 | 1,0 | 0,995:0,995 | 2,779 | 72,447 | 0 | 0 | 0 | 0 | 0 | 3,77 | 0 |
| Thi 926_14 | 3,0% | 0,93 | 1,0 | 0,985:1,01 | 2,774 | 72,308 | 0 | 0 | 0 | 0 | 0 | 0,376 | 0 |
| Thi 927_14 | 3,0% | 0,93 | 1,0 | 1:1,015 | 2,764 | 72,040 | 0 | 0 | 0 | 0 | 0 | 0,374 | 0 |
| Thi 928_14 | 3,0% | 0,93 | 1,0 | 1,015:1,015 | 2,753 | 71,772 | 0 | 0 | 0 | 0 | 0 | 0,373 | 0 |
| Thi 929_14 | 3,0% | 0,93 | 1,0 | 0,985:1,005 | 2,780 | 72,469 | 0 | 0 | 0 | 0 | 0 | 0,377 | 0 |
| Thi 930_14 | 3,0% | 0,93 | 1,0 | 0,99:0,985 | 2,789 | 72,698 | 0 | 0 | 0 | 0 | 0 | 0,378 | 0 |
| Thi 931_14 | 3,0% | 0,93 | 1,0 | 0,985:1,01 | 2,777 | 72,390 | 0 | 0 | 0 | 0 | 0 | 0,376 | 0 |
| Thi 932_14 | 3,0% | 0,93 | 1,0 | 0,995:1,01 | 2,770 | 72,209 | 0 | 0 | 0 | 0 | 0 | 0,375 | 0 |
| Thi 933_14 | 3,0% | 0,93 | 1,0 | 1,01:1,01 | 2,760 | 71,940 | 0 | 0 | 0 | 0 | 0 | 0,374 | 0 |
| Thi 934_14 | 3,0% | 0,93 | 1,0 | 0,995:0,99 | 2,782 | 72,526 | 0 | 0 | 0 | 0 | 0 | 0,377 | 0 |
| Thi 935_14 | 3,0% | 0,93 | 1,0 | 1,105:0,985 | 2,772 | 72,244 | 0 | 0 | 0 | 0 | 0 | 0,376 | 0 |
| Thi 936_14 | 3,0% | 0,93 | 1,0 | 1,005:0,995 | 2,772 | 72,266 | 0 | 0 | 0 | 0 | 0 | 0,376 | 0 |
| Thi 937_14 | 3,0% | 0,93 | 1,0 | 0,985:1,105 | 2,774 | 72,311 | 0 | 0 | 0 | 0 | 0 | 0,376 | 0 |
| Thi 938_14 | 3,0% | 0,93 | 1,0 | 1,005:1,005 | 2,766 | 72,108 | 0 | 0 | 0 | 0 | 0 | 0,375 | 0 |
| Thi 939_14 | 3,0% | 0,93 | 1,0 | 1,015:1 | 2,762 | 72,007 | 0 | 0 | 0 | 0 | 0 | 0,374 | 0 |
| TF 940_14 | 3,0% | 0,93 | 1,0 | 1,015:0,99 | 2,769 | 72,165 | 0 | 0 | 0 | 0 | 0 | 0,375 | 0 |

FIG 39za

| Li₃N | Mn₂O₃ | CuO | Zn₃N₂ | La₂O₃ | Si₃N₄ | Graphite | AlN | Eu₂O₃ | EuN | CeO₂ | SiO₂ | Total | CIE x | CIE y |
|---|---|---|---|---|---|---|---|---|---|---|---|---|---|---|
| | | | | | | | | | Weights/g | | | | Optical characterization | |
| 0 | 0 | 0 | 0 | 0 | 37,065 | 0 | 32,979 | 4,247 | 0 | 0 | 0 | 150 | 0,653 | 0,346 |
| 0 | 0 | 0 | 0 | 0 | 37,187 | 0 | 32,592 | 4,261 | 0 | 0 | 0 | 150 | 0,652 | 0,347 |
| 0 | 0 | 0 | 0 | 0 | 37,612 | 0 | 32,469 | 4,245 | 0 | 0 | 0 | 150 | 0,653 | 0,347 |
| 0 | 0 | 0 | 0 | 0 | 37,388 | 0 | 32,768 | 4,241 | 0 | 0 | 0 | 150 | 0,653 | 0,347 |
| 0 | 0 | 0 | 0 | 0 | 37,110 | 0 | 33,198 | 4,233 | 0 | 0 | 0 | 150 | 0,652 | 0,347 |
| 0 | 0 | 0 | 0 | 0 | 37,365 | 0 | 33,239 | 4,218 | 0 | 0 | 0 | 150 | 0,652 | 0,347 |
| 0 | 0 | 0 | 0 | 0 | 37,785 | 0 | 33,115 | 4,202 | 0 | 0 | 0 | 150 | 0,653 | 0,345 |
| 0 | 0 | 0 | 0 | 0 | 37,024 | 0 | 33,104 | 4,243 | 0 | 0 | 0 | 150 | 0,652 | 0,347 |
| 0 | 0 | 0 | 0 | 0 | 37,329 | 0 | 32,551 | 4,256 | 0 | 0 | 0 | 150 | 0,652 | 0,647 |
| 0 | 0 | 0 | 0 | 0 | 36,983 | 0 | 33,235 | 4,238 | 0 | 0 | 0 | 150 | 0,652 | 0,347 |
| 0 | 0 | 0 | 0 | 0 | 37,265 | 0 | 33,152 | 4,227 | 0 | 0 | 0 | 150 | 0,652 | 0,347 |
| 0 | 0 | 0 | 0 | 0 | 37,686 | 0 | 33,028 | 4,212 | 0 | 0 | 0 | 150 | 0,652 | 0,347 |
| 0 | 0 | 0 | 0 | 0 | 37,429 | 0 | 32,639 | 4,246 | 0 | 0 | 0 | 150 | 0,655 | 0,344 |
| 0 | 0 | 0 | 0 | 0 | 39,347 | 0 | 32,347 | 4,229 | 0 | 0 | 0 | 150 | 0,654 | 0,345 |
| 0 | 0 | 0 | 0 | 0 | 37,670 | 0 | 32,686 | 4,231 | 0 | 0 | 0 | 150 | 0,653 | 0,346 |
| 0 | 0 | 0 | 0 | 0 | 36,943 | 0 | 33,363 | 4,233 | 0 | 0 | 0 | 150 | 0,654 | 0,345 |
| 0 | 0 | 0 | 0 | 0 | 37,587 | 0 | 32,942 | 4,221 | 0 | 0 | 0 | 150 | 0,653 | 0,346 |
| 0 | 0 | 0 | 0 | 0 | 37,908 | 0 | 32,732 | 4,216 | 0 | 0 | 0 | 150 | 0,651 | 0,348 |
| 0 | 0 | 0 | 0 | 0 | 37,991 | 0 | 32,476 | 4,225 | 0 | 0 | 0 | 150 | 0,653 | 0,346 |

FIG 39zb

| Experiment | Composition $Ca_{1-x}Sr_xAlSiN_3$:yEu or $Sr(Sr_aCa_{1-a})Si_2Al_2N_6$:yEu (a=2x-1) | | AEM Content | Si:Al ratio | Weights/g | | | | | | | | |
|---|---|---|---|---|---|---|---|---|---|---|---|---|---|
| | y | x | | | $Ca_3N_2$ | $Sr_3N_2$ | BaNx | $AlF_3$ | $SrF_2$ | $BaF_2$ | $Li_2B_4O_7$ | $LiBF_4$ | LiF |
| TF 941_14 | 3.0% | 0.93 | 1.0 | 1.01:0.985 | 2.775 | 72.334 | 0 | 0 | 0 | 0 | 0 | 0.376 | 0 |
| TF 942_14 | 3.0% | 0.93 | 1.0 | 0.9:1.015 | 2.837 | 73.881 | 0 | 0 | 0 | 0 | 0 | 0.384 | 0 |
| Thi 943_14 | 3.0% | 0.93 | 1.0 | 1.015:1.005 | 2.759 | 71.929 | 0 | 0 | 0 | 0 | 0 | 0.374 | 0 |
| Thi 944_14 | 3.0% | 0.93 | 1.0 | 0.99:1 | 2.780 | 72.458 | 0 | 0 | 0 | 0 | 0 | 0.377 | 0 |
| Thi 945_14 | 3.0% | 0.93 | 1.0 | 1.015:0.995 | 2.766 | 72.086 | 0 | 0 | 0 | 0 | 0 | 0.375 | 0 |
| Thi 946_14 | 3.0% | 0.93 | 1.0 | 0.95:0.99 | 2.814 | 73.354 | 0 | 0 | 0 | 0 | 0 | 0.381 | 0 |
| Thi 947_14 | 3.0% | 0.93 | 1.0 | 0.995:1.015 | 2.767 | 72.130 | 0 | 0 | 0 | 0 | 0 | 0.375 | 0 |
| Thi 948_14 | 3.0% | 0.93 | 1.0 | 1:1.005 | 2.770 | 72.198 | 0 | 0 | 0 | 0 | 0 | 0.375 | 0 |
| TF 949_14 | 3.0% | 0.93 | 1.0 | 1.033:1.066 | 2.711 | 70.672 | 0 | 0 | 0 | 0 | 0 | 0.367 | 0 |
| TF 950_14 | 3.0% | 0.93 | 1.0 | 1.066:1.132 | 2.652 | 69.138 | 0 | 0 | 0 | 0 | 0 | 0.359 | 0 |
| TF 951_14 | 3.0% | 0.93 | 1.0 | 1.1:1.2 | 2.594 | 67.625 | 0 | 0 | 0 | 0 | 0 | 0.352 | 0 |
| TF 952_14 | 3.0% | 0.93 | 1.0 | 1.06:1.16 | 1.121 | 71.105 | 0 | 0 | 0 | 0 | 0 | 0.354 | 0 |
| TF 953_14 | 3.0% | 0.93 | 1.0 | 0.995:1.01 | 2.770 | 72.209 | 0 | 0 | 0 | 0 | 0 | 0.375 | 0 |
| TF 954_14 | 3.0% | 0.93 | 1.0 | 1:1 | 2.773 | 72.277 | 0 | 0 | 0 | 0 | 0 | 0.376 | 0 |
| Thi 044_14 | 3.0% | 0.93 | 1.0 | 1:1.005 | 2.770 | 72.198 | 0 | 0 | 0 | 0 | 0 | 0.375 | 0 |
| Thi 045_14 | 3.0% | 0.93 | 1.0 | 1:1.01 | 2.767 | 72.119 | 0 | 0 | 0 | 0 | 0 | 0.375 | 0 |
| Thi 046_14 | 3.0% | 0.93 | 1.0 | 1:1.015 | 2.764 | 72.040 | 0 | 0 | 0 | 0 | 0 | 0.374 | 0 |
| Thi 047_14 | 3.0% | 0.93 | 1.0 | 1:1.01 | 2.767 | 72.119 | 0 | 0 | 0 | 0 | 0 | 0.375 | 0 |
| Thi 048_14 | 3.0% | 0.93 | 1.0 | 1:1.01 | 2.767 | 72.119 | 0 | 0 | 0 | 0 | 0 | 0.375 | 0 |
| Thi 049_14 | 3.0% | 0.93 | 1.0 | 1:1.01 | 2.767 | 72.119 | 0 | 0 | 0 | 0 | 0 | 0.375 | 0 |

FIG 39zc

| Experiment | Composition $Ca_{1-x}Sr_xAlSiN_3:yEu$ or $Sr(Sr_aCa_{1-a})Si_2Al_2N_6:yEu$ $(a=2x-1)$ | | AEM Content | Si:Al ratio | Weights/g | | | | | | | | |
|---|---|---|---|---|---|---|---|---|---|---|---|---|---|
| | y | x | | | $Ca_3N_2$ | $Sr_3N_2$ | $BaN_x$ | $AlF_3$ | $SrF_2$ | $BaF_2$ | $Li_2B_4O_7$ | $LiBF_4$ | LiF |
| TF 941_14 | 3.0% | 0.93 | 1.0 | 1.01:0.985 | 2.775 | 72.334 | 0 | 0 | 0 | 0 | 0 | 0.376 | 0 |
| TF 942_14 | 3.0% | 0.93 | 1.0 | 0.9:1.015 | 2.837 | 73.881 | 0 | 0 | 0 | 0 | 0 | 0.384 | 0 |
| Thi 943_14 | 3.0% | 0.93 | 1.0 | 1.015:1.005 | 2.759 | 71.929 | 0 | 0 | 0 | 0 | 0 | 0.374 | 0 |
| Thi 944_14 | 3.0% | 0.93 | 1.0 | 0.99:1 | 2.780 | 72.458 | 0 | 0 | 0 | 0 | 0 | 0.377 | 0 |
| Thi 945_14 | 3.0% | 0.93 | 1.0 | 1.015:0.995 | 2.766 | 72.086 | 0 | 0 | 0 | 0 | 0 | 0.375 | 0 |
| Thi 946_14 | 3.0% | 0.93 | 1.0 | 0.95:0.99 | 2.814 | 73.354 | 0 | 0 | 0 | 0 | 0 | 0.381 | 0 |
| Thi 947_14 | 3.0% | 0.93 | 1.0 | 0.995:1.015 | 2.767 | 72.130 | 0 | 0 | 0 | 0 | 0 | 0.375 | 0 |
| Thi 948_14 | 3.0% | 0.93 | 1.0 | 1:1.005 | 2.770 | 72.198 | 0 | 0 | 0 | 0 | 0 | 0.375 | 0 |
| TF 949_14 | 3.0% | 0.93 | 1.0 | 1.033:1.066 | 2.711 | 70.672 | 0 | 0 | 0 | 0 | 0 | 0.367 | 0 |
| TF 950_14 | 3.0% | 0.93 | 1.0 | 1.066:1.132 | 2.652 | 69.138 | 0 | 0 | 0 | 0 | 0 | 0.359 | 0 |
| TF 951_14 | 3.0% | 0.93 | 1.0 | 1.1:1.2 | 2.594 | 67.625 | 0 | 0 | 0 | 0 | 0 | 0.352 | 0 |
| TF 952_14 | 3.0% | 0.93 | 1.0 | 1.06:1.16 | 1.121 | 71.105 | 0 | 0 | 0 | 0 | 0 | 0.354 | 0 |
| TF 953_14 | 3.0% | 0.93 | 1.0 | 0.995:1.01 | 2.770 | 72.209 | 0 | 0 | 0 | 0 | 0 | 0.375 | 0 |
| TF 954_14 | 3.0% | 0.93 | 1.0 | 1:1 | 2.773 | 72.277 | 0 | 0 | 0 | 0 | 0 | 0.376 | 0 |
| Thi 044_14 | 3.0% | 0.93 | 1.0 | 1:1.005 | 2.770 | 72.198 | 0 | 0 | 0 | 0 | 0 | 0.375 | 0 |
| Thi 045_14 | 3.0% | 0.93 | 1.0 | 1:1.01 | 2.767 | 72.119 | 0 | 0 | 0 | 0 | 0 | 0.375 | 0 |
| Thi 046_14 | 3.0% | 0.93 | 1.0 | 1:1.015 | 2.764 | 72.040 | 0 | 0 | 0 | 0 | 0 | 0.374 | 0 |
| Thi 047_14 | 3.0% | 0.93 | 1.0 | 1:1.01 | 2.767 | 72.119 | 0 | 0 | 0 | 0 | 0 | 0.375 | 0 |
| Thi 048_14 | 3.0% | 0.93 | 1.0 | 1:1.01 | 2.767 | 72.119 | 0 | 0 | 0 | 0 | 0 | 0.375 | 0 |
| Thi 049_14 | 3.0% | 0.93 | 1.0 | 1:1.01 | 2.767 | 72.119 | 0 | 0 | 0 | 0 | 0 | 0.375 | 0 |

FIG 39zd

| | Weights/g | | | | | | | | | | | | Optical characterization | |
|---|---|---|---|---|---|---|---|---|---|---|---|---|---|---|
| Li₃N | Mn₂O₃ | CuO | Zn₃N₂ | La₂O₃ | Si₃N₄ | Graphite | AlN | Eu₂O₃ | EuN | CeO₂ | SiO₂ | Total | CIE x | CIE y |
| 0 | 0 | 0 | 0 | 0 | 37,893 | 0 | 32,388 | 4,235 | 0 | 0 | 0 | 150 | 0,653 | 0,346 |
| 0 | 0 | 0 | 0 | 0 | 34,488 | 0 | 34,088 | 4,325 | 0 | 0 | 0 | 150 | 0,650 | 0,348 |
| 0 | 0 | 0 | 0 | 0 | 37,867 | 0 | 32,860 | 4,211 | 0 | 0 | 0 | 150 | 0,653 | 0,346 |
| 0 | 0 | 0 | 0 | 0 | 37,206 | 0 | 32,937 | 4,242 | 0 | 0 | 0 | 150 | 0,651 | 0,348 |
| 0 | 0 | 0 | 0 | 0 | 37,950 | 0 | 32,604 | 4,220 | 0 | 0 | 0 | 150 | 0,653 | 0,345 |
| 0 | 0 | 0 | 0 | 0 | 36,144 | 0 | 33,011 | 4,294 | 0 | 0 | 0 | 150 | 0,653 | 0,346 |
| 0 | 0 | 0 | 0 | 0 | 37,225 | 0 | 33,280 | 4,223 | 0 | 0 | 0 | 150 | 0,654 | 0,345 |
| 0 | 0 | 0 | 0 | 0 | 37,447 | 0 | 32,983 | 4,227 | 0 | 0 | 0 | 150 | 0,654 | 0,345 |
| 0 | 0 | 0 | 0 | 0 | 37,865 | 0 | 34,246 | 4,137 | 0 | 0 | 0 | 150 | 0,653 | 0,346 |
| 0 | 0 | 0 | 0 | 0 | 38,226 | 0 | 35,577 | 4,048 | 0 | 0 | 0 | 150 | 0,652 | 0,346 |
| 0 | 0 | 0 | 0 | 0 | 38,582 | 0 | 36,888 | 3,959 | 0 | 0 | 0 | 150 | 0,654 | 0,345 |
| 0 | 0 | 0 | 0 | 0 | 37,481 | 0,000 | 35,948 | 3,991 | 0 | 0 | 0 | 150 | --- | --- |
| 0 | 0 | 0 | 0 | 0 | 37,265 | 0 | 33,150 | 4,227 | 0 | 0 | 0 | 150 | 0,653 | 0,346 |
| 0 | 0 | 0 | 0 | 0 | 37,488 | 0 | 32,855 | 4,231 | 0 | 0 | 0 | 150 | 0,654 | 0,345 |
| 0 | 0 | 0 | 0 | 0 | 37,447 | 0 | 32,983 | 4,227 | 0 | 0 | 0 | 150 | 0,651 | 0,348 |
| 0 | 0 | 0 | 0 | 0 | 37,406 | 0 | 33,111 | 4,222 | 0 | 0 | 0 | 150 | 0,653 | 0,346 |
| 0 | 0 | 0 | 0 | 0 | 37,365 | 0 | 33,239 | 4,218 | 0 | 0 | 0 | 150 | 0,651 | 0,348 |
| 0 | 0 | 0 | 0 | 0 | 37,406 | 0 | 33,111 | 4,222 | 0 | 0 | 0 | 150 | 0,652 | 0,347 |
| 0 | 0 | 0 | 0 | 0 | 37,406 | 0 | 33,111 | 4,222 | 0 | 0 | 0 | 150 | 0,653 | 0,346 |
| 0 | 0 | 0 | 0 | 0 | 37,406 | 0 | 33,111 | 4,222 | 0 | 0 | 0 | 150 | 0,652 | 0,347 |

FIG 40a

| | $\lambda_{dom}$(blue LED) | Phosphor | Phosphor concentration | x | y | $\Phi_e$(potting)/ $\Phi_e$(no potting) | $\Phi_V$(potting)/ $\Phi_e$(no potting) |
|---|---|---|---|---|---|---|---|
| Comparative example 1 | 447.6 | $(Ca_{0.1}Sr_{0.4}Ba_{0.5})2 Si_5N_8$:Eu (6%) | 20 % | 0.661 | 0.335 | 100 % | 100 % |
| Inventive example 1 | 446.9 | $Sr(Sr_{0.8}Ca_{0.2}) Si_2Al_2N_6$:Eu (2%) | 21.5 % | 0.659 | 0.335 | 113 % | 145 % |

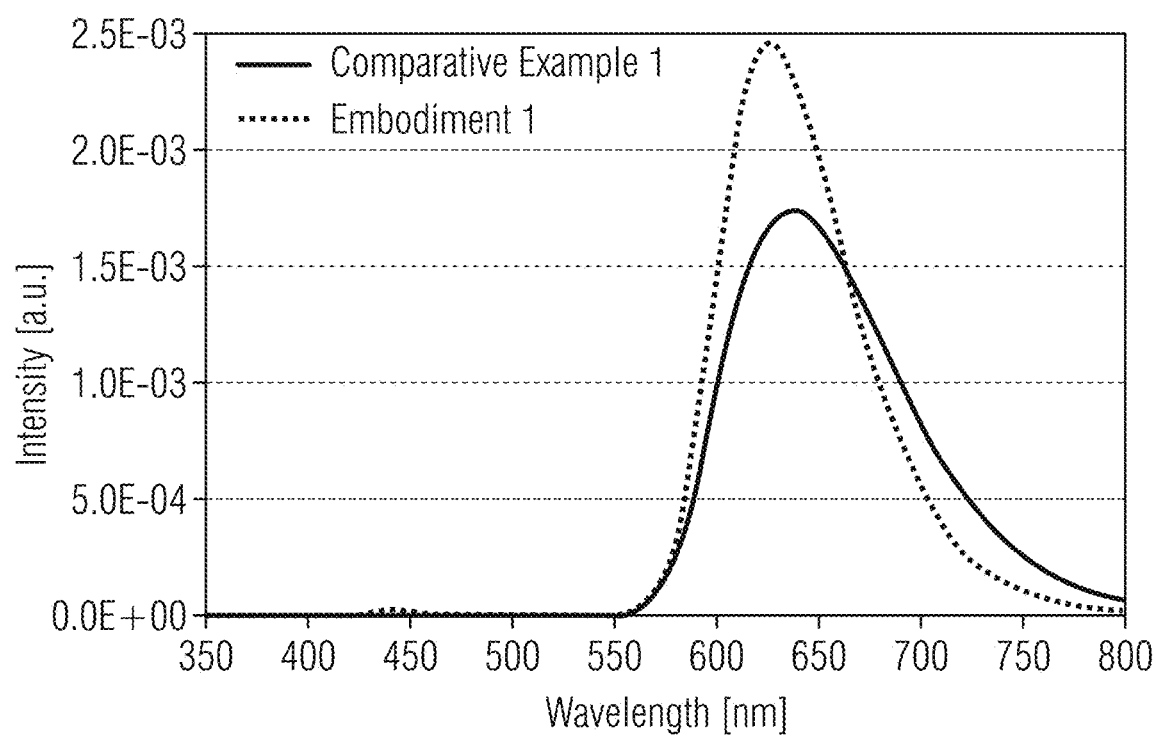

FIG 41a

| | $\lambda_{dom}$(blue LED) | Phosphor | Phosphor concentration | x | y | $\Phi_e$(potting)/ $\Phi_e$(no potting) | $\Phi_v$(potting)/ $\Phi_e$(no potting) |
|---|---|---|---|---|---|---|---|
| Comparative example 2 | 447.5 | CaAlSi(N,O)$_3$: Eu (0.4%) | 30 % | 0.668 | 0.320 | 100 % | 100 % |
| Inventive example 2 | 446.9 | Sr(Sr$_{0.8}$Ca$_{0.2}$) Si$_2$Al$_2$N$_6$:Eu (5%) | 17 % | 0.670 | 0.317 | 133 % | 160 % |

FIG 42a

| | λ_dom(blue LED) | First phosphor | Second phosphor | Ratio of phosphors | Phosphor concentration | x | y | $\Phi_e$(potting)/ $\Phi_e$(no potting) | $\Phi_v$(potting)/ $\Phi_e$(no potting) |
|---|---|---|---|---|---|---|---|---|---|
| Comparative example 3 | 447.6 | $(Ca_{0.1}Sr_{0.4}Ba_{0.5})_2$ $Si_5N_8$:Eu (6%) | | | 20 % | 0.661 | 0.335 | 100 % | 100 % |
| Inventive example 3 | 447.0 | CaAlSi(N, O)$_3$: Eu (0.4%) | $Sr(Sr_{0.8}Ca_{0.2})$ $Si_2Al_2N_6$:Eu (2%) | 0.5/1 | 21.5 % | 0.661 | 0.330 | 104 % | 118 % |

FIG 43a

| | $\lambda_{dom}$(blue LED) | First phosphor | Second phosphor | Ratio of phosphors | Phosphor concentration | x | y | $\Phi_e$(potting)/ $\Phi_e$(no potting) | $\Phi_v$(potting)/ $\Phi_e$(no potting) |
|---|---|---|---|---|---|---|---|---|---|
| Comparative example 4 | 447.1 | CaAlSi(N, O)$_3$: Eu (0.4%) | (Ca$_{0.1}$Sr$_{0.4}$Ba$_{0.5}$)$_2$ Si$_5$N$_8$:Eu (4%) | 1.7/1 | 21.5 % | 0.661 | 0.329 | 100 % | 100 % |
| Inventive example 4 | 447.0 | CaAlSi(N, O)$_3$: Eu (0.4%) | Sr(Sr$_{0.8}$Ca$_{0.2}$) Si$_2$Al$_2$N$_6$:Eu (2%) | 0.5/1 | 21.5 % | 0.661 | 0.330 | 104 % | 129 % |

FIG 44a

| | λ_dom(blue LED) | First phosphor | Second phosphor | Ratio of phosphors | Phosphor concentration | x | y | Φ_e(potting)/Φ_e(no potting) | Φ_v(potting)/Φ_e(no potting) |
|---|---|---|---|---|---|---|---|---|---|
| Comparative example 5 | 444.7 | (Y_{0.957}Ce_{0.043})_3 Al_5O_{12} | (Ca_{0.1}Sr_{0.4}Ba_{0.5})_2 Si_5N_8:Eu (4%) | 5.9/1 | 41 % | 0.561 | 0.430 | 100 % | 100 % |
| Inventive example 5 | 444.4 | (Y_{0.957}Ce_{0.043})_3 Al_5O_{12} | Sr(Sr_{0.8}Ca_{0.2}) Si_2Al_2N_6:Eu (2%) | 12.1/1 | 41 % | 0.561 | 0.430 | 107 % | 109 % |
| Inventive example 6 | 444.4 | (Y_{0.957}Ce_{0.043})_3 Al_5O_{12} | Sr(Sr_{0.86}Ca_{0.14}) Si_2Al_2N_6:Eu (0.8%) | 5/1 | 39 % | 0.561 | 0.428 | 107 % | 117 % |

FIG 45a

| Example | $\lambda_{dom}$(blue LED) | Composition of red phosphor | Phosphor concentration (% by wt.) | $\lambda_{dom}$ | CIE-x | CIE-y |
|---|---|---|---|---|---|---|
| Inventive ex. 1 | 446.9 | $Sr(Sr_{0.86}Ca_{0.14})Si_2Al_2N_6$:Eu (10% Eu) | 15.5 % | 621.2 nm | 0.682 | 0.307 |
| Inventive ex. 2 | 446.9 | $Sr(Sr_{0.86}Ca_{0.14})Si_2Al_2N_6$:Eu (10% Eu) | 17.0 % | 621.2 nm | 0.690 | 0.306 |
| Inventive ex. 3 | 446.9 | $Sr(Sr_{0.86}Ca_{0.14})Si_2Al_2N_6$:Eu (20% Eu) | 19.3 % | 632.3 nm | 0.698 | 0.291 |

FIG 46a

| Example | $\lambda_{dom}$(blue LED) at 350 mA | Composition of yellow phosphor | Composition of red phosphor | Total phosphor conc. (% by wt.) | Yellow/red ratio |
|---|---|---|---|---|---|
| Comp. ex. 1 | 444.5 | $(Lu_{0.8}Y_{0.2})_3Al_5O_{12}$:Ce (4.5% Ce) | $(Ca_{0.025}Sr_{0.475}Ba_{0.5})_2Si_5N_8$:Eu (2.5% Eu) | 19.9 % | 7.0 |
| Comp. ex. 2 | 444.6 | $(Lu_{0.85}Y_{0.15})_3Al_5O_{12}$:Ce (3% Ce) | $(Sr_{0.5}Ba_{0.5})_2Si_5N_8$:Eu (1% Eu) | 17.7 % | 3.0 |
| Inventive ex. 1 | 444.6 | $(Lu_{0.85}Y_{0.15})_3Al_5O_{12}$:Ce (3% Ce) | $Sr(Sr_{0.86}Ca_{0.14})Si_2Al_2N_6$:Eu (0.4% Eu) | 17.7 % | 3.0 |
| Inventive ex. 2 | 444.4 | $(Lu_{0.85}Y_{0.15})_3Al_5O_{12}$:Ce (3% Ce) | $Sr(Sr_{0.86}Ca_{0.14})Si_2Al_2N_6$:Eu (1.2% Eu) | 17.7 % | 8.1 |
| Inventive ex. 3 | 444.5 | $Y_3(Al_{0.70}Ga_{0.30})_5O_{12}$:Ce (3% Ce) | $Sr(Sr_{0.86}Ca_{0.14})Si_2Al_2N_6$:Eu (1.2% Eu) | 9.8 % | 4.0 |
| Inventive ex. 4 | 444.5 | $Y_{O3}(Al_{0.75}Ga_{0.25})_5O_{12}$:Ce (3% Ce) | $Sr(Sr_{0.86}Ca_{0.14})Si_2Al_2N_6$:Eu (1.2% Eu) | 9.8 % | 4.2 |

FIG 46b

| Example | CIE-x | CIE-y | CRI | Rel. $\Phi_v$(filled potting)/ $\Phi_e$(clear potting) | Rel. $\Phi_v$(filled potting)/ $\Phi_e$(clear potting) (color point corr.) |
|---|---|---|---|---|---|
| Comp. ex. 1 | 0.435 | 0.403 | 69 | 100 % | 100 % |
| Comp. ex. 2 | 0.433 | 0.405 | 69 | 104.1 % | 103.4 % |
| Inventive ex. 1 | 0.435 | 0.401 | 70 | 103 % | 103.4 % |
| Inventive ex. 2 | 0.434 | 0.402 | 76 | 100.6 % | 100.7 % |
| Inventive ex. 3 | 0.435 | 0.402 | 75 | 102.1 % | 102.4 % |
| Inventive ex. 4 | 0.434 | 0.403 | 74 | 101.2 % | 101.1 % |

FIG 46c

| Example | CIE-x | CIE-y | CRI | Rel. $\Phi_v$(filled potting)/ $\Phi_e$(clear potting) | Rel. $\Phi_v$(filled potting)/ $\Phi_e$(clear potting) (color point corr.) |
|---|---|---|---|---|---|
| Comp. ex. 1 | 0.430 | 0.401 | 69 | 100 % | 100 % |
| Comp. ex. 2 | 0.429 | 0.402 | 69 | 104.4 % | 104.6 % |
| Inventive ex. 1 | 0.433 | 0.399 | 71 | 104.1 % | 105.4 % |
| Inventive ex. 2 | 0.430 | 0.400 | 75 | 101.6 % | 101.9 % |
| Inventive ex. 3 | 0.432 | 0.400 | 75 | 104.4 % | 105.4 % |
| Inventive ex. 4 | 0.431 | 0.401 | 74 | 102.7 % | 103.5 % |

FIG 47a

| Example | CIE-x | CIE-y | CRI | Rel. $\Phi_v$(filled potting)/ $\Phi_e$(clear potting) | Rel. LER |
|---|---|---|---|---|---|
| Comp. ex. 1 | 0.379 | 0.377 | 71 | 100 % | 100 % |
| Inventive ex. 1 | 0.380 | 0.378 | 70 | 100.7 % | 101.3 % |

FIG 47b

| Example | T [°C] | $\lambda_{dom}$ LED | CIE-x | CIE-y | CRI | Rel. $\Phi_v$(filled potting)/ $\Phi_e$(clear potting) | Rel. LER |
|---|---|---|---|---|---|---|---|
| Comp. ex. 1 | 25 | 444.8 | 0.372 | 0.368 | 71 | 100 % | 100 % |
|  | 85 | 447.8 | 0.369 | 0.370 | 72 | 101.6 % | 100.9 % |
| Inventive ex. 1 | 25 | 445.0 | 0.373 | 0.370 | 71 | 101.3 % | 101.5 % |
|  | 85 | 448.0 | 0.368 | 0.371 | 71 | 101.3 % | 101.6 % |

FIG 48a

| phosphor | nominal composition | CIE-x | CIE-y | dominant wavelength [nm] | FWHM [nm] | LER [lm/W] | relative LER | relative ext. QE |
|---|---|---|---|---|---|---|---|---|
| comparative example 1 | CaAlSiN$_3$:Eu | 0.656 | 0.341 | 607.9 | 89 | 132 | 100% | 100% |
| embodiment 1 | Sr(Sr$_{0.8}$Ca$_{0.2}$)Si$_2$Al$_2$N$_6$:Eu (3.7%) | 0.659 | 0.340 | 608.2 | 78 | 172 | 130% | 125% |
| embodiment 2 | Sr(Sr$_{0.86}$Ca$_{0.14}$)Si$_2$Al$_2$N$_6$:Eu (10%) | 0.675 | 0.324 | 613.4 | 80 | 127 | 96% | 120% |
| embodiment 3 | Sr(Sr$_{0.86}$Ca$_{0.14}$)Si$_2$Al$_2$N$_6$:Eu (20%) | 0.687 | 0.311 | 618.8 | 85 | 88 | 66% | 99% |

FIG 48e

| solution | comparative example LED1 | embodiment LED1 |
|---|---|---|
| LED dominant wavelength [nm] | 452.3 | 452.3 |
| green phosphor | LuAG:Ce | LuAG:Ce |
| red phosphor | CaAlSiN$_3$:Eu | Sr(Sr$_{0.8}$Ca$_{0.2}$)Si$_2$Al$_2$N$_6$:Eu (3.7%) |
| total phosphor concentration | 11.8% | 13.0% |
| green:red ratio | 6.3:1 | 31:1 |
| CIE x/y (unfiltered) | 0.286 / 0.273 | 0.286 / 0.272 |
| CIE u'/v' (unfiltered) | 0.200 / 0.431 | 0.201 / 0.430 |
| CIE x/y (red channel, filtered) | 0.653 / 0.330 | 0.650 / 0.333 |
| CIE x/y (green channel, filtered) | 0.292 / 0.590 | 0.295 / 0.587 |
| CIE x/y (blue channel, filtered) | 0.149 / 0.063 | 0.149 / 0.062 |
| CIE u'/v' (red channel, filtered) | 0.463 / 0.525 | 0.456 / 0.526 |
| CIE u'/v' (green channel, filtered) | 0.123 / 0.559 | 0.125 / 0.559 |
| CIE u'/v' (blue channel, filtered) | 0.173 / 0.164 | 0.173 / 0.163 |
| color gamut overlap vs. sRGB / rec. 709 in x/y color space | 98.2% | 98.0% |
| color gamut overlap vs. sRGB / rec. 709 in u'/v' color space | 98.7% | 98.3% |
| relative conversion efficiency | 100% | 105% |
| relative LER | 100% | 104% |

FIG 48h

| solution | comparative example LED2 | embodiment LED2 | embodiment LED3 |
|---|---|---|---|
| LED dominant wavelength [nm] | 450.6 | 446.9 | 450.7 |
| green phosphor | Nitrido-Orthosilicate:Eu | Nitrido-Orthosilicate:Eu | Nitrido-Orthosilicate:Eu |
| red phosphor | CaAlSiN$_3$:Eu | Sr(Sr$_{0.86}$Ca$_{0.14}$)Si$_2$Al$_2$N$_6$:Eu (10%) | Sr(Sr$_{0.86}$Ca$_{0.14}$)Si$_2$Al$_2$N$_6$:Eu (20%) |
| total phosphor concentration | 9.3% | 8.8% | 11.0% |
| green:red ratio | 2.2:1 | 13.5:1 | 12.2:1 |
| CIE x/y (unfiltered) | 0.274 / 0.247 | 0.273 / 0.249 | 0.274 / 0.249 |
| CIE u'/v' (unfiltered) | 0.202 / 0.410 | 0.200 / 0.412 | 0.201 / 0.412 |
| CIE x/y (red channel, filtered) | 0.663 / 0.319 | 0.657 / 0.319 | 0.666 / 0.316 |
| CIE x/y (green channel, filtered) | 0.271 / 0.604 | 0.271 / 0.613 | 0.265 / 0.604 |
| CIE x/y (blue channel, filtered) | 0.151 / 0.057 | 0.154 / 0.057 | 0.150 / 0.060 |
| CIE u'/v' (red channel, filtered) | 0.483 / 0.522 | 0.477 / 0.521 | 0.488 / 0.521 |
| CIE u'/v' (green channel, filtered) | 0.112 / 0.560 | 0.111 / 0.562 | 0.109 / 0.559 |
| CIE u'/v' (blue channel, filtered) | 0.178 / 0.153 | 0.182 / 0.151 | 0.175 / 0.158 |
| color gamut overlap vs. DCI-P3 in x/y color space | 81.6% | 81.7% | 82.7% |
| color gamut overlap vs. DCI-P3 in u'/v' color space | 90.5% | 89.4% | 91.7% |

FIG 49a

| Current [mA] | CIE-x (Comp. ex. 1) | CIE-y (Comp. ex. 1) | CIE-x (Inventive. ex. 1) | CIE-y (Inventive. ex. 1) | $\Phi_v$(filled potting)/ $\Phi_e$(clear potting) | Relative LER (luminous efficiency) |
|---|---|---|---|---|---|---|
| 40 | 0,346 | 0,350 | 0,346 | 0,348 | 101,2% | 101,6% |
| 100 | 0,346 | 0,351 | 0,346 | 0,349 | 101,3% | 101,5% |
| 200 | 0,346 | 0,351 | 0,346 | 0,350 | 101,3% | 101,5% |
| 350 | 0,345 | 0,352 | 0,346 | 0,350 | 101,4% | 101,4% |
| 500 | 0,344 | 0,352 | 0,345 | 0,350 | 101,6% | 101,3% |
| 700 | 0,343 | 0,352 | 0,345 | 0,350 | 101,9% | 101,3% |
| 1000 | 0,342 | 0,351 | 0,344 | 0,350 | 102,1% | 101,2% |

FIG 50a

| Current [mA] | CIE-x (Comp. ex. 2) | CIE-y (Comp. ex. 2) | CIE-x (Inventive. ex. 2) | CIE-y (Inventive. ex. 2) | $\Phi_v$(filled potting)/ $\Phi_e$(clear potting) | Relative LER (luminous efficiency) |
|---|---|---|---|---|---|---|
| 40 | 0,563 | 0,430 | 0,562 | 0,429 | 116,2% | 110,4% |
| 100 | 0,563 | 0,430 | 0,562 | 0,428 | 116,1% | 110,3% |
| 200 | 0,562 | 0,430 | 0,561 | 0,428 | 116,5% | 110,1% |
| 350 | 0,561 | 0,430 | 0,561 | 0,428 | 117,1% | 109,7% |
| 500 | 0,561 | 0,431 | 0,561 | 0,429 | 118,3% | 109,5% |
| 700 | 0,560 | 0,431 | 0,560 | 0,429 | 118,9% | 109,1% |
| 1000 | 0,559 | 0,432 | 0,559 | 0,429 | 117,0% | 108,5% |

FIG 51a

| Example | $\lambda_{dom}$ (blue LED) | Composition of green phosphor | Composition of red phosphor | Total phosphor conc. (% by wt.) | Green/ red ratio | Abs. green conc. (% by wt.) | Abs. red conc. (% by wt.) | CCT/K | CRI | R9 | Rel. conversion efficiency |
|---|---|---|---|---|---|---|---|---|---|---|---|
| Comp. ex. 1 | 446 | $Y_3(Al_{0.6}Ga_{0.4})_5O_{12}$: Ce (ca 2% Ce) | $Sr_{0.7}Ca_{0.3}$ AlSiN$_3$:Eu (0.5% Eu) | 15,0% | 2,0 | 10,0% | 5,0% | 2713 | 81 | 9 | 101% |
| Comp. ex. 2 | 446 | $Lu_3(Al_{0.75}Ga_{0.25})_5O_{12}$: Ce (ca 2.5% Ce) | $(Ca_{0.1}Sr_{0.4}Ba_{0.5})_2$ Si$_5$N$_8$:Eu (3.25% Eu) | 16,7% | 4,6 | 13,7% | 3,0% | 2680 | 80 | 11 | 100% |
| Intentive ex. 1 | 446 | $Y_3(Al_{0.6}Ga_{0.4})_5O_{12}$: Ce (ca 2% Ce) | $Sr(Sr_{0.86}Ca_{0.14})$ Si$_2$Al$_2$N$_6$:Eu (3% Eu) | 15,7% | 7,55 | 13,9% | 1,8% | 2708 | 83 | 10 | 107% |
| Intentive ex. 2 | 446 | $Lu_3Al_5O_{12}$: Ce (ca 1.5% Ce) | $Sr(Sr_{0.80}Ca_{0.20})$ Si$_2$Al$_2$N$_6$:Eu (2% Eu) | 27,5% | 12,4 | 25,4% | 2,1% | 2685 | 81 | 9 | 110% |

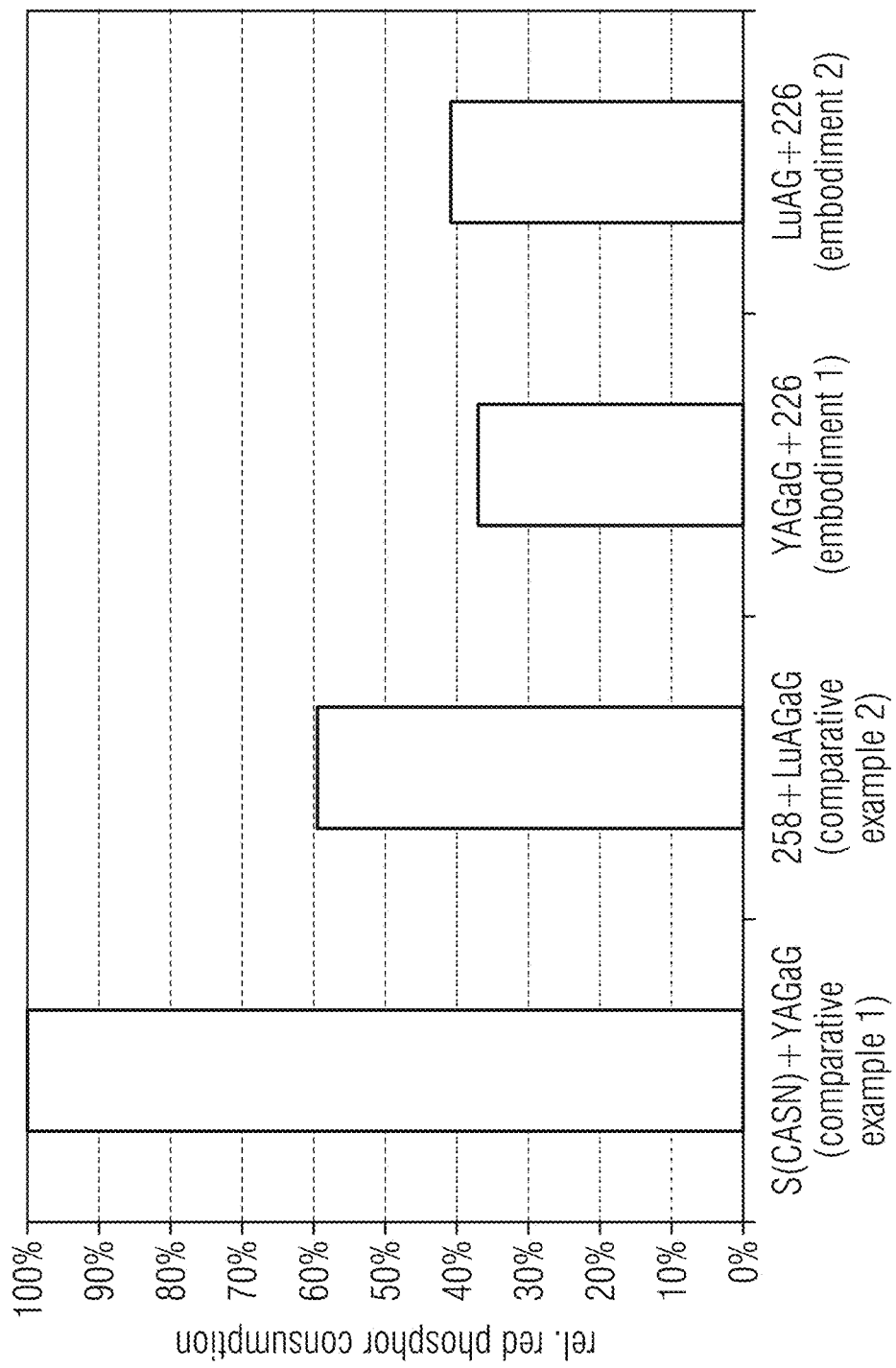

FIG 52a

| Examples | LED wavelength l_dom /nm | Green | Red | Overall conc. | Ratio g/r | Abs. green conc. | Abs. red conc. | CCT/K | CRI | R9 | Rel. conversion efficiency |
|---|---|---|---|---|---|---|---|---|---|---|---|
| Comparative example 1 | 446 | (Lu, Ce)3(Al, Ga)5O12 (25% Ga, ca 2.5% Ce) | (Sr0.4Ca0.6) AlSiN3:0.4% Eu | 18,0% | 2,78 | 13,2% | 4,8% | 2673 | 92 | 55 | 100% |
| Inventive example 1 | 446 | (Lu, Ce)3(Al, Ga)5O12 (25% Ga, ca 2.5% Ce) | Sr(Sr0.84Ca0.16) Al2Si2N6:4.7% Eu | 18,8% | 12,60 | 17,4% | 1,4% | 2711 | 91 | 42 | 109% |
| Inventive example 2 | 446 | (Lu, Ce)3(Al, Ga)5O12 (25% Ga, ca 2% Ce) | Sr(Sr0.84Ca0.16) Al2Si2N6:4.7% Eu | 20,3% | 15,00 | 19,0% | 1,3% | 2707 | 93 | 49 | 105% |
| Inventive example 3 | 446 | (Lu, Ce)3(Al, Ga)5O12 (25% Ga, ca 2% Ce) | Sr(Sr0.8Ca0.2) Al2Si2N6:3.7% Eu | 20,5% | 12,40 | 19,0% | 1,5% | 2670 | 91 | 40 | 107% |
| Inventive example 4 | 446 | (Lu, Ce)3(Al, Ga)5O12 (25% Ga, ca 1.8% Ce) | Sr(Sr0.8Ca0.2) Al2Si2N6:3.7% Eu | 20,5% | 13,00 | 19,0% | 1,5% | 2726 | 92 | 44 | 109% |

FIG 52b

| Example | LED wavelength ldom/nm | Green | Red | Overall conc. | Ratio g/r | Abs. green conc. | Abs. red conc. | CCT/K | CRI | R9 | Conversion efficiency |
|---|---|---|---|---|---|---|---|---|---|---|---|
| Comparative example 1 | 446 | (Lu, Ce)$_3$(Al, Ga)$_5$O$_{12}$ (25% Ga, ca 2.5% Ce) | (Sr$_{0.4}$Ca$_{0.6}$)AlSiN$_3$:0.4% Eu | 18.0% | 2.78 | 13.2% | 4.8% | 2673 | 92 | 55 | 100% |
| Inventive example 1 | 446 | (Lu, Ce)$_3$(Al, Ga)$_5$O$_{12}$ (25% Ga, ca 2.5% Ce) | Sr(Sr$_{0.8}$Ca$_{0.2}$)Al$_2$Si$_2$N$_6$:4.7% Eu | 18.8% | 12.60 | 17.4% | 1.4% | 2711 | 91 | 42 | 109% |
| Comparative example 1 | 446 | (Lu, Ce)$_3$(Al, Ga)$_5$O$_{12}$ (25% Ga, ca 2.5% Ce) | (Sr$_{0.4}$Ca$_{0.6}$)AlSiN$_3$:0.4% Eu | 13.2% | 3.87 | 10.5% | 2.7% | 3974 | 90 | 61 | 100% |
| Inventive example 1 | 446 | (Lu, Ce)$_3$(Al, Ga)$_5$O$_{12}$ (25% Ga, ca 2.5% Ce) | Sr(Sr$_{0.8}$Ca$_{0.2}$)Al$_2$Si$_2$N$_6$:4.7% Eu | 13.5% | 16.00 | 12.7% | 0.8% | 3986 | 90 | 50 | 106% |

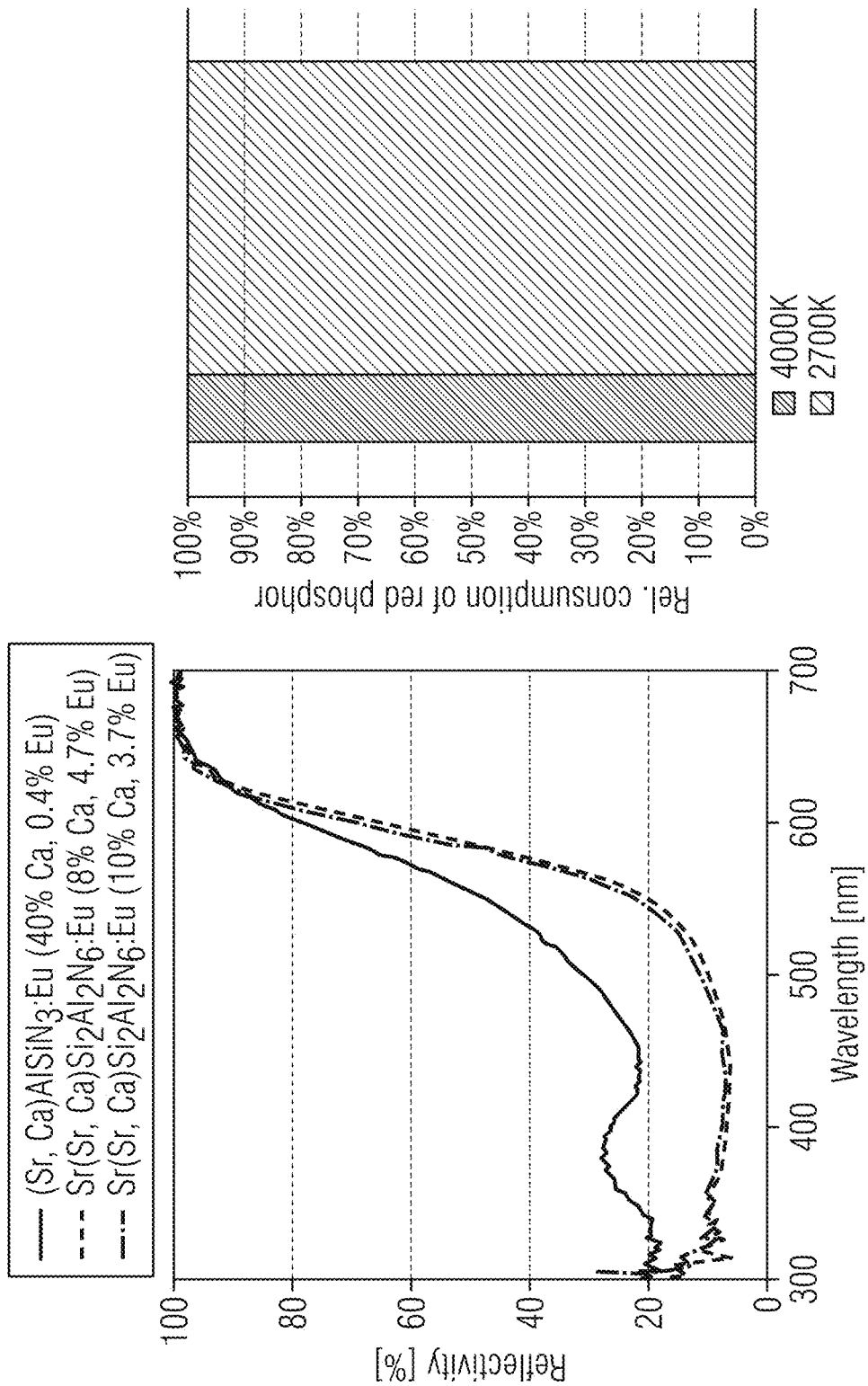

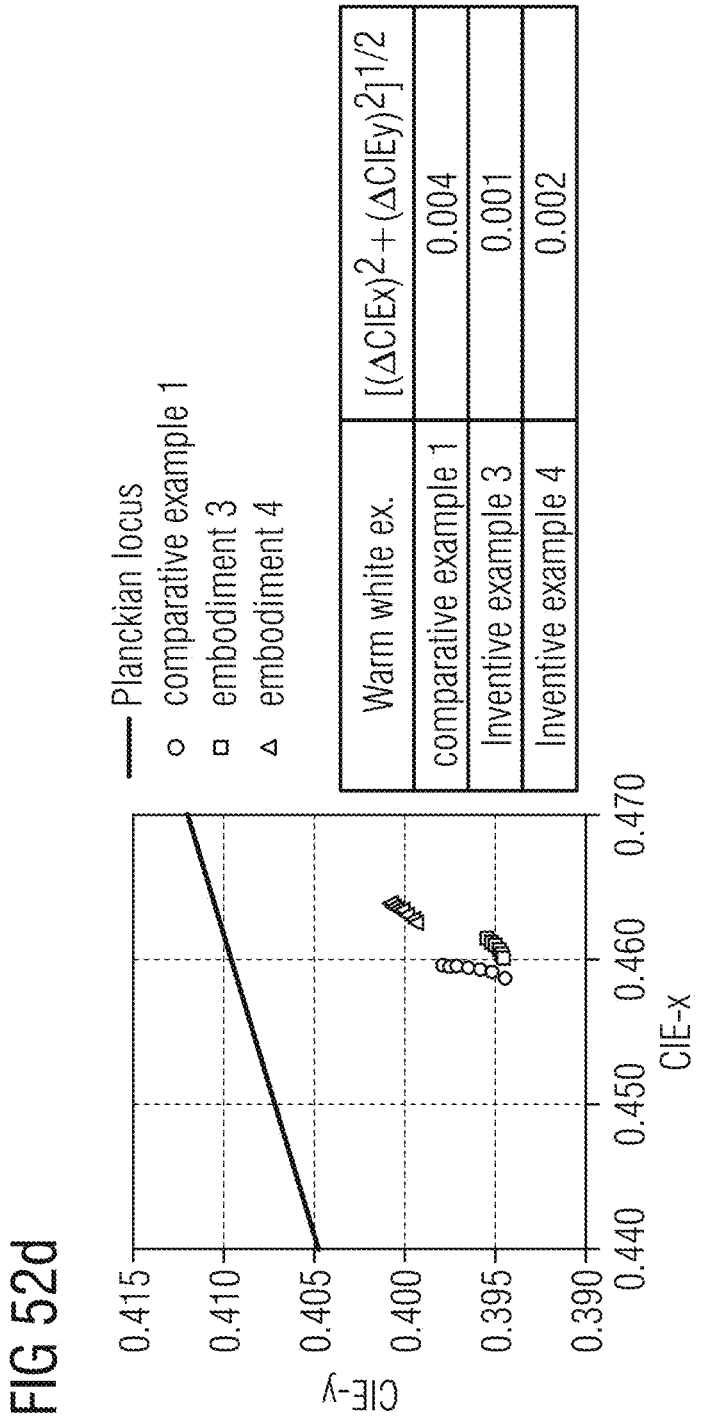

FIG 53a

| Example | λ$_{dom}$ (blue LED at 350 mA) | Composition of yellow-green phosphor | Composition of orange-red phosphor | Composition of red phosphor | Total phosphor conc. (% by wt.) | Yellow-green/red or yellow-green/red ratio |
|---|---|---|---|---|---|---|
| Comp. ex. 1 | 447 | Lu$_3$(Al$_{0.75}$Ga$_{0.25}$)$_5$O$_{12}$:Ce (2% Ce) | CaAlSi(N, O)$_3$:Eu (0.4% Eu) | - | 21.5% | 2.4:1 |
| Comp. ex. 2 | 447 | Lu$_3$(Al$_{0.75}$Ga$_{0.25}$)$_5$O$_{12}$:Ce (2% Ce) | (Ca$_{0.025}$Sr$_{0.475}$Ba$_{0.5}$)$_2$Si$_5$N$_8$:Eu (2.5% Eu) | CaAlSi(N, O)$_3$:Eu (0.4% Eu) | 19.0% | 3.6:0.2:0.8 |
| Inventive ex. 1 | 447 | Lu$_3$(Al$_{0.75}$Ga$_{0.25}$)$_5$O$_{12}$:Ce (2% Ce) | (Sr$_{0.5}$Ba$_{0.5}$)$_2$Si$_5$N$_8$:Eu (1% Eu) | Sr(Sr$_{0.8}$Ca$_{0.2}$)Si$_2$Al$_2$N$_8$:Eu (4.5% Eu) | 20.6% | 13.7:0.14:0.86 |
| Inventive ex. 2 | 447 | Lu$_3$(Al$_{0.75}$Ga$_{0.25}$)$_5$O$_{12}$:Ce (2% Ce) | Sr(Sr$_{0.86}$Ca$_{0.14}$)Si$_2$Al$_2$N$_6$:Eu (0.8% Eu) | Sr(Sr$_{0.80}$Ca$_{0.2}$)Si$_2$Al$_2$N$_6$:Eu (4.5% Eu) | 20.6% | 13.6:0.11:0.89 |

FIG 53b

| Example | CIE-x | CIE-y | CRI | Rel.Φ$_v$(filled potting)/ Φ$_e$(clear potting) | Rel. LER (luminous efficiency) | Rel.Φ$_e$(filled potting)/ Φ$_e$(clear potting) |
|---|---|---|---|---|---|---|
| Comp. ex.1 | 0,460 | 0,411 | 97 | 100% | 100% | 100% |
| Comp. ex.2 | 0,459 | 0,412 | 94 | 107,5% | 105,9% | 101,5% |
| Inventive ex. 1 | 0,460 | 0,413 | 92 | 120,9% | 115,7% | 104,5% |
| Inventive ex. 2 | 0,460 | 0,409 | 92 | 120,2% | 114,7% | 104,8% |

|  | Phosphor | $\lambda_{dom}$ | LER | LER relative |
|---|---|---|---|---|
| Comparative example 6 | $(Ca_{0.5}Sr_{0.5})_2Si_5N_8:Eu\ (1.2\%)$ | 601 nm | 0.273 | 100% |
| Inventive example 7 | $Sr(Sr_{0.8}Ca_{0.2})Si_2Al_2N_6:Eu\ (1.2\%)$ | 597 nm | 0.389 | 142% |

|  | Phosphor | $\lambda_{dom}$ | LER | LER relative |
|---|---|---|---|---|
| Comparative example 7 | $(Ca_{0.1}Sr_{0.4}Ba_{0.5})_2 Si_5N_8{:}Eu\ (4\%)$ | 597 nm | 0.343 | 100% |
| Inventive example 8 | $Sr(Sr_{0.8}Ca_{0.2}) Si_2Al_2N_6{:}Eu\ (1.2\%)$ | 597 nm | 0.389 | 113% |

FIG 59a

| Nominal composition | R(450-470) | CIE-x: | CIE-y: | LER | ldom [nm] | FWHM [nm] |
|---|---|---|---|---|---|---|
| $Sr_{(1-x)}(Sr_{0.8}Ca_{0.2})_{(1-y)}Cu_{(x+y)}Si_2Al_2N_6 : 2\% Eu (x+y=0.2)$ | 15,6% | 0,646 | 0,352 | 0,260 | 604,8 | 90,0 |
| $Sr_{(1-x)}(Sr_{0.8}Ca_{0.2})_{(1-y)}Zn_{(x+y)}Si_2Al_2N_6 : 2\% Eu (x+y=0.2)$ | 14,8% | 0,648 | 0,350 | 0,275 | 605,4 | 83,2 |
| $Sr_{(1-x)}(Sr_{0.8}Ca_{0.2})_{(1-y)}(La Li)_{(x+y)}Si_2Al_2N_6 : 2\% Eu (x+y=0.2)$ | 11,4% | 0,640 | 0,353 | 0,183 | 604,5 | 146,0 |
| $Sr_{(1-x)}(Sr_{0.86}Ca_{0.14})_{(1-y)}(La Li)_{(x+y)}Si_2Al_2N_6 : 3\% Eu (x+y=0.04)$ | 10,6% | 0,648 | 0,349 | 0,215 | 605,6 | 103,3 |
| $Sr_{(1-x)}(Sr_{0.86}Ca_{0.14})_{(1-y)}La_{(x+y)}Si_{2-(x+y)}Al_{2+(x+y)}N_6 : 3\% Eu (x+y=0.2)$ | 10,0% | 0,464 | 0,352 | 0,234 | 604,8 | 100,3 |

| Nominal composition | R(450-470) | CIE-x: | CIE-y: | LER | Idom [nm] | Centroid WL [nm] | FWHM [nm] |
|---|---|---|---|---|---|---|---|
| Sr(Sr$_{0.8}$Ca$_{0.2}$)Si$_2$Al$_2$N$_6$ : 3% Eu | 7.2% | 0.653 | 0.346 | 0.275 | 606.4 | 641.1 | 77.6 |
| Sr(Sr$_{0.8}$Ca$_{0.2}$)(Si$_{1.98}$C$_{0.02}$)Al$_2$N$_6$ : 3% Eu | 7.8% | 0.656 | 0.343 | 0.258 | 607.3 | 643.8 | 79.8 |
| Sr(Sr$_{0.8}$Ca$_{0.2}$)(Si$_{1.60}$C$_{0.40}$)Al$_2$N$_6$ : 3% Eu | 8.2% | 0.656 | 0.343 | 0.245 | 607.3 | 646.2 | 83.5 |

FIG 61a

| Nominal composition | R(450-470) | CIE-x | CIE-y | LER | ldom [nm] | Centroid WL [nm] | FWHM [nm] |
|---|---|---|---|---|---|---|---|
| Sr(Sr0.8Ca0.2)Si2Al2N6:Eu(1.5%), Ce(1.5%), Li(1.5%) | 13.3% | 0.638 | 0.36 | 0.292 | 602.8 | 602.8 | 88.0 |
| Sr(Sr0.8Ca0.2)Si2Al2N6:Mn(2%) | 79.6% | 0.573 | 0.423 | 0.480 | 590.1 | 590.1 | 85.5 |
| Sr(Sr0.8Ca0.2)Si2Al2N6:Ce(1%) | 45.2% | 0.452 | 0.524 | 0.611 | 572.4 | 572.4 | 126.9 |

FIG 62d

| Composition | rel. Q.E. | CIE-x. | CIE-y. | LER | Centroid WL [nm] | λdom [nm] | FWHM [nm] |
|---|---|---|---|---|---|---|---|
| Sr(Sr$_{0.8}$Ca$_{0.2}$)Si$_2$Al$_2$N$_6$:Eu (2%), Li (0,5%) | 107% | 0.645 | 0.353 | 0.304 | 637.1 | 604.6 | 77.4 |
| Sr(Sr$_{0.8}$Ca$_{0.2}$)Si$_2$Al$_2$N$_6$:Eu (2%) | 100% | 0.644 | 0.355 | 0.284 | 641.0 | 604.1 | 84.5 |

FIG 74a

| $Ca_{1-x}Sr_xAlSiN_3:Eu_y$ | | | m/g | | | | | | | | Color locus | |
|---|---|---|---|---|---|---|---|---|---|---|---|---|
| No. | y | x | $Ca_3N_2$ | $Sr_3N_2$ | $AlF_3$ | $SrF_2$ | $BaF_2$ | $Li_2B_4O_7$ | $LiBF_4$ | $Si_3N_4$ | AlN | $Eu_2O_3$ | CIE x | CIE y |
| 1 | 0.6% | 0.8 | 2.746 | 21.552 | 0.875 | 0.436 | 0 | 0 | 0 | 12.993 | 11.104 | 0.293 | 0.632 | 0.365 |
| 2 | 0.6% | 0.8 | 2.730 | 21.428 | 0.290 | 1.301 | 0 | 0 | 0 | 12.918 | 11.040 | 0.292 | 0.632 | 0.365 |
| 3 | 0.6% | 0.8 | 2.729 | 21.416 | 0.232 | 1.387 | 0 | 0 | 0 | 12.911 | 11.034 | 0.292 | 0.634 | 0.364 |
| 4 | 0.6% | 0.8 | 2.748 | 21.564 | 0.934 | 0.349 | 0 | 0 | 0 | 13.000 | 11.111 | 0.294 | 0.632 | 0.365 |
| 5 | 0.6% | 0.8 | 2.738 | 21.492 | 1.163 | 0 | 0 | 0 | 0 | 12.957 | 11.357 | 0.293 | 0.631 | 0.366 |
| 6 | 0.6% | 0.8 | 2.646 | 20.769 | 1.124 | 1.682 | 0 | 0 | 0 | 12.521 | 10.975 | 0.283 | 0.631 | 0.366 |
| 7 | 0.6% | 0.8 | 2.574 | 20.202 | 1.641 | 2.454 | 0 | 0 | 0 | 12.179 | 10.676 | 0.275 | 0.633 | 0.364 |
| 8 | 0.6% | 0.8 | 2.506 | 19.665 | 2.129 | 3.185 | 0 | 0 | 0 | 11.855 | 10.392 | 0.268 | 0.632 | 0.364 |
| 9 | 0.6% | 0.8 | 2.731 | 21.434 | 0 | 0 | 0 | 0 | 1.295 | 12.922 | 11.326 | 0.292 | 0.635 | 0.363 |
| 10 | 0.6% | 0.8 | 2.735 | 21.463 | 0.581 | 0 | 0 | 0 | 0.648 | 12.939 | 11.342 | 0.292 | 0.633 | 0.364 |
| 11 | 0.6% | 0.8 | 2.719 | 21.340 | 0.000 | 0.864 | 0 | 0 | 0.645 | 12.865 | 11.277 | 0.290 | 0.634 | 0.364 |
| 12 | 0.6% | 0.8 | 2.725 | 21.389 | 0.387 | 0.578 | 0 | 0 | 0.432 | 12.895 | 11.303 | 0.291 | 0.633 | 0.364 |
| 13 | 0.6% | 0.8 | 2.671 | 20.961 | 0 | 0 | 2.369 | 0 | 0 | 12.637 | 11.077 | 0.285 | 0.633 | 0.364 |
| 14 | 0.6% | 0.8 | 2.704 | 21.223 | 0.574 | 0 | 1.199 | 0 | 0 | 12.795 | 11.215 | 0.289 | 0.631 | 0.366 |
| 15 | 0.6% | 0.8 | 2.689 | 21.103 | 0.000 | 0.857 | 1.193 | 0 | 0 | 12.722 | 11.152 | 0.287 | 0.630 | 0.367 |
| 16 | 0.6% | 0.8 | 2.701 | 21.195 | 0.000 | 0 | 1.198 | 0 | 0.640 | 12.778 | 11.200 | 0.289 | 0.636 | 0.361 |
| 17 | 0.4% | 0.6 | 5.741 | 16.896 | 0.305 | 1.368 | 0 | 0 | 0 | 13.581 | 11.905 | 0.204 | 0.636 | 0.360 |
| 18 | 0.4% | 0.6 | 5.738 | 16.886 | 0.244 | 1.458 | 0 | 0 | 0 | 13.573 | 11.897 | 0.204 | 0.635 | 0.361 |
| 19 | 0.4% | 0.6 | 5.776 | 16.999 | 0.920 | 0.459 | 0 | 0 | 0 | 13.664 | 11.977 | 0.206 | 0.637 | 0.359 |
| 20 | 0.4% | 0.6 | 5.779 | 17.009 | 0.982 | 0.367 | 0 | 0 | 0 | 13.672 | 11.984 | 0.206 | 0.638 | 0.358 |

FIG 74b

| Ca$_{1-x}$Sr$_x$AlSiN$_3$:Eu$_y$ | | | m/g | | | | | | | | | | Color locus | |
|---|---|---|---|---|---|---|---|---|---|---|---|---|---|---|
| No. | y | x | Ca$_3$N$_2$ | Sr$_3$N$_2$ | AlF$_3$ | SrF$_2$ | BaF$_2$ | Li$_2$B$_4$O$_7$ | LiBF$_4$ | Si$_3$N$_4$ | AlN | Eu$_2$O$_3$ | CIE x | CIE y |
| 21 | 0.4% | 0.6 | 5.793 | 17.048 | 0.000 | 0 | 0 | 0 | 1.239 | 13.703 | 12.011 | 0.206 | 0.636 | 0.359 |
| 22 | 0.4% | 0.6 | 5.793 | 17.049 | 0.615 | 0 | 0 | 0 | 0.620 | 13.704 | 12.012 | 0.206 | 0.640 | 0.356 |
| 23 | 0.4% | 0.6 | 5.758 | 16.946 | 0 | 0.915 | 0 | 0 | 0.616 | 13.621 | 11.940 | 0.205 | 0.639 | 0.357 |
| 24 | 0.4% | 0.6 | 5.785 | 17.025 | 0 | 0 | 0 | 0.619 | 0.686 | 13.685 | 11.995 | 0.206 | 0.642 | 0.354 |
| 25 | 0.4% | 0.6 | 5.747 | 16.913 | 0 | 1.205 | 0 | 0.418 | 0 | 13.595 | 11.917 | 0.205 | 0.639 | 0.358 |
| 26 | 0.4% | 0.6 | 5.737 | 16.885 | 0 | 1.458 | 0 | 0.245 | 0 | 13.573 | 11.897 | 0.204 | 0.639 | 0.358 |
| 27 | 0.4% | 0.6 | 5.782 | 17.017 | 0 | 0 | 0 | 0.421 | 0.905 | 13.679 | 11.990 | 0.206 | 0.640 | 0.356 |
| 28 | 0.4% | 0.6 | 5.780 | 17.011 | 0 | 0 | 0 | 0.247 | 1.096 | 13.674 | 11.986 | 0.206 | 0.640 | 0.356 |
| 29 | 0.4% | 0.6 | 5.793 | 17.050 | 0.809 | 0 | 0 | 0.421 | 0 | 13.707 | 12.013 | 0.206 | 0.639 | 0.357 |
| 30 | 0.4% | 0.6 | 5.793 | 17.049 | 0.984 | 0 | 0 | 0.248 | 0 | 13.707 | 12.013 | 0.206 | 0.639 | 0.358 |
| 31 | 0.4% | 0.6 | 5.770 | 16.980 | 0.408 | 0.611 | 0 | 0.411 | 0 | 13.651 | 11.964 | 0.205 | 0.639 | 0.358 |
| 32 | 0.4% | 0.6 | 5.725 | 17.196 | 0.486 | 0.728 | 0 | 0.245 | 0 | 13.545 | 11.871 | 0.204 | 0.639 | 0.358 |
| 33 | 0.4% | 0.6 | 5.704 | 17.134 | 0.906 | 0.606 | 0 | 0.122 | 0 | 13.496 | 11.828 | 0.203 | 0.636 | 0.360 |
| 34 | 0.4% | 0.6 | 5.753 | 17.280 | 0.000 | 1.100 | 0 | 0.123 | 0 | 13.611 | 11.929 | 0.205 | 0.637 | 0.360 |
| 35 | 0.4% | 0.6 | 5.793 | 17.049 | 1.107 | 0.000 | 0 | 0.124 | 0 | 13.707 | 12.013 | 0.206 | 0.638 | 0.358 |
| 36 | 0.4% | 0.6 | 5.722 | 17.186 | 0.818 | 0.548 | 0 | 0.122 | 0 | 13.537 | 11.864 | 0.204 | 0.638 | 0.359 |
| 37 | 0.8% | 0.8 | 2.791 | 21.907 | 0.119 | 0 | 0 | 0 | 0 | 13.209 | 11.577 | 0.398 | 0.634 | 0.364 |
| 38 | 1.0% | 0.8 | 2.786 | 21.863 | 0.118 | 0 | 0 | 0 | 0 | 13.183 | 11.554 | 0.496 | 0.638 | 0.360 |
| 39 | 1.2% | 0.8 | 2.780 | 21.820 | 0.118 | 0 | 0 | 0 | 0 | 13.157 | 11.531 | 0.594 | 0.641 | 0.357 |
| 40 | 1.2% | 0.9 | 1.354 | 23.908 | 0.115 | 0 | 0 | 0 | 0 | 12.814 | 11.230 | 0.579 | 0.633 | 0.366 |

FIG 74c

| $Ca_{1-x}Sr_xAlSiN_3:Eu_y$ | | | m/g | | | | | | | | | Color locus | |
|---|---|---|---|---|---|---|---|---|---|---|---|---|---|
| No. | y | x | $Ca_3N_2$ | $Sr_3N_2$ | $AlF_3$ | $SrF_2$ | $BaF_2$ | $Li_2B_4O_7$ | $LiBF_4$ | $Si_3N_4$ | AlN | $Eu_2O_3$ | CIE x | CIE y |
| 41 | 1.2% | 0.875 | 1.704 | 23.397 | 0.116 | 0 | 0 | 0 | 0 | 12.898 | 11.304 | 0.582 | 0.636 | 0.362 |
| 42 | 1.2% | 0.85 | 2.058 | 22.878 | 0.117 | 0 | 0 | 0 | 0 | 12.983 | 11.378 | 0.586 | 0.640 | 0.358 |
| 43 | 1.2% | 0.825 | 2.417 | 22.353 | 0.117 | 0 | 0 | 0 | 0 | 13.069 | 11.454 | 0.590 | 0.642 | 0.356 |
| 44 | 1.2% | 0.925 | 1.009 | 24.413 | 0.114 | 0 | 0 | 0 | 0 | 12.731 | 11.158 | 0.575 | 0.628 | 0.370 |
| 45 | 1.2% | 0.95 | 0.668 | 24.912 | 0.114 | 0 | 0 | 0 | 0 | 12.649 | 11.086 | 0.571 | 0.626 | 0.372 |
| 46 | 1.5% | 0.8 | 2.772 | 21.756 | 0.118 | 0 | 0 | 0 | 0 | 13.118 | 11.497 | 0.740 | 0.645 | 0.353 |
| 47 | 2.0% | 0.8 | 2.759 | 21.649 | 0.117 | 0 | 0 | 0 | 0 | 13.053 | 11.440 | 0.982 | 0.654 | 0.345 |
| 48 | 0.5% | 0.7 | 8.632 | 39.518 | 0.244 | 0 | 0 | 0 | 0 | 27.227 | 23.866 | 0.512 | 0.635 | 0.364 |
| 49 | 0.6% | 0.8 | 5.594 | 43.903 | 0.238 | 0 | 0 | 0 | 0 | 26.468 | 23.200 | 0.598 | 0.638 | 0.361 |
| 50 | 0.5% | 0.7 | 8.632 | 39.518 | 0.244 | 0 | 0 | 0 | 0 | 27.227 | 23.866 | 0.512 | 0.632 | 0.366 |
| 51 | 0.6% | 0.8 | 5.594 | 43.903 | 0.238 | 0 | 0 | 0 | 0 | 26.486 | 23.200 | 0.598 | 0.628 | 0.371 |
| 52 | 0.5% | 0.8 | 5.600 | 43.947 | 0.238 | 0 | 0 | 0 | 0 | 26.494 | 23.223 | 0.499 | 0.624 | 0.375 |
| 53 | 0.6% | 0.9 | 2.724 | 48.097 | 0.231 | 0 | 0 | 0 | 0 | 25.774 | 22.592 | 0.582 | 0.622 | 0.377 |
| 54 | 0.7% | 0.9 | 2.721 | 48.050 | 0.231 | 0 | 0 | 0 | 0 | 25.749 | 22.570 | 0.678 | 0.624 | 0.375 |
| 55 | 0.8% | 0.9 | 2.719 | 48.004 | 0.231 | 0 | 0 | 0 | 0 | 25.724 | 22.548 | 0.774 | 0.626 | 0.372 |
| 56 | 1.0% | 0.9 | 2.713 | 47.911 | 0.231 | 0 | 0 | 0 | 0 | 25.674 | 22.505 | 0.966 | 0.635 | 0.364 |
| 57 | 1.2% | 0.9 | 2.708 | 47.818 | 0.230 | 0 | 0 | 0 | 0 | 25.625 | 22.461 | 1.157 | 0.637 | 0.362 |
| 58 | 0.6% | 0.85 | 4.140 | 46.028 | 0.235 | 0 | 0 | 0 | 0 | 26.116 | 22.892 | 0.590 | 0.624 | 0.374 |
| 59 | 0.9% | 0.9 | 2.716 | 47.957 | 0.231 | 0 | 0 | 0 | 0 | 25.699 | 22.527 | 0.870 | 0.629 | 0.370 |
| 60 | 1.2% | 0.95 | 1.337 | 49.826 | 0.227 | 0 | 0 | 0 | 0 | 25.295 | 22.173 | 1.142 | 0.631 | 0.368 |

| | x | y | ldom [nm] | FWHM [nm] | QI | QE | LER | B |
|---|---|---|---|---|---|---|---|---|
| Sr(Sr0.7Ca0.3)AlSiN3:Eu (0.4%) | 0.628 | 0.37 | 600.5 | 86.7 | 100% | 100% | 100% | 100% |
| Sr(Sr0.8Ca0.2)AlSiN3:Eu (0.6%) | 0.628 | 0.371 | 600.3 | 86.5 | 99% | 110% | 101% | 111% |
| Sr(Sr0.9Ca0.1)AlSiN3:Eu (0.8%) | 0.626 | 0.372 | 600.1 | 79.5 | 99% | 113% | 110% | 125% |

FIG 81

| G | R | ldom [nm] | c | v | CIE x | CIE y | CCT/K | CRI | E |
|---|---|---|---|---|---|---|---|---|---|
| (Lu, Ce)3(Al, Ga)5O12 (25% Ga, 2.5% Ce) | (Ca, Sr, Ba)2Si5N8 (10% Ca, 47% Sr, 50% Ba, 3% Eu) | 601.5 | 15.50% | 4.45:1 | 0.461 | 0.408 | 2669 | 79 | 100.00% |
| (Lu, Ce)3(Al, Ga)5O12 (25% Ga, 2.5% Ce) | (Sr, Ca)AlSiN3 (80% Sr, 0.5% Eu) | 599.4 | 18.00% | 2.5:1 | 0.459 | 0.416 | 2754 | 80 | 101.40% |
| (Lu, Ce)3(Al, Ga)5O12 (25% Ga, 2.5% Ce) | (Sr, Ca)AlSiN3 (80% Sr, 0.6% Eu) | 600.3 | 16.80% | 2.6:1 | 0.461 | 0.408 | 2655 | 81 | 101.50% |
| (Lu, Ce)3(Al, Ga)5O12 (25% Ga, 2.5% Ce) | (Sr, Ca)AlSiN3 (90% Sr, 0.8% Eu) | 600.1 | 16.70% | 3.7:1 | 0.462 | 0.411 | 2681 | 79 | 110.40% |

FIG 83

| G | R | ldom [nm] | c | v | CIE x | CIE y | CCT/K | CRI | E |
|---|---|---|---|---|---|---|---|---|---|
| (Lu, Ce)3(Al, Ga)5O12 (25% Ga, 2.5% Ce) | (Ca, Sr, Ba)2Si5N8 (10% Ca, 47% Sr, 50% Ba, 3% Eu) | 601.5 | 15.50% | 4.45:1 | 0.461 | 0.408 | 2669 | 79 | 100.00% |
| (Lu, Ce)3(Al, Ga)5O12 (25% Ga, 2.5% Ce) | (Sr, Ca)AlSiN3 (80% Sr, 0.5% Eu) | 599.4 | 18.00% | 2.5:1 | 0.459 | 0.416 | 2754 | 80 | 101.40% |
| (Lu, Ce)3(Al, Ga)5O12 (25% Ga, 2.5% Ce) | (Sr, Ca)AlSiN3 (80% Sr, 0.6% Eu) | 600.3 | 16.80% | 2.6:1 | 0.461 | 0.408 | 2655 | 81 | 101.50% |
| (Lu, Ce)3(Al, Ga)5O12 (25% Ga, 2.5% Ce) | (Sr, Ca)AlSiN3 (90% Sr, 1.2% Eu) | 602.4 | 16.50% | 5.5:1 | 0.462 | 0.408 | 2649 | 82 | 105.80% |

FIG 90

| Space group | Cmc2$_1$ | Cell search | P1 (CA only in one layer, unrefined) | P1 final refining |
|---|---|---|---|---|
| Lattice parameters | | | | |
| a | 9.821 Å | 9.825 Å | 9.821 Å | 9.821 Å |
| b | 5.749 Å | 5.752 Å | 5.749 Å | 5.749 Å |
| c | 5.163 Å | 5.165 Å | 5.163 Å | 5.163 Å |
| V | | | 291.5 Å$^3$ | 291.5 Å$^3$ |
| Goodness parameters | | | | |
| R$_p$ | 7.2% | | 7.1% | 6.2% |
| R$_{wp}$ | 11.1% | | 11.0% | 9.6% |
| R$_{bragg}$ | 5.6% | | 3.7% | 3.7% |

PHOSPHOR, METHOD FOR PRODUCING A PHOSPHOR AND USE OF A PHOSPHOR

CROSS-REFERENCE TO RELATED APPLICATIONS

This is a continuation application of U.S. application Ser. No. 15/094,702, entitled "Phosphor, Method for Producing a Phosphor and Use of a Phosphor" which was filed on Apr. 8, 2016 and issued as U.S. Pat. No. 9,719,013 on Aug. 1, 2017 which is a continuation of PCT/EP2014/071544, filed Oct. 8, 2014, which claims priority to German patent application 102013220315.2, filed Oct. 8, 2013, German patent application 102013222144.4, filed Oct. 30, 2013, German patent application 102014102853.8, filed Mar. 4, 2014, German patent application 102014105589.6, filed Apr. 17, 2014, German patent application 102014107984.1, filed Jun. 5, 2014, German patent application 102014108759.3, filed Jun. 23, 2014, and German patent application 102014110058.1, filed Jul. 17, 2014, each of which is incorporated herein by reference in its entirety.

TECHNICAL FIELD

A phosphor is specified. Additionally specified are a process for producing such a phosphor and a use of such a phosphor. A phosphor suitable for use in semiconductor components such as LEDs or laser diodes is specified in EP 2 135 920 and EP 1 696 016.

SUMMARY

Embodiments of the invention provide a phosphor which has comparatively narrow-band spectral emission in the red spectral region.

Embodiments of the invention include an inorganic substance which includes, in its composition, at least the element D, the element A1, the element AX, the element SX and the element NX (where D is one, two or more elements from the group of Mn, Ce, Pr, Nd, Sm, Eu, Tb, Dy, Ho, Er, Tm, alkali metals (Li, Na, K, Rb, Cs) and Yb. A1 is one, two or more elements from the group of the divalent metals not included in D, SX is one, two or more elements from the group of the tetravalent metals, AX is one, two or more elements from the group of the trivalent metals, and NX is one, two or more elements from the group of O, N, S, C, Cl, F) and has the same crystal structure as $Sr(Sr_aCa_{1-a})Si_2Al_2N_6$.

The inventors have found that such a phosphor has a whole series of advantages over conventional phosphors, as described further down.

A phosphor having the same crystal structure as $Sr(Sr_aCa_{1-a})Si_2Al_2N_6$ is defined hereinafter as a phosphor which, as well as the $P2_1$ space group, can additionally also be described in one of space groups 1 to 3 according to the International Tables Crystallography A, i.e. in the following space groups: P1, P2, P$\overline{1}$, and wherein the length of the chemical bonds between the elements Al—N and Si—N calculated from the lattice constants and atomic coordinates according to a Rietveld analysis is within a value of ±15% of the values described in FIG. 22.

In a further embodiment of the present invention, the space group is monoclinic $P2_1$.

In a further embodiment of the present invention, the inorganic substance can be described by the following general formula:

$(D_aAl_b)(D_cAl_d)SX_eAX_fNX_g$ where a+b≤1 and c+d≤1 and where the parameters a, b, c, d, e, f and g fulfill the following conditions:
0≤a≤0.5; 0≤c≤0.5; 0≤b≤1; 0≤d≤1; a+c>0; b+d<2; 0.1≤e≤8; 0.1≤f≤16; 0.8 (f+4/3e+2/3 (b+d))≤g; and g≤1.2 (f+4/3e+2/3 (b+d)).

Preferably, the following conditions apply: 0≤a≤0.1; 0≤c≤0.1; 0≤b≤1; 0≤d≤1; a+c>0; b+d<2; 0.1≤e≤8; 0.1≤f≤16; 0.8 (f+4/3e+2/3 (b+d))≤g; and g≤1.2 (f+4/3e+2/3 (b+d)).

In a further embodiment, the phosphor has a general empirical formula $A1(A1_aM_{1-a})SX_2AX_2NX_6$:D. In this formula, A1 is at least one divalent metallic element, for example Sr, M is another divalent metallic element, for example Ca, SX contains at least one tetravalent element, for example Si and/or C, AX contains at least one trivalent element, for example Al and/or La, and NX contains at least one element selected from the group of N, O, F, Cl.

In addition, the general elements A1, M, SX, AX and NX in this empirical formula may be defined as already described above, i.e. D as one, two or more elements from the group of Mn, Ce, Pr, Nd, Sm, Eu, Tb, Dy, Ho, Er, alkali metals (Li, Na, K, Rb, Cs), particularly Li, Tm and Yb, A1 as one, two or more elements from the group of the divalent metals not included in D, SX as one, two or more elements from the group of the tetravalent metals, e.g. Si, C, Ge, Hf, Zr, Ti, AX as one, two or more elements from the group of the trivalent metals, e.g. Al, La, Ga, In, B, and NX as one, two or more elements from the group of O, N, S, C, Cl, F.

The parameter value a may be between 0.6 and 1.0, or between 0.8 and 1.0. In addition, it may be the case that a<1.

The present invention further provides, in a further embodiment, a phosphor of the general formula:

$Sr(Sr_aM_{1-a})Si_2Al_2(N,X)_6$:D,A,B,E,G,L where the phosphors of the invention are co-doped with the elements A, B, E, G and L and these co-dopants can occupy either positions in the host lattice or interstitial lattice sites. The general element X represents elements such as O or halogen, for example, which especially also serve to balance charge carriers if occupied interstitial lattice sites are present in the crystal lattice or voids are present at lattice sites.

The metal M here is selected from Ca, Ba, Mg alone or in combination, A is selected from divalent metals which are different than M and than the further dopant D used, for example Cu, Zn or combinations thereof, B represents trivalent metals, especially transition or rare earth metals, e.g. La or Pr, and E represents monovalent metals, e.g. Li or other alkali metals such as Cs, Rb, K or Na. G represents tetravalent elements, for example C or Ge, or Hf, Zr, Ti. The element L here represents trivalent elements, for example B, Ga or In.

More particularly, this phosphor may have the following general formula:

$Sr(Sr_aM_{1-a})Si_2Al_2(N,O)_6$:D,A,B,E,G

Hereinafter, rather than the general formula $Sr(Sr_aM_{1-a})Si_2Al_2(N,O)_6$:D,A,B,E,G, the formulae $Sr(Sr_aM_{1-a})Si_2Al_2(N,O)_6$:D and $Sr(Sr_aM_{1-a})Si_2Al_2(N,O)_6$:Eu, $Sr(Sr_aM_{1-a})Si_2Al_2(N)_6$:D and $Sr(Sr_aM_{1-a})Si_2Al_2(N)_6$:Eu are used synonymously for reasons of simplicity.

The dopants may additionally occupy specific positions within the crystal lattice of the phosphors of the invention, for example lattice sites or interstitial lattice sites, and may also replace elements present in the phosphors, so as to result, in a further embodiment, in a phosphor of the following general formula:

$Sr_{(1-x-h)}(Sr_aM_{1-a})_{(1-y-i)}A_{(x+y)}B_{(h+i)/2}E_{(h+i)/2}Si_{(2-z)}$
$G_zAl_{2-v}L_v(N,X)_6$:D

More particularly, the general formula may be as follows:

$$Sr_{(1-x-h)}(Sr_aM_{1-a})_{(1-y-i)}A_{(x+y)}B_{(h+i)/2}E_{(h+i)/2}Si_{(2-z)}G_zAl_2N_6:D$$

where the metal M and the elements A, B and E are the elements just described above, and where $0 \leq x+y \leq 0.4$, preferably $0 \leq x+y \leq 0.3$, further preferably $0.04 \leq x+y \leq 0.3$, x+y may especially be 0.2 or 0.04, and also $0 \leq h+i \leq 0.4$, preferably $0 \leq h+i \leq 0.3$, further preferably $0.04 \leq h+i \leq 0.3$, where it is also possible for no B to be present, such that x=0 and y=0. The parameters h+i may especially be 0.2 or 0.04, where it is also possible for no B and E to be present, such that h=0 and i=0. In this case, the divalent metals A and/or a combination of equal molar proportions of the trivalent and monovalent metals B and E may replace Sr and/or Ca. The parameters x+y, h+i and z may be selected independently of one another. In addition, it is also possible for each of x and y and h and i independently to be 0.

G represents tetravalent elements, for example C or Ge, which replace Si, where the parameter z is as follows: $0 \leq z \leq 1$, or $0 \leq z \leq 0.5$, or $0.02 \leq z \leq 0.3$, where z may especially be 0.02 or 0.4, or no tetravalent element may be present, such that z=0. The parameter v for the element L may assume the following values: $0 \leq v \leq 1$, and also $0 \leq v \leq 0.5$.

Replacement of Sr and M by A and/or replacement of Sr and M by a combination of B and E can lead to a change in the color locus in the CIE color space, to a change in the dominant wavelength, in the reflection capacity, in the luminous efficiency LER, in the thermal quenching characteristics, in the stability to radiation, in the hydrolysis sensitivity and/or in the FWHM of the phosphor of the invention, and hence open up further ways of adapting the phosphors of the invention for specific applications.

Replacement of Si by G can additionally lead to a significant shift in the wavelength of emission of the phosphor and can thus bring about an improvement in the color rendering index, particularly in the case of rendering of deep red colors. Co-doping with carbon, for example, thus increases the options for achieving particular color loci.

In addition, it is possible that the tetravalent element G, e.g. C, also partly replaces the nitrogen atoms in the phosphors of the invention, in which case G is present as $G^{4-}$, so as to result in the following general structural formula:

$$Sr(Sr_aM_{1-a})Si_2G_{3z}Al_2(N,X)_{6-4z}:D \text{ or}$$

$$Sr(Sr_aM_{1-a})Si_2G_{3z}Al_2N_{6-4z}:D.$$

In a further embodiment of the phosphor, it is possible that each of x+y, h+i and/or z=0, in which case the following general formula is the result:

$$Sr(Sr_aM_{1-a})Si_{(2-z)}G_zAl_2(N,X)_6:D \text{ or}$$

$$Sr(Sr_aM_{1-a})Si_{(2-z)}G_zAl_2N_6:D$$

when x+y=0 (x=0 and y=0) and additionally h+i=0 (h=0 and i=0), or the general formula:

$$Sr_{(1-h)}(Sr_aM_{1-a})_{(1-i)}B_{(h+i)/2}E_{(h+i)/2}Si_2Al_2(N,X)_6:D \text{ or}$$

$$Sr_{(1-h)}(Sr_aM_{1-a})_{(1-i)}B_{(h+i)/2}E_{(h+i)/2}Si_2Al_2N_6:D$$

is the result when z=0 and x+y=0 (x=0 and y=0).

In addition, it is possible for exclusively divalent elements A to replace Sr and M i.e. for no B or E or G to be present, so as to result in the following general formulae:

$$Sr_{(1-x)}(Sr_aM_{1-a})_{(1-y)}A_{(x+y)}Si_2Al_2(N,X)_6:D \text{ or}$$

$$Sr_{(1-x)}(Sr_aM_{1-a})_{(1-y)}A_{(x+y)}Si_2Al_2N_6:D$$

In addition, M in the above formulae may preferably be Ca.

A further embodiment of a phosphor of the invention has the following general formula:

$$Sr_{(1-x)}(Sr_aM_{1-a})_{(1-y)}B_{(x+y)}Si_{2-(x+y)}Al_{2+(x+y)}N_6:D \text{ or}$$

$$Sr_{(1-x)}(Sr_aM_{1-a})_{(1-y)}B_{(x+y)}Si_{2-(x+y)}Al_{2+(x+y)}N_6:D,$$

such that Sr and M, and Si are replaced by a combination of the trivalent metals B and Al, where the following applies here too: $0 \leq x+y \leq 0.4$, preferably $0.04 \leq x+y \leq 0.3$; x+y may especially be 0.2.

All the above mentioned phosphors have strong absorption in the blue spectral region and emit red secondary radiation. In addition, these phosphors have the same crystal structure as $Sr(Sr_aCa_{1-a})Si_2Al_2N_6$, and so crystallize in the space groups P1, P2, P$\bar{1}$, especially in the monoclinic P$2_1$ space group.

A further embodiment of the present invention also provides phosphors of the general formula already described above:

$$Sr_{(1-x-h)}(Sr_aM_{1-a})_{(1-y-i)}A_{(x+y)}B_{(h+i)/2}E_{(h+i)/2}Si_{(2-z)}G_zAl_2N_6:D \text{ or}$$

$$Sr_{(1-x)}(Sr_aM_{1-a})_{(1-y)}B_{(x+y)}Si_{2-(x+y)}Al_{2+(x+y)}N_6:D$$

where D is one, two or more elements from the group of Mn, Ce, Pr, Nd, Sm, Eu, Tb, Dy, Ho, Er, Tm, alkali metals, i.e. Li, Na, K, Rb, Cs, preferably Li and Yb. D is preferably selected from Eu, Ce, Li, Mn and combinations thereof. Preferably, the activator D is selected from at least one element from Eu, Ce, Mn, especially Eu, Ce or Mn, or a mixture of Eu, Ce, Li. By using the latter activators, it is possible with particular efficiency to adjust the color locus of the phosphor in the CIE color space, its dominant wavelength λdom, the luminous efficiency LER, FWHM, and the diffuse reflectance at 450-470 nm.

Another particular possibility is co-doping of Eu-doped phosphors of the invention with alkali metals, i.e. Li, Na, K, Rb, Cs, preferably Li. Co-doping with the alkali metals may especially lead to a decrease in the spectral half-height width FWHM, and result in improved characteristics with regard to thermal quenching, and an improvement in the luminous efficiency.

In a further embodiment of the present invention, the activator D is a combination of Eu and one or more alkali metals, preferably Li. This can lead to a further reduction in the FWHM of the radiation emitted, an improvement in the thermal quenching characteristics and the quantum efficiency.

A general formula of this phosphor having a combination of Eu and Li can be described as follows:

$$Sr_{(1-x-h)}(Sr_aM_{1-a})_{(1-y-i)}A_{(x+y)}B_{(h+i)/2}E_{(h+i)/2}Si_{(2-z)}G_zAl_2N_6:Eu,Li \text{ or}$$

$$Sr_{(1-x)}(Sr_aM_{1-a})_{(1-y)}B_{(x+y)}Si_{2-(x+y)}Al_{2+(x+y)}N_6:Eu,Li$$

In this case, it is possible that the lithium metal ions occupy positions in the host lattice and/or are present at intermediate lattice sites. Balancing of charge carriers is possible by adjusting the Si:Al ratio and/or by partly replacing N with O and/or halogens such as F. Also possible are randomly distributed voids within the cation lattice sites. For this reason, the following general formulae are also suitable for description of phosphors of the invention having Eu and Li as activators, without showing the additional elements A, B, E and G for reasons of clarity, but these may fundamentally be present:

$Li_jSr(Sr_aM_{1-a})Si_{(2-j)}Al_{(2+j)}N_6$:Eu $Sr(Sr_aM_{1-a})Li_jSi_{(2-j)}Al_{(2+j)}N_6$:Eu $Li_{2j+2k+2l}Sr_{1-j}(Sr_{a-k}M_{1-a-l})Si_2Al_2N_6$:Eu $Li_jSr_{1-k}(Sr_aM_{1-a})_{1-l}Si_{2+m}Al_{2-n}N_6$:Eu $Li_j[Sr(Sr_aM_{1-a})]_{1-j}Si_{2+j}Al_{2-j}N_6$:Eu

The following applies to the parameter j: $0 \leq j \leq 0.2$, preferably $0 \leq j \leq 0.15$, further preferably $0 \leq j \leq 0.05$.

In a further embodiment, the phosphor has a general empirical formula $Sr(Sr_aM_{1-a})Si_2Al_2N_6$:D. In this formula, M is Ca and/or Ba. In addition, M may also be selected from the group of Ca, Ba, Zn, Mg and/or Li, alone or in combination. In these cases and the above-described general formulae, the value of a may be 0.6 to 1.0, preferably 0.8 to 1.0 (excluding the boundary values). More particularly, a is chosen at 0.7 to 0.99, further preferably at 0.85 to 0.99, including the boundary values.

The activator D may, in a further embodiment of the invention, be present in molar percentages between 0.1% and 20 mol %, or 0.1% and 10%, or 1 mol %-10 mol %, or 0.5% to 5%, 2-5 mol %, or 0.8% to 3%. Here and hereinafter, percentage figures for the activator, especially Eu, are understood as molar percentages based on the molar proportions of the alkaline earth metals in the particular phosphor.

The activator D may preferably be selected from the metals Eu, Ce, Mn and Li and combinations thereof. In addition, the activator D may be Eu, Mn or Ce, and combinations of Eu, Ce and Li.

With the rising concentration of europium dopant, the dominant wavelength of the emission of the phosphors of the invention moves to higher wavelengths from the orange to the red color region (see FIG. 58a), with a rise in the relative intensity of photoluminescence of 0.1 to about 4 mol % and then a drop again as the activator concentrations of europium continue to rise (see FIG. 58b). Based on the relative intensity of the photoluminescence, a concentration range of 1-10 mol % Eu, or 2-5 mol %, is preferred. Behavior substantially analogous to the relative intensity of photoluminescence is also displayed by the relative photoluminescence intensity assessed by eye, which likewise increases with rising activator concentrations of europium and drops again from about 4 mol % to about 20 mol % (see FIG. 58c). Based on the photoluminescence intensity assessed by eye, activator concentrations of 0.4-10 mol % of Eu, or 1-5 mol % of europium, are preferred.

In at least one embodiment, the phosphor is set up to emit red or orange light. Red or orange light means that the phosphor emits radiation having a dominant wavelength of at least 560 nm, preferably between 585 nm and 640 nm inclusive, especially between 590 nm and 615 nm inclusive.

The dominant wavelength is especially that wavelength which is found to be the point of intersection of the spectral color line of the CIE standard chromaticity diagram with a straight line, this straight line proceeding from the white point in the CIE standard chromaticity diagram and running through the actual color locus of the radiation. In general, the dominant wavelength differs from a wavelength of maximum intensity. More particularly, the dominant wavelength in the red spectral region is at smaller wavelengths than the wavelength of maximum intensity.

In at least one embodiment, the phosphor has a general empirical formula $Sr(Sr_aCa_{1-a})Si_2Al_2N_6$:D. In this formula, D is at least one activating element. Frequently, D is formed by element Eu and/or else Ce. Other or additional activating elements or dopants may be selected from the group of Mn, Ce, Pr, Nd, Sm, Eu, Gd, Tb, Dy, Ho, Er, Tm, Yb, and Lu, each alone or in combination. It is possible that the phosphor includes further elements, for instance in the form of impurities, in which case these impurities taken together should preferably have a maximum proportion by weight in the phosphor of not more than 0.1 permille or 100 ppm or 10 ppm, parts per million.

In at least one embodiment, the phosphor is set up to emit red light and preferably to be excited by blue light.

Phosphors which can be excited in the ultraviolet spectral range into the blue-green spectral range and which emit red light are of great significance for the production of white light-emitting diodes. Specifically in the case of light-emitting diodes having low color temperatures, called warm white light-emitting diodes, and/or in the case of light-emitting diodes having a high color rendering index, phosphors of this kind are required. Phosphors of this kind are also required in a multitude of other applications, for instance for display backlighting, what are called color-on-demand applications or else for orange and red full conversion light-emitting diodes. Use in combination with an organic light-emitting diode, OLED for short, is likewise possible. The phosphor described here is usable for such applications, and likewise for laser applications such as the LARP method.

In at least one embodiment, the phosphor in a powder diffractogram on irradiation with monochromatic Cu—$K_{\alpha 1}$ radiation has a reflection at an angle 2 theta between 36.7° and 37.0°, according to the composition of the phosphor. The exact position of this reflection depends on the general empirical formula of the phosphor. An intensity of this reflection, especially based on a main reflection, is preferably at least 0.3% or 0.5% and/or at most 10% or 8% or 5% or 4%.

In at least one embodiment, the dominant wavelength of the phosphor is at least 596 nm or 598 nm. Alternatively or additionally, the dominant wavelength is at most 610 nm, 606 nm or 604 nm. The wavelength of maximum intensity is, for example, at least 605 nm or 610 nm and/or at most 630 nm or 625 nm.

In at least one embodiment, the phosphor has a spectral half-height width at half the maximum height, FWHM or full-width at half maximum for short, of at least 70 nm or 75 nm or 78 nm. The maximum of this spectral range is preferably 90 nm or 87 nm or 84 nm or 82 nm.

In at least one embodiment, the phosphor has an absorption maximum in the blue spectral region, especially a relative absorption maximum. The blue spectral region especially refers to wavelengths of at least 400 nm and/or of at most 480 nm. For example, the absorption maximum is at least 410 nm or 420 nm and/or at most 450 nm or 440 nm.

The abovementioned values relating to the spectral properties of the phosphor especially apply at room temperature, i.e. at about 300 K.

Additionally specified is a process for producing such a phosphor. Features of the phosphor are therefore also disclosed for the process, and vice versa.

In at least one embodiment, the process has at least the following steps, preferably in the sequence specified:

A) providing reactants in the solid state for Sr, Al, Si and Eu and optionally for Ca, B) mixing the reactants, C) heating the reactants under an inert gas atmosphere, especially nitrogen atmosphere, or under a forming gas atmosphere, to at least 1500° C. and forming a calcined cake, and D) comminuting the calcined cake to give the phosphor.

In at least one embodiment of the process, at least step C) or else all steps are effected at about atmospheric pressure. More particularly, the process in that case is not effected under high pressure conditions. Preferably, the atmospheric pressure and/or a total pressure is between 0.9 bar and 1.5 bar or 0.95 bar and 1.05 bar inclusive.

Reactants and sources used for strontium, aluminum and/or calcium may be the respective pure metals or else metal alloys with the appropriate metals. Reactants used may likewise be silicides, hydrides, nitrides, oxynitrides, halides and/or oxides of these metals. In addition, it is possible to use mixtures of these compounds.

Reactants or sources used for silicon for the production of the phosphor may be a silicon-metal compound, a silicon nitride, an alkaline earth metal silicide, silicon diimide, or a mixture of these compounds. Preference is given to using silicon nitrides and/or silicon metals.

Reactants or sources used for Eu may be metallic europium, a europium alloy, a europium oxide, a europium nitride, europium hydride or a europium halide. It is likewise possible to use mixtures of these compounds. Preference is given to using europium oxide as reactant for europium.

Reactants used for the further tetravalent elements G, e.g. C, the trivalent elements B, e.g. La, the monovalent elements E, e.g. Li, and the divalent elements A other than D and M, e.g. Cu or Zn, may, for example, be the corresponding elements, silicides, hydrides, nitrides, oxynitrides, carbonates, hydroxides, halides and/or oxides of these elements and compounds derived therefrom, for example hydrates. For example, it is possible to use $Mn_2O_3$, $CuO$, $Zn_3N_2$, $La_2O_3$, $Li_2B_4O_7$ and graphite.

In at least one embodiment, a melting agent and/or a flux is used for the improvement of crystallinity and/or to promote crystal growth. For this purpose, preferably chlorides, fluorides, halides and/or boron compounds of the alkaline earth metals used are employed. Combinations of two or more melting agents or fluxes may also be used. Melting agents and/or fluxes used are especially, for example, at least one of the following substances: $LiF$, $LiCl$, $NaF$, $NaCl$, $SrCl_2$, $SrF_2$, $CaCl_2$, $CaF_2$, $BaCl_2$, $BaF_2$, $NH_4Cl$, $NH_4F$, $KF$, $KCl$, $MgF_2$, $MgCl_2$, $AlF_3$, $H_3BO_3$, $B_2O_3$, $Li_2B_4O_7$, $NaBO_2$, $Na_2B_4O_7$, $LiBF_4$. Also suitable are $NH_4HF_2$, $NaBF_4$, $KBF_4$, $EuF_3$ and compounds derived therefrom, for example hydrates.

In at least one embodiment, the starting substances, especially for Sr, Ca, Al and/or Si and also Eu, and optionally also for the further tetravalent elements G, e.g. C, the trivalent elements B, e.g. La, the monovalent elements E, e.g. Li, and the divalent elements A other than D and M, e.g. Cu or Zn, are weighed out according to the general empirical formula of the phosphor. It is possible that the alkaline earth metal components Sr, Ca are also weighed out with an excess, in order to compensate for any evaporation losses that occur during the synthesis. In addition, it is also possible to employ Ba as alkaline earth metal component.

In at least one embodiment, step D) is followed by a step E). In step E), the phosphor is calcined further, which can also be referred to as tempering. The calcination is especially effected at a temperature of at least 1500° C. and preferably under a nitrogen atmosphere or forming gas atmosphere. Forming gas refers to a mixture of $N_2$ and $H_2$.

The temperature of at least 1500° C. in steps C) and/or E) is preferably employed for at least four hours or six hours. For example, in each of steps C) and E), a temperature of 1650° C.±50° C. is employed.

In an alternative embodiment of a process of the invention for preparation of such a phosphor, rather than step E), it is also possible to repeat steps C) and D).

In at least one embodiment, the reactants are mixed in a ball mill or in a tumbling mixer. In the mixing operation, it may be advantageous to choose the conditions such that a large amount of energy is introduced into the mixture, which results in grinding of the reactants. The resultant increase in homogeneity and reactivity of the mixture can have a positive influence on the properties of the resulting phosphor.

By controlled alteration of the bulk density or by modification of the agglomeration of the reactant mixture, it is possible to reduce the formation of secondary phases. In addition, a particle size distribution, a particle morphology and/or a yield of the resulting phosphor can be affected. Techniques of particular suitability for the purpose are screening and pelletizing operations, including use of suitable additives.

In at least one embodiment, a tempering is effected, especially in a crucible made from tungsten, molybdenum or boron nitride. The tempering is preferably effected in a gas-tight oven in a nitrogen atmosphere or in a nitrogen/hydrogen atmosphere. The atmosphere may be flowing or stationary. It is additionally possible for carbon in finely divided form to be present in the oven space. Also possible are multiple tempering steps of the phosphor, in order to improve or to control the crystallinity or particle size distribution. Further advantages may be a lower defect density, associated with improved optical properties of the phosphor and/or a higher stability of the phosphor. Between the heat treatments, the phosphor may be treated in a wide variety of different ways, or it is possible to add substances such as melting agents to the phosphor.

For grinding of the phosphor, it is possible, for instance, to use a mill, a fluidized bed mill or a ball mill. In the grinding operation, it is preferable to ensure that the proportion of splintered grains produced is kept to a minimum, since these can worsen the optical properties of the phosphor.

The phosphor can additionally be washed. For this purpose, the phosphor can be washed in water or in aqueous acids such as hydrochloric acid, nitric acid, hydrofluoric acid, sulfuric acid, organic acids or a mixture of these. The phosphor may alternatively or additionally be washed in an alkali such as sodium hydroxide solution, potassium hydroxide solution, an aqueous ammonia solution or mixtures thereof. Alternatively or additionally, washing in organic solvents such as acetone, propanol and/or phenol is possible. The washing preferably follows after the grinding.

In at least one embodiment, for instance, the empering, further calcining, grinding, sieving and/or washing result in removal of secondary phases, glass phases or other contamination and hence an improvement in the optical properties of the phosphor. It is also possible by this treatment to selectively remove or dissolve small phosphor particles and to influence the particle size distribution for the application. In addition, such a treatment can alter a surface of the phosphor particles in a controlled manner, for example the removal of particular constituents from the particle surface. This treatment can, also in conjunction with a downstream treatment, lead to improved stability of the phosphor. More particularly, the application of a protective layer is possible, as is basically known per se.

Additionally specified is the use of such a phosphor. Features relating to use are therefore also disclosed for the process and the phosphor, and vice versa.

In at least one embodiment, the phosphor is used in a light-emitting diode as radiation source as the first phosphor in a lighting device. The light-emitting diode comprises at least one semiconductor chip that emits in the blue and/or UV spectral region in operation. The phosphor is arranged downstream of the semiconductor chip along a beam path.

The blue and/or UV light produced by the semiconductor chip is partly or fully absorbed by the phosphor and converted to radiation of greater wavelength, especially to red (e.g. D=Eu) or orange (e.g. D=Ce) light. It is possible that at least one further second phosphor which has an emission different than the first phosphor and is especially suitable for generation of green and/or yellow light is present, especially also phosphors having the same structure as the first phosphor. In addition, the light-emitting diode preferably emits mixed radiation including blue light from the semiconductor chip and converted radiation from the phosphor, and also green and/or yellow light from the further phosphor. The primary radiation used may also be UV radiation rather than blue light.

As well as the first phosphor and optionally the second phosphor, it is also possible for further non-luminous particles, for example scattering particles and diffusers, to be present in the beam path of the radiation source.

In the remarks which follow, the composition of the novel phosphor of the invention having the empirical formula $Sr(Sr_aCa_{1-a})Si_2Al_2N_6$:Eu is described. This corresponds to the nominal composition of the samples according to the composition weighed out. However, the Si:Al ratio actually present may also differ from 2:2, which can be expressed by a parameter d. A possible value of d is, for example, between 0 and 0.1, including the boundary values. No distinction of Si and Al by x-ray methods is possible. It is likewise possible that the finished phosphor contains other, further elements which are introduced, for example, via impurities or fluxes in the starting mixture or during the synthesis, especially (but not exclusively) boron and/or carbon and/or oxygen and/or halogens, for example fluorine or chlorine. By virtue of possible evaporations of individual components, there may also be statistical underoccupation of individual positions. This effect too can be detected only with difficulty, if at all, by x-ray analysis.

Therefore, in all embodiments, an empirical formula of the $Sr_{1-e}(Sr_aCa_{1-a})_{1-g}(Si,C)_{2+d}(Al,B)_{2-d}(N,O,F,Cl,C)_6$:Eu type is accordingly a possible description of the phosphor actually present.

For reasons of clarity, hereinafter, however, all embodiments will refer simply to "$Sr(Sr_aCa_{1-a})Si_2Al_2N_6$:Eu"; in that case, the particular empirical formula specified corresponds to the composition weighed out.

In various embodiment a phosphor includes an inorganic substance which includes, in its composition, at least the element D, the element Al, the element AX, the element SX and the element NX (where D is one, two or more elements from the group of Mn, Ce, Pr, Nd, Sm, Eu, Tb, Dy, Ho, Er, Tm, alkali metals (Li, Na, K, Rb, Cs) and Yb, Al is one, two or more elements from the group of the divalent metals not included in D, SX is one, two or more elements from the group of the tetravalent metals, AX is one, two or more elements from the group of the trivalent metals, and NX is one, two or more elements from the group of O, N, S, C, Cl, F) and has the same crystal structure as $Sr(Sr_aCa_{1-a})Si_2Al_2N_6$.

Embodiments provide the phosphor according to the preceding embodiment, wherein the inorganic substance is described by the following general formula: $(D_aAl_b)(D_cAl_d)SX_eAX_fNX_g$, where a+b≤1 and c+d≤1 and where the parameters a, b, c, d, e, f and g fulfill the following conditions: 0≤a≤0.5; 0≤c≤0.5; 0≤b≤1; 0≤d≤1; a+c>0; b+d<2; 0.1≤e≤8; 0.1≤f≤16; 0.8 (f+4/3e+2/3(b+d))≤g; and g≤1.2 (f+4/3e+2/3 (b+d)), where a and c can be as follows: 0≤a≤0.1 and 0≤c≤0.1.

In various embodiments a phosphor has the general formula: $Sr(Sr_aM_{1-a})Si_2Al_2(N,X)_6$:D,A,B,E,G,L, where M is selected from Ca, Ba, Mg alone or in combination, A is selected from divalent metals different than M and D, B=trivalent metals, E=monovalent metals, G=tetravalent elements and L=trivalent elements.

Embodiments provide the phosphor according to any of the preceding embodiments, having the general formula $Al(Al_aM_{1-a})SX_2AX_2NX_6$:D.

Embodiments provide the phosphor according to the preceding embodiments, wherein the parameter a is between 0.6 and 1.0, or between 0.8 and 1.0.

Embodiments provide the phosphor according to any of the preceding embodiments, having the general formula: $Sr_{(1-x-h)}(Sr_aM_{1-a})_{(1-y-i)}A_{(x+y)}B_{(h+i)/2}E_{(h+i)/2}Si_{(2-z)}G_zAl_2N_6$:D with M selected from Ca, Ba, Mg alone or in combination, A selected from divalent metals different than M, for example Cu, Zn or combinations thereof, B=trivalent metals, e.g. La, and E=monovalent metals, e.g. Li, where 0≤x+y≤0.4, preferably 0.04≤x+y≤0.3 and 0≤h+i≤0.4, preferably 0.04≤h+i≤0.3.

Embodiments provide the phosphor according to any of the preceding embodiments, the phosphor having the general formula: $Sr_{(1-x)}(Sr_aM_{1-a})_{(1-y)}B_{(x+y)}Si_{2-(x+y)}Al_{2+(x+y)}(N,X)_6$:D, with B=trivalent metals, e.g. La, and: 0≤x+y≤0.4, preferably 0.04≤x+y≤0.3.

Embodiments of the phosphor according to any of the preceding embodiments, the phosphor having the general formula: $Sr_{(1-x-h)}(Sr_aM_{1-a})_{(1-y-i)}A_{(x+y)}B_{(h+i)/2}E_{(h+i)/2}Si_{(2-z)}G_zAl_2(N,X)_6$:D or $Sr_{(1-x)}(Sr_aM_{1-a})_{(1-y)}B_{(x+y)}Si_{2-(x+y)}Al_{2+(x+y)}(N,X)_6$:D with M selected from Ca, Ba, Mg alone or in combination, A selected from divalent metals other than M, for example Cu, Zn or combinations thereof, B=trivalent metals, e.g. La, and E=monovalent metals, e.g. Li, where D=one, two or more elements from the group of Mn, Ce, Pr, Nd, Sm, Eu, Tb, Dy, Ho, Er, Tm, alkali metals and Yb, preferably selected from Eu, Ce, Li, Mn and combinations thereof.

Embodiments provide the phosphor according to the preceding embodiments, where D=Eu and one or more alkali metals, preferably Li.

Embodiments provide the phosphor according to any of the preceding embodiments, the phosphor having the general formula $Sr(Sr_aM_{1-a})Si_2Al_2N_6$:D where M is selected from the group of Ca, Ba, Zn, Mg.

Embodiments provide the phosphor according to any of the preceding embodiments, the phosphor having the formula: $Sr(Sr_aCa_{1-a})Si_2Al_2N_6$:D where D is at least one activating element selected from the group of Mn, Ce, Pr, Nd, Sm, Eu, Gd, Tb, Dy, Ho, Er, Tm, Yb, and Lu, each alone or in combinations thereof.

Embodiments provide the phosphor according to any of the preceding embodiments, wherein the concentration of the activating element is between 0.1 mol % and 20 mol %, preferably between 0.1% and 10 mol %, or 1 mol % to 10 mol %, based on the concentration of the alkaline earth metals.

Various embodiments provide a process for producing a phosphor according to any of the preceding embodiments, wherein the process includes the steps of A) providing reactants in the solid state for Sr, Al, Si and Eu, and optionally for Ca, and optionally reactants for the elements A, B, E, L and G, B) mixing the reactants, C) heating the reactants under an inert gas atmosphere, preferably nitrogen atmosphere, or under a forming gas atmosphere, to at least 1500° C. and forming a calcined cake, and D) comminuting the calcined cake to give the phosphor.

Embodiments provide the process according to the preceding embodiment, in which the reactant used for Sr, Al and/or Ca is a pure metal, a metal alloy, a silicide, a nitride, hydride, an oxynitride, an oxide, a halide or a mixture thereof, wherein the reactant used for Si is a silicon metal, a silicon nitride, an alkaline earth metal silicide, a silicon diimide or a mixture thereof, and wherein the reactant used for Eu is at least one of the following substances: europium metal, europium oxide, europium nitride, europium hydride, europium halide.

Embodiments provide the process according to previous embodiments in which at least one of the following substances is added as melting agent and/or as flux in step C): LiF, LiCl, NaF, NaCl, $SrCl_2$, $SrF_2$, $CaCl_2$, $CaF_2$, $BaCl_2$, $BaF_2$, $NH_4Cl$, $NH_4F$, KF, KCl, $MgF_2$, $MgCl_2$, $AlF_3$, $H_3BO_3$, $B_2O_3$, $Li_2B_4O_7$, $NaBO_2$, $Na_2B_4O_7$, $LiBF_4$, $NH_4HF_2$, $NaBF_4$, $KBF_4$, and $EuF_3$.

Embodiments provide the process according to any of the previous embodiments, in which, in a step E) that follows step D), calcination of the phosphor is effected at a temperature of at least 1500° C. under forming gas atmosphere.

Embodiments provide the process according to any of the previous embodiments, in which the temperature of at least 1500° C. is maintained for at least 2 h in step C) and/or in step E).

Embodiments provide the process according to any of the previous embodiments, in which the reactants used are $Ca_3N_2$, $Sr_3N_2$, AlN, $Si_3N_4$ and $Eu_2O_3$, and optionally $Mn_2O_3$, CuO, $Zn_3N_2$, $La_2O_3$, $Li_2B_4O_7$ and graphite, wherein the reactants are weighed out such that the following atomic ratio is present: Sr:Ca:Al:Si:Eu=(1+a):(1−a):2:2:y, where y is the proportion of divalent lattice sites which is replaced by Eu, wherein step B) is conducted in an oxygen-free and water-free manner in a nitrogen atmosphere, wherein the flux added is $AlF_3$, $Li_2B_4O_7$ and/or $LiBF_4$, wherein step C) is conducted at a temperature of 1650° C.±50° C. under an $N_2/H_2$ atmosphere for at least 3 h, and wherein at least step C) is conducted at a pressure between 0.9 bar and 1.5 bar inclusive.

Embodiments provide using the phosphor according to any of the previous embodiments in a light-emitting diode, wherein the light-emitting diode includes at least one semiconductor chip that emits blue light in operation, with the luminophone arranged downstream of the semiconductor chip along a beam path.

In various embodiments a phosphor of the general empirical formula $Sr(Sr_aM_{1-a})Si_2Al_2N_6$:D where M is selected from the group of Ca, Ba, Zn, Mg and/or Li is provided Embodiments provide the phosphor according to the preceding embodiment, wherein D is selected from Mn, Ce, Pr, Nd, Sm, Eu, Tb, Dy, Ho, Er, Tm and Yb, preferably D=Ce and Eu.

In various embodiments a lighting device comprises a radiation source that emits primary radiation in the wavelength range between 300 nm and 570 nm, a first phosphor according to any of the preceding embodiments which is disposed in the beam path of the primary radiation source and converts at least a portion of the primary radiation to secondary radiation within an orange to red wavelength range from 570 nm to 800 nm, preferably 580 nm to 700 nm, further preferably 590 nm to 650 nm.

Embodiments provide the lighting device according to the preceding embodiment, additionally including a second phosphor which is disposed in the beam path of the primary radiation source and has a different emission than the first phosphor.

Embodiments provide the lighting device according to the preceding embodiments, additionally including a second phosphor which is disposed in the beam path of the secondary radiation and absorbs and converts at least a portion of the secondary radiation.

Embodiments provide the lighting device according to any of the preceding embodiments, wherein the second phosphor includes the elements M, A, D, E, and X, where M is one or more elements selected from the group consisting of: Mn, Ce, Pr, Nd, Sm, Eu, Tb, Dy, Ho, Er, Tm, and Yb, A is one or more elements selected from the group consisting of divalent metal elements other than M, D is one or more elements selected from the group consisting of tetravalent metal elements, E is one or more elements selected from the group consisting of trivalent metal elements, X is one or more elements selected from the group consisting of: O, N, and F, and which has the same crystal structure as $CaAlSiN_3$.

Embodiments provide the lighting device according to any of the preceding embodiments, wherein the second phosphor has the general structural formula $(Gd,Lu,Tb,Y)_3(Al,Ga,D)_5(O,X)_{12}$:RE with X=halide, N or divalent element, D=tri- or tetravalent element and RE=rare earth metals as activator, especially cerium with an optional co-dopant.

Embodiments provide the lighting device according to the preceding embodiments, suitable for flash applications, having a second phosphor of the general formula $(Gd,Lu,Tb,Y)_3(Al,Ga,D)_5(O,X)_{12}$:RE with X=halide or divalent element, D=tri- or tetravalent element and RE=rare earth metals as activator, especially cerium with an optional co-dopant, wherein the second phosphor is disposed in the beam path of the primary radiation source.

Embodiments provide the lighting device according to the preceding embodiments, suitable for flash applications, wherein the second phosphor has the general formula $Lu_3(Al_{1-x}Ga_x)_5O_{12}$:Ce or $(Lu,Y)_3(Al_{1-x}Ga_x)_5(O)_{12}$:Ce with a cerium content of 0.5-5 mol %, preferably 0.5-2 mol %, based in each case on the rare earth metals, and a gallium content x between 0 and 0.5, preferably between 0.15 and 0.3.

Embodiments provide the lighting device according to the preceding embodiments, suitable for flash applications, wherein the second phosphor has the general formula $(Gd,Y)_3(Al_{1-x}Ga_x)_5O_{12}$:Ce or $(Tb,Y)_3(Al_{1-x}Ga_x)_5(O)_{12}$:Ce with a cerium content of 1.5-5 mol %, preferably 2.5-5 mol %, and a gallium content x of 0 to 0.5, preferably x of 0 to 0.1.

Embodiments provide the lighting device according to any of the preceding embodiments, suitable for flash applications, wherein a second radiation source is additionally present, with phosphors disposed in the beam path thereof that convert the primary radiation thereof to a secondary radiation, and wherein mixing of the secondary radiation from the first and second radiation sources results in an overall emission of radiation from the lighting device.

Embodiments provide the lighting device according to the preceding embodiments, suitable for flash applications, wherein the color range of the converted radiation from the second radiation source is different than the color range of the converted radiation from the first radiation source.

Embodiments provide the lighting device according to the preceding embodiment, suitable for flash applications, wherein the first and second radiation sources can be operated with different currents and a color range of the overall emission radiation from the lighting device can be established via different currents for the first and second radiation sources.

Embodiments provide the lighting device according to either of the preceding embodiments, suitable for flash applications, wherein an optical element, especially a lens, arranged downstream of the phosphors of the first and second radiation sources mixes the secondary radiation from the first and second radiation sources to produce the overall emission of radiation.

Embodiments provide a lighting device for production of a white light having a CRI≥80 according to the preceding embodiments, wherein the first phosphor has the general formula $Sr(Sr_aCa_{1-a})Si_2Al_2N_6:D$ where $0.7\leq a$, preferably $0.8\leq a$, further preferably $0.84\leq a$, and the second phosphor present is a garnet of the general formula $(Gd,Lu,Y,Tb)_3(Al,Ga)_5(O)_{12}:RE$ with RE=rare earth metal, preferably Ce.

Embodiments provide the lighting device for production of a white light having a CRI≥80 according to the preceding embodiment, wherein the second phosphor has the general formula $Y_3(Al_{1-x}Ga_x)_5(O)_{12}:Ce$ where the proportion of Ga is $0.2\leq x\leq 0.6$, preferably $0.3\leq x\leq 0.5$, further preferably $0.35\leq x\leq 0.45$.

Embodiments provide the lighting device for production of a white light having a CRI≥90 according to previous embodiments, wherein the radiation source emits a primary radiation in the wavelength range between 430 nm and 470 nm, preferably 440 and 460 nm, the second phosphor present is a garnet of the general formula $(Gd,Lu,Y,Tb)_3(Al,Ga)_5(O)_{12}:RE$, preferably $(Lu,Y)_3(Al,Ga)_5(O)_{12}:RE$, with RE=rare earth metal, preferably Ce.

Embodiments provide the lighting device for production of a white light having a CRI≥90 according to the preceding embodiment, wherein the metal M in the first phosphor is Sr and Ca and the parameter a is as follows: $0.7\leq a$, preferably $0.8\leq a$, further preferably $0.84\leq a$, and where the proportion of the activator D is ≥1.5%, preferably ≥3.5%, further preferably ≥4.5%.

Embodiments provide the lighting device according to previous embodiments, wherein the second phosphor is selected from at least one phosphor from the group of the following phosphors: a beta-SiAlON of the general formula $Si_{6-z}Al_zO_zN_{8-z}:Eu$ with $0<z\leq 4$, nano-semiconductor materials as quantum dots, nitridoorthosilicates of the general composition $AE_{2-x}RE_xSiO_{4-x}N_x:Eu$ with AE=Sr, Ca, Ba, Mg, RE=rare earth metals, or of the general composition $AE_{2-x}RE_xSi_{1-y}O_{4-x-2y}N_x:Eu$.

Embodiments provide the lighting device according to previous embodiments, suitable for backlighting applications, wherein the first phosphor has the general formula $Sr(Sr_aCa_{1-a})Si_2Al_2N_6:D$ where $0.7\leq a$, preferably $0.8\leq a$, further preferably $0.84\leq a$, and the proportion of the activator D is >=2 mol %, preferably >=3 mol %, further preferably >=4 mol %, and the second phosphor has the general formula $Y_3(Al_{1-x}Ga_x)_5O_{12}:Ce$ with $0.2<=x<=0.6$, preferably $0.3<=x<=0.5$, further preferably $0.3<=x<=0.45$, or $Lu_3(Al_{1-x}Ga_x)O_{12}:Ce$ with $0<=x<=0.6$, preferably $0<=x<=0.4$, further preferably $0<=x<=0.25$, with a cerium content of 0.5-5 mol %, preferably 0.5-3 mol %, further preferably 0.5-2.5 mol %, based in each case on the rare earth metals.

Embodiments provide the lighting device according to previous embodiments, suitable for backlighting applications, wherein the first phosphor has the general formula $Sr(Sr_aCa_{1-a})Si_2Al_2N_6:D$ where $0.7\leq a$, preferably $0.8\leq a$, further preferably $0.84\leq a$, and the proportion of the activator D is >=4 mol %, preferably >=8 mol %, further preferably >=10 mol %, and wherein the second phosphor includes a beta-SiAlON $Si_{6-x}Al_zO_yN_{8-y}:RE_z$ where $0<x<=4$, $0<y<=4$, $0<z<1$ and RE contains one or more elements selected from rare earth metals, preferably at least Eu and/or Yb.

Embodiments provide the lighting device according to previous embodiments, suitable for backlighting applications, wherein the first phosphor has the general formula $Sr(Sr_aCa_{1-a})Si_2Al_2N_6:D$ where $0.7\leq a$, preferably $0.8\leq a$, further preferably $0.84\leq a$, and the proportion of the activator D is ≥4 mol %, preferably ≥8 mol %, further preferably ≥10 mol %, and the second phosphor has a general formula $AE_{2-x}L_xSiO_{4-x}N_x:RE$ and/or $AE_{2-x}L_xSi_{1-y}O_{4-x-2y}N_x:RE$ and/or $AE_2SiO_4:RE$, where AE contains one or more elements selected from Mg, Ca, Sr, Ba and RE contains one or more elements selected from rare earth metals, preferably at least Eu, and L contains one or more elements selected from rare earth metals other than RE, with $0<x\leq 0.1$, preferably $0.003\leq x<=0.02$, and $0<y\leq 0.1$, preferably $0.002\leq y\leq 0.02$.

Embodiments provide the lighting device according to the preceding embodiments, suitable for backlighting applications, wherein the second phosphor, as AE, contains at least Sr and Ba, and the ratio of Sr and Ba is as follows: $0.5\leq Ba:Sr\leq 2$, preferably $0.75\leq Ba:Sr\leq 1.25$.

Embodiments provide the lighting device according to preceding embodiments, suitable for backlighting applications, wherein the first phosphor has the general formula $Sr(Sr_aCa_{1-a})Si_2Al_2N_6:D$ where $0.7\leq a$, preferably $0.8\leq a$, further preferably $0.84\leq a$, and the proportion of the activator D is ≥4 mol %, preferably ≥8 mol %, further preferably ≥10 mol %, and wherein the second phosphor contains quantum dots in the form of nanocrystalline materials including a group II-VI compound and/or a group III-V compound and/or a group IV-VI compound and/or metal nanocrystals, which, on excitation with primary radiation, emit secondary radiation in the green to yellow spectral region with a peak wavelength of 500-560 nm, preferably 510-550 nm, further preferably 520-540 nm.

Embodiments provide the lighting device according to any of the preceding embodiments, wherein the first phosphor is embedded in a first matrix material.

Embodiments provide the lighting device according to the preceding embodiments, wherein the first matrix material is selected from a group of materials consisting of: glass, silicone, epoxy resin, polysilazane, polymethacrylate and polycarbonate, and combinations thereof.

Embodiments provide the lighting device according to any of the preceding embodiments, wherein the first and/or second phosphor is in the form of particles and has a median particle size of 5 to 30 μm.

Embodiments provide the lighting device according to any of the preceding embodiments, wherein the first and/or second phosphor is in the form of a ceramic converter element.

Embodiments provide the lighting device according to any of the preceding embodiments, wherein the second phosphor is embedded in a second matrix material.

Embodiments provide the lighting device according to any of the preceding embodiments, wherein the first phosphor and the second phosphor have been mixed with one another.

Embodiments provide the lighting device according to any of the preceding embodiments, wherein the first phosphor and/or the second phosphor are spaced apart from the radiation source.

Embodiments provide the lighting device according to any of the preceding embodiments, wherein the radiation source comprises an LED, an OLED or a laser.

Embodiments provide the lighting device according to any of the preceding embodiments, wherein a filter or filter particles that absorb(s) the primary radiation and/or partly absorb(s) the secondary radiation is/are additionally present.

Embodiments provide a phosphor for emission of red light, having the general empirical formula $Sr_xCa_{1-x}AlSiN_3$:Eu, where $0.8<x\leq1$, wherein between 0.1% and 5% inclusive of the Sr, Ca and/or Sr/Ca lattice sites have been replaced by Eu, and wherein, in the x-ray structure analysis, the phosphor in orthorhombic description exhibits a reflection (R) having the MILLER indices 1 $\bar{2}$ 1.

Embodiments provide the phosphor according to the preceding embodiment, where $0.85\leq x\leq0.95$, and wherein between 0.35% and 2.2% inclusive of the Sr lattice sites have been replaced by Eu.

Embodiments provide the phosphor according to either of the preceding embodiments, which exhibits, in a powder diffractogram on monochromatic irradiation with Cu—$K_{\alpha1}$ radiation, the reflection (R) having the Miller indices 1 $\bar{2}$ 1 at 2θ between 36.7° and 37.0°.

Embodiments provide the phosphor according to the preceding embodiment, in which the reflection (R), based on a main reflection, exhibits an intensity between 0.3% and 8% inclusive.

Embodiments provide the phosphor according to any of the preceding embodiments,
which has a dominant wavelength between 596 nm and 606 nm inclusive, wherein a breadth of a radiation spectrum emitted by the phosphor at half the maximum height is between 75 nm and 87 nm inclusive, and wherein the phosphor has a relative absorption maximum in the wavelength range between 410 nm and 450 nm inclusive and can be induced to emit radiation with blue light.

Embodiments provide the process for producing a phosphor according to any of the preceding embodiments, having the steps of: A) providing reactants in the solid state for Sr, Al, Si and Eu and optionally for Ca, B) mixing the reactants, C) heating the reactants under a nitrogen atmosphere or under a forming gas atmosphere to at least 1500° C. and forming a calcined cake, and D) comminuting the calcined cake to give the phosphor.

Embodiments provide the process according to the preceding embodiment, in which the reactant used for Sr, Al and/or Ca is a pure metal, a metal alloy, a silicide, a nitride, an oxynitride, an oxide, a halide or a mixture thereof, wherein the reactant used for Si is a silicon metal, a silicon nitride, an alkaline earth metal silicide, a silicon diimide or a mixture thereof, and
wherein the reactant used for Eu is at least one of the following substances: europium metal, europium oxide, europium nitride, a europium halide.

Embodiments provide the process according to any of the previous embodiments, in which at least one of the following substances is added as melting agent and/or as flux in step C): LiF, LiCl, NaF, NaCl, $SrCl_2$, $SrF_2$, $CaCl_2$, $CaF_2$, $BaCl_2$, $BaF_2$, $NH_4Cl$, $NH_4F$, KF, KCl, $MgF_2$, $MgCl_2$, $AlF_3$, $H_3BO_3$, $B_2O_3$, $Li_2B_4O_7$, $NaBO_2$, $Na_2B_4O_7$, $LiBF_4$.

Embodiments provide the process according to any of the previous embodiments, in which, in a step E) that follows step D), calcination of the phosphor is effected at a temperature of at least 1500° C. under forming gas atmosphere.

Embodiments provide the process according to any of the previous embodiments, in which the temperature of at least 1500° C. is maintained for at least 2 h in step C) and/or in step E).

Embodiments provide the process according to any of the previous embodiments, in which the reactants used are $Ca_3N_2$, $Sr_3N_2$, AlN, $Si_3N_4$ and $Eu_2O_3$, wherein the reactants are weighed out such that the following atomic ratio is present: Ca:Sr:Al:Si:Eu=(1−x):x:1:3:y, where y is the proportion of Sr lattice sites which is replaced by Eu, wherein step B) is conducted in an oxygen-free and water-free manner in a nitrogen atmosphere, wherein the flux added is $AlF_3$, $Li_2B_4O_7$ and/or $LiBF_4$, wherein step C) is conducted at a temperature of 1650° C.±50° C. under an $N_2/H_2$ atmosphere for at least 3 h, and wherein at least step C) is conducted at a pressure between 0.9 bar and 1.5 bar inclusive.

Embodiments provide the use of a phosphor according to any of the previous embodiments in a light-emitting diode, wherein the light-emitting diode includes at least one semiconductor chip that emits blue light in operation, with the phosphor arranged downstream of the semiconductor chip along a beam path.

BRIEF DESCRIPTION OF THE DRAWINGS

A phosphor described here is elucidated in detail hereinafter by embodiments with reference to drawings. Identical reference numerals indicate identical elements in the individual figures. However, the drawings are not to scale; instead, individual elements may be shown in excessively large size for better understanding.

FIG. 5 shows a further comparison of spectral data for phosphors or phosphor mixtures;

FIG. 7 shows another comparison of spectral data for phosphors or phosphor mixtures;

FIGS. 11a and 11b show SEM images for further phosphors;

FIG. 19 shows an overview of some structural data known from the literature for nitrides of similar composition;

FIG. 22 shows interatomic distances in the structure $Sr(Sr_aCa_{1-a})Si_2Al_2N_6$;

FIG. 23 shows crystallographic data and positional parameters for the compound $Sr(Sr_aCa_{1-a})Si_2Al_2N_6$;

FIGS. 39a-39zd show starting weights m in g for various reactants for production of conventional and inventive phosphors;

FIGS. 40a and 40b show a table with different parameters for a phosphor according to embodiments and a comparative phosphor and an intensity/wavelength diagram;

FIGS. 41a and 41b show a further table with different parameters for a phosphor according to embodiments and a comparative phosphor and a further intensity/wavelength diagram;

FIGS. 42a and 42b show another table with different parameters for a phosphor according to embodiments and a comparative phosphor and another intensity/wavelength diagram;

FIGS. 43a and 43b show yet another table with different parameters for a phosphor according to embodiments and a comparative phosphor and yet another intensity/wavelength diagram;

FIGS. 44a and 44b show one more table with different parameters for a phosphor according to embodiments and a comparative phosphor and one more another intensity/wavelength diagram;

FIGS. 45a and 45b show a final table with different parameters for a phosphor according to embodiments and a comparative phosphor and a final intensity/wavelength diagram;

FIGS. 46a-46e show various embodiments of lighting devices of the invention that are suitable for streetlighting applications and the optical properties thereof;

FIGS. 47a-47i show further various embodiments of lighting devices of the invention that are suitable for street lighting applications and the optical properties thereof;

FIGS. 48a-48j show embodiments of lighting devices of the invention for backlighting applications and the optical properties thereof;

FIGS. 49a-49g show experimental data for various comparative and inventive examples of lighting devices for flash applications;

FIGS. 50a-50e show further experimental data for various comparative and inventive examples of lighting devices for flash applications;

FIGS. 51a-51h show experimental data for lighting devices according to various comparative and inventive examples for warm white general-purpose lighting applications with high CRI;

FIGS. 52a-52h show further experimental data for lighting devices according to various comparative and inventive examples for warm white general-purpose lighting applications with high CRI;

FIGS. 53a-53d show additional experimental data for lighting devices according to various comparative and inventive examples for warm white general-purpose lighting applications with high CRI;

FIGS. 59a-59g show the composition of phosphors of the invention which have been co-doped with Cu, Zn, La and Li, and their spectra and x-ray diffractograms;

FIGS. 60a and 60b show the nominal composition and the spectra of phosphors of the invention which have been co-doped with carbon;

FIGS. 61a-61d show the nominal composition and the spectra of phosphors of the invention which have been doped with various activators, including europium, cerium, lithium and manganese;

FIGS. 62a-62e show various properties of phosphors of the invention and the x-ray diffractograms thereof, these having been co-doped not only with europium but also with lithium;

FIGS. 74a-74c shows starting weights for modifications of phosphors according to embodiments and the color locus that they emit;

FIG. 81 shows LED efficiencies for various phosphors or phosphor mixtures according to embodiments;

FIGS. 83-87 show schematic diagrams of properties of phosphors on excitation with blue light according to further embodiments;

FIGS. 88-90 show data based on x-ray structure analysis of phosphors according to embodiments;

Figure 1:
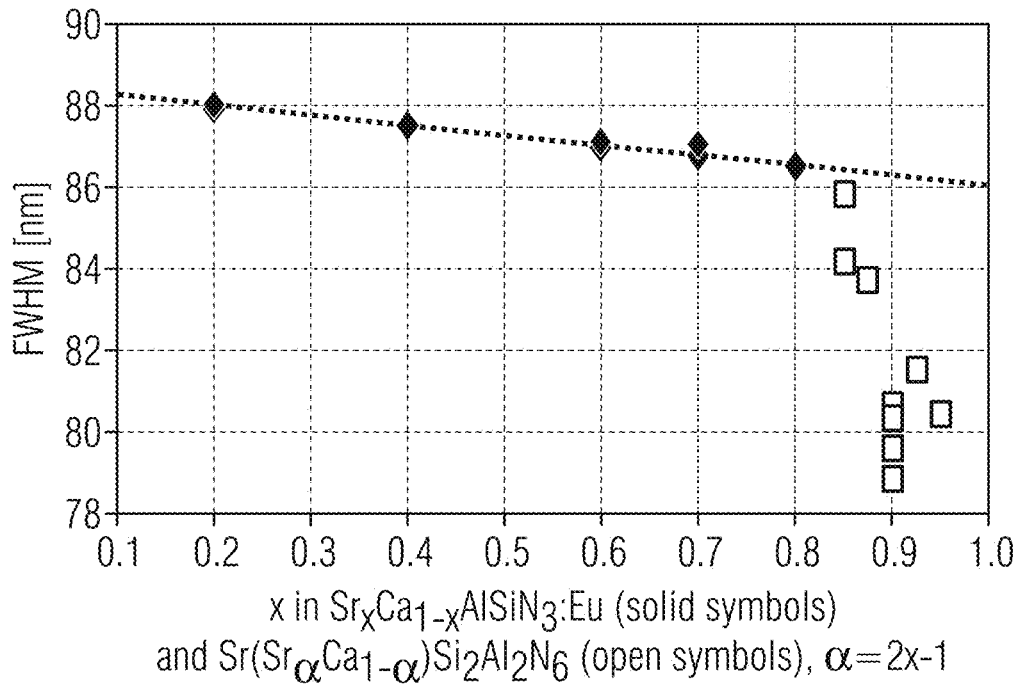
FIG. 1 shows a relationship between x and FWHM.

A phosphor described here is elucidated in detail hereinafter by embodiments with reference to the drawing. Identical reference numerals indicate identical elements in the individual figures. However, the drawings are not to scale; instead, individual elements may be shown in excessively large size for better understanding.

DETAILED DESCRIPTION OF ILLUSTRATIVE EMBODIMENTS

One embodiment of a phosphor described here can be produced as follows: reactants used for the synthesis of the phosphor of the general empirical formula $Sr(Sr_aCa_{1-a})Si_2Al_2N_6$:Eu are the binary nitrides of the constituent elements, i.e. $Ca_3N_2$, $Sr_3N_2$, AlN and $Si_3N_4$. Since these are highly oxidation-sensitive and hydrolysis-sensitive substances, what is called a glovebox is employed, under an $N_2$ atmosphere with $O_2<1$ ppm and $H_2O<1$ ppm. In addition, doping with $Eu^{2+}$ is accomplished using $Eu_2O_3$. The reactants are weighed out such that the following atomic ratio is effectively present, in a simplifying representation: Sr:Ca:Si:Al:Eu=(1+a):(1−a):2:2:y, where y corresponds to the degree of doping, i.e. the proportion of divalent lattice sites which are substituted by Eu. In addition, various fluxes are added; see the above explanation. A reactant mixture is scaled up, for example, to a total starting weight of 50-100 g with retention of the atomic ratios described above. It is also possible to use other total starting weights.

The reactant mixture is introduced, for example, into a PET mixing vessel together with $ZrO_2$ balls and mixed on a roller table in a glovebox for 6 h. Subsequently, the balls are removed from the mixture and the powder is transferred into a closed molybdenum crucible. This crucible is placed into an outer tungsten crucible, a semicircular open tungsten tube, and transferred into a tube furnace. There is a flow of 3 l/min of forming gas with 92.5% $N_2$ and 7.5% $H_2$ through the tubular furnace during the run time. In the tubular furnace, the mixture is heated at a rate of 250 K/h to 1650° C., kept at this temperature for 4 h and then cooled down at 250 K/h to 50° C. The calcined cake formed is taken out after the furnace has cooled, comminuted with a mortar mill and sieved through a sieve having a mesh size of 31 μm. The sieve fraction <31 μm is the phosphor used.

The sieving may optionally be followed by a further calcining, tempering and/or washing operation and/or a coating operation.

Illustrative starting weights m in g and resulting color loci CIE x, CIE y, also referred to as chromaticity coordinates, of the emission spectrum of the particular phosphor in the CIE standard chromaticity diagram on excitation with blue light at 460 nm and on complete absorption of the blue light are listed in tabular form in FIGS. 39a-39zd. Starting weights with x≤0.8 refer here to conventional phosphors, whereas starting weights with x>0.8 (corresponding to a>0.6) indicate phosphors of the invention.

FIG. 1 shows the relationship between x and FWHM.

FIG. 1 shows a dependence of a spectral half-height width FWHM of the emission on the Sr content for embodiments of the novel phosphor $Sr(Sr_aCa_{1-a})Si_2Al_2N_6$:Eu of the invention (open symbols) compared to known phosphors composed of the $Sr_xCa_{1-x}AlSiN_3$:Eu system (solid symbols). The Sr content corresponds to the parameter a for $Sr(Sr_aCa_{1-a})Si_2Al_2N_6$:Eu or x for $Sr_xCa_{1-x}AlSiN_3$:Eu, where a=2x−1. The parameter a is indicated by alpha in the figure.

For the phosphor according to the prior art, a very small change in the FWHM with rising x is observed (dotted line). The novel phosphor of the invention, in contrast, at an Sr content of a>0.6, which would correspond in formal terms to an x>0.8 in the case of the known phosphor, exhibits a very significant change in the half-height width FWHM with rising a. Moreover, the half-height width of the novel phosphor is significantly lower than in the case of the phosphor according to the prior art. The parameter a can therefore readily be chosen between 0.6 and 1.0, or between 0.8 and 1.0; boundary values are preferably excluded. Very good properties are exhibited especially by phosphors having a value of a between 0.64 and 0.96, or between 0.82 and 0.98, including the boundary values. Particular preference is given to a range for a between 0.68 and 0.92, or between 0.84 and 0.96, including the boundary values.

In the case of use of constituents other than Sr, Ca, the value of a may also be much lower.

Figure 2:
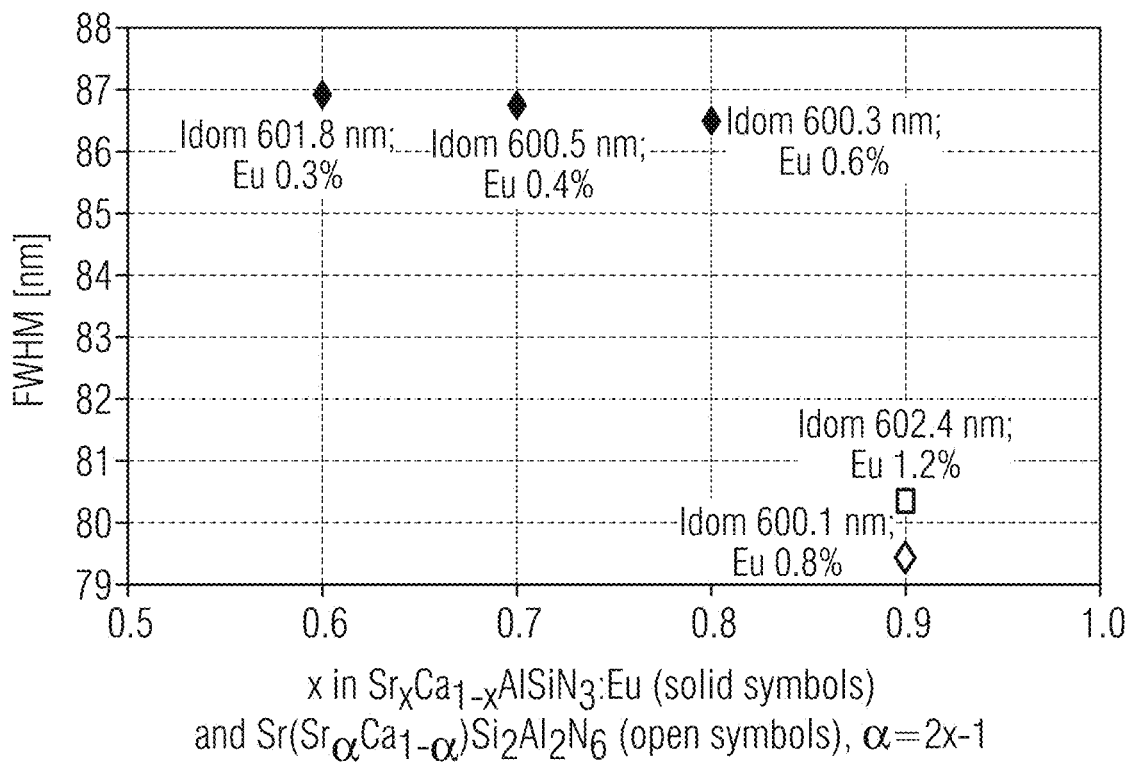
FIG. 2 shows the ratio between a dominant wavelength and the FWHM for various phosphors.

FIG. 2 shows the ratio between ldom (dominant wavelength) and the FWHM for various phosphors.

What is shown here is a dependence of a spectral half-height width FWHM of the emission on the Sr content for embodiments of the novel phosphor $Sr(Sr_aCa_{1-a})Si_2Al_2N_6$:Eu of the invention (open symbols) compared to known phosphors composed of the $Sr_xCa_{1-x}AlSiN_3$:Eu system (solid symbols). The Sr content corresponds to the parameter a for $Sr(Sr_aCa_{1-a})Si_2Al_2N_6$:Eu or x for $Sr_xCa_{1-x}AlSiN_3$:Eu, where a=2x−1. In addition, a dominant wavelength ldom of the spectrum emitted by the phosphor and the Eu content are specified.

Surprisingly, a phosphor $Sr(Sr_aCa_{1-a})Si_2Al_2N_6$:Eu of the invention with a=0.8 (which would correspond to x=0.9), with a comparable dominant wavelength ldom, shows a much smaller half-height width FWHM compared to conventional phosphors of the $Sr_xCa_{1-x}AlSiN_3$:Eu type. The much smaller half-height width FWHM is virtually independent of the Eu content of the sample used.

Figures 3, 4:
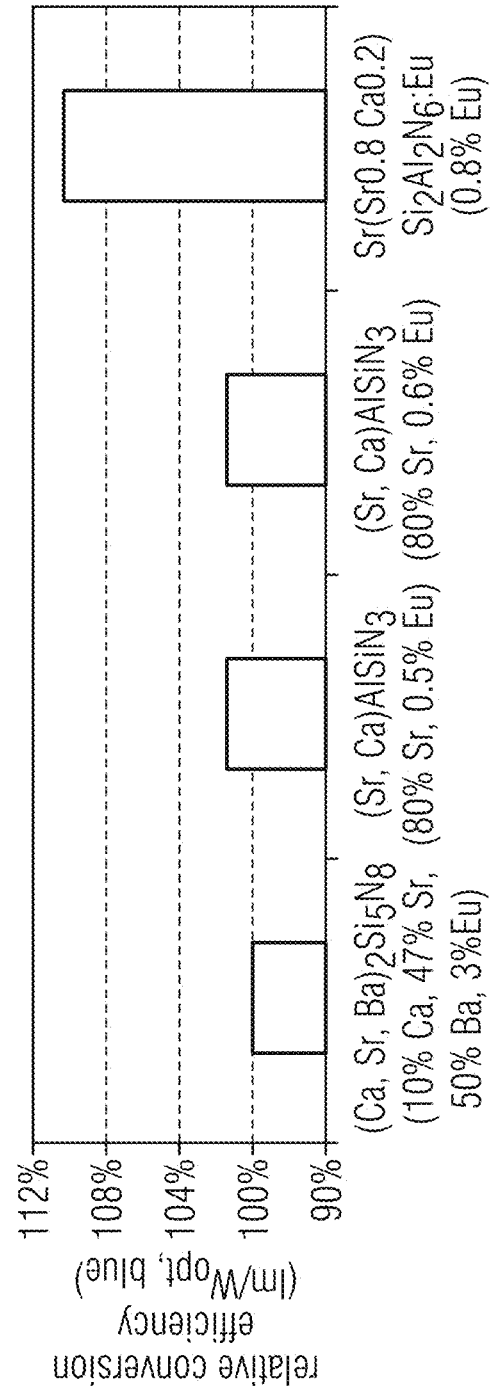
FIG. 3 shows a comparison of spectral data for phosphors or phosphor mixtures.
FIG. 4 shows LED efficiencies for various phosphors or phosphor mixtures.

FIG. 3 gives a comparison of spectral data.

Phosphors of the novel type feature a small half-height width FWHM of the emission compared to the previously known phosphor (within the range of 79 to 81 compared to 86 to 88 for the prior art) and a very high luminous efficiency LER (110 to 111% compared to 100 to 101% for the prior art) combined with simultaneously high internal quantum efficiency QI and external quantum efficiency QE (about 113% compared to 100% to 110% for the prior art); see the table in FIG. 3. In addition, a relative brightness B is specified (about 125 to 126% compared to about 100 to 111% for the prior art). To calculate the external quantum efficiency QE, the mean re-emission within the range from 450 nm to 470 nm was employed; measurement was effected in pressed powder tablets at an excitation wavelength of 460 nm. Also specified are the x and y components of the color locus.

FIG. 4 compares the LED efficiency of various systems. The relative conversion efficiencies of various warm white light-emitting diodes, LEDs for short, are shown. In each case, a mixture of two phosphors that emit green and red light was used, with the green light-emitting phosphor G remaining the same (such phosphors, especially garnets doped with Ce, are known per se) and the red-emitting phosphor R being varied. Stated on the abscissa axis for four different phosphors is the type of red-emitting phosphor R. The ordinate axis gives the relative efficiency E. The phosphors were excited with a blue-emitting semiconductor chip having a dominant wavelength of 446 nm.

All the phosphor mixtures were adjusted such that, in the CIE standard chromaticity diagram, a color locus close to Planck with a correlated color temperature CCT of about 2700 K is attained. The color rendering index CRI of all the LEDs measured is 80±1. All the red phosphors R used show a comparable dominant wavelength of about 600.5 nm±1 nm.

Further details of the phosphor mixtures as shown in FIG. 4 can be found in the table in FIG. 5. Additionally stated are the relative efficiency E (rel. eff.), a phosphor concentration c (phosphor concentration) and a ratio V of the green phosphor G and the red phosphor R (ratio green/red).

Figure 6:
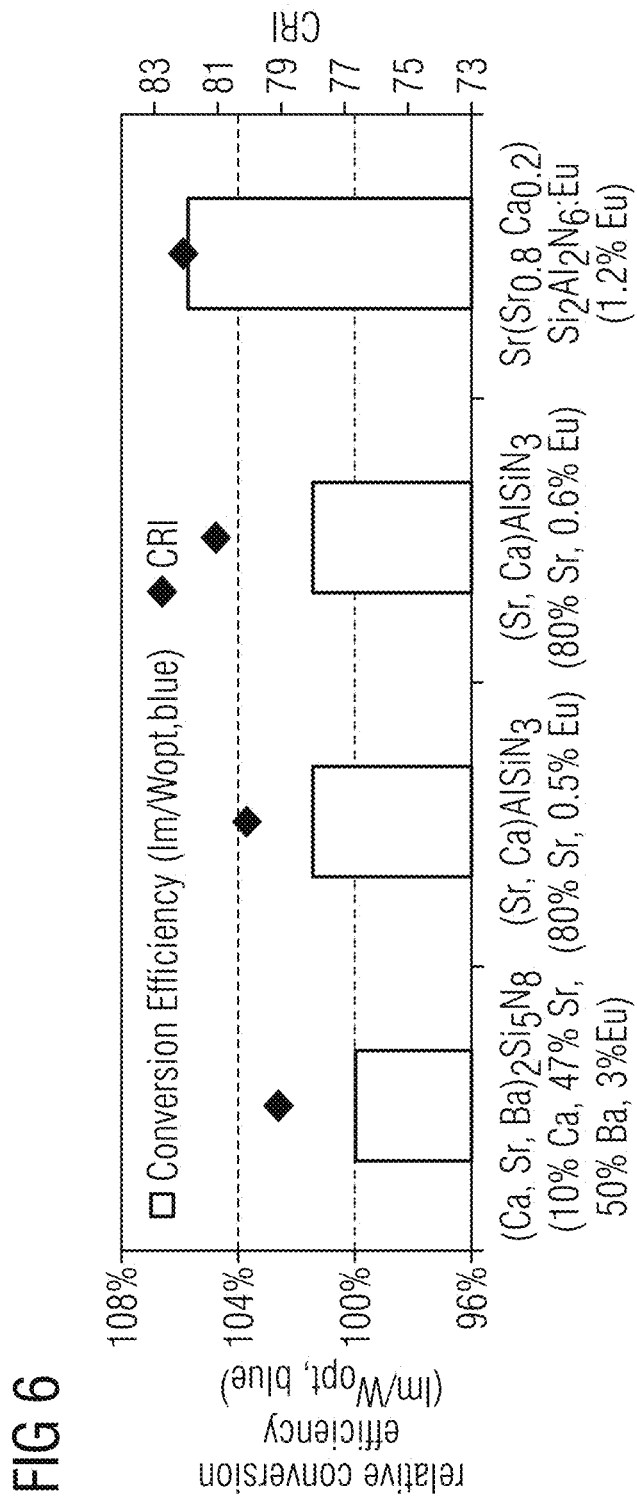
FIG. 6 shows LED efficiencies for various phosphors or phosphor mixtures.

FIG. 6 shows a comparison of conversion efficiency and color rendering index for various warm white light-producing LEDs. In each case, a mixture of two phosphors was used, with the green phosphor G being kept constant and the red phosphor R being varied, analogously to the table in FIG. 5. All the phosphor mixtures were adjusted such that a color locus close to Planck having a correlated color temperature CCT of about 2700 K is achieved. The relative conversion efficiency E (left-hand ordinate), the relative size of which is illustrated by the columns in FIG. 6, of a warm white light-producing LED with the novel phosphor having a total of 90% Sr at the alkaline earth metal site (shown on the right) shows a much higher efficiency (about 6% compared to a 258-nitride) and simultaneously improved color rendering CRI (right-hand ordinate, the color rendering index is symbolized as black rhombuses) compared to LEDs having a previously known red phosphor with only 80% Sr (1113-calsin type) or an even lower Sr content (258-nitridosilicate type) at the alkaline earth metal site.

Further data relating to the LED measurements from FIG. 6 can be found in the table in FIG. 7, analogously to the table in FIG. 5. The efficiency E (rel. eff.) of a warm white light-producing LED with correlated color temperature CCT of about 2700 K having a novel red phosphor having a total Sr content of 90% at the alkaline earth metal site (together with a green garnet phosphor) is distinctly higher here too, and an elevated color rendering index CRI is also achievable.

Figure 8:
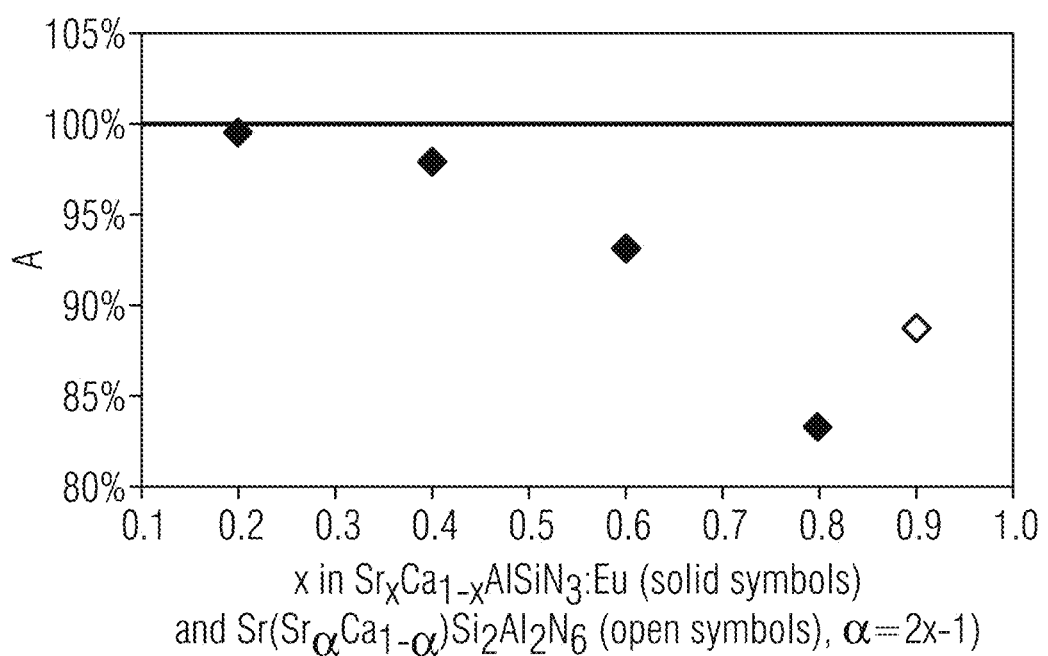
FIG. 8 shows a red phosphors subjected to a hydrolysis test with respect to air humidity.

Red phosphors composed of the novel material system were subjected to a hydrolysis test in order to assess aging stability of the phosphor with respect to air humidity; see FIG. 8. Specifically, red phosphors composed of the $Sr_xCa_{1-x}AlSiN_3$:Eu material system and one embodiment of the novel $Sr(Sr_aCa_{1-a})Si_2Al_2N_6$:Eu phosphor of the invention were subjected to a hydrolysis test, in order to assess the aging stability of the phosphor with respect to air humidity. For this purpose, the phosphor powders were stored at 130° C. and 100% rel. air humidity for 40 h. The relative absorption A of the phosphors in the blue spectral region (450-470 nm) as ordinate was measured both before and after this treatment. A measure of the stability of a phosphor to hydrolysis, i.e. the decomposition of the phosphor in the presence of water, is considered to be the decrease in the absorption capacity in the blue spectral region. With increasing Sr content, according to FIG. 8, for phosphors composed of the known SrxCa1-xAlSiN3:Eu system, a significant increase in hydrolysis sensitivity is observed (solid rhombuses). Surprisingly, however, the novel $(Sr(Sr_aCa_{1-a})Si_2Al_2N_6$:Eu) phosphor with a=0.8 (corresponding in a formal sense to 90% Sr in a representation as x=0.9) is more hydrolysis-stable (hollow rhombus) than a previously known $Sr_xCa_{1-x}AlSiN_3$:Eu phosphor having an Sr content of 80% (x=0.8).

Figure 9A:
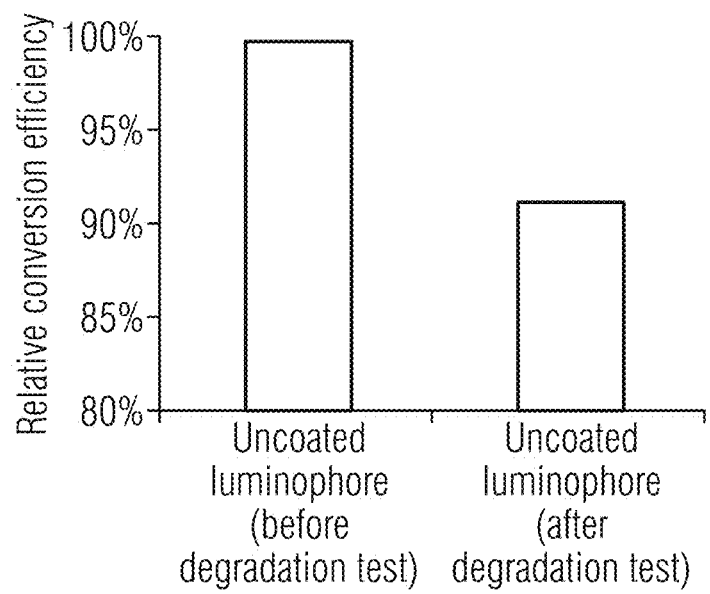
FIGS. 9a and 9b show an examination of moisture stability of phosphors according to embodiments.
Figure 9B:
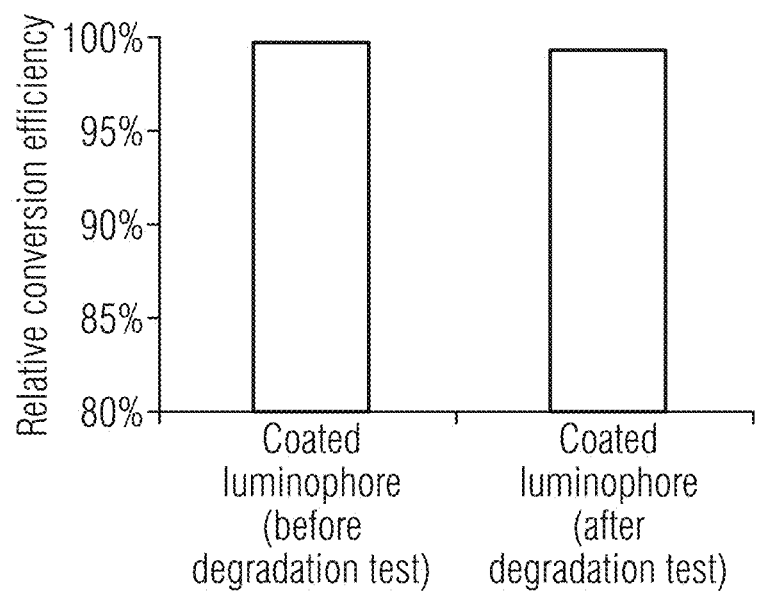

In FIG. 9, the moisture stability of the novel phosphor is examined.

To improve the stability of the novel phosphor of the invention to hydrolysis, specimens of the phosphor were coated with an inert material (SiO2) after the synthesis.

Untreated and subsequently coated samples were subjected to a hydrolysis test, in order to assess the aging stability of the phosphor to air humidity. For this purpose, the phosphor powders were stored at 130° C. and 100% rel. air humidity for 48-56 h. The quantum efficiency and the absorption of the phosphors in the blue spectral region (450-470 nm) were measured both before and after this treatment. A measure of the stability of a phosphor with respect to hydrolysis (decomposition of the phosphor in the presence of water) is considered to be the change in the relative conversion efficiency (calculated from the quantum efficiency and absorption in the spectral range of 450-470 nm) before and after the degradation test. The coating distinctly improves the stability.

Figure 10A:
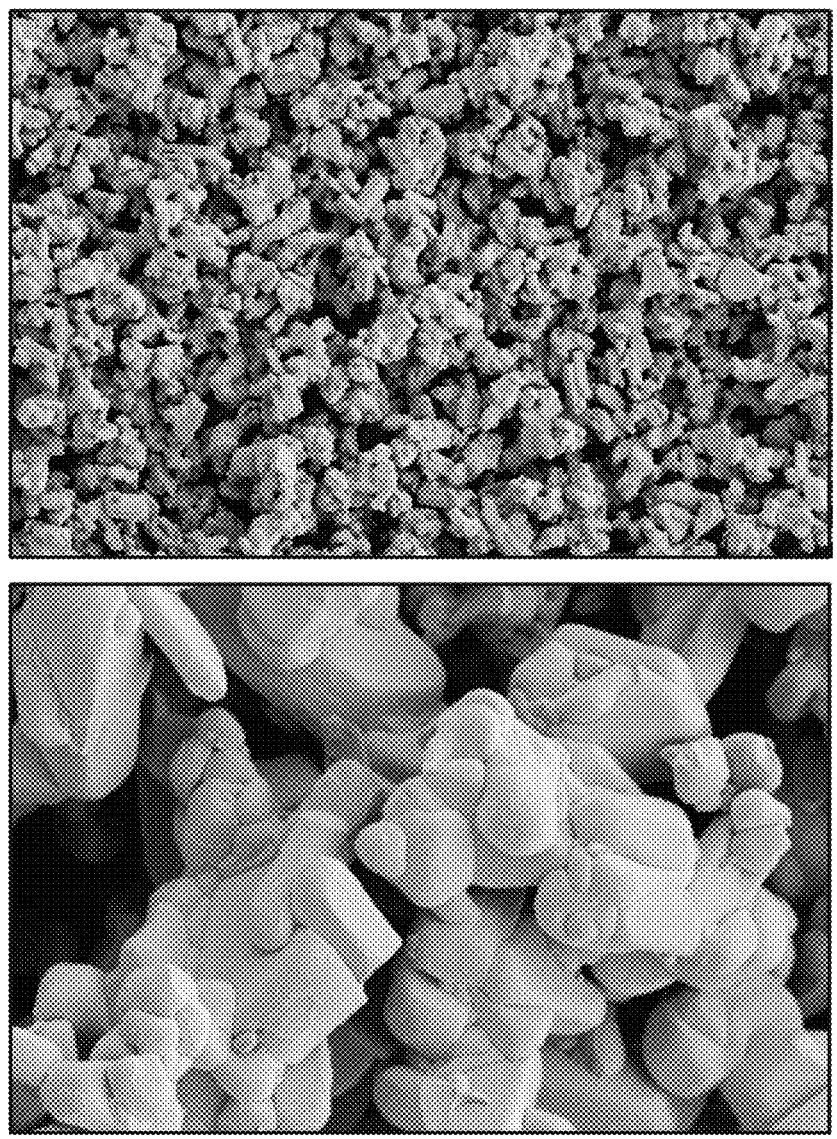
FIGS. 10a and 10b show SEM images for various phosphors.
Figure 10B:
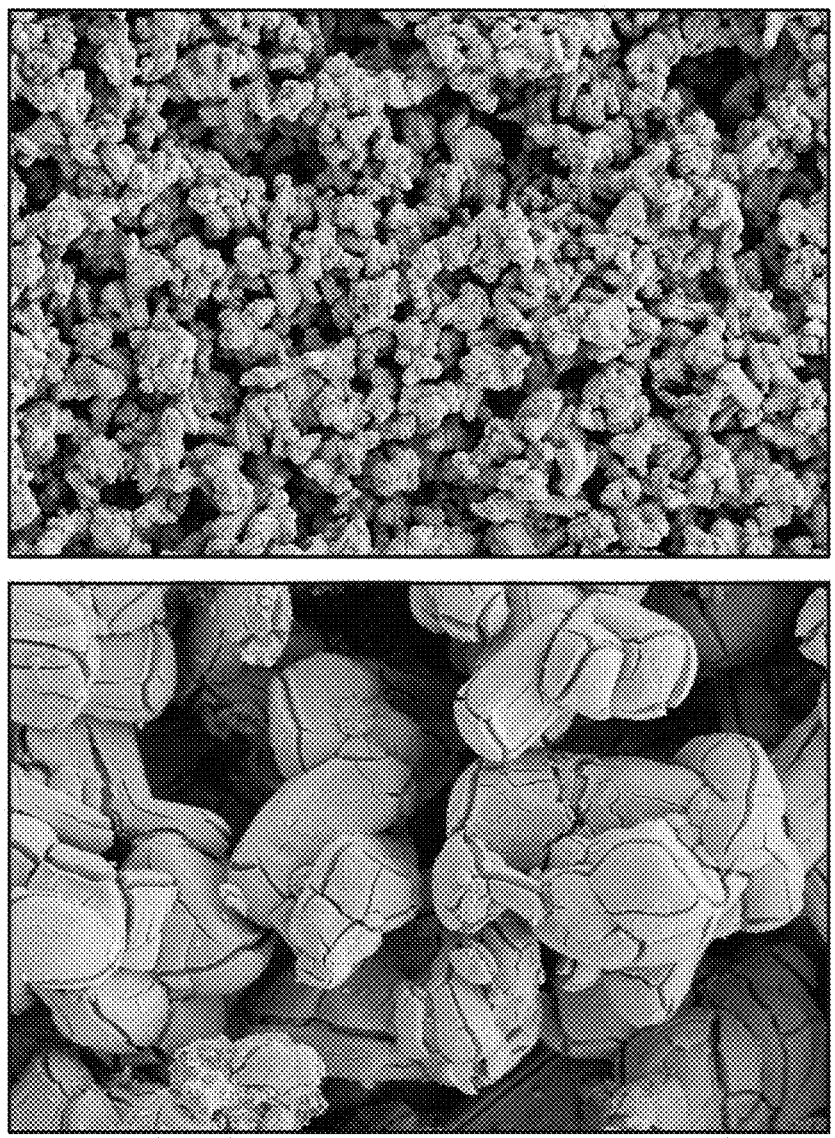

FIGS. 10a and 10b show SEM images of various phosphors.

The figures show SEM images of the uncoated phosphor before and after the degradation process in different magnifications. What are shown are embodiments of the novel phosphor having the composition $Sr(Sr_{0.8}Ca_{0.2})Si_2Al_2N_6$: 1.2% Eu.

Formation of cracks in the individual phosphor grains is apparent in the SEM images of the sample after the degradation test.

Figure 11A:
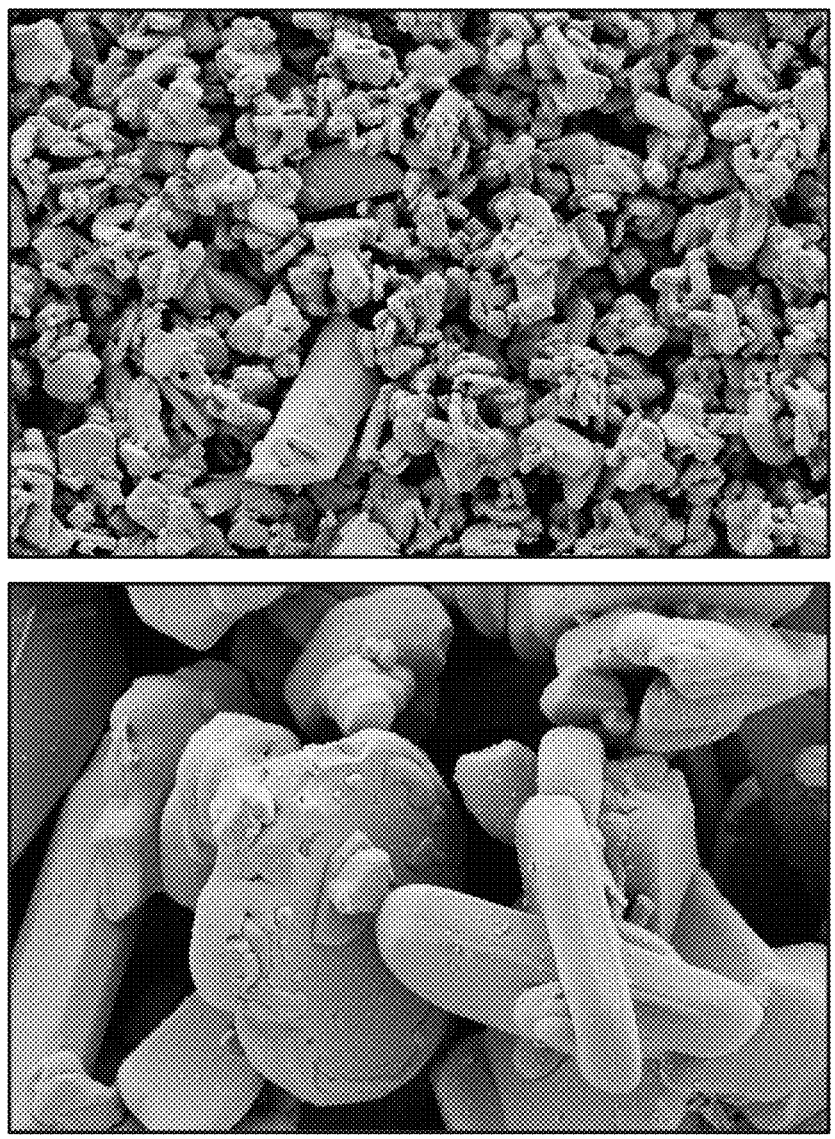

FIGS. 11a and 11b show SEM images of various phosphors.

The figures show SEM images of the coated phosphor before and after the degradation process in different magnifications.

What are shown are embodiments of the novel phosphor having the composition $Sr(Sr_{0.8}Ca_{0.2})Si_2Al_2N_6$:1.2% Eu.

No formation of cracks in the phosphor grains is apparent in the SEM images of the sample after the degradation test.

Figure 12:
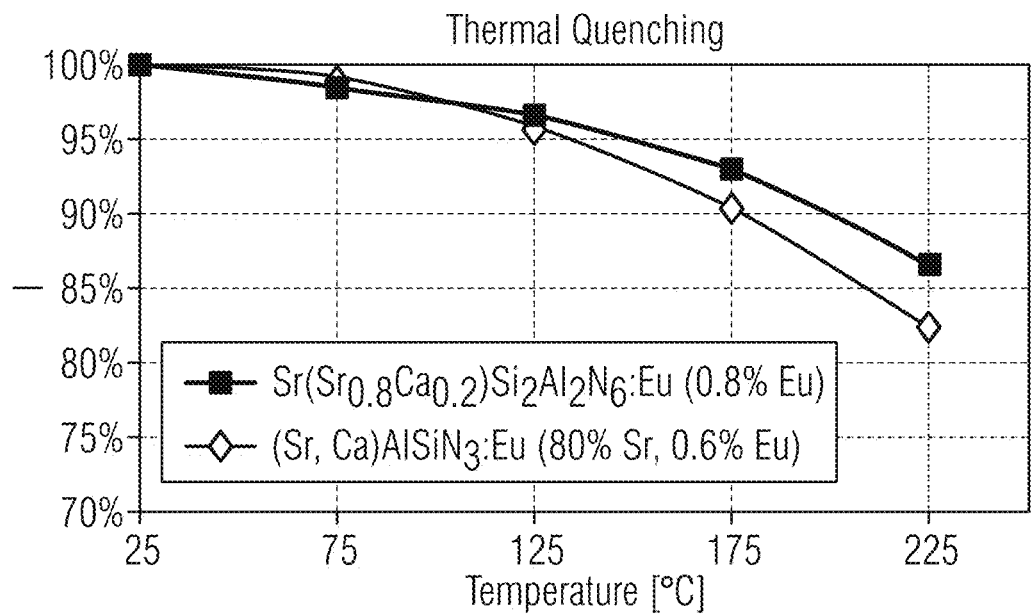
FIG. 12 shows thermal quenching characteristics of two red phosphors in comparison to one another.

FIG. 12 shows thermal quenching characteristics of two red phosphors in comparison to one another. Both phosphors have a comparable emission color, with a dominant wavelength of approximately 600 nm. Surprisingly, the novel phosphor $Sr(Sr_aCa_{1-a})Si_2Al_2N_6$:Eu of the invention with a=0.8 (solid squares), in spite of a higher Eu content (0.8%), has a smaller decrease in emission intensity I (ordinate) with rising temperature compared to the reference phosphor composed of the known $Sr_xCa_{1-x}AlSiN_3$:Eu system; in that case, the Eu content is 0.6% (hollow rhombuses).

Figure 13:
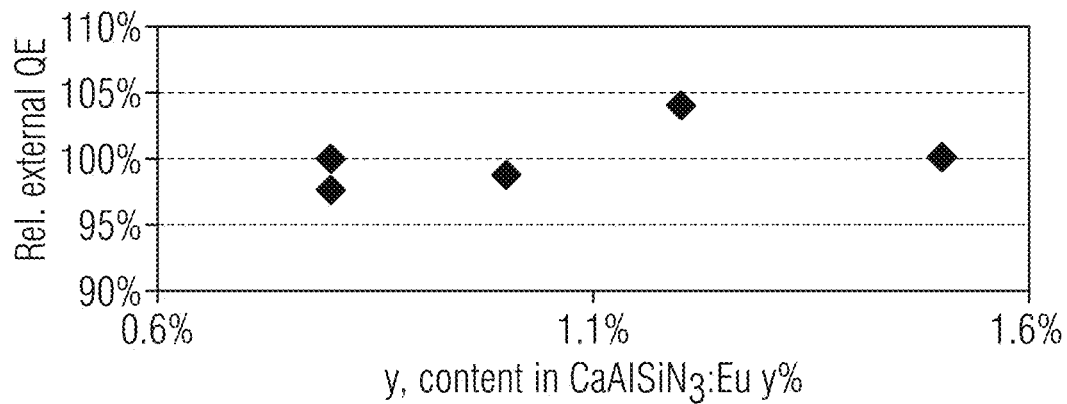
FIG. 13 shows the relative external quantum efficiency QE for a previously known phosphor composed of 1113-calsin system.

FIG. 13 shows the relative external quantum efficiency QE for a previously known phosphor composed of the 1113-calsin system. The data are taken from EP 2 135 920.

What is reported therein about these phosphors composed of the CaAlSiN3:Eu system (referred to hereinafter as calsin) is that the conversion efficiency stagnates with rising activator content (>0.8% Eu).

Figure 14:
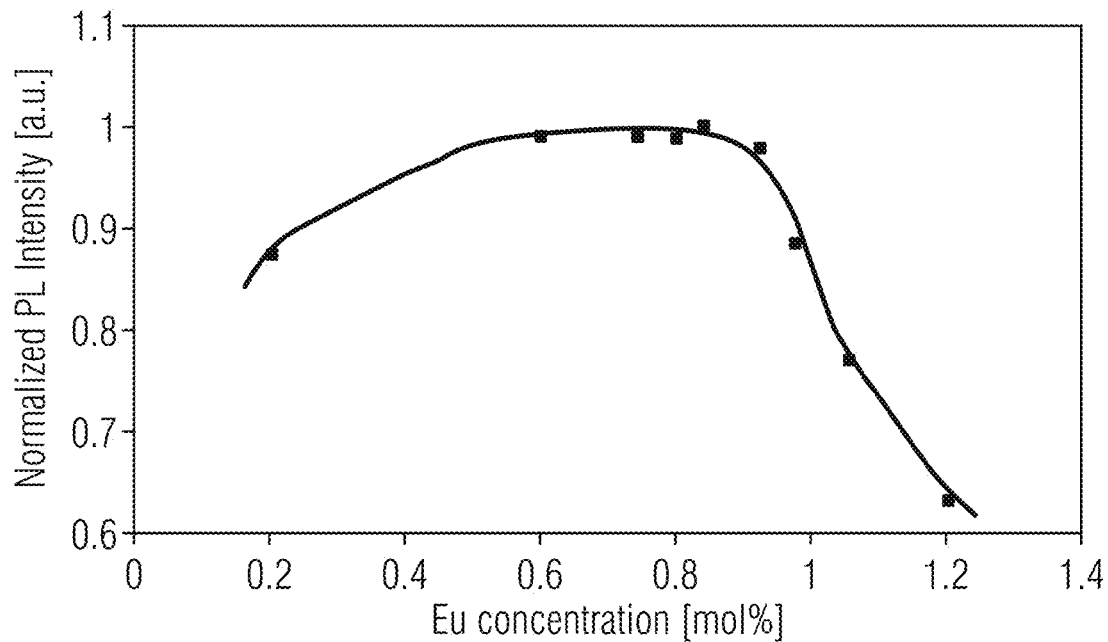
FIG. 14 shows another relative external quantum efficiency QE for a previously known phosphor.

Similar behavior is also known for SCASN. The described phosphor composed of the (Sr,Ca)AlSiN3:Eu system with Sr content 80% shows strong dependence of the relative emission intensity of the luminescence signal on the activator content. This behavior is described, for example, in H. Watanabe et al., J. Electrochem. Soc., 2008, 155 (3), F31-F36. The behavior is shown in FIG. 14.

In contrast to pure calsin (cf. FIG. 13), the photoluminescence intensity actually collapses from a value of about 0.8% Eu or more for SCASN and only attains 60% of the maximum value.

Similar behavior is also described in U.S. Pat. No. 8,274,215.

Figure 15:
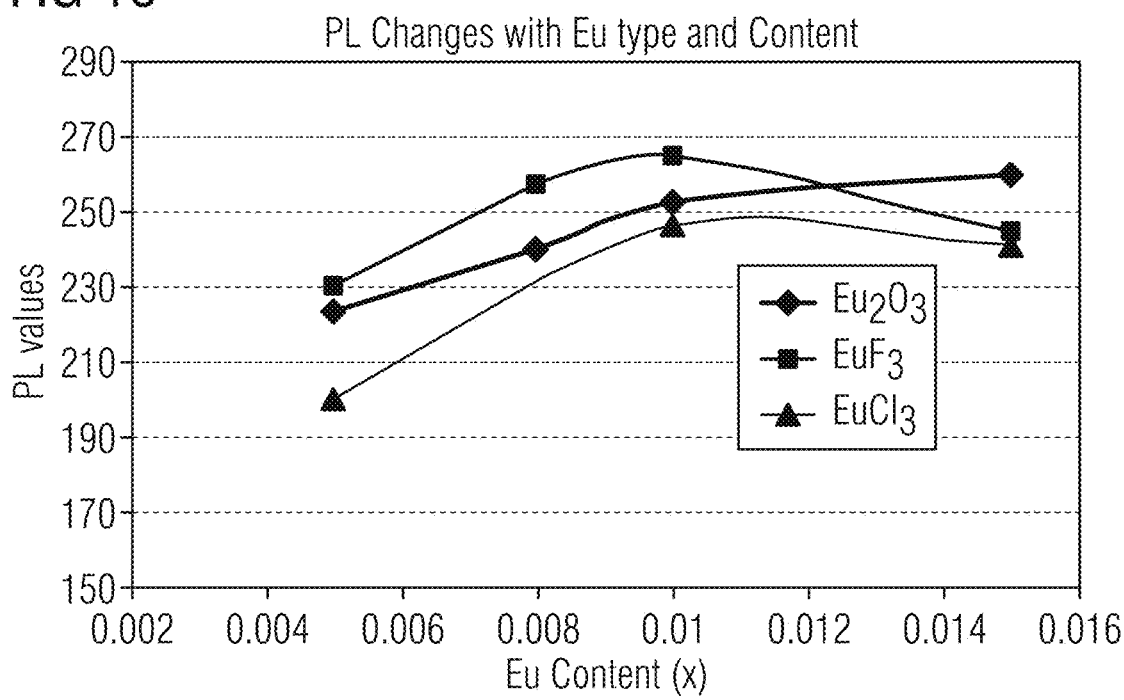
FIG. 15 shows yet another relative external quantum efficiency QE for a previously known phosphor.

In the case of an Eu content of at least 1% (x=0.01), the luminescence signal decreases or virtually stagnates (Sr content: 80%). FIG. 15 shows the figure derived therefrom. The inventors of U.S. Pat. No. 8,274,215 note in this regard that, with rising Eu content (up to the value of x=0.01), the intensity of the photoluminescence increases, then it remains the same or decreases.

Figure 16:
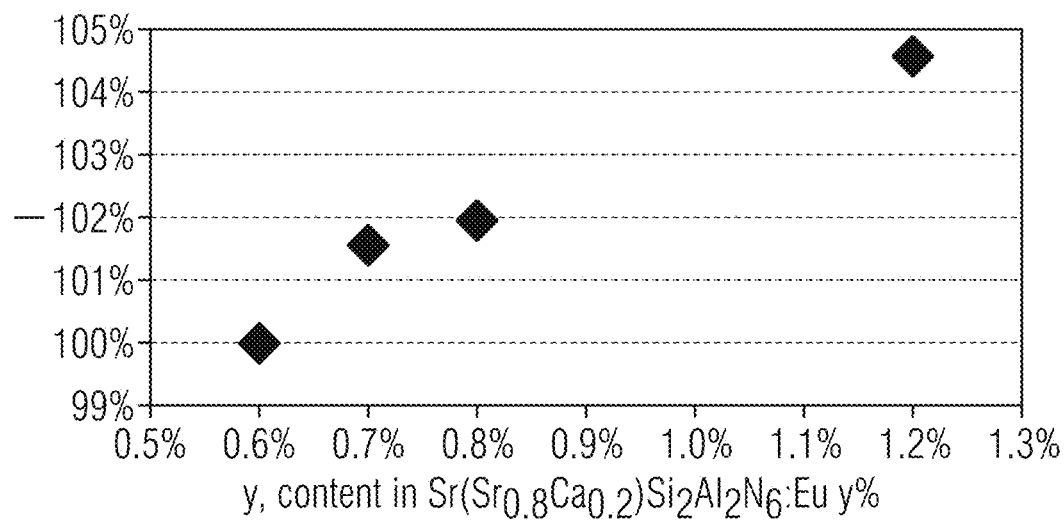
FIG. 16 shows the relative emission intensity I as a function of doping Eu.

FIG. 16 shows, in contrast, the relative emission intensity I as a function of the doping of Eu as activator, which replaces the alkaline earth metal content, for a novel phosphor. The Eu content is given here in %. Surprisingly, the novel phosphor (shown in the abscissa) shows behavior distinctly different from the prior art. With rising Eu content, the emission intensity I increases noticeably even in the case of an Eu content well above 1%, and in fact in an approximately linear manner. This property offers various technical advantages for the application. These include a relatively low phosphor requirement and the possibility of attaining color loci with relatively large x, understood as the first CIE component, and also high dominant wavelength lambdadom (ldom). With rising activator content Eu (shown as parameter y in %), the luminescence signal moves to greater wavelengths in an approximately linear manner. This allows, for example, the color rendering index CRI of a warm white light-emitting LED to be increased; see also the other corresponding LED examples in the present application.

Figure 17:
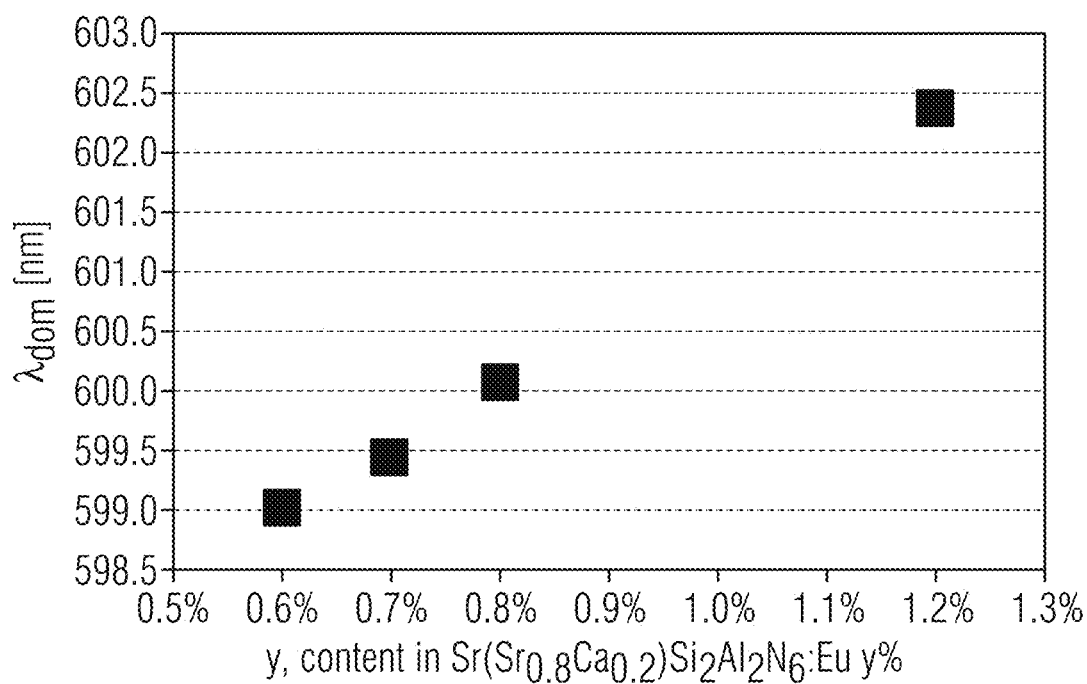
FIG. 17 shows the influence of the degree of doping with Eu on the emission wavelength.

FIG. 17 shows the influence of the degree of doping with Eu on the emission wavelength, shown as lambdadom (in nm). With rising activator content y for the novel phosphor, the luminescence signal moves to greater wavelengths in an approximately linear manner. This allows, for example, the color rendering index CRI of a warm white light-emitting LED to be increased; see also the other corresponding LED examples in the present application.

In order to determine the structure of the novel phosphor of the invention, crystals of the novel phosphor were chosen under a light microscope and prepared for a diffractometry study. The measurement was effected on a Bruker D8 Venture with rotating anode and CCD detector. A summary of the results (important goodness factors and the underlying refined parameters) can be found in the table in FIG. 21.

The diffraction patterns collected were examined in great detail for their quenching conditions. A basic pattern discernible is a structure derived from AlN (wurtzite structure type) which can be described in the $P2_1$ space group.

The solution and refinement of the data set were effected with the JANA2006 software package (Petricek, V., Dusek, M. & Palatinus, L. (2006). Jana2006. The crystallographic computing system. Institute of Physics, Prague, Czech Republic.).

The refinement proceeds very efficiently with the following restrictions: since Si and Al are indistinguishable by x-ray methods, all Si and Al positions were refined with the population of Si:Al=1:1 as weighed out and a single thermal displacement factor for Si and Al.

In addition, all nitrogen atoms together and all alkaline earth metal atoms together were each described by one thermal displacement factor. All further parameters (e.g. the atomic position parameters) were freely refined.

Results of these single-crystal studies are discussed in detail hereinafter.

Figure 18:
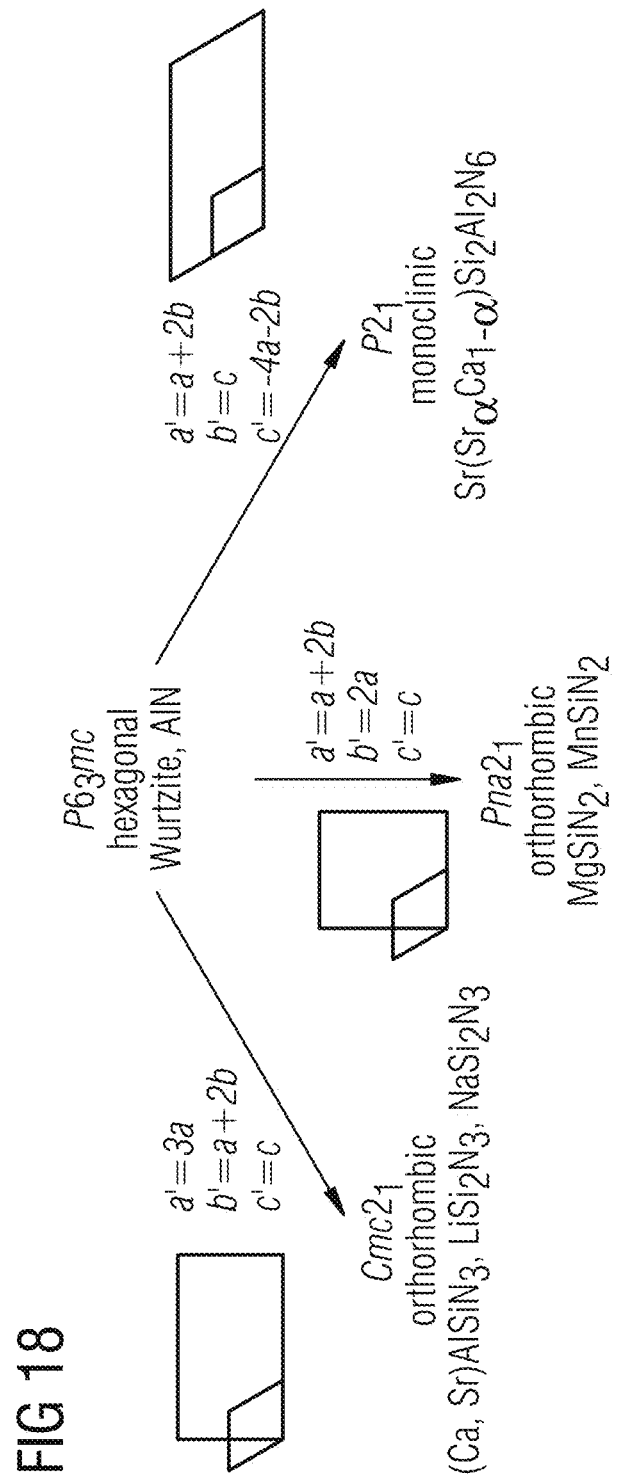
FIG. 18 shows the crystallographic relationship between various light-emitting nitrides.

FIG. 18 shows the crystallographic relationship between various light-emitting nitrides and AlN.

A whole series of known nitrides used as phosphors can be derived from AlN with wurtzite structure. Because of this fundamental structural relationship, the diffractograms (particularly x-ray powder diffractograms) of these compounds also often appear to be similar at first glance. However, differences are found in clearly pronounced details. The structures can differ significantly, as shown in FIG. 18 by way of example for the derivation of the unit cells for various compounds.

Figure 20A:
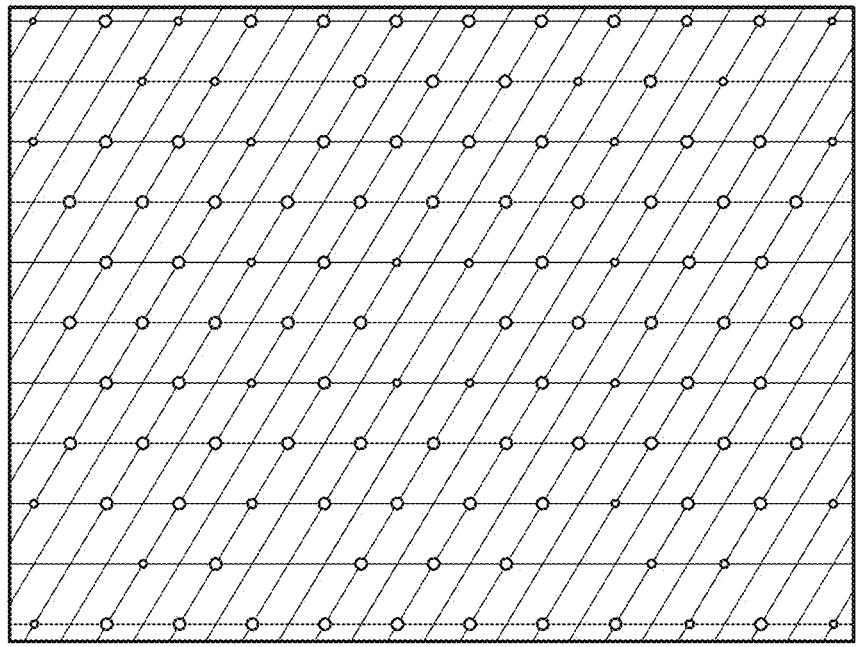
FIGS. 20a-20c show a $Sr(Sr_aCa_{1-a})Si_2Al_2N_6$ structure according to embodiments.
Figure 20B:
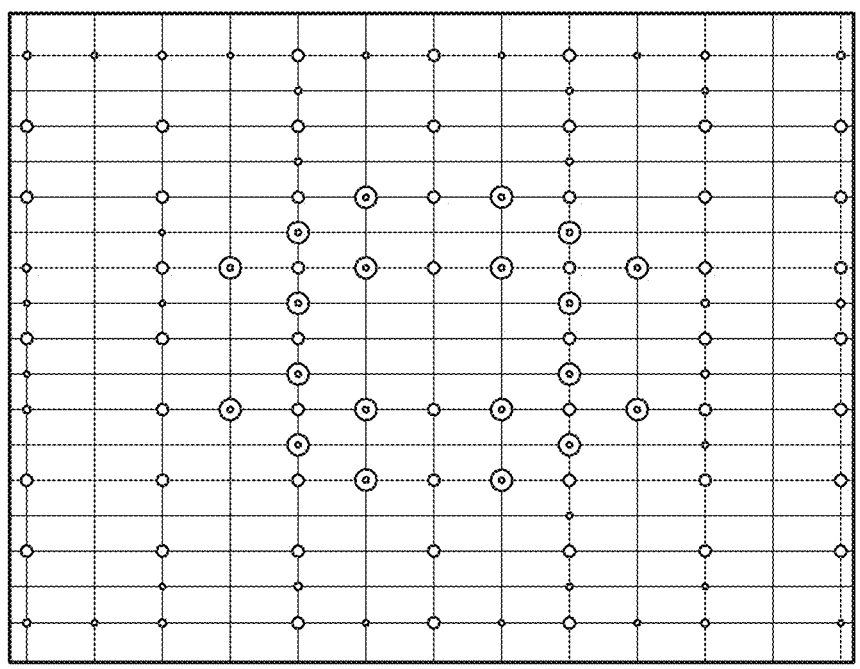
Figures 20C, 21:
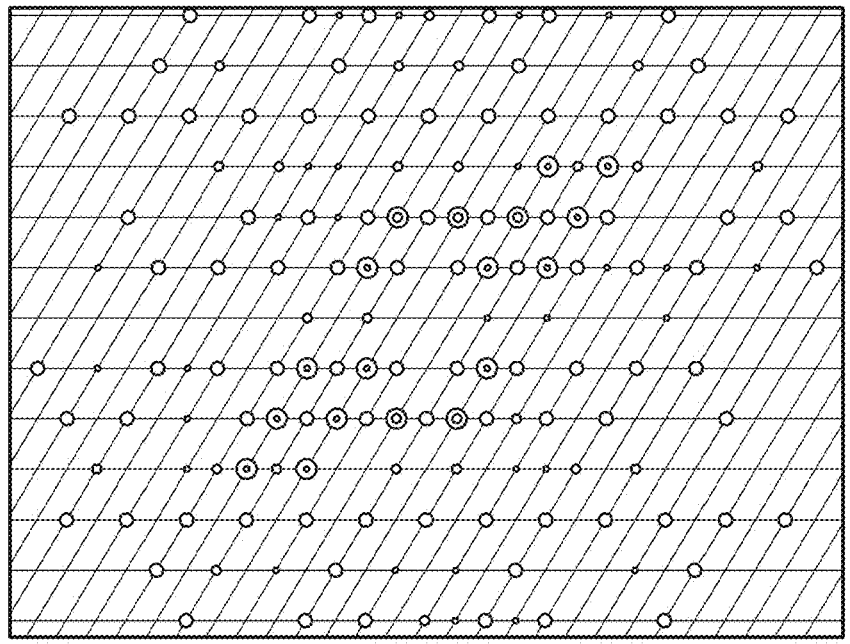
FIG. 21 shows experimental results and underlying parameters.

FIGS. 20a to 20c show, for the novel $Sr(Sr_aCa_{1-a})Si_2Al_2N_6$ structure (the doping is unimportant for this fundamental consideration), why it clearly has to be described in the $P2_1$ space group and cannot be described in either of the two other space groups listed above.

According to FIG. 20, the single-crystal diffraction data are examined in reciprocal space for the novel phosphor $Sr(Sr_aCa_{1-a})Si_2Al_2N_6$. FIG. 20a is a representation of the novel phosphor in reciprocal space viewed in the [hol] direction.

The pseudohexagonal base structure is clearly apparent.

FIG. 20b is a representation of the novel phosphor in reciprocal space viewed in the [okl] direction. The circled reflections are examples of reflections which cannot exist in the Pna21 space group. The occurrence thereof rules out description in this Pna21 space group because of the quenching conditions of various crystallographic space groups. The novel phosphor thus cannot have the same structure as, for example, $MgSiN_2$, or $MnSiN_2$.

Finally, FIG. 20c shows a representation of the novel phosphor in reciprocal space viewed in the [h11] direction.

The circled reflections are examples of reflections which cannot exist in the Cmc21 space group. The clearly apparent occurrence thereof rules out description in the Cmc21 space group. The novel phosphor thus cannot have the same structure as, for example, $(Ca,Sr)AlSiN_3$, $LiSi_2N_3$, $NaSi_2N_3$.

FIG. 19 shows an overview of some structural data known from the literature for nitrides of similar composition ($Cmc2_1$ space group, $NaSiO_3$ structure type).

The single-crystal diffractometry solution of the novel structure $Sr(Sr_aCa_{1-a})Si_2Al_2N_6$ is shown in detail in FIG. 21. This gives the lattice parameters, the unit cell, the radiation source used for the analysis, the reflections, the measured section of reciprocal space and further data.

FIG. 22 gives the interatomic distances in the novel structure $Sr(Sr_aCa_{1-a})Si_2Al_2N_6$ in detail. In a direct comparison with nitrides of similar composition, for example $SrAlSiN_3$ (ICSD 419410), $CaAlSiN_3$ (ICSD 161796) or $(Sr,Ca)AlSiN_3$ (ICSD 163203) (cf. table in FIG. 19 for further examples), it should be noted that there is a somewhat larger and a somewhat smaller environment around the alkaline earth metal atoms Sr and Ca. In $SrAlSiN_3$, $CaAlSiN_3$ and $(Sr,Ca)AlSiN_3$, for the alkaline earth metal atoms, there is only a pentacoordinated position with a mean Sr—N distance of 267 pm. In the novel structure $Sr(Sr_aCa_{1-a})Si_2Al_2N_6$ of the invention, Sr1 forms a hexacoordinated environment with a mean Sr1-N distance of 272 pm; Sr2/Ca2 forms a pentacoordination with a mean Sr2/Ca2-N distance of 264 pm.

FIG. 23 compares the crystallographic data and positional parameters (according to single crystallography) for a novel compound $Sr(Sr_aCa_{1-a})Si_2Al_2N_6$ with the corresponding data for the previously known $SrAlSiN_3$:Eu (on the right). There is a distinct difference between the crystal systems and space groups.

Figure 24A:
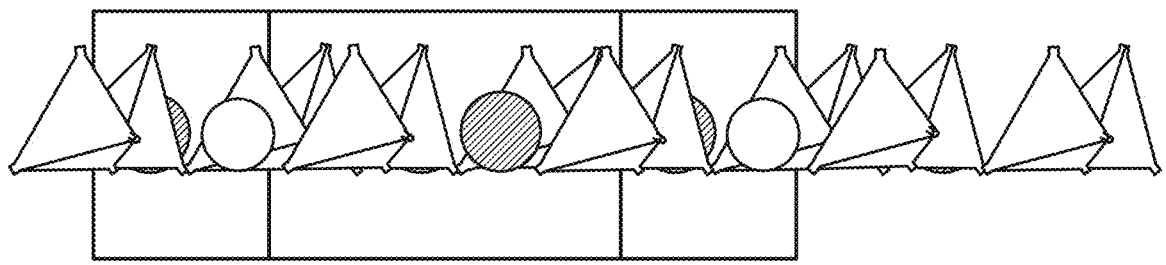
FIGS. 24a-24c illustrate the structure of the phosphor type $Sr(Sr_aCa_{1-a})Si_2Al_2N_6$.
Figure 24B:
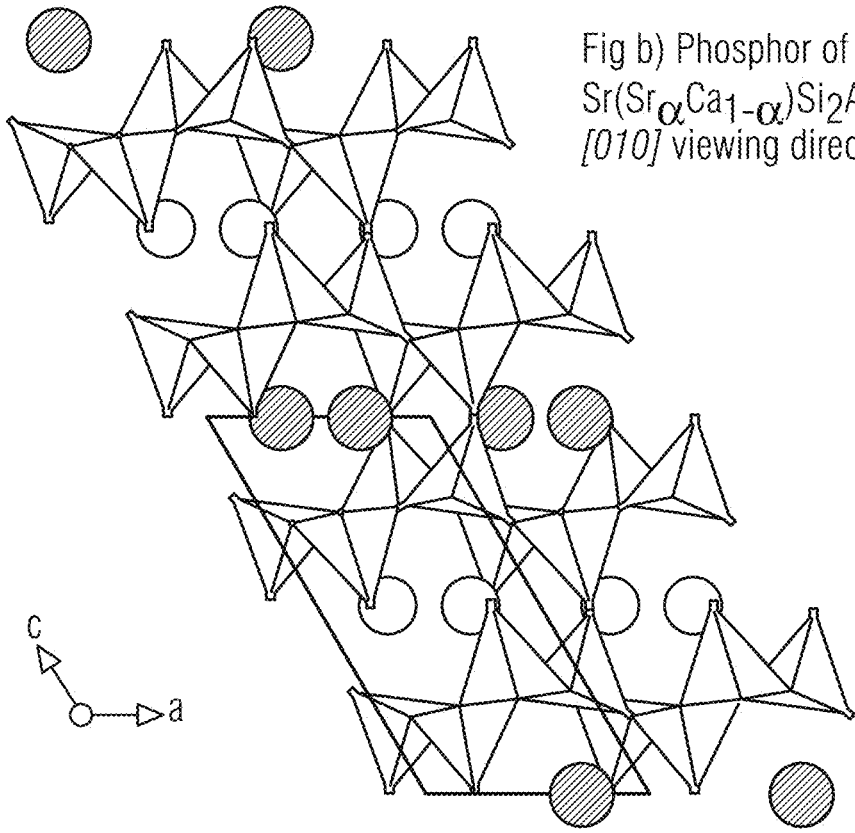
Figure 24C:
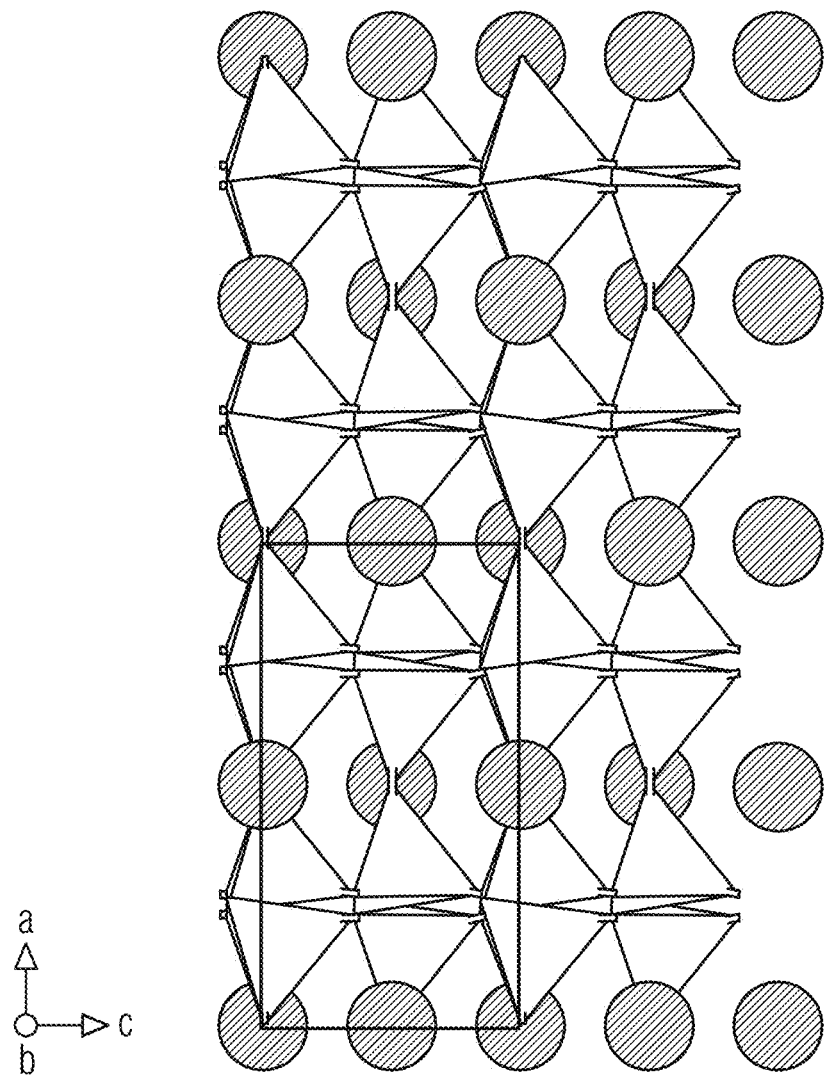

FIG. 24a-24c illustrate the structure of the novel phosphor type $Sr(Sr_aCa_{1-a})Si_2Al_2N_6$. FIG. 24a shows a view of the layers of $Sr(Sr_aCa_{1-a})Si_2Al_2N_6$. The layers are derived from AlN. Compared to AlN, individual tetrahedra are absent and are replaced by an alkaline earth metal ion. The tetrahedra are distinctly distorted compared to AlN. However, all bond lengths and angles are similar to other nitridosilicates. FIG. 20b shows the phosphor $Sr(Sr_aCa_{1-a})Si_2Al_2N_6$ of the invention from the [010] direction. The 3D network of the $(Si/Al)N_4$ tetrahedra is clearly apparent. Running in the a-c plane are layers that are linked in the b direction (not shown) to form a network. Intercalated between these, layer by layer in each case, are the pure Sr position (shown as white circles) and the position having a mixed Sr/Ca population (shown as black circles).

FIG. 24c shows, for comparison, the structure, known from the literature, of $(Sr_{0.846}Ca_{0.211})AlSiN_3$ (ICSD 163203) from the [010] direction. Here, all the Sr/Ca positions (black) have mixed populations. There are no pure Sr positions.

This ordering into a position having a mixed Sr/Ca population and a position fully populated by Sr alone in the novel phosphor $Sr(Sr_aCa_{1-a})Si_2Al_2N_6$:Eu of the invention is advantageous, for example over the structure of SCASN (cf. FIG. 24c), where only a position having a mixed population is available for the activator atoms (doping), which leads to broadening of the emission, this of course being based on the interaction between the activator and the surrounding host lattice, and to stronger quenching properties. The $Sr(Sr_aCa_{1-a})Si_2Al_2N_6$:Eu structure of the invention, by contrast, offers the activator, preferably Eu here, an ordered Sr position, without disorder and without the associated disadvantages. The improved properties of luminescence can be explained plausibly by this structure. The Eu, according to this model concept, populates predominantly the pure Sr plane only, and the mixed plane to a lesser degree.

Proceeding from FIG. 24b, it is also possible to represent a phosphor having the lower symmetry according to space groups 1 to 3 of the International Tables Cryst. A, i.e. space groups P1, P$\bar{1}$, P2, in that, for example, the mixed layer has been split up into planes having different population (in part) by means of pure Sr alongside a mixed population.

Figure 25:
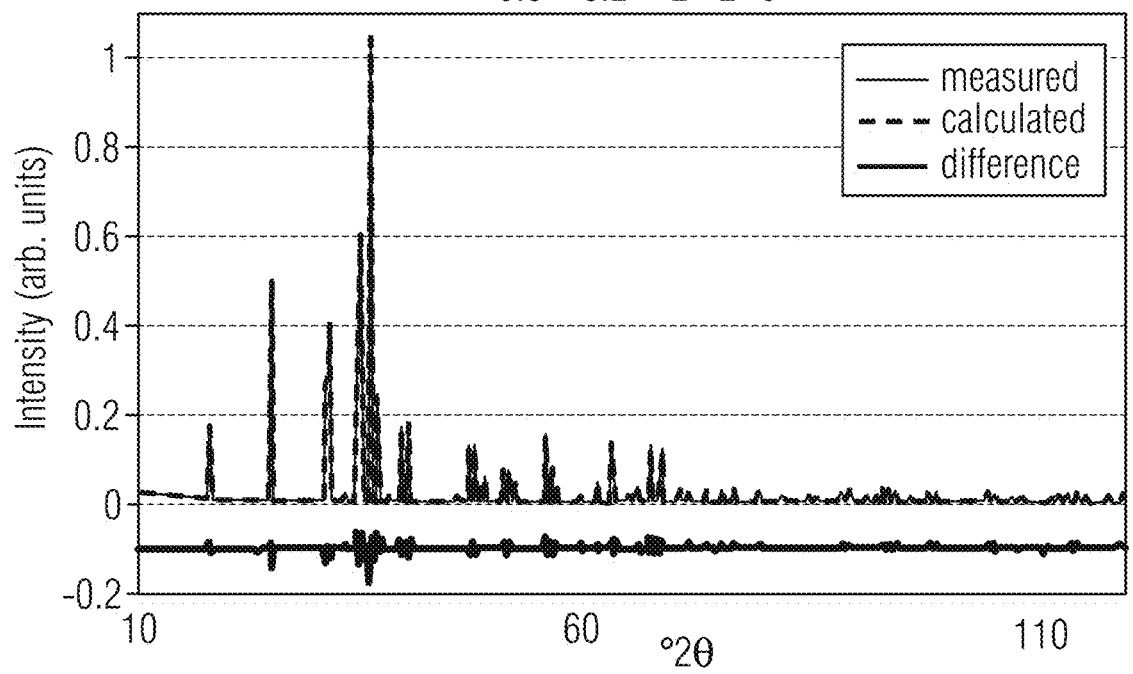
FIGS. 25-34 show crystallographic evaluations.
Figure 26:
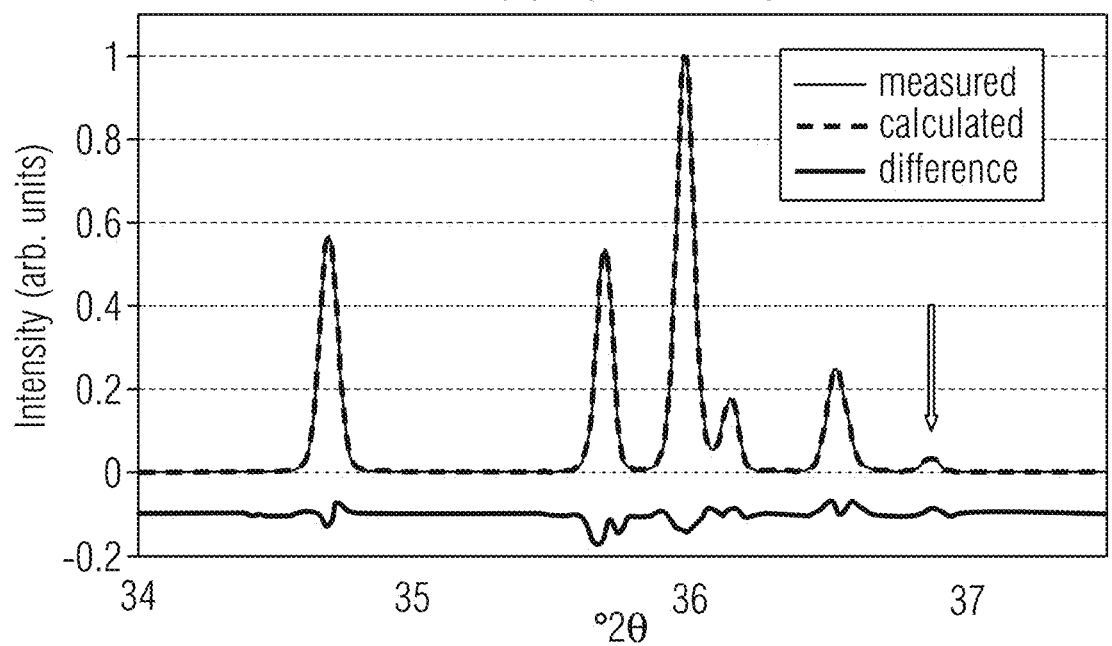

In FIG. 25 and FIG. 26 there is a crystallographic evaluation. FIG. 25 shows a Rietveld refinement of the x-ray powder diffractogram of specimen TF162bG/12, an embodiment of the novel phosphor of the invention having the weighed-out composition $Sr(Sr_{0.8}Ca_{0.2})Si_2Al_2N_6$:Eu. The diffractogram can be very well described with the structure model found by the single-crystal x-ray structure analysis for $Sr(Sr_aCa_{1-a})Si_2N_2N_6$ (Rprofil 7%, Rbragg 6%).

FIG. 26 shows an enlarged section of the Rietveld refinement of the x-ray powder diffractogram of TF162bG/12. The reflection marked with an arrow is an example of a reflection of $Sr(Sr_{0.8}Ca_{0.2})Si_2Al_2N_6$:Eu which can occur in the $P2_1$ space group and other lower-symmetry space groups such as the P1 space group. The occurrence of this reflection definitively rules out description of the novel phosphor in the higher-symmetry Cmc21 and Pna21 space groups of the other AlN-related nitridosilicatic phosphors.

Figure 27:
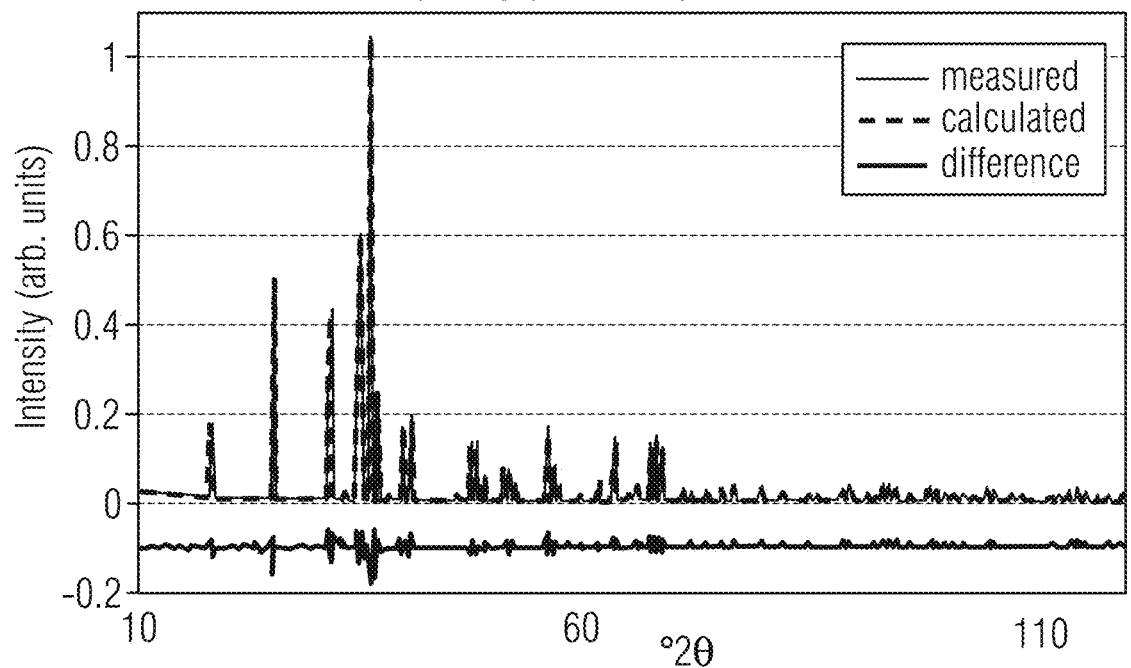
Figure 28:
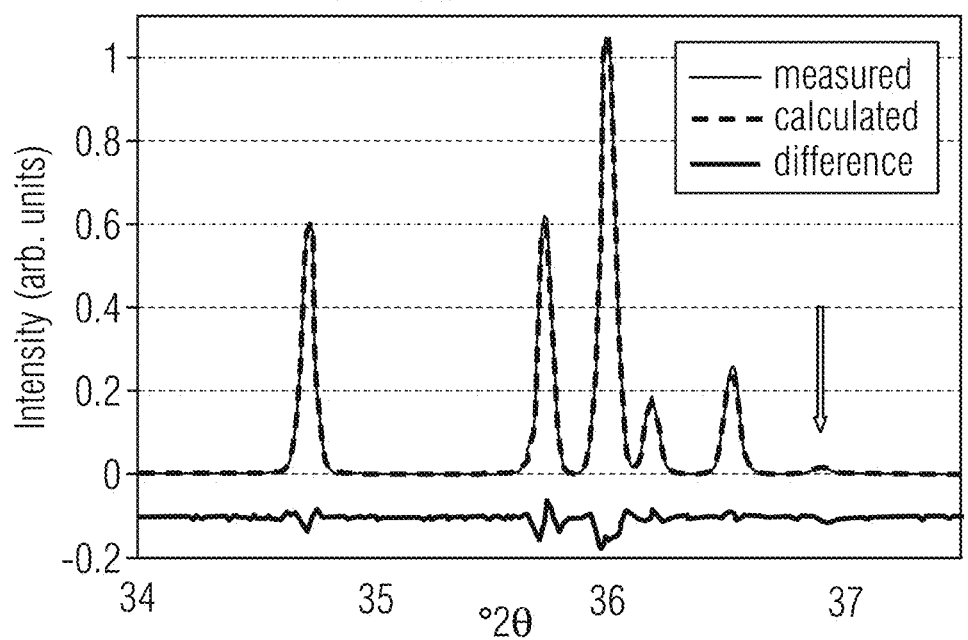
Figure 29:
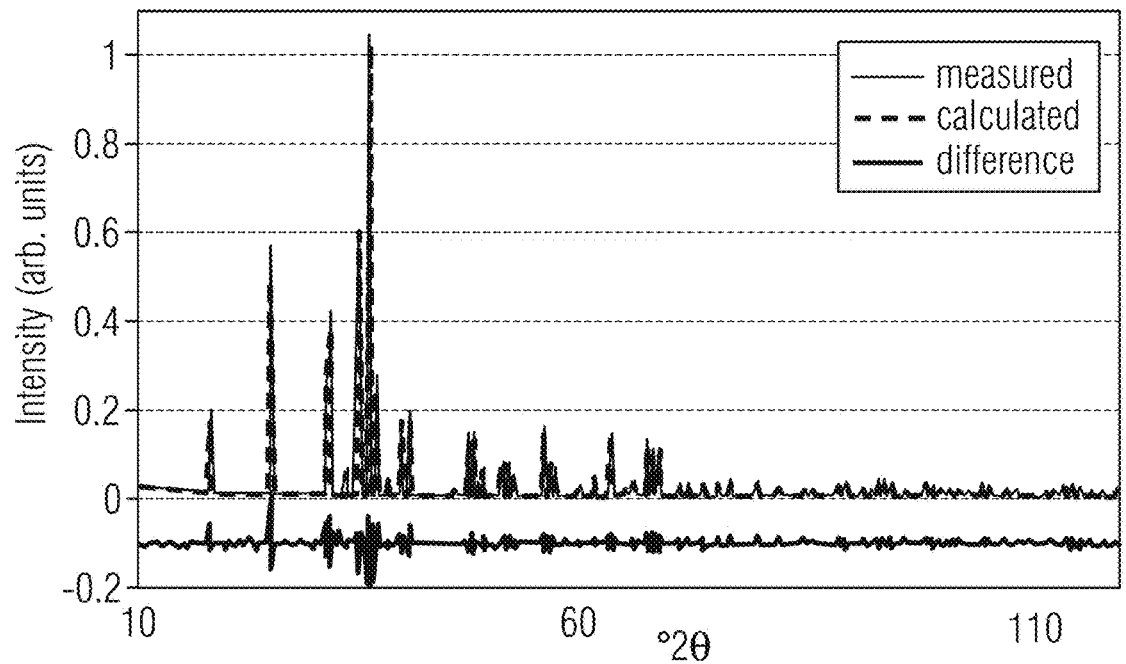
Figure 30:
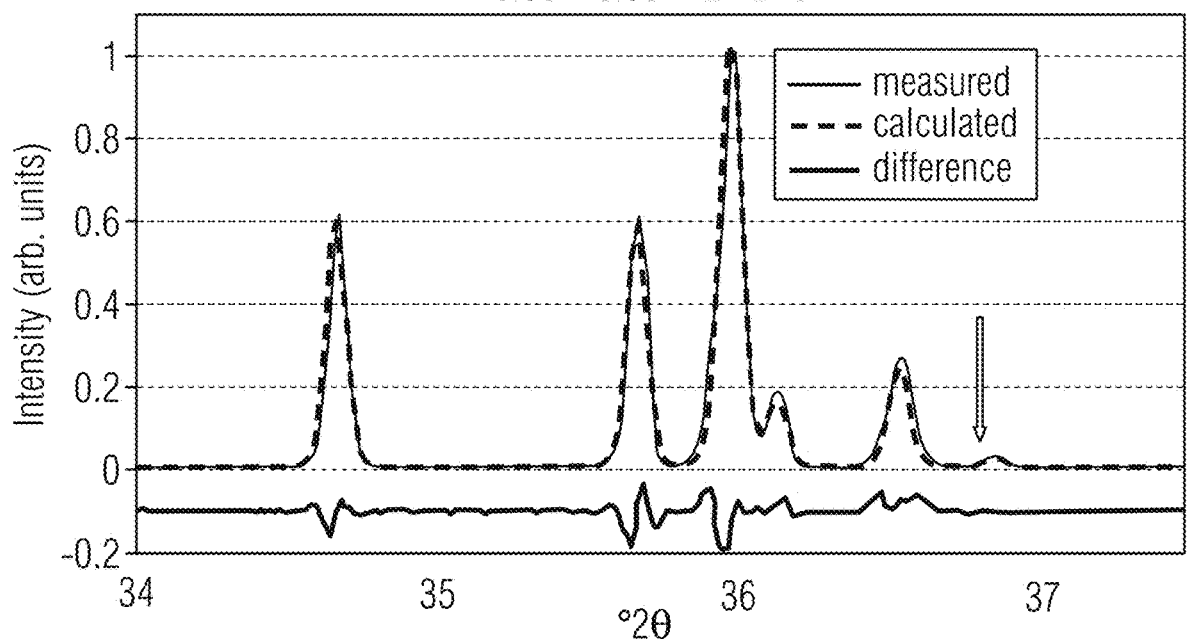
Figure 31:
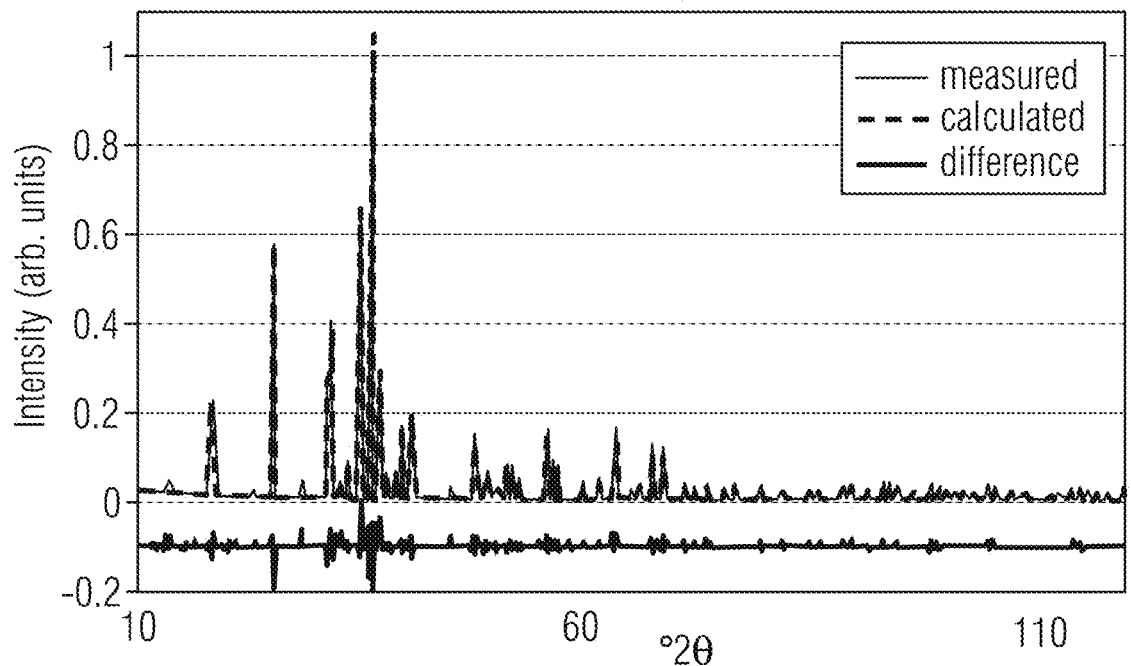
Figure 32:
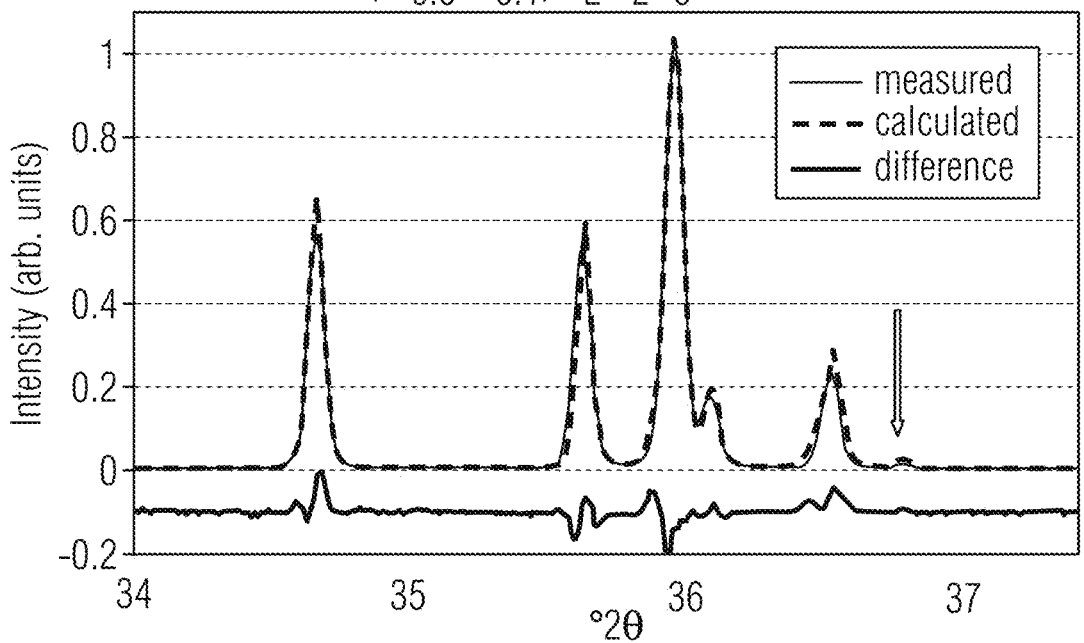
Figure 33:
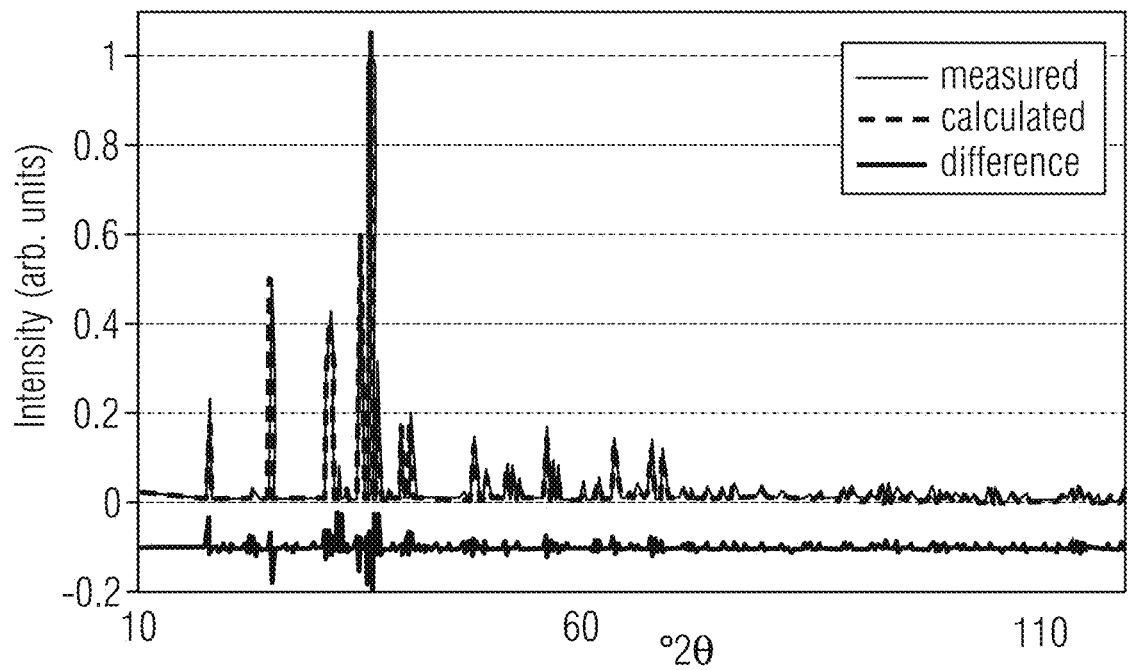
Figure 34:
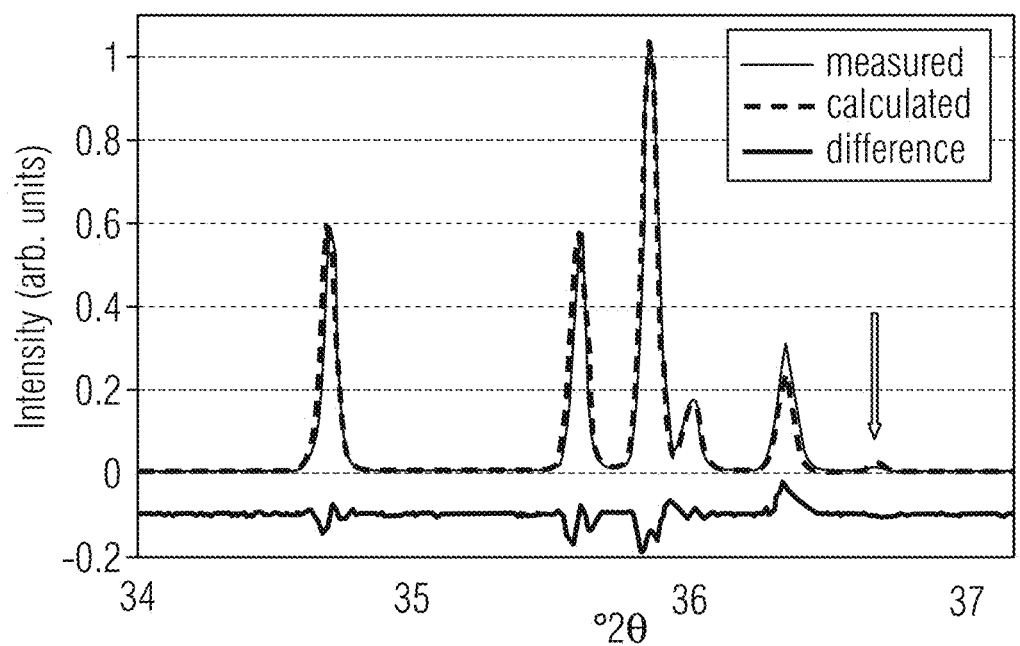

FIG. 27/28 and FIGS. 29/30 and 31/32 and FIG. 33/34 show, by way of example, further Rietveld refinements of the x-ray powder diffractogram of other embodiments, as shown in each diagram, each with a characteristic section.

Figure 35A:
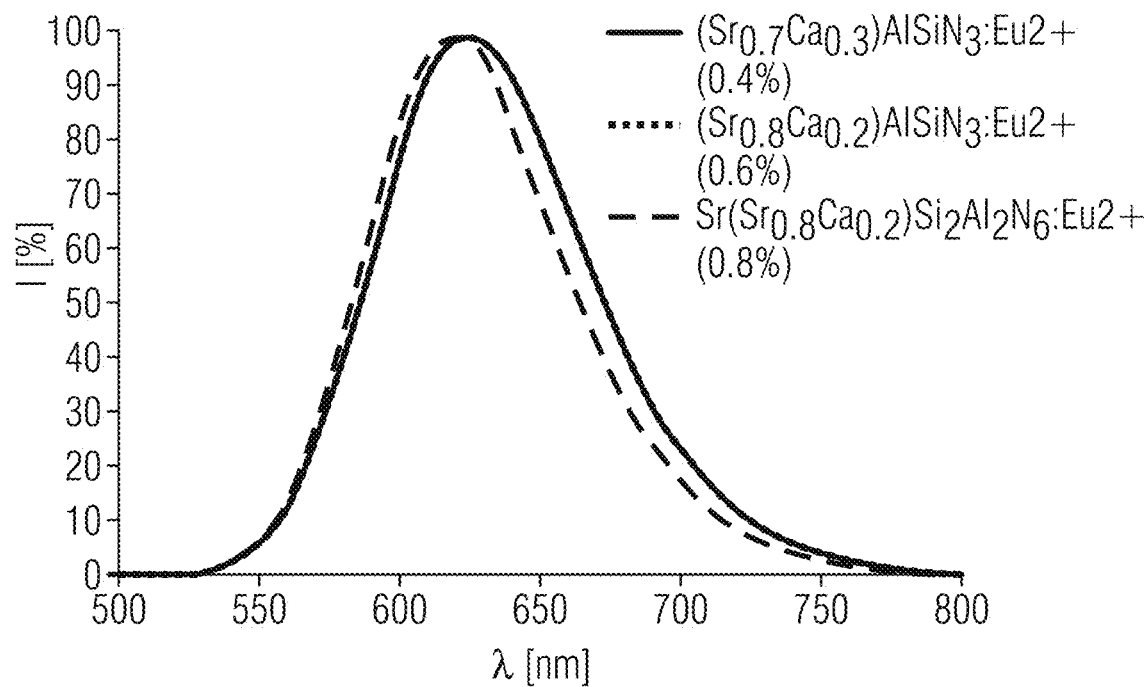
FIGS. 35a and 35b show emission spectra and reflectance spectra of phosphors according to embodiments compared to known phosphors.
Figure 35B:
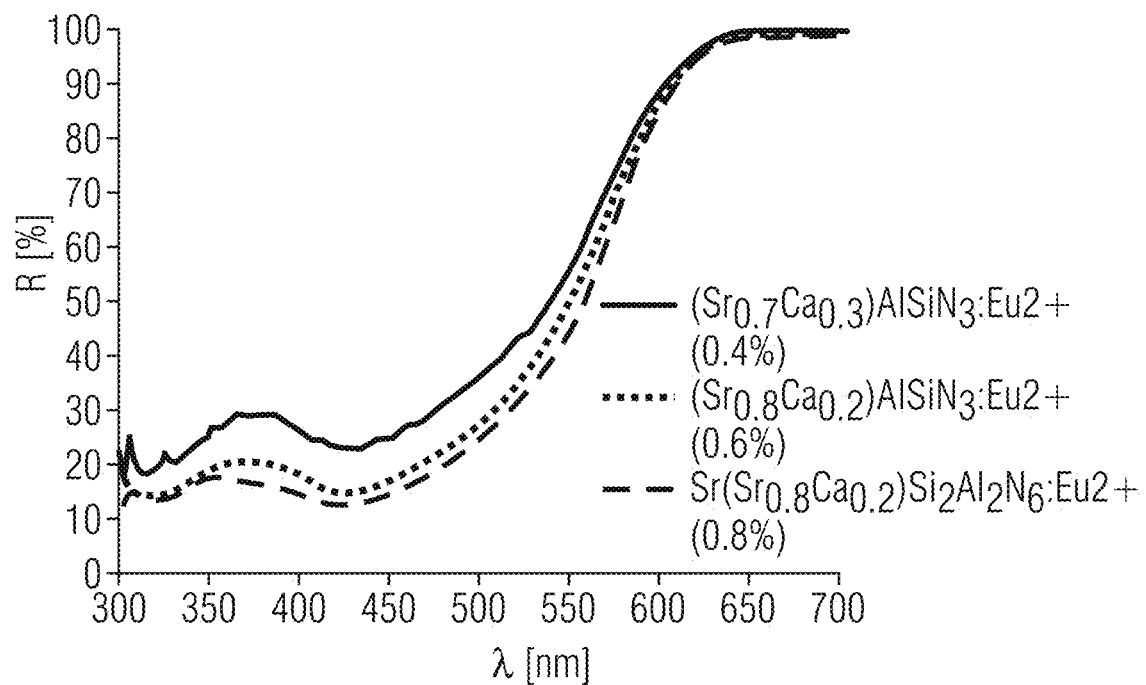

FIGS. 35a and 35b show the absorption and emission characteristics of a phosphor of the invention compared to known phosphors.

FIG. 35a shows emission spectra and FIG. 35b reflectance spectra of an embodiment of the novel phosphor $Sr(Sr_aCa_{1-a})Si_2Al_2N_6$:Eu with a=0.8 and 0.8% Eu compared to known phosphors composed of the $Sr_xCa_{1-x}AlSiN_3$:Eu system with comparable dominant wavelength ldom (ldom≈600 nm). The wavelength l is plotted against the intensity I and the reflectance R. The emission spectra show an unexpectedly narrow spectral emission of the novel phosphor $Sr(Sr_aCa_{1-a})Si_2Al_2N_6$:Eu with a=0.8. At the same time, the novel phosphor $Sr(Sr_aCa_{1-a})Si_2Al_2N_6$:Eu with a=0.8 features a strong absorption; see FIG. 35b. The absorption is found to be approximately 1-R.

Figure 36A:
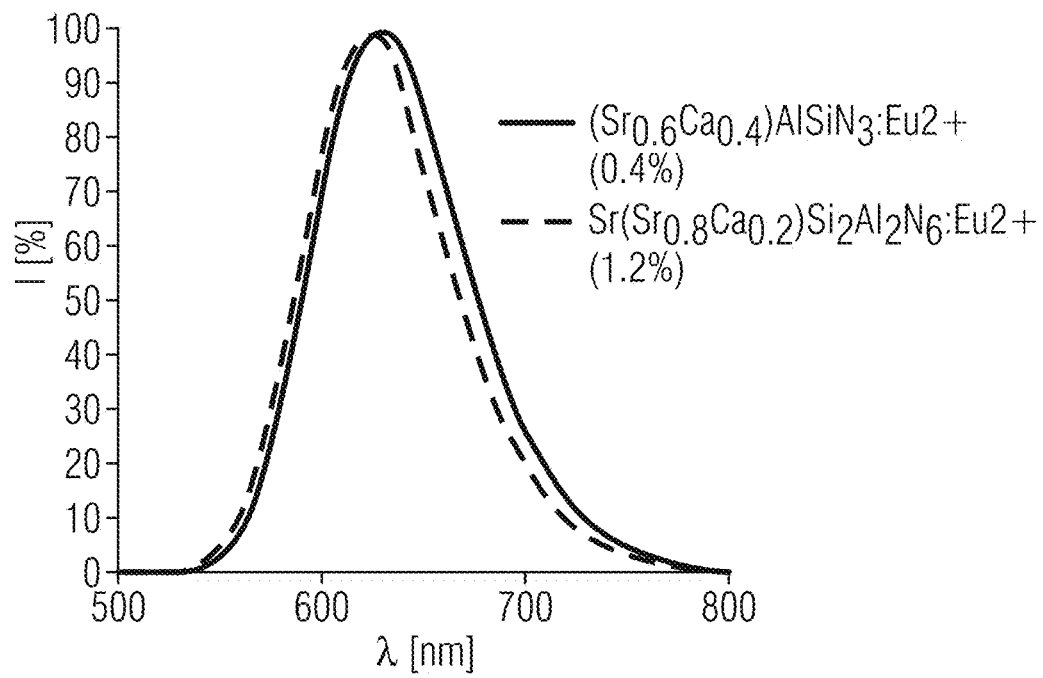
FIGS. 36a and 36b show emission spectra and reflectance spectra of phosphors according to further embodiments compared to known phosphors.
Figure 36B:
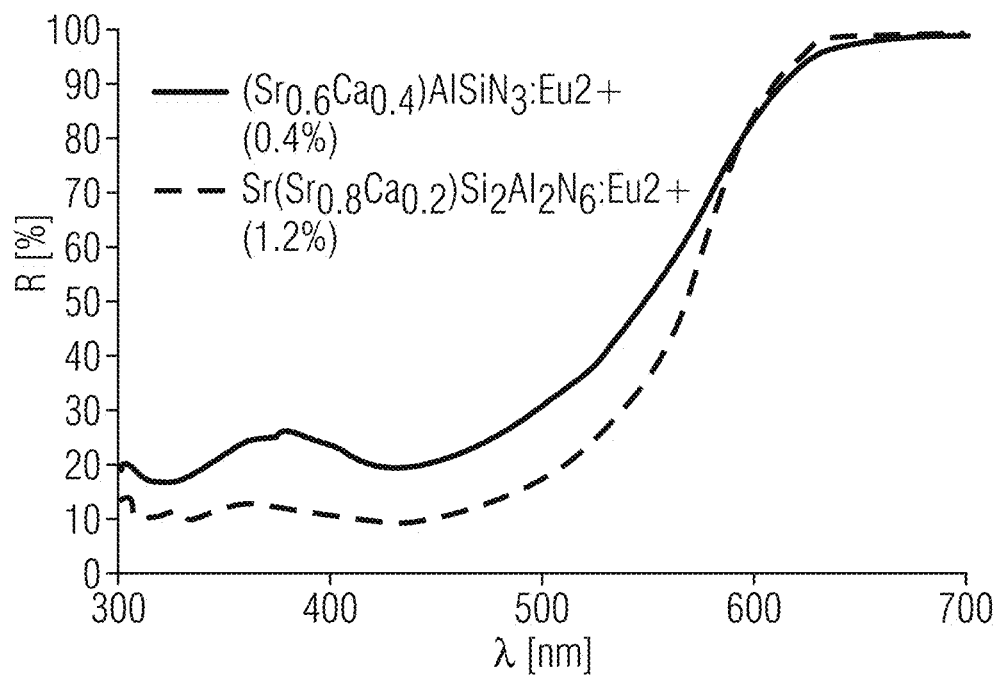

FIGS. 36a and 36b show the absorption and emission characteristics of a further phosphor of the invention compared to known phosphors.

FIG. 36a shows emission spectra and FIG. 36b reflectance spectra of an embodiment of the novel phosphor $Sr(Sr_aCa_{1-a})Si_2Al_2N_6$:Eu with a=0.8 and 1.2% Eu compared to known phosphors composed of the $Sr_xCa_{1-x}AlSiN_3$:Eu system with comparable dominant wavelength ldom (ldom≈602-603 nm). The wavelength l is plotted against the intensity I and the reflectance R. The emission spectra show an unexpectedly narrow spectral emission of the novel phosphor $Sr(Sr_aCa_{1-a})Si_2Al_2N_6$:Eu with a=0.8. At the same time, the novel phosphor $Sr(Sr_aCa_{1-a})Si_2Al_2N_6$:Eu with a=0.8 features a strong absorption; see FIG. 36b. The absorption is found to be approximately 1-R.

The novel phosphor described here offers the following advantages in particular: lower half-height width of emission, associated with higher luminous efficiency at the same dominant wavelength, the possibility of achieving higher activator concentrations of Eu at >0.8% with simultaneously high quantum efficiency and conversion efficiency, associated with a smaller phosphor demand in LED applications and simplified processibility, improved aging stability with respect to moisture compared to conventional (Sr,Ca)AlSiN3:Eu having low Sr content, and improvement of thermal stability.

Figure 37:
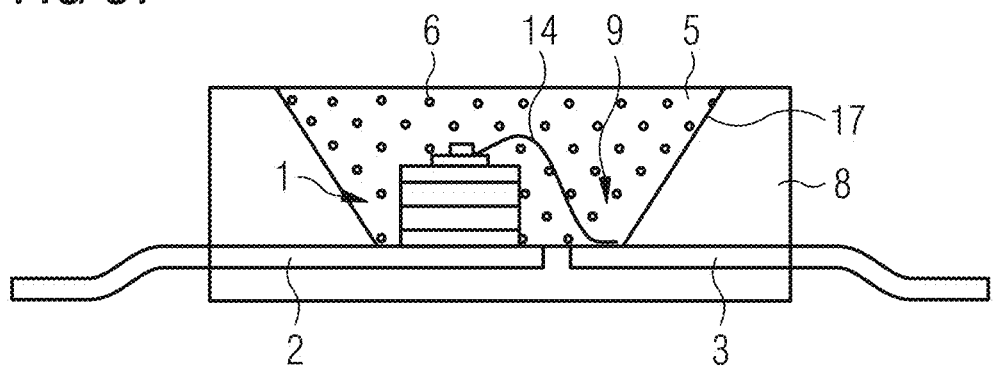
FIG. 37 shows a semiconductor component which serves as light source (LED) for white light.

FIG. 37 shows a semiconductor component which serves as a light source (LED) for white light.

For use in a white LED together with a GaInN chip, for example, a construction similar to that described in U.S. Pat. No. 5,998,925 is used. The structure of such a light source for white light is shown explicitly in FIG. 37. The light source, which is the radiation source for the primary radiation, is a semiconductor component which can emit primary radiation in the UV and/or blue wavelength range. For example, the radiation source used may be a semiconductor component (chip 1) of the InGaN type with a peak emission wavelength of 460 nm having a first and second electrical connection 2, 3, embedded into an opaque base housing 8 in the region of a recess 9. One of the connections 3 is connected to the chip 1 via a bonding wire 14. The recess has a wall 17 which serves as reflector for the blue primary radiation from the chip 1. The recess 9 is filled with a potting compound 5 comprising, as main constituents, a potting compound and phosphor pigments 6 (less than 50% by weight). Further small proportions are accounted for, for example, by methyl ether and Aerosil inter alia. The phosphor pigments are a mixture of various phosphor mixtures described here, which also contain phosphors of the invention, for example LuAG:Ce pigments and pigments of the novel phosphor.

Generally, in the case of an LED chip that emits UV radiation as radiation source, it is possible to use a phosphor mixture composed of at least three different phosphors (blue-emitting phosphor, for example $BaMgAl_{10}O_{17}$:Eu$^{2+}$ or $(Ba,Sr,Ca)_5(PO_4)_3Cl:Eu^{2+}$, together with a green/yellow-emitting phosphor, for example one of the garnet phosphors described here, and an orange/red-emitting phosphor, for example one of the invention), and, in the case of a blue light-emitting LED chip as radiation source, to use a phosphor mixture composed of at least two different phosphors (a green/yellow phosphor, for example one of the garnet phosphors described here, and an orange/red-emitting phosphor, for example one of the invention).

Figure 38:
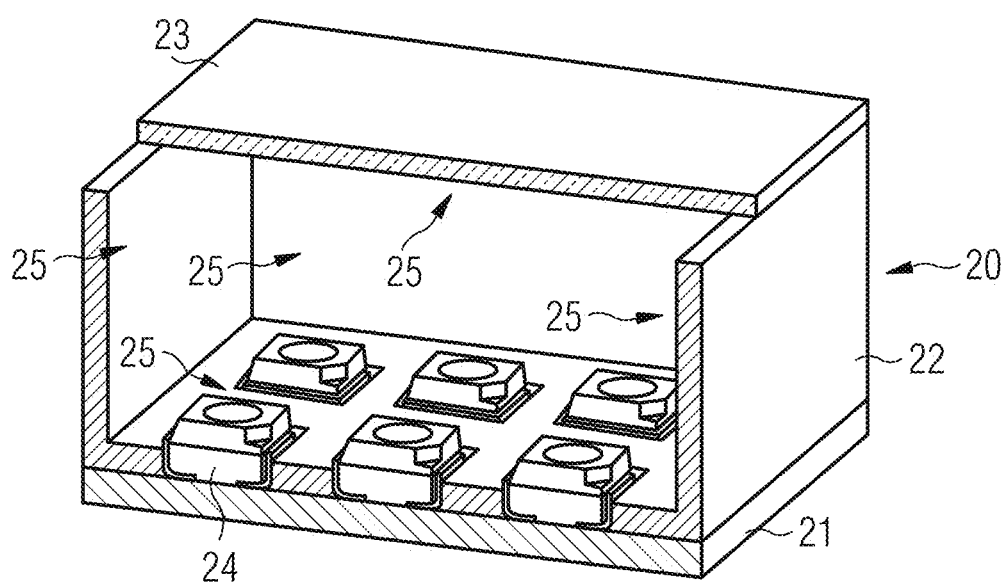
FIG. 38 shows a lighting unit comprising phosphors according to the present invention.

FIG. 38 shows a section from an area light 20 as lighting unit. It consists of a common carrier 21, onto which has been bonded a cuboidal outer housing 22. The upper side thereof has been provided with a common cover 23. The cuboidal housing has recesses in which individual semiconductor components 24 are accommodated. They are UV light-emitting diodes and/or light-emitting diodes that emit blue light as primary radiation with a peak emission of 380 nm. The conversion to white light is effected by means of conversion layers that are directly within the casting resin of the individual LEDs, similarly to the manner described in FIG. 37, or layers 25 applied to all the surfaces accessible to the UV radiation (these are especially ceramic surfaces or plates). These include the inner surfaces of the side walls of the housing, the cover and the base section. The conversion layers 25 comprise, in the case of UV light-emitting LEDs, three phosphors which emit in the red-orange, yellow-green and blue spectral regions with utilization of phosphors of the invention. When the LEDs as radiation sources emit blue radiation as primary radiation, as already described above, it is also possible for only two different phosphors that emit in the green-yellow or orange-red to be present in the phosphor mixtures.

In a number of further embodiments of the present invention, conventional blue light-emitting InGaN LEDs were provided with a conventional silicone potting material with different amounts of various phosphors of the invention or conventional phosphors as comparative examples embedded therein. In this case, phosphors of the invention in particular are to be used partly together with other phosphors for color conversion of blue primary light to the red or yellow or yellow-orange wavelength range. These phosphors may also be used, inter alia, for full conversion of the primary light from the primary radiation source to the red or yellow or yellow-orange wavelength range.

Alternatively, the primary radiation source used, rather than an LED such as an InGaN LED, may also be an organic light-emitting device (OLED) comprising a layer stack of organic semiconductive layers disposed between an anode and a cathode. In this case, at least one of the electrodes has to be transparent to the radiation produced by the OLED, in which case the phosphors of the invention can be disposed in the beam path of the radiation above the transparent electrode.

Embodiments for full conversion of red: the table in FIG. 40a shows the dominant wavelength of the blue-emitting LED ($\lambda_{dom(blue\ LED)}$), the chemical formulae of the inventive and conventional phosphors used, and the concentrations thereof in the potting material (percent by weight based on the overall potting material), the x and y color coordinates of the secondary radiation converted in the CIE color space and the resulting luminous flux $\Phi_{v(potting)}$ and the radiant power $\Phi_{e(potting)}$ of the potted LEDs, in each case relative to the $\Phi_{e(no\ potting)}$ value for the unpotted LEDs (figures relative to the comparative example in each case). All further tables likewise include this parameter and in some cases further parameters, for example mixing ratios in the case of mixing of two different phosphors in the potting material of an LED.

It can be inferred unambiguously from this table in FIG. 40a that, with a very similar color locus in the red-orange region (x and y CIE color coordinates), the phosphor of the invention according to inventive example 1 compared to the conventional phosphor according to comparative example 1 has a higher luminous flux and also a higher radiant power. This can also be inferred from the corresponding emission spectrum of FIG. 40b, in which it is clearly apparent that inventive example 1 has a higher light intensity compared to the LED of comparative example 1.

Figure 41B:
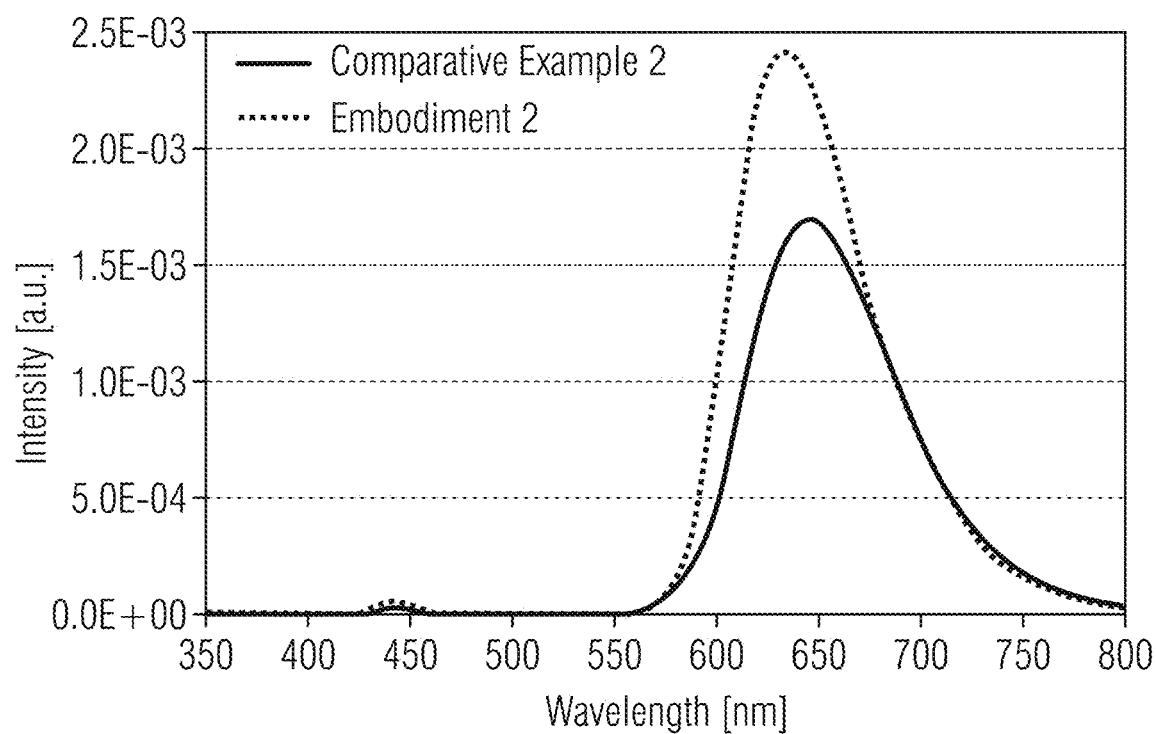

In the table in FIG. 41a, again, the luminous flux and the radiant power of a blue-emitting LED having a conventional $CaAlSiN_3$ phosphor (comparative example 2, phosphor effected according to EP patent application EP 1 696 016 A1) are compared with an LED with one embodiment of a phosphor of the invention incorporated into the silicone potting material thereof (inventive example 2). Because of the good stability of the phosphors of the invention, they can also be used with a higher proportion of activator dopants (in the present case 5%) compared to $CaAlSiN_3$ phosphors, where a corresponding color locus can be achieved only with very low Eu dopings (in the present case 0.4%). It can again be inferred from the table in FIG. 41a that, with comparable color loci of the two LEDs in the red color space, the LED having the phosphor of the invention has a higher luminous flux and a higher radiant power. This can likewise be inferred from the emission spectrum of FIG. 41b, in which the emission spectra of comparative example 2 and of inventive example 2 are compared.

The second phosphors described in EP patent application EP 1 696 016 A1 are especially phosphors including the elements M, A, D, E, and X, where M is one or more elements selected from the group consisting of: Mn, Ce, Pr, Nd, Sm, Eu, Tb, Dy, Ho, Er, Tm, and Yb, A is one or more elements selected from the group consisting of divalent metal elements other than M, D is one or more elements selected from the group consisting of tetravalent metal elements, E is one or more elements selected from the group consisting of trivalent metal elements, X is one or more elements selected from the group consisting of: O, N, and F, and where the phosphors have the same crystal structure as $CaAlSiN_3$.

In addition, second phosphors used may also be phosphors of the general formula $(M_{1-x}Eu)_x(Al,Q)(Si,Y)N_3$ where M=Ca, Sr, alone or in combination or in combination with other divalent and/or monovalent elements, for example Li, Q=trivalent cation other than $Al^{3+}$, Y=other tetravalent cations other than $Si^{4+}$, $N^{3-}$ may be partly replaced by $O^{2-}$, $F^-$, $Cl^-$, $Br^-$, $C^{4-}$.

Figure 42B:
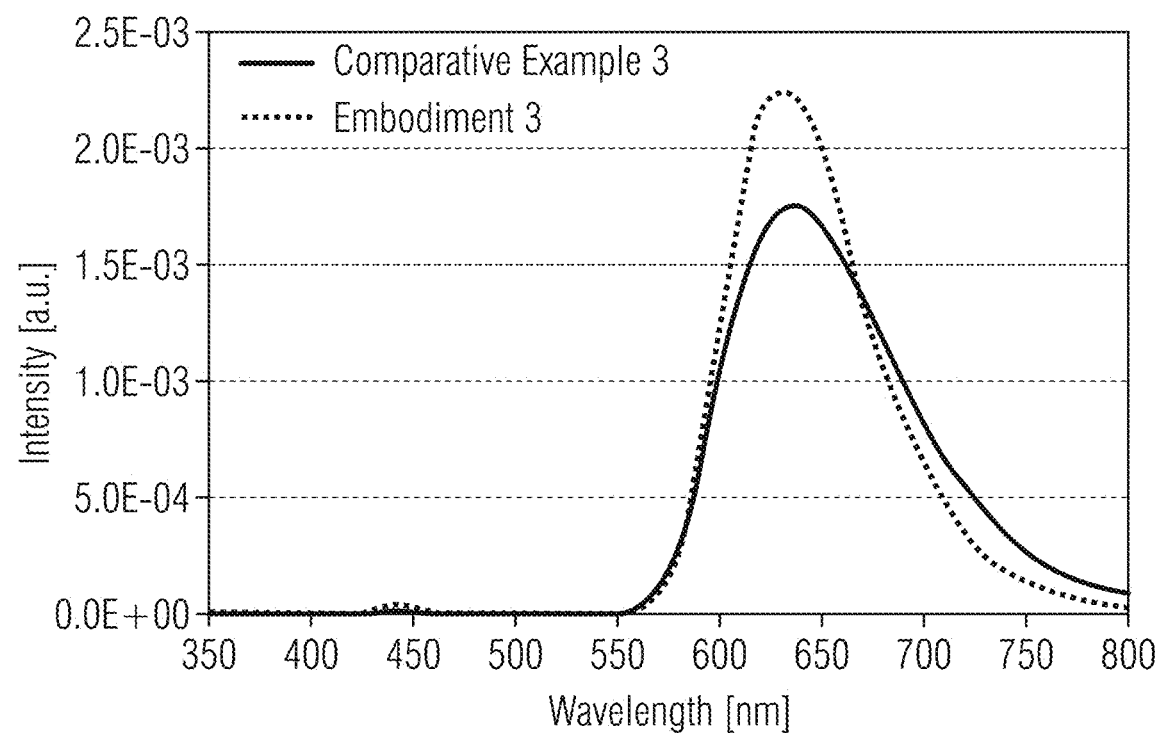

In the table in FIG. 42a, comparative example 3 and inventive example 3 are compared. In inventive example 3 again, a conventional $CaAlSiN_3$ phosphor $CaAlSi(N,O)_3$:Eu (0.4%) is used as the first phosphor, with additional incorporation of a further embodiment of a phosphor of the invention in the potting material as a second phosphor. In the present case, the $CaAlSiN_3$ phosphor is capable of absorbing the short-wave components of the secondary radiation converted by the phosphor of the invention and converting it to red light with longer wavelengths compared to the starting light. This approach has the advantage that, in contrast to wavelength-specific filters, the radiation is not just absorbed but also emitted again because of the conversion in the phosphor, which leads to an increased radiant power of the LED. It can again be inferred from the table that, with a similar color locus in the CIE color space, both the luminous flux and the radiant power of inventive example 3 have greatly increased compared to comparative example 3. This can likewise be inferred from the emission spectrum of FIG. 42b.

Figure 43B:
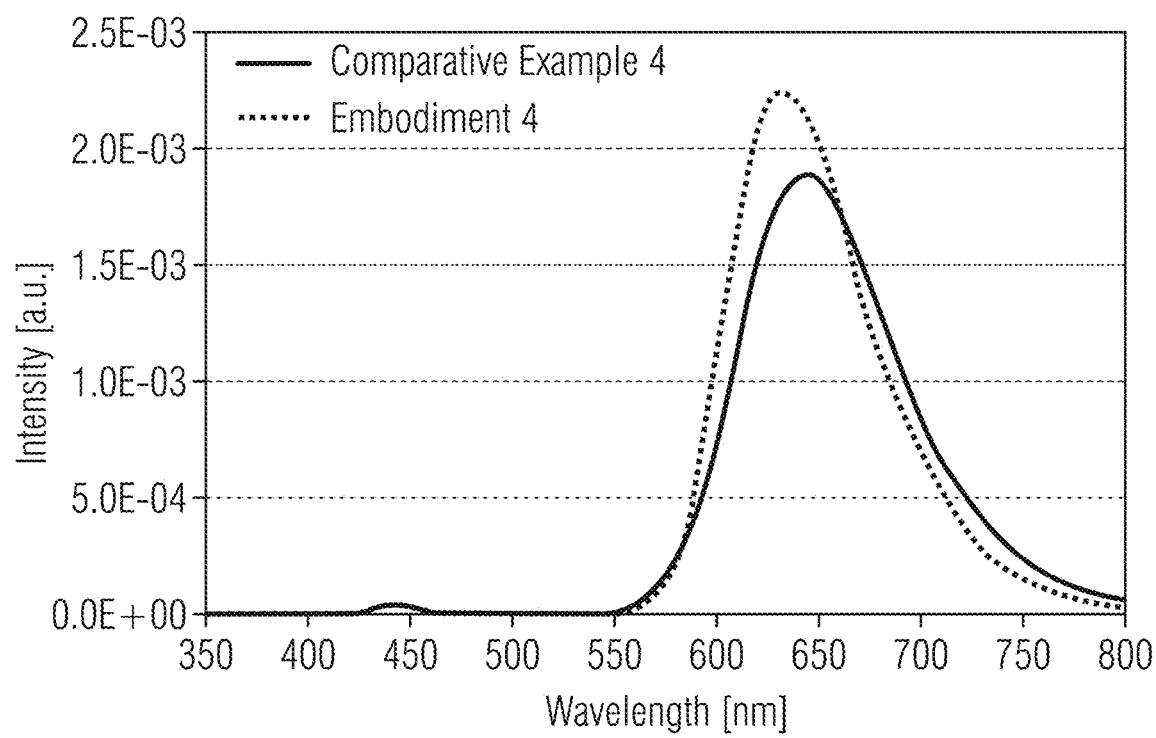

Analogously to inventive example 3 in inventive example 4 as well, which is compared with a comparative example 4 in the table in FIG. 43a, a conventional CaAlSiN$_3$ phosphor is used, which absorbs the short-wave components of the light converted by the phosphor of the invention and emits them again as red light of a higher wavelength. This table too, and the corresponding emission spectrum in FIG. 43b, show that, given similar color loci, the LED comprising the phosphor of the invention has a higher luminous flux and a higher radiant power compared to the LED comprising the conventional phosphors.

Figure 44B:
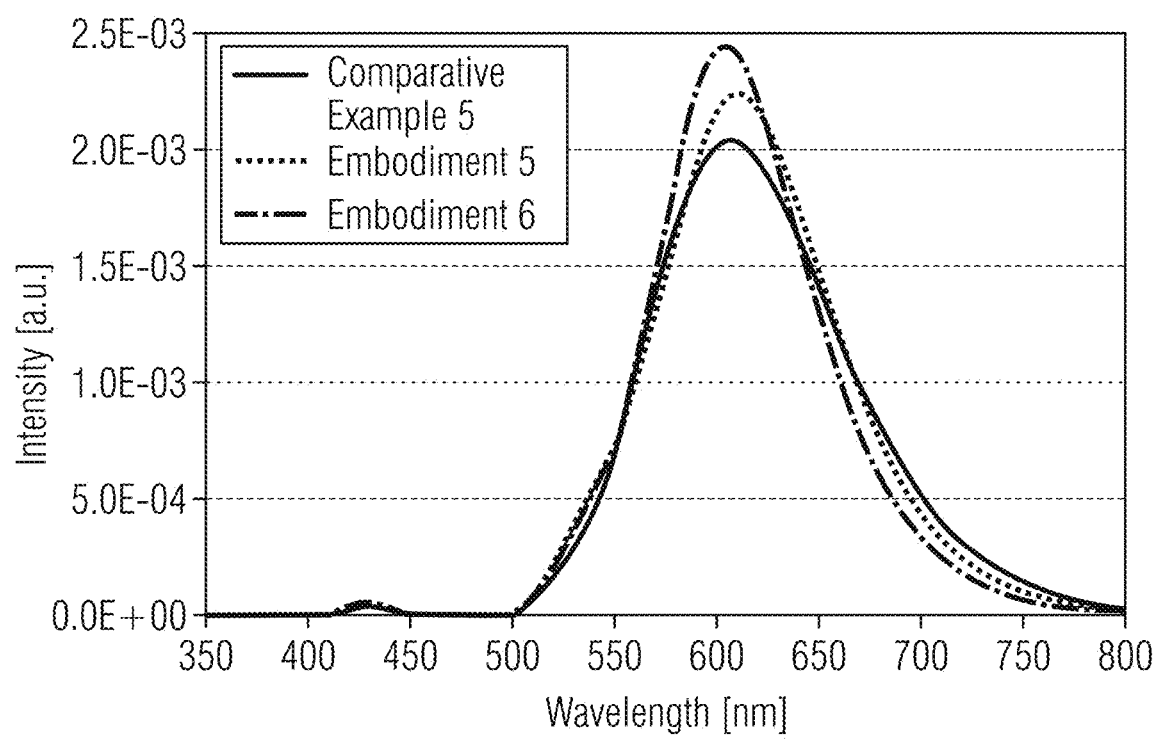

Two inventive examples 5 and 6 are compared in the table in FIG. 44a to a comparative example 5. In all LEDs, the blue primary radiation is converted to an orange secondary radiation, with exclusive use of conventional phosphors in comparative example 5 and of different embodiments of phosphors of the invention with a cerium-activated yttrium aluminum garnet phosphor in each of inventive examples 5 and 6. It can likewise be inferred from this table, just as from the corresponding emission spectrum of FIG. 44b, that the LEDs having the combination of phosphors including phosphors of the invention have a higher luminous flux and a higher radiant power than LEDs comprising conventional phosphors.

Further lighting devices of the invention are to be described hereinafter, where different amounts of phosphors of the invention having high europium concentrations are present as dopant in the potting material of the radiation source that emits the primary radiation, for example a blue LED. Lighting devices of this kind can also be used, for example, for full conversion of the primary radiation from the radiation source to a secondary radiation, for example in a red or yellow or yellow-orange wavelength range. More particularly, it is possible for lighting devices of the invention, in particular embodiments of the present invention, to have, as a radiation source that emits primary light, a blue LED having a dominant wavelength of 300-500 nm, preferably 400-500 nm, further preferably 420-470 nm, and a phosphor of the invention having the general formula Sr(Sr$_a$M$_{1-a}$)Si$_2$Al$_2$N$_6$:D where M is selected from the group of Ca, Ba, Zn, Mg, preferably Ca, and D is preferably Eu, and where the europium concentrations may be ≥6 mol %, further preferably ≥8 mol %. The radiation emitted by these radiation sources may have a half-height width FWHM of ≤90 nm, preferably ≤85 nm, and a dominant wavelength of ≥607 nm, preferably ≥609 nm.

Figure 45B:
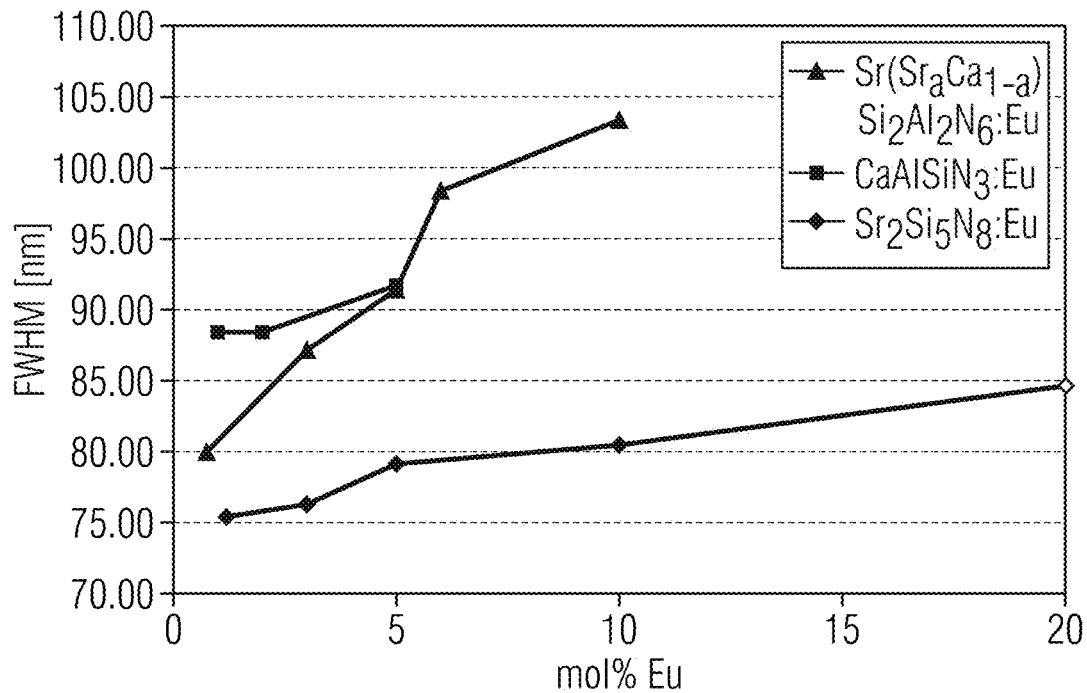
Figure 45C:
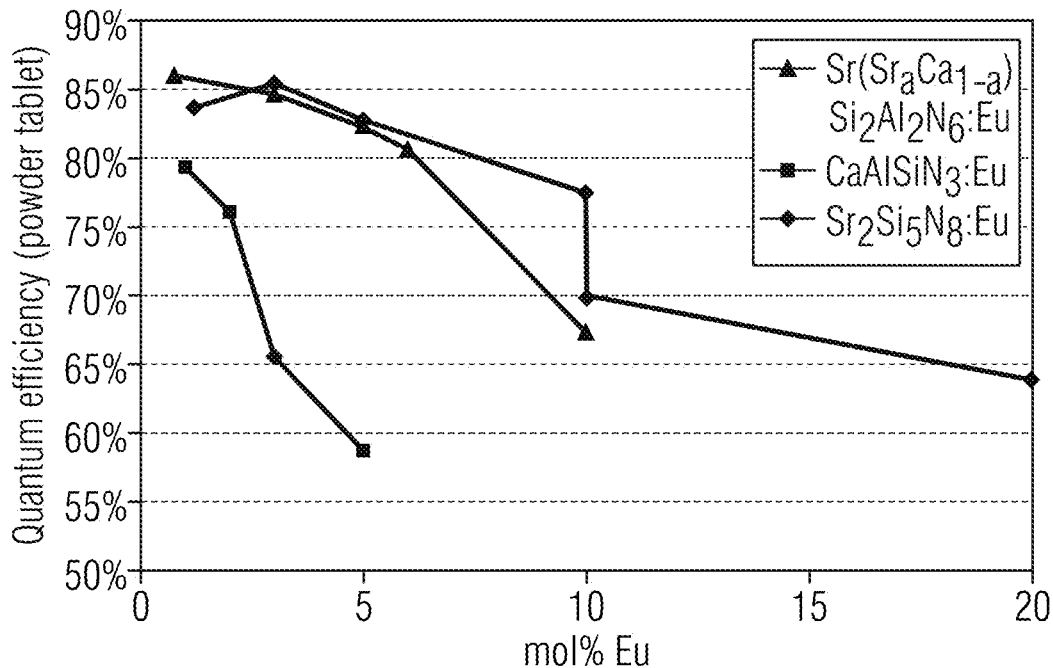
FIG. 45c shows phosphors according to embodiments of the invention having increased europium content.
Figure 45D:
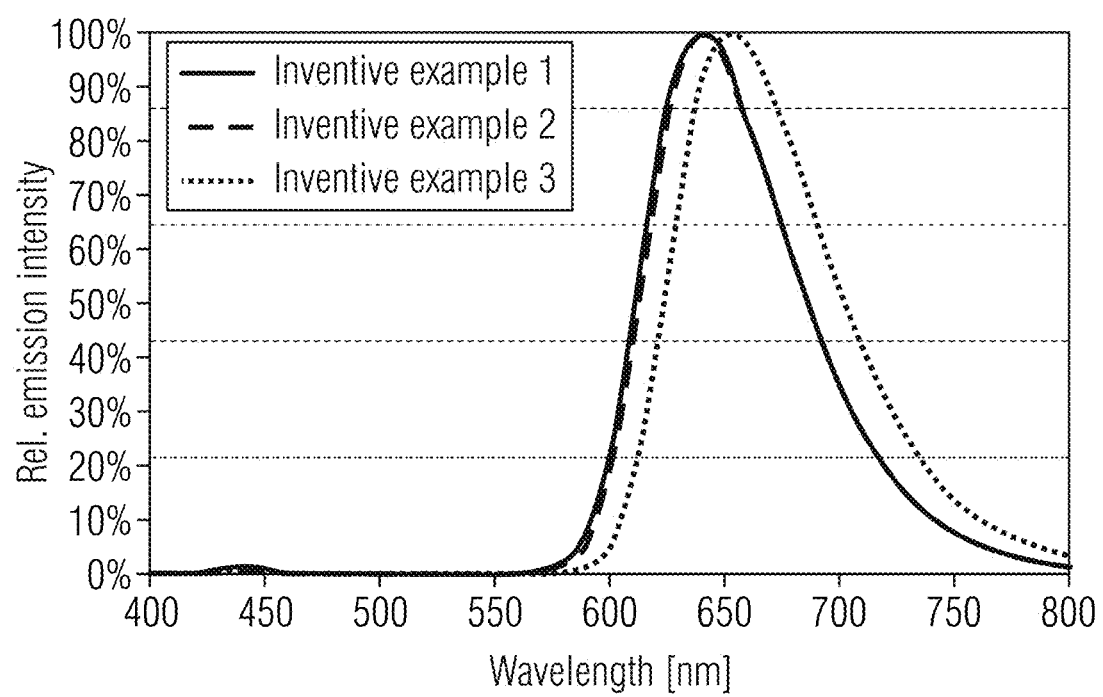
FIG. 45d shows emission spectra of phosphors according to embodiments of the invention.

The table in FIG. 45a shows various embodiments of lighting devices of the invention in which different concentrations of phosphors of the invention have been incorporated in the potting material of a conventional blue InGaN LED with a standard silicone potting material. In spite of the high europium concentrations, FIG. 45b shows that the half-height widths of the radiation emitted increase to a lesser degree with increasing europium concentrations in the case of phosphors of the invention having the general formula Sr(Sr$_a$M$_{1-a}$)Si$_2$Al$_2$N$_6$:Eu than in the case of conventional phosphors of the formulae CaAlSiN$_3$:Eu and Sr$_2$Si$_5$N$_8$:Eu. FIG. 45c likewise shows that, in the case of phosphors of the invention having an increasing europium content, surprisingly, the quantum efficiency decreases less significantly compared to conventional phosphors. FIG. 45d shows the emission spectra of the three inventive examples 1 to 3, it being clearly apparent that, apart from a very small proportion of the primary radiation, the entire radiation emitted by the lighting device is attributable to converted secondary radiation having a low half-height width FWHM. These properties of phosphors of the invention allow the provision of lighting devices which emit deep red light for the purposes of full conversion of the primary radiation.

The phosphors of the invention may be used with a multitude of different garnet phosphors as second phosphors. These may especially have the general structural formula:

(Gd,Lu,Tb,Y)$_3$(Al,Ga,D)$_5$(O,X)$_{12}$:RE with X=halide, N or divalent element, D=tri- or tetravalent element and RE=rare earth metals as activator, especially cerium with an optional co-dopant, for example lanthanoids, e.g. Pr, Sm, Nd.

The garnets may additionally also have the following general formula:

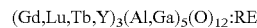
(Gd,Lu,Tb,Y)$_3$(Al,Ga)$_5$(O)$_{12}$:RE with RE=rare earth metals as activator, especially cerium with an optional co-dopant, for example lanthanoids, e.g. Pr, Sm, Nd.

Embodiments of Streetlighting Applications:

In a further embodiment of the present invention, it is possible to provide lighting devices of the invention which can especially also be used for general lighting applications, for example streetlighting, with a CRI≥70 and high color temperatures (~5000 K).

More particularly, these lighting devices may have, as radiation source, a blue LED having a dominant wavelength of 300-500 nm, preferably 400-500 nm, further preferably 420-470 nm, with at least one phosphor of the invention having the general formula Sr(Sr$_a$M$_{1-a}$)Si$_2$Al$_2$N$_6$:D where M is selected from the group of Ca, Ba, Zn, Mg, with D=Eu, present in the beam path of the radiation source as first phosphor and at least one yellow/green-emitting garnet phosphor of the general formula (Y,Lu,Gd)$_3$(Al,Ga)$_5$O$_{12}$:Ce present as second phosphor.

The first phosphor used here may be a phosphor of the invention having the general formula Sr(Sr$_a$M$_{1-a}$)Si$_2$Al$_2$N$_6$:D where M is selected from the group of Ca, Ba, Zn, Mg, preferably Ca, and D is preferably Eu, with a≥0.8, preferably a≥0.82, further preferably a≥0.85, and a europium content of 0.1-5 mol %, preferably 0.1-3 mol %, further preferably 0.1 to 2 mol %. The phosphor of the invention has a peak emission wavelength of about 600-640 nm, preferably 605-625 nm, and a half-height width FWHM of <85 nm, preferably <80 nm, further preferably <78 nm. Such a phosphor of the invention together with the garnet phosphor as second phosphor can give a lighting device in which a wide range of correlated color temperature CCT within the range of at least 6500-4000 K, preferably 6500-3000 K, is possible, where the CRI is at least 70.

In this case, the garnet phosphor as second phosphor may especially have the general formula Lu$_3$(Al,Ga)$_5$O$_{12}$:Ce or (Y,Lu)$_3$(Al,Ga)$_5$O$_{12}$:Ce, in which case the maximum excitability is preferably between 440-455 nm, further preferably between 454-450 nm. The yellow/green-emitting garnet phosphor is selected such that it has a high conversion efficiency and high thermal stability. A preferred yellow/green-emitting phosphor is a (Y,Lu)$_3$(Al,Ga)$_5$O$_{12}$:Ce having a cerium content of 0.5-5 mol %, preferably 1-3 mol %, and a Y content of 0-50 mol %, preferably 0-30 mol %, so as to result in a phosphor of the general formula (Lu$_{1-x}$Y$_x$)$_3$(Al,Ga)$_5$O$_{12}$:Ce with x=0 to 0.5, preferably x=0 to 0.3. Other variants of the garnet phosphor are also possible, having similar spectral characteristics, especially variants with $(Y,Lu)_3(Al,Ga)_5O_{12}$:Ce where at least some of the Al has been exchanged for Ga.

In a further embodiment, a garnet phosphor of the following general formula $Y_3(Al,Ga)_5O_{12}$:Ce is used, having a maximum excitability in the range of 440-455 nm, preferably 445-450 nm. The preferred yellow/green-emitting phosphor is selected such that it has a high conversion efficiency and high thermal stability. The preferred yellow/green-emitting phosphor is a phosphor of the general formula $Y_3(Al,Ga)_5O_{12}$:Ce having a cerium content of 1.5-5 mol %, preferably 2-5 mol %, and a gallium content of 0-50 mol %, preferably 0-30 mol %. Within this system, however, other element combinations are also possible, which result in similar spectral properties.

Hereinafter the optical properties of two comparative examples 1 and 2 where a garnet phosphor has been combined with a conventional 2-5-8 phosphor in the standard silicone potting material of a conventional InGaN LED having the dominant wavelength of 444.5 or 444.6 nm at 350 mA are to be compared with three embodiments of the present invention. The area of each of the LED chips is 1 $mm^2$.

The compositions of the various phosphors and the respective concentrations of the phosphors in the standard potting material and the relative proportions of the two phosphors are given in FIG. 46a.

It can be inferred from the table in FIG. 46b that, given similar color coordinates, the LEDs of inventive examples 1-4 comprising the phosphors of the invention, at a driver current of 350 mA, have a higher or similar conversion efficiency as the ratio of the luminous flux $\Phi_v$ of an LED having potting material filled with the phosphor mixtures and the radiant power $\Phi_e$ of an LED having a clear potting material without phosphors $\Phi(_{v(filled\ potting)}/\Phi_{e(clear\ potting)})$ compared to the LEDs comprising the conventional phosphor mixture, but the CRI is higher. The color point correction was conducted by taking a theoretical model of comparative example 2 and extrapolating the LED efficiency of the comparative example for the color points of the other inventive examples. The conversion efficiencies were each stated as the relative conversion efficiencies in relation to inventive example 1.

FIG. 46c shows the same measurement data as FIG. 46b, but at a driver current of 1000 mA. In that figure too, the inventive examples again have a higher CRI.

In summary, it can be stated that neither of comparative examples 1 and 2 attains the necessary CRI of 70 at 3000 K for streetlighting applications. For this reason, comparative examples 1 and 2 can be used either only in lighting devices having a correlated color temperature CCT between 6500-4000 K and not within a range of 6500-3000 K, or an additional, third phosphor has to be used to improve the color temperature, but this complicates the manufacturing process for the lighting devices. Thus, lighting devices of the invention, because of the phosphor of the invention, can have a sufficient CRI>70 within a broad color temperature range of 6500-3000 K for streetlighting applications. In contrast to conventional phosphor mixtures, no additional, third phosphor is needed for the achievement of a broad color temperature range.

Figure 46D:
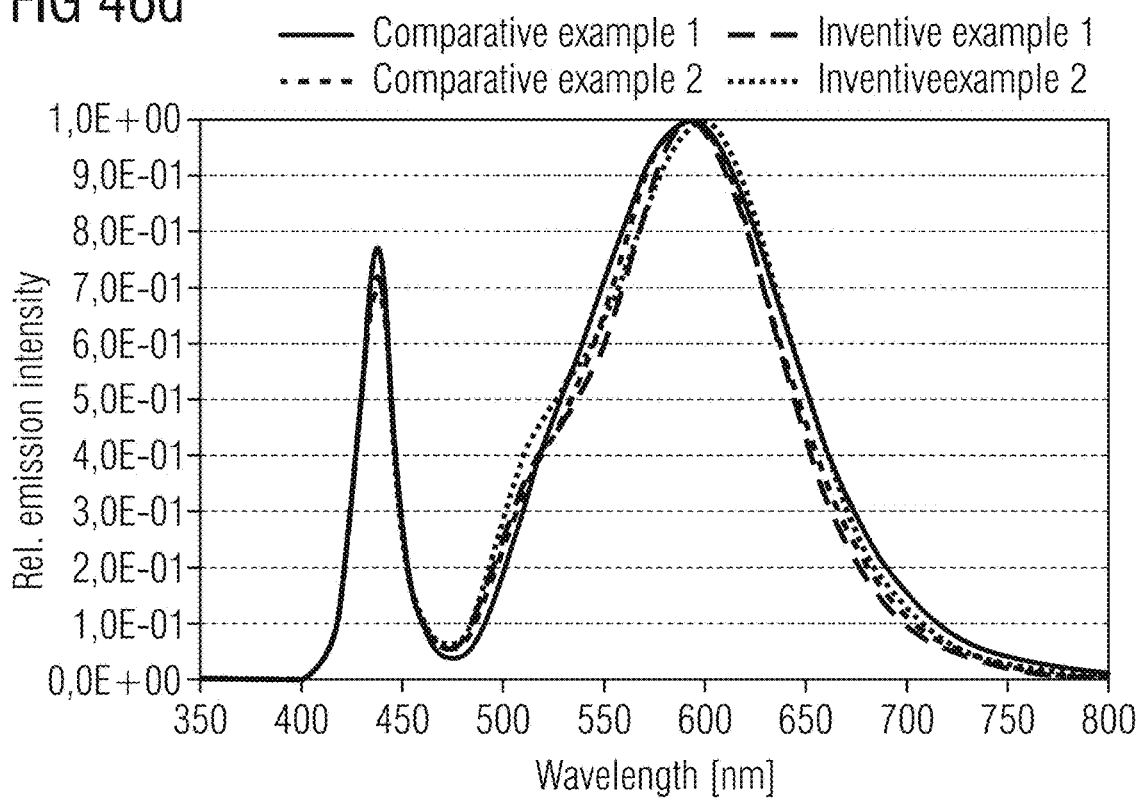
Figure 46E:
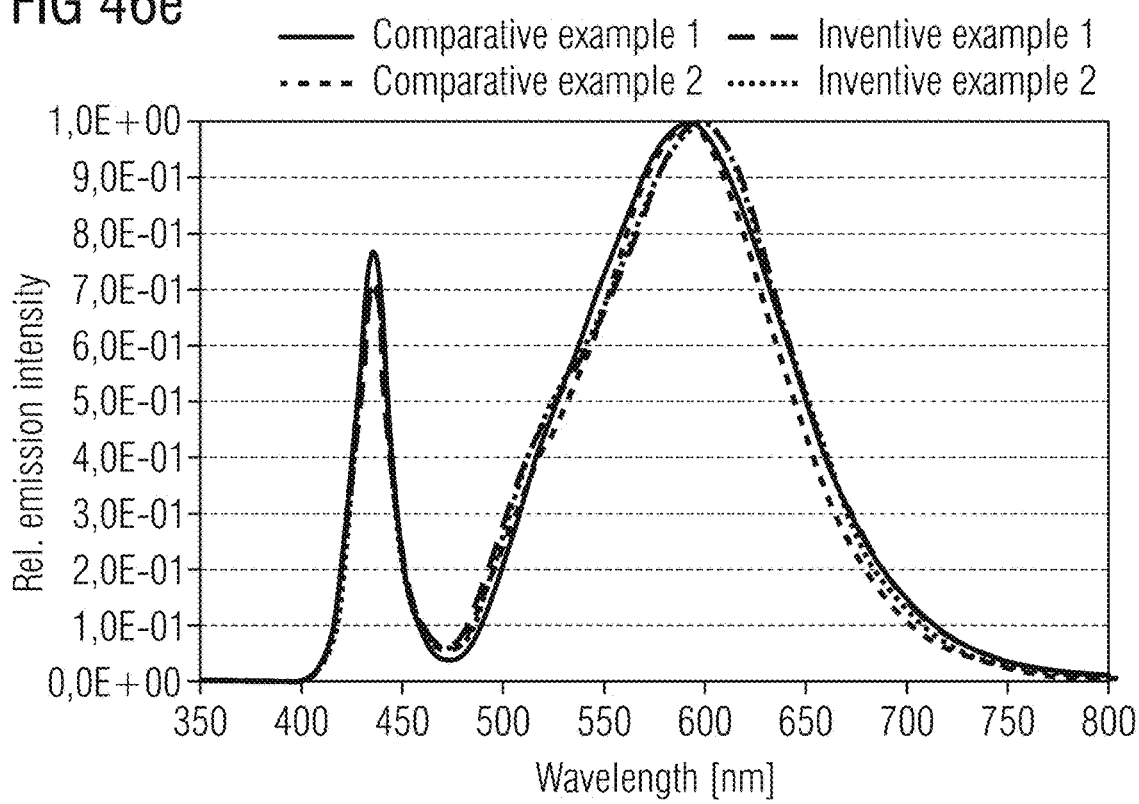

FIGS. 46d and 46e show the normalized LED spectra of inventive examples 1 and 2 and of the corresponding comparative examples 1 and 2 at a driver current of 350 mA (FIG. 46d) and the normalized LED spectra of inventive examples 3 and 4 and of comparative examples 1 and 2 at a driver current of 350 mA (FIG. 46e).

In further embodiments of the present invention, the efficiency of the lighting devices, for example for streetlighting, at a particular color temperature CCT and a particular CRI, can be improved by adding a further, third phosphor to the phosphor mixtures. More particularly, a lighting device in this embodiment of the present invention may have a radiation source having a blue light-emitting LED having a dominant wavelength between 440-455 nm, and also a red-emitting phosphor of the invention having a peak wavelength between 605-620 nm, preferably 605-616 nm, and a half-height width FWHM≤80 nm, preferably ≤78 nm, as the first phosphor, a green/yellow-emitting phosphor having a peak wavelength between 540-565 nm, preferably 546-556 nm, and a half-height width FWHM≥100 nm, preferably ≥105 nm, as the second phosphor, and a yellow/orange-emitting phosphor having a peak wavelength of 580-590 nm, preferably 582-588 nm, and a half-height width FWHM≤80 nm, preferably ≤78 nm, as the third phosphor.

The first phosphor used may especially be a red-emitting phosphor of the general formula $Sr(Sr_aM_{1-a})Si_2Al_2N_6$:D where M is selected from the group of Ca, Ba, Zn, Mg, preferably Ca, having a peak emission between 605-620 nm, preferably 605-616 nm, and a half-height width FWHM below or equal to 80 nm, preferably below or equal to 78 nm. It may especially be the case here that the value a≥0.8, preferably a≥0.84, and the europium content is between 0.1-5 mol %, preferably 0.1-3 mol %, further preferably between 0.1-2 mol %. These red-emitting phosphors feature a high thermal stability and a high conversion efficiency under operating conditions typical for streetlighting.

More particularly, the green/yellow-emitting phosphor as the second phosphor may be a garnet phosphor of the general formula $(Y,Lu,Gd,Tb)_3(Al,Ga)O_{12}$:Ce which is matched to the emission wavelengths of the blue LED and the two other phosphors. More particularly, the phosphor may be a green-emitting garnet phosphor of the general formula $(Y,Lu)_3(Al,Ga)_5O_{12}$:Ce, especially a yellow/green-emitting phosphor of the general formula $(Y,Lu)_3(Al,Ga)_5O_{12}$:Ce having a cerium content of 1-5 mol %, preferably 2-4 mol %, and an yttrium content of 0-50 mol %, preferably 0-30 mol %, further preferably 0-20 mol %, and a gallium content of 0-50 mol %, preferably 0-30 mol %, further preferably 0-15 mol %, and so the result is a garnet phosphor of the following general formula: $(Lu_{1-x}Y_x)_3(Al_{1-y}Ga_y)_5O_{12}$:Ce with x=0 to 0.5, preferably x=0 to 0.3, further preferably x=0 to 0.15 and y=0 to 0.5, preferably y=0 to 0.2, further preferably y=0 to 0.15. Other element combinations within the general formula $(Y,Lu,Gd,Tb)_3(Al,Ga)_5O_{12}$:RE with RE=rare earth metal, e.g. Ce, are likewise possible.

The third phosphor used may especially be a phosphor of the general formula $(Ca,Sr,Ba)_2(Si,Al)_5(N,O)_8$:Eu which, together with the primary light source, for example a blue LED, and the green/yellow-emitting phosphor and the red-emitting phosphor of the invention, achieves a CRI≥65, preferably ≥70, over a wide range of correlated color temperature CCT (at least of 6500-4000 K, further preferably of 6500-3000 K). In order to achieve the above-described spectral properties for the yellow/red- or yellow/orange-emitting phosphor as the third phosphor, this has a europium content of 0.1-5 mol %, preferably of 0.1-3 mol %, further preferably of 0.1-2 mol %, and a barium content of 50-100 mol %, preferably 70-100 mol %, further preferably 80-100 mol %, and a calcium content of 0-20 mol %, preferably 0-10 mol %, where the proportion of strontium is chosen such that the alkaline earth metals barium, strontium and calcium together with the europium dopant add up to 100%.

There follows a description of one embodiment of a lighting device of the invention having three different first to third phosphors in relation to a comparative example. Comparative example 1 is a lighting device having a blue LED chip (dominant wavelength 445 nm) having a chip area of 1 mm$^2$, in which 14% by weight of a phosphor mixture composed of two different phosphors is present in the standard silicone potting material of the LED, where the ratio of the green to the red phosphor is 4.7:1.

The green-emitting phosphor here is a phosphor of the formula $(Lu_{0.85}Y_{0.15})_3Al_5O_{12}$:Ce (3 mol %), and the red-emitting phosphor a phosphor of the formula $(Sr_{0.5}Ba_{0.5})_2Si_5N_8$:Eu (1 mol %), the LED being operated at a driver current of 350 mA. In inventive example 1, present in the standard silicone potting material of a blue LED having a dominant wavelength of 445 nm at a driver current of 350 mA is 14% by weight of a phosphor mixture comprising the following three first to third phosphors: $Sr(Sr_{0.86}Ca_{0.14})Si_2Al_2N_6$:Eu (0.8 mol %) as the first phosphor, $(Lu_{0.85}Y_{0.15})_3 Al_5O_{12}$:Ce (3 mol %) as the second phosphor and $(Sr_{0.1}Ba_{0.9})_2Si_5N_8$:Eu (1 mol %) as the third phosphor, where the ratio of first phosphor:second phosphor:third phosphor is 0.67:5.3:0.33. The area of the LED chip is again 1 mm$^2$.

FIG. 47a shows, in tabular form, a list of the CIE color coordinates and of the CRI and the conversion efficiency as the ratio of the luminous flux $\Phi_v$ of an LED having a potting material filled with the phosphor mixtures and the radiant power $\Phi_e$ of an LED having a clear potting material without phosphors $\Phi_{(v(filled\ potting)}/\Phi_{e(clear\ potting)})$ and the luminous efficiency for comparative example 1 and inventive example 1 of the present invention at a driver current of 350 mA and a dominant wavelength of 444.6 nm. It is apparent that both the luminous efficiency and the conversion efficiency in the inventive example are higher than in the comparative example.

FIG. 47b shows further results for inventive example 1 and for comparative example 1 at a driver current of 350 mA at different temperatures of 25° C. and 85° C. Here too, it is apparent that the luminous efficiency is higher in inventive example 1 than in comparative example 1.

Figure 47C:
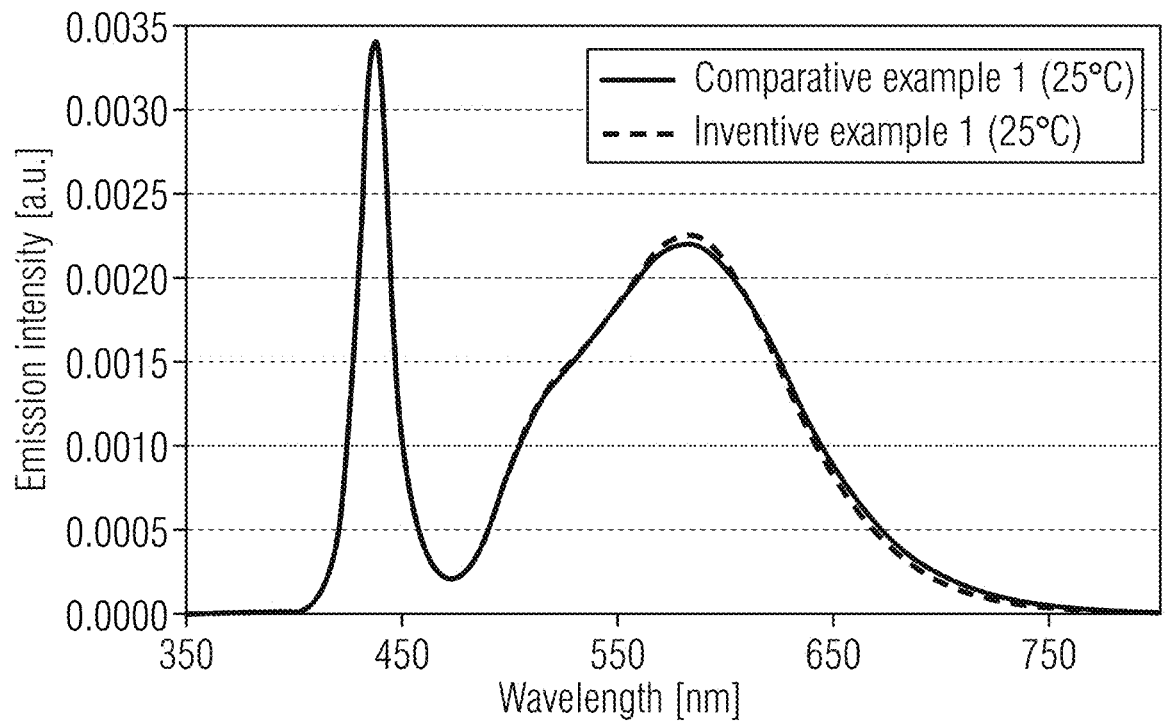

FIG. 47c shows the emission spectra of comparative example 1 and of inventive example 1 at 25° C. at a color temperature of 4000 K and a driver current of 350 mA. The two examples have roughly comparable emission spectra.

Figure 47D:
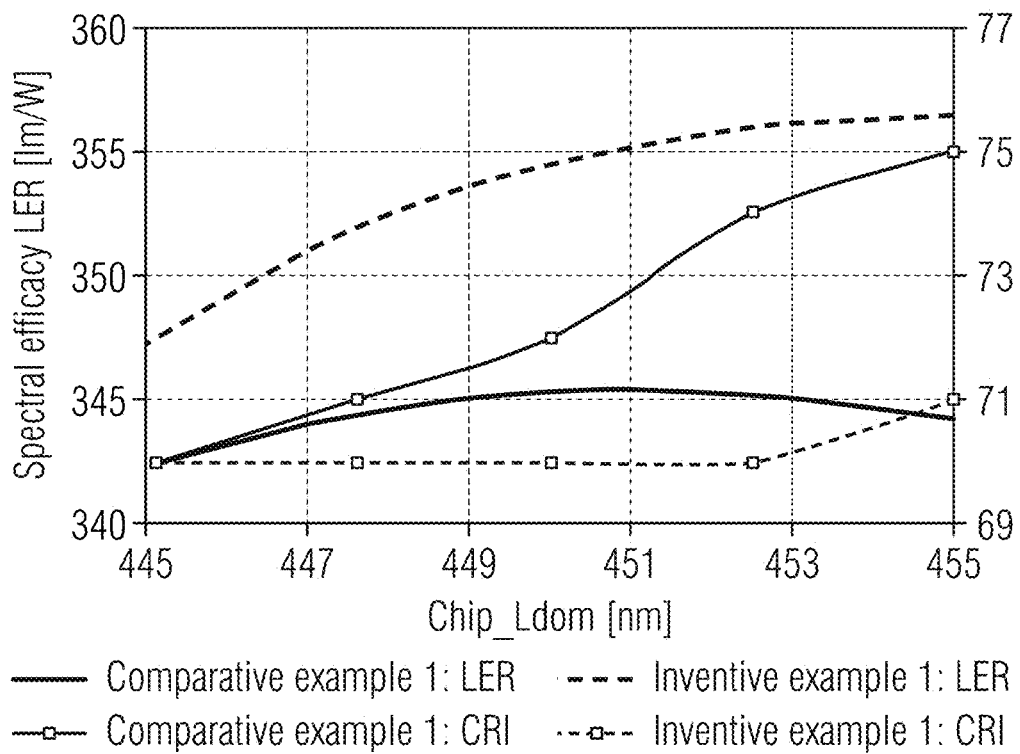

FIG. 47d shows the spectral efficiency (LER, 1 m/W$_{opt}$) of inventive example 1 compared to comparative example 1 as a function of the dominant wavelength of the LED chip at a color temperature of 4000 K based on ray tracing simulations. It is clearly apparent that, in the case of the phosphor mixture of the invention, composed of three phosphors, the spectral efficiency is greater than in the comparative example. The data shown in the FIGS. 47e to 47i that follow are also based on ray tracing simulations, with selection of color loci on the Planckian locus with the CCT specified for the simulations.

Figure 47E:
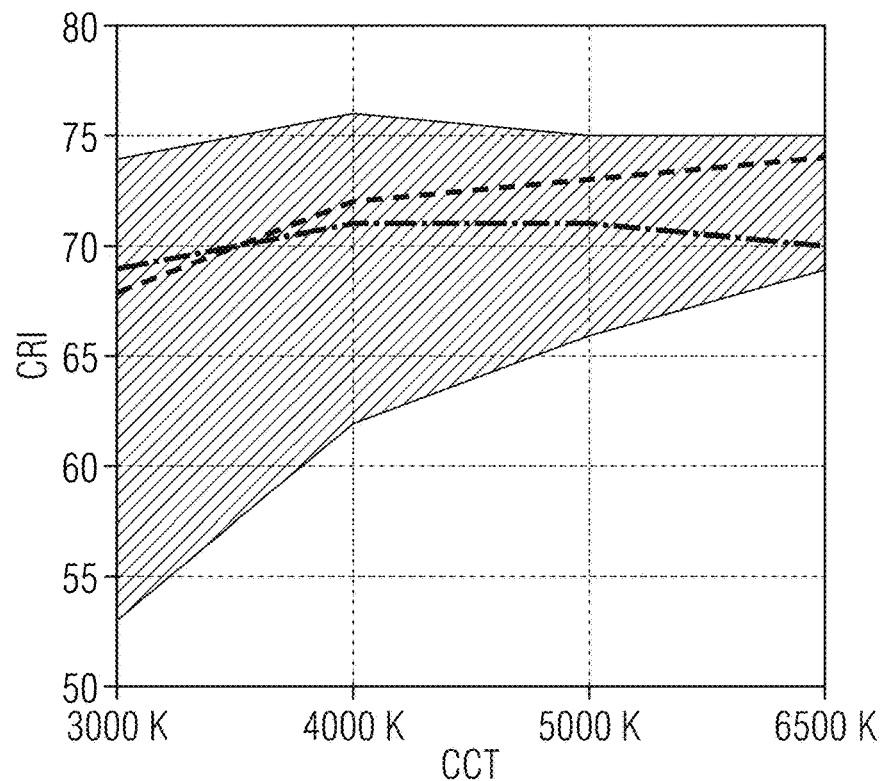

FIG. 47e shows that the range for the CRI with the phosphor mixture of the invention, comprising three phosphors, can be adjusted over a very wide range between 53 and 76 over a range of the correlated color temperature CCT of 3000-6500 K (see areas shaded gray). The dominant wavelength of the LED chip is 448 nm and the dashed and dotted lines in this figure show the CRI for two comparative examples. Inventive example 1 comprises a mixture of three different phosphors of the following composition: $(Lu_{0.85}Y_{0.15})_3Al_5O_{12}$:Ce (3 mol %), $(Sr_{0.1}Ba_{0.9})_2Si_5N_8$:Eu (1 mol %) and $Sr(Sr_{0.86}Ca_{0.14})Si_2Al_2N_6$:Eu (0.8 mol %), whereas comparative example 1 contains the two following phosphors: $(Lu_{0.8}Y_{0.2})_3Al_5O_{12}$:Ce (4.5 mol %) and $(Ca_{0.025}Sr_{0.475}Ba_{0.5})_2Si_5N_8$:Eu (2.5 mol %), and comparative example 2 comprises the following phosphors: $(Lu_{0.85}Y_{0.15})_3Al_5O_{12}$:Ce (3 mol %) and $(Sr_{0.5}Ba_{0.5})_2Si_5N_8$:Eu (1 mol %).

Figure 47F:
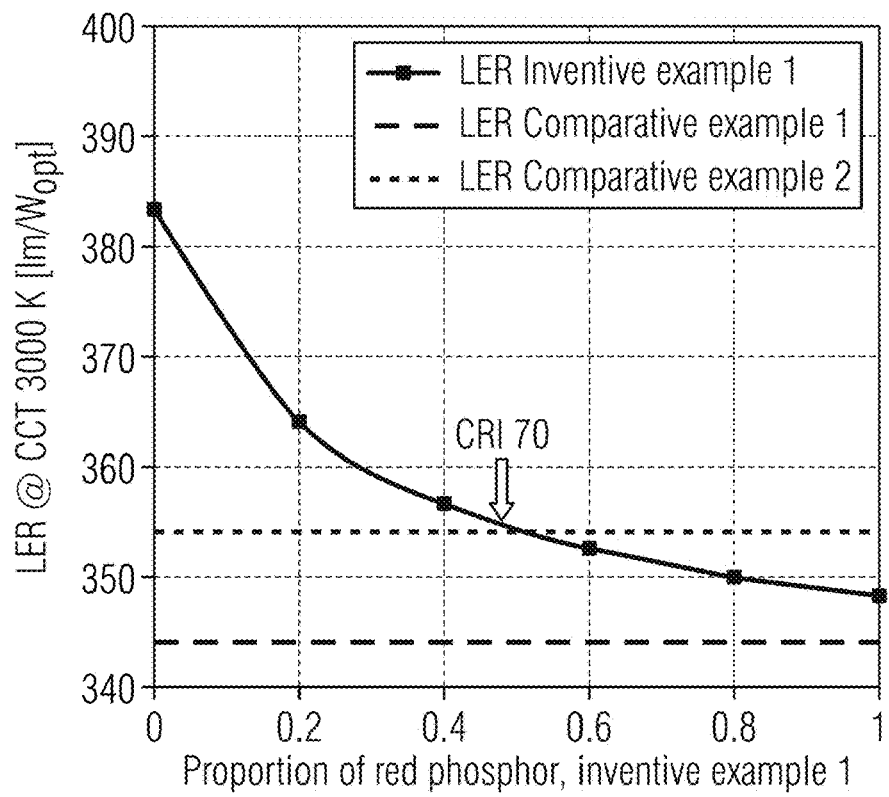
Figure 47G:
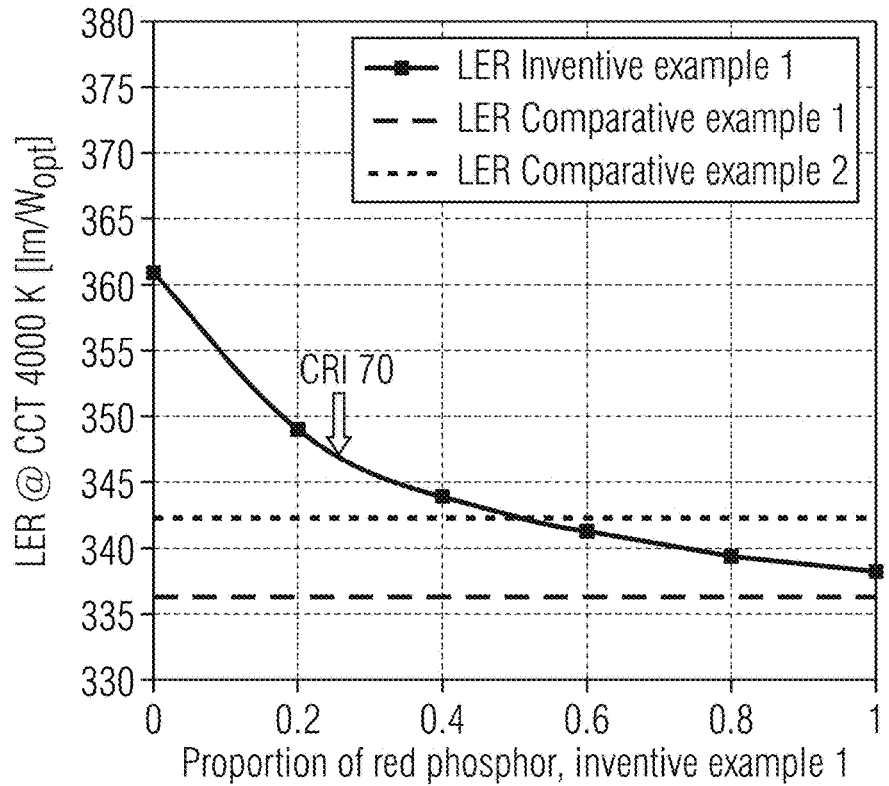
Figure 47H:
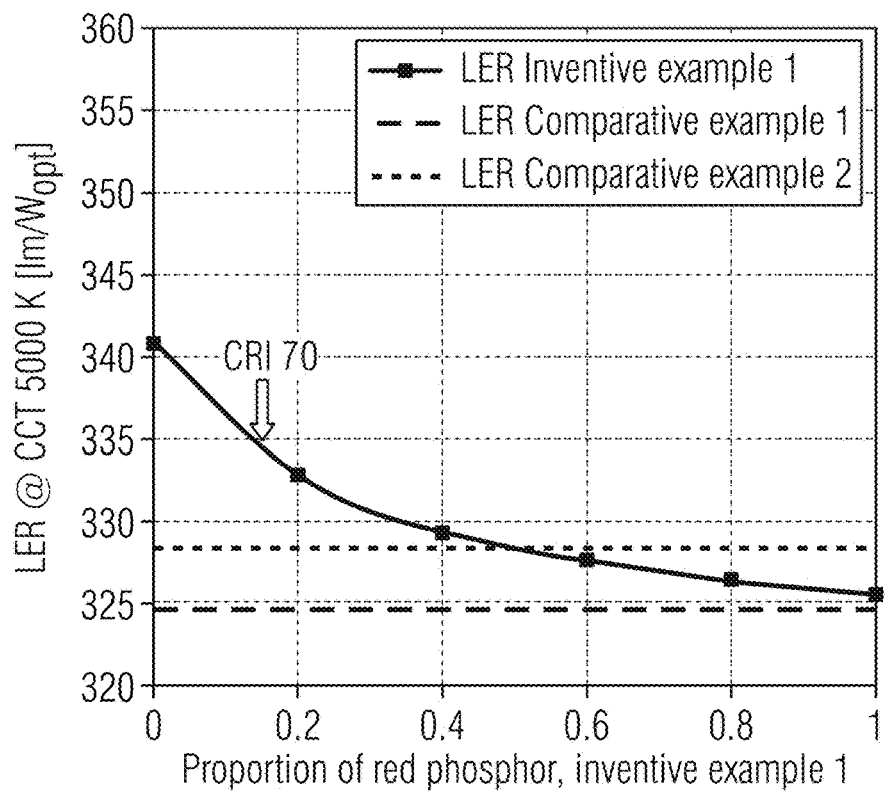
Figure 47I:
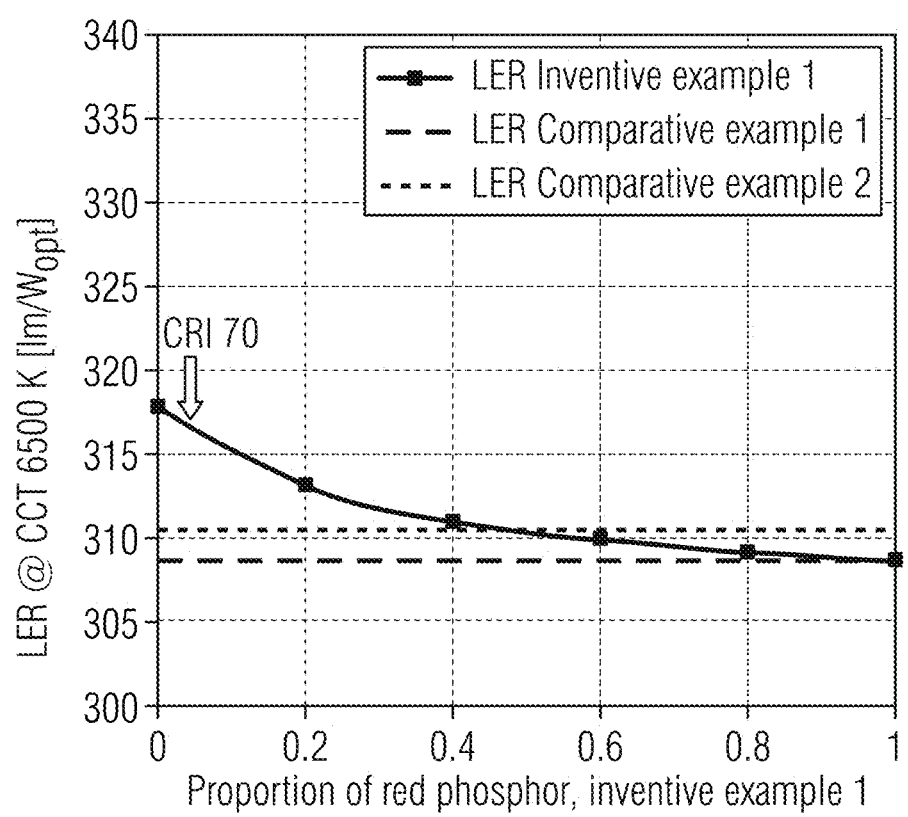

FIGS. 47f to 47i show the luminous efficiency LER for this inventive example 1 and comparative examples 1 and 2 as a function of the proportion of the red phosphor of the invention for inventive example 1 at various CCTs (FIG. 47f: 3000 K on Planck; FIG. 47g: 4000 K on Planck; FIG. 47h: 5000 K on Planck and FIG. 47i: 6500 K on Planck). For comparative examples 1 and 2 which contain only two phosphors, the luminous efficiency LER and the proportion of the red phosphor are already determined by the desired color point/CCT. Therefore, the values on the x axis relate only to inventive example 1, and the values shown there give the proportion of the red phosphor in relation to the orange phosphor in the phosphor mixture of the invention containing the three phosphors. The mixture of the red and green phosphors is then mixed with the green-yellow phosphor, in order to achieve the desired color locus (LER at CRI 70 marked with an arrow for embodiments). It can additionally be inferred from these figures that, at a CRI of 70, the phosphor mixture of the invention has an LER higher than in the case of conventional phosphor mixtures. Particularly in the case of high correlated color temperatures CCT, the proportion of the red phosphor in the mixture can be gradually reduced and, correspondingly, the proportion of the orange-emitting phosphor increased, since a high proportion of red-emitting phosphor is required particularly at low CCT. Zero or only small proportions of deep red emission in the LED spectrum generally have a positive effect on the LED efficiency.

Embodiments of backlighting applications: a further embodiment of the present invention is directed to phosphor mixtures for backlighting applications. For backlighting applications, a broad color space has to be achieved with narrow-band red- and green-emitting phosphors, the phosphor mixture determining the optical properties of the LED, such as brightness, efficiency and robustness.

For the sRGB/Rec709 color space, lighting devices which can be used as backlighting devices for LCDs, for example, are especially those having, as primary radiation source, a blue LED having a dominant emission wavelength of 430-470 nm, preferably 440-460 nm, further preferably 445-455 nm, and also containing a green/yellow-emitting garnet phosphor of the general formula $(Lu,Y,Gd,Tb)_3(Al,Ga)_5O_{12}$:Ce and also a red-emitting phosphor, especially an inventive phosphor of the general formula $Sr(Sr_aM_{1-a})Si_2Al_2N_6$:D where M is selected from the group of Ca, Ba, Zn, Mg, preferably Ca, and D is preferably Eu. It is optionally also possible for further converters or phosphors or non-converting materials such as diffusers to be present in the phosphor mixture.

The garnet phosphor may especially have the general composition $(Lu,Y)_3(Al,Ga)_5O_{12}$:Ce and may also take the form of yttrium aluminum gallium garnet having a gallium content of 20 mol %≤x≤60 mol %, further preferably 30 mol %≤x≤50 mol %, further preferably 30 mol %≤x≥45 mol %, so as to result in the general formula: $Y_3(Al_{1-x}Ga_x)_5O_{12}$:Ce with 0.2≤x≤0.6, further preferably 0.3≤x≤0.5, further preferably 0.3≤x≤0.45. In addition, the garnet phosphor may also take the form of lutetium aluminum gallium garnet having the following general formula: $Lu_3(Al_{1-x}Ga_x)_5O_{12}$:Ce with 0≤x≤0.6, further preferably 0≤x≤0.4, further preferably 0≤x≤0.25, with a cerium content of 0.5-5 mol %, preferably 0.5-3 mol %, further preferably 0.5-2.5 mol %, based in each case on the rare earth metals.

The red-emitting phosphor of the invention may have an activator content of $\geq 2$ mol %, preferably an activator content of $\geq 3$ mol %, further preferably a content of $\geq 4$ mol %, where the divalent metals, which are preferably strontium and calcium, have a calcium content of $\leq 15$ mol %, preferably $\leq 10$ mol %, further preferably $\leq 8$ mol %, so as to result in the following general formula: $Sr(Sr_aCa_{1-a})Si_2Al_2N_6$:Eu with $a\geq 0.7$, preferably $a\geq 0.8$, further preferably $a\geq 0.84$.

Both the abovementioned garnet phosphors may be used, the use of the yttrium aluminum gallium garnet rather than the lutetium aluminum gallium garnet bringing the advantage that the yttrium garnet has a lower specific density, such that less phosphor is required for the phosphor mixtures and, at the same time, a lower percentage of rare earth metals has to be used for the production of the phosphors, and so they can be produced less expensively.

For backlighting applications having elevated demands on the color space (for example Adobe RGB, NTSC or DCI-P3), phosphor mixtures having very narrow-band-emitting green-yellow phosphors are required. Preferably, lighting devices of this kind have, as radiation source, a blue LED having a dominant wavelength between 430-470 nm, preferably 440-460 nm, further preferably 445-455 nm.

The green/yellow-emitting phosphors used may be nitridoorthosilicates which have the general composition $AE_{2-x}RE_xSiO_{4-x}N_x$:Eu with AE=Sr, Ca, Ba, Mg, RE=rare earth metals and/or $AE_{2-x}RE_xSi_{1-y}O_{4-x-2y}N_x$:Eu, and AE and RE as defined in the previous example, and which are more particularly described in the patent application WO 2011/160944. It is likewise possible to use orthosilicates of the general formula $AE_2SiO_4$:Eu with AE=Ca, Ba, Mg, Sr. Both the nitridoorthosilicates and orthosilicates having the abovementioned empirical formulae preferably include a combination of at least two alkaline earth metals, further preferably a combination of strontium and barium having the ratio of $0.5\leq Ba:Sr\leq 2$, further preferably $0.75\leq Ba:Sr\leq 1.25$. The nitridoorthosilicates may also be described by the general formula $AE_{2-x}L_xSiO_{4-x}N_x$:RE where AE contains one or more elements selected from Mg, Ca, Sr, Ba and RE contains one or more elements selected from rare earth metals, preferably at least Eu, and L contains one or more elements selected from rare earth metals other than RE, with $0<x\leq 0.1$, preferably $0.003\leq x\leq 0.02$. A further general composition is $AE_{2-x}L_xSi_{1-y}O_{4-x-2y}N_x$:RE where AE contains one or more elements selected from Mg, Ca, Sr, Ba and RE contains one or more elements selected from rare earth metals, preferably at least Eu, and L contains one or more elements selected from rare earth metals other than RE, with $0<x\leq 0.1$, preferably $0.003\leq x\leq 0.02$, and $0<y\leq 0.1$, preferably $0.002\leq y\leq 0.02$.

It is also possible to use yellow/green-emitting beta-SiAlONs of the general formula $Si_{6-z}Al_zO_zN_{8-z}$:Eu with $0<z\leq 4$. The beta-SiAlONs may also have the general formula $Si_{6-z}Al_zO_yN_{8-y}$:$RE_z$ where $0<x\leq 4$, $0<y\leq 4$, $0<z<1$ and RE is one or more elements selected from rare earth metals, preferably at least Eu and/or Yb.

It is also possible to use yellow- to green-emitting nano-semiconductor materials, called "quantum dots", containing at least one compound selected from: a group II-VI compound, a group IV-VI compound or metal nanocrystals.

Inventive red-emitting phosphors may especially phosphors of the following general formula: $Sr(Sr_aCa_{1-a})Si_2Al_2N_6$:D having an activator content of $\geq 4$ mol %, preferably $\geq 8$ mol %, further preferably $\geq 10$ mol %, further preferably $\geq 15$ mol %, where the divalent metals are preferably strontium and calcium with a calcium content of $\geq 15$ mol %, preferably $\geq 10$ mol %, further preferably $\geq 8$ mol %, so as to result in the general formula $Sr(Sr_aCa_{1-a})Si_2Al_2N_6$:D with $a\geq 0.7$, preferably $a\geq 0.8$, further preferably $a\geq 0.84$.

Figure 48B:
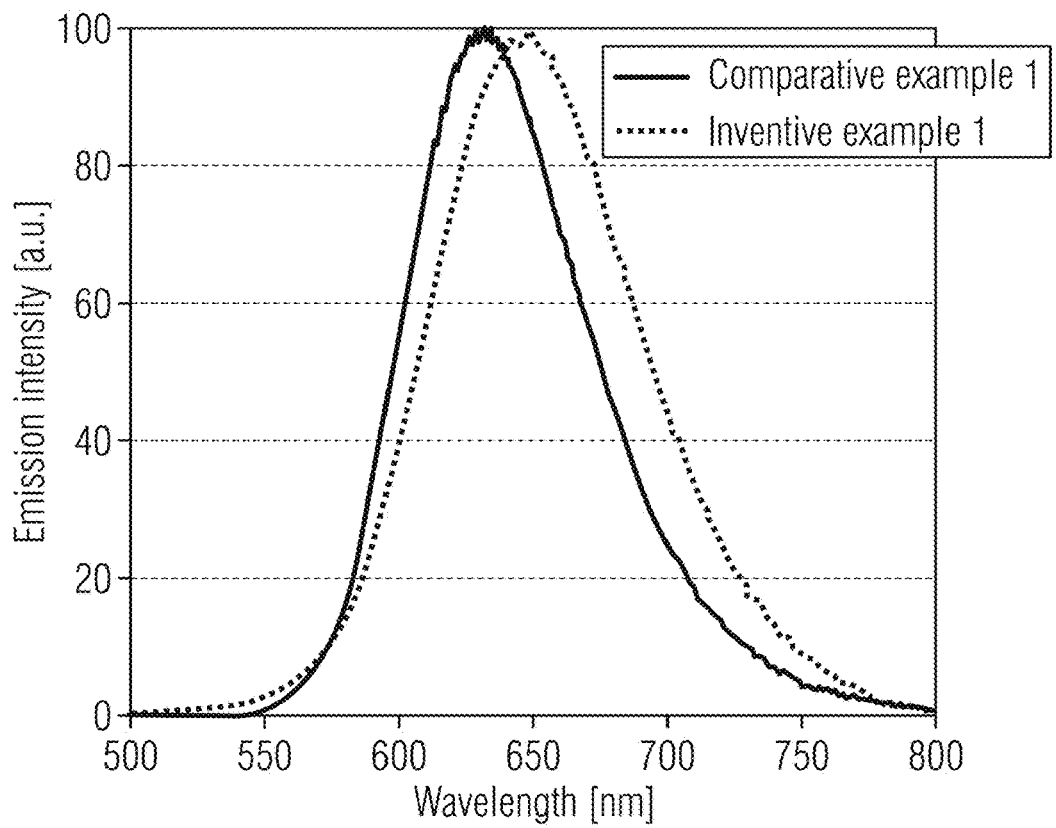
Figure 48C:
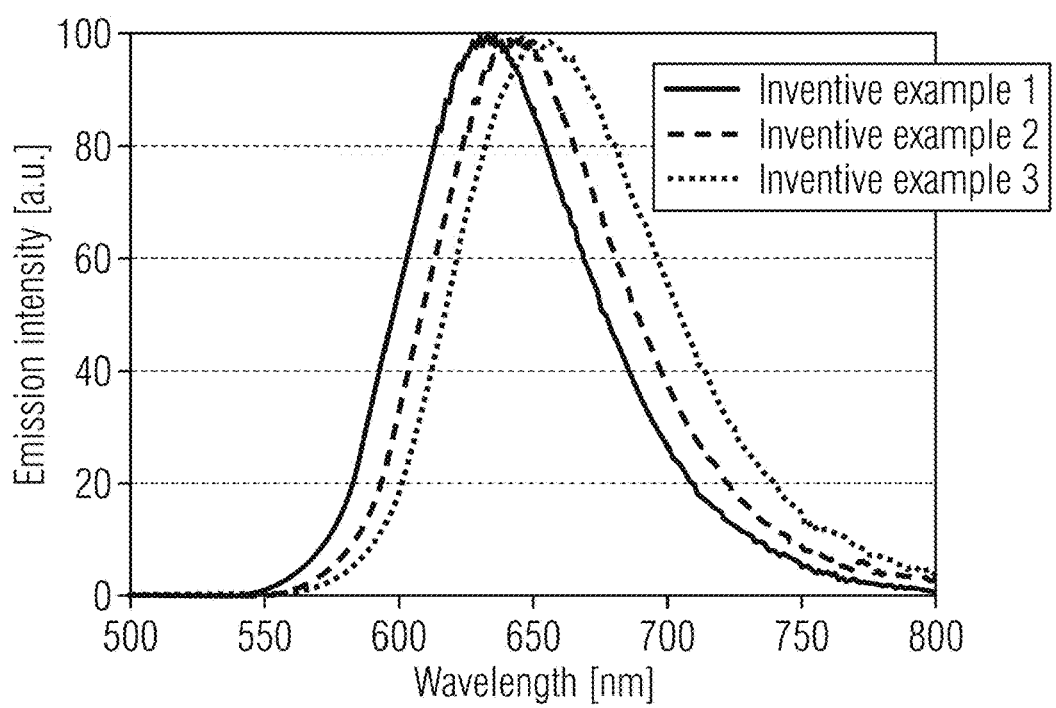

There follows a discussion of some embodiments of lighting devices discussed here in comparison with conventional lighting devices. The phosphors of inventive examples 1 and 2 shown in FIGS. 48a to 48d were used in lighting devices having LEDs and are labeled with embodiment LED1 or embodiment LED2 in the figures which follow. The comparative examples were also labeled correspondingly. FIG. 48a shows, in tabular form, spectral data of a comparative example 1, in which a conventional phosphor of the formula $CaAlSiN_3$:Eu (0.4% Eu) has been incorporated in the standard silicone potting material of a blue-emitting LED. In contrast, in inventive examples 1 to 3, phosphors of the invention having different proportions of europium as activator were incorporated into the potting material. In the inventive examples, a smaller half-height width FWHM of the radiation emitted relative to comparative example 1 was observed, and inventive examples 1 and 2 simultaneously show a higher external quantum efficiency than the comparative example. The further FIGS. 48b and 48c show the emission spectra of the comparative example and the three inventive examples 1 to 3. These emission spectra of the inventive examples show a reduced half-height width with simultaneously deep red emission.

Figure 48D:
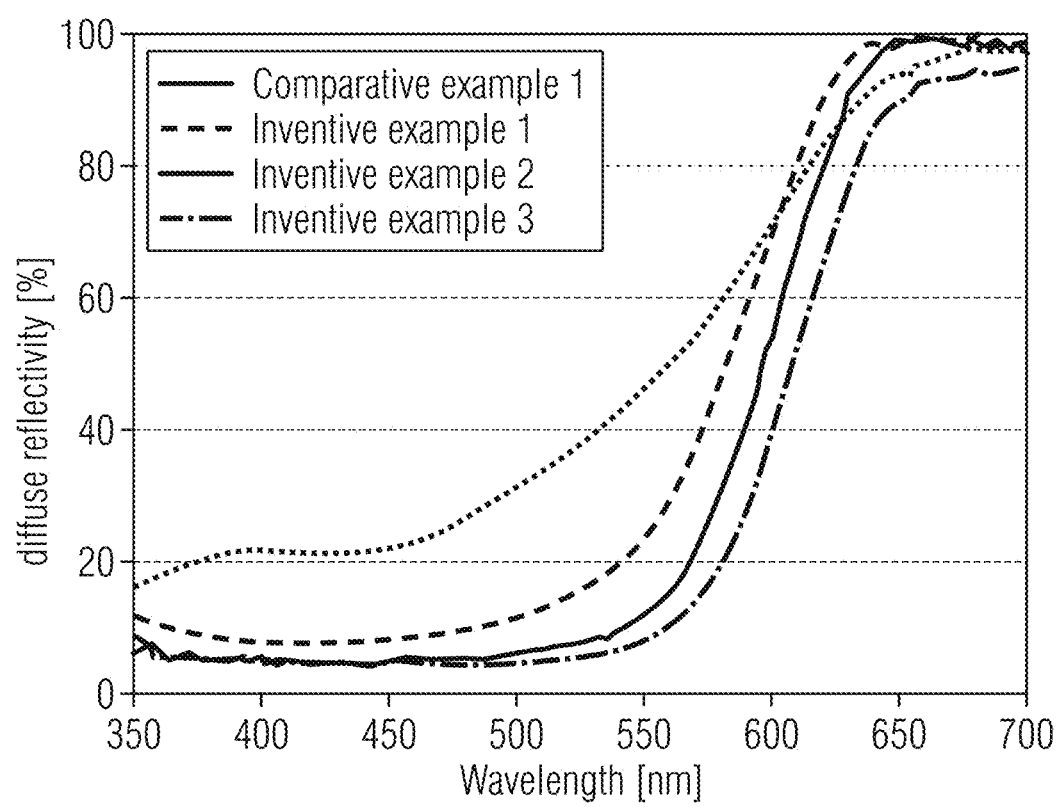

FIG. 48d shows the diffuse reflection of the comparative example and the three inventive examples as a function of wavelength. All the inventive examples comprising the phosphor of the invention exhibit a very low reflection in the UV to green region of the spectrum, which means a high absorption. At the same time, the reflection is very high at wavelengths >650 nm, and so a high conversion efficiency can be achieved.

Figure 48F:
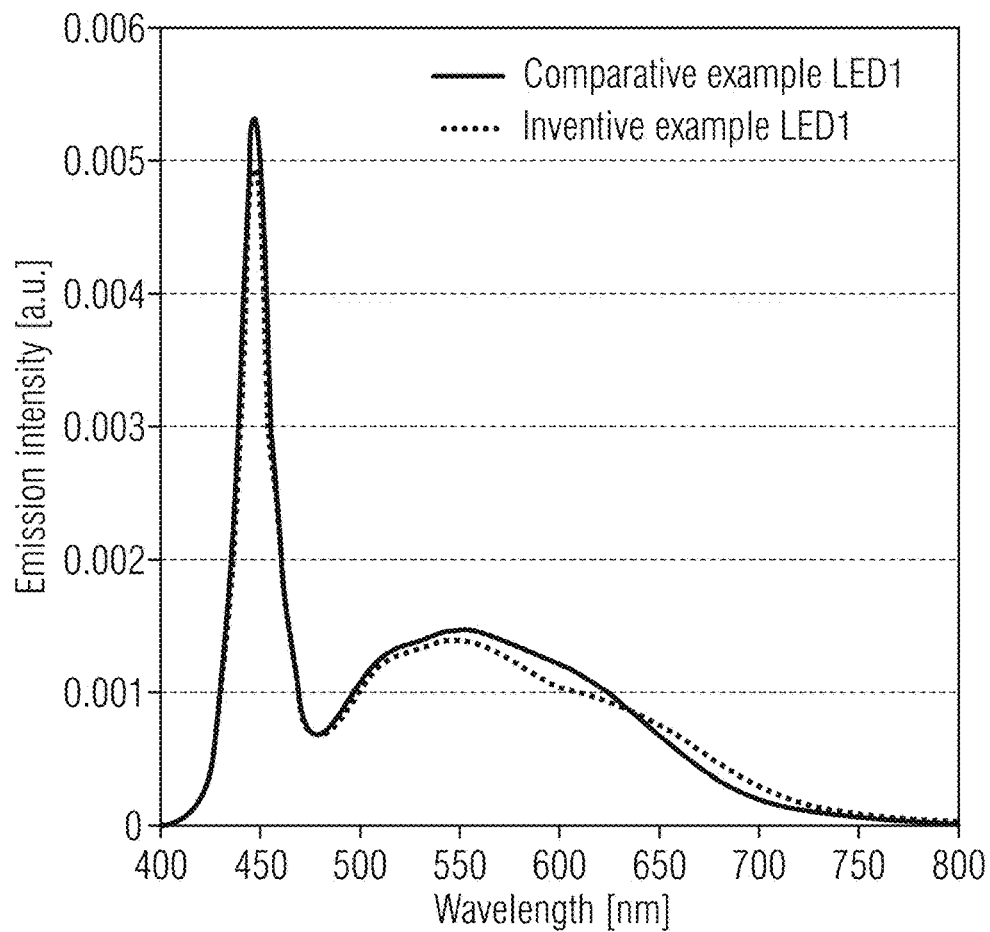
Figure 48G:
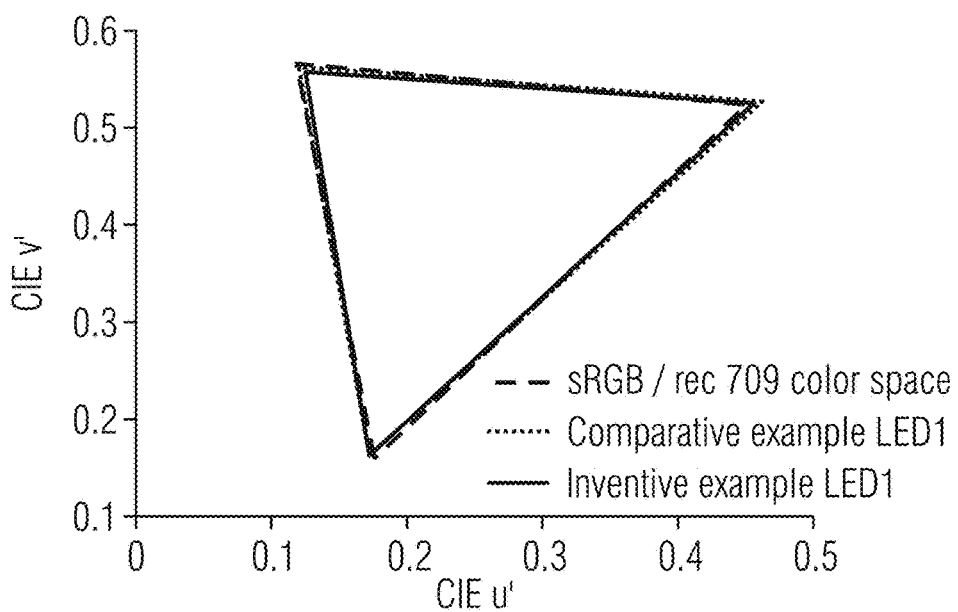

White light-emitting LED lighting devices were constructed with the aid of various combinations of embodiments of the present invention and comparative examples. A white point having the CIE coordinates CIE-x=0.285 and CIE-y=0.275 was chosen here. The resulting LED emission spectra were analyzed and compared, and the coverage of the color space was determined by employing a standard set of LCD filter absorption curves and determining the resulting filtered color points for the blue, green and red channels. It can be inferred from FIG. 48e that, in contrast to a comparative example 1, an inventive example 1 exhibits an elevated conversion efficiency and an increase in the luminous efficiency LER by 4%, with similar overlap with the sRGB color space in both lighting devices. FIG. 48f shows the LED spectra of comparative example 1 and of inventive example 1 from the previous table in FIG. 48e. FIG. 48g gives a comparison of the coverage of the sRGB color space for comparative example 1 and inventive example 1.

Figure 48I:
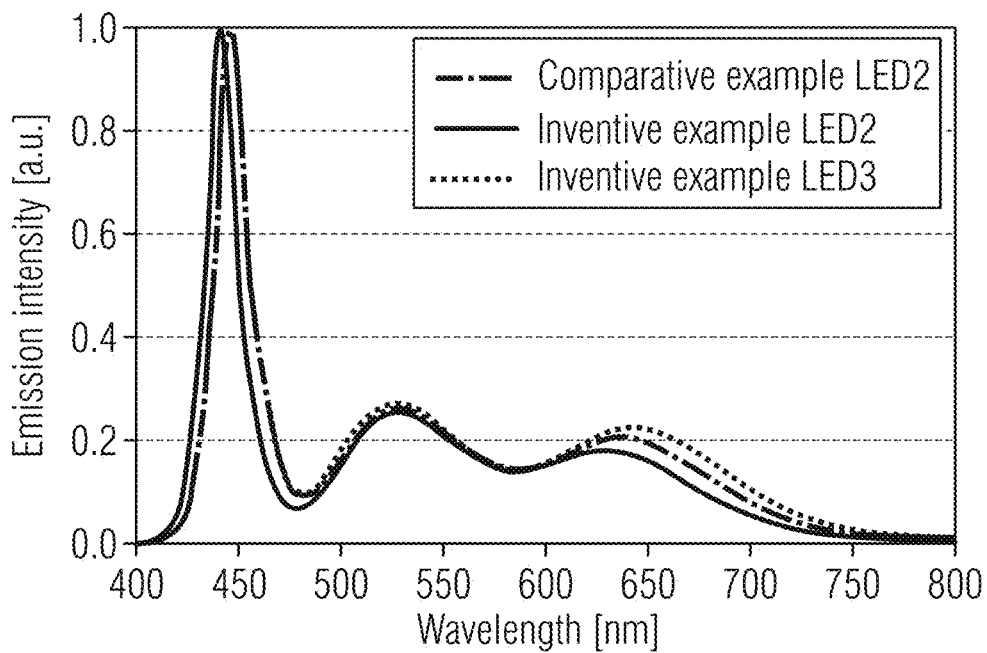
Figure 48J:
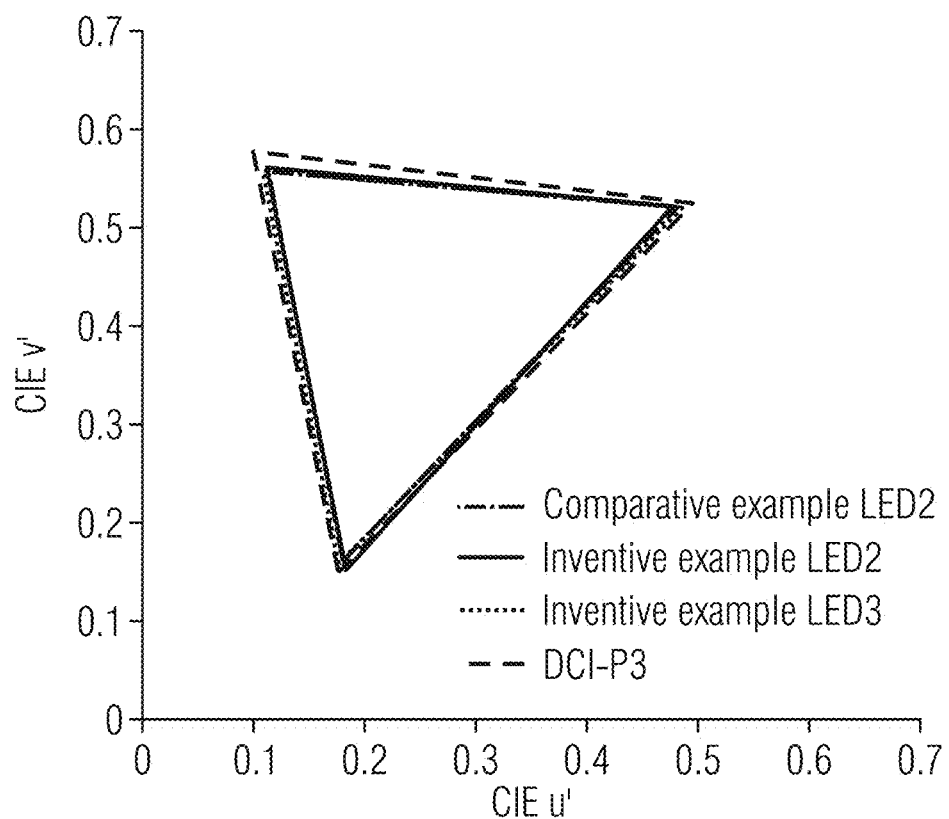

FIG. 48h gives, in tabular form, the composition of a comparative example 2 and of inventive examples 2 and 3 for backlighting devices for an extremely large color space, for example DCI-P3. A white point with CIE-x=0.275 and CIE-y=0.250 was chosen. The resulting LED emission spectra were again analyzed and compared analogously to the examples already described above in FIG. 48e, but this time for the DCI-P3 color space. The overlap with this color space is comparable or higher in the case of the inventive examples. FIGS. 48i and 48j show the LED emission spectra of inventive examples 2 and 3 in comparison to comparative example 2 and the coverage of the DCI-P3 color space for these examples.

Second phosphors used may also be other phosphors, for example from the group of the SiONs, SiAlONs, silicates and quantum dots.

Embodiments of flash applications: the phosphors of the invention, especially the phosphors of the general structural formula $Sr(Sr_aCa_{1-a})Si_2Al_2(N,O)_6$, can also be used for flash applications together with the garnets activated by means of an activator, especially the above-described cerium-activated garnets. For this purpose, the radiation source used, which emits a primary radiation, is a blue-emitting LED, for example an InGaN LED, having a dominant wavelength of 300-500 nm, preferably 400-500 nm, further preferably 420-470 nm. A particularly suitable spectrum for a flash application, for example in mobile phone cameras, has an intensity, based on the maximum of the spectrum in the cyan color range (about 450-500 nm), of at least 12.5%. The intensity of the spectrum in the wavelength range of >650 nm may at the same time be comparatively small, since typical sensors of cameras have a high sensitivity in this range and this spectral region is frequently filtered out by special IR filters in order to avoid disruptive influences of radiation from this radiation range on the sensor and the image quality.

For flash applications, it is possible here to use lighting devices having only one radiation source wherein the blue-emitting and/or UV radiation-emitting LED chip contains a phosphor mixture comprising at least one of the phosphors of the invention, for example together with a yellow/green-emitting garnet phosphor, in the beam path thereof. LED devices for flash applications may additionally at least also have two different LED modules, in which case one module emits a comparatively cold white light (correlated color temperature CCT between 4000-6000 K) and the further module a comparatively warm white light (correlated color temperature CCT between about 1500-3000 K). By controlled feeding of current to the two LED modules, even better variability of lighting situations of the environment in the subject of the photo is possible, for example in artificial light or in daylight.

For a cold white color locus, the first phosphor used may be an inventive orange/red-emitting phosphor of the general formula:

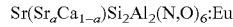

$Sr(Sr_aCa_{1-a})Si_2Al_2(N,O)_6$:Eu with a≥0.8, preferably a≥0.82. The europium content is between 0.1-20 mol %, or between 1-10 mol %, further between 0.1-5 mol %, preferably between 0.1-3 mol %, further preferably between 0.1-2 mol %, based on the alkaline earth metals.

The emission peak of the phosphors of the invention may be between 600-640 nm, preferably between 605-625 nm, and the spectral half-height width at half the maximum height (FWHM) should be <85 nm, preferably <80 nm, additionally preferably <78 nm. The emission intensity at wavelengths greater than 650 nm should be very low, since typical sensors of cameras have a high sensitivity in this range.

Second phosphors used for a cold white application may then be the above-described garnets of the general formula:

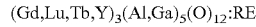

$(Gd,Lu,Tb,Y)_3(Al,Ga)_5(O)_{12}$:RE with RE=rare earth metals, especially Ce.

The garnets are especially blue/green- to yellow-emitting phosphors of the formulae $Lu_3(Al,Ga)_5(O)_{12}$:Ce and $(Lu,Y)_3(Al,Ga)_5(O)_{12}$:Ce, which have particularly good excitability at a wavelength in the range of 425-455 nm, preferably 430-450 nm. Particular preference is given to a blue/green-emitting phosphor having very good stability and conversion efficiency at high temperatures and high radiation intensities which are typical for flash applications, having the formula $Lu_3(Al_{1-x}Ga_x)_5(O)_{12}$:Ce with a cerium content of 0.5-5 mol %, preferably 0.5-2 mol %, based in each case on the rare earth metals, and a gallium content x of 0 to 0.5, preferably 0.15 to 0.3. Other garnets having other element combinations are likewise possible, especially variants in which some or all of the lutetium has been replaced by yttrium in the formula of the garnet $Lu_3(Al,Ga)_5(O)_{12}$:Ce. These combinations of a first and a second phosphor, compared to conventional combinations of phosphors where the above-described garnet phosphor has been mixed with another red-emitting phosphor from the class of the 2-5-8 phosphors of the general formula $(Ca,Sr,Ba)_2(Si,Al)(N,O)_8$:Eu with optional co-dopants, for example lanthanoids such as Mn, Nd, Dy, Sm, Tm and alkali metals such as Li, Na, K, have better stability in relation to the color point and higher LED efficiencies at elevated currents. Hereinafter, phosphors of the general formula $(Ca,Sr,Ba)_2(Si,Al)(N,O)_8$:Eu having optional co-dopants are referred to as "2-5-8 phosphors". In addition, phosphor mixtures of the invention exhibit reduced intensity of emission at wavelengths >650 nm, but the intensity, based on the maximum of the spectrum in the cyan color region, of at least 12.5% is satisfied as an important condition for flash applications.

For warm white flash applications, it is preferable to use a yellow-emitting garnet phosphor $(Gd,Lu,Tb,Y)_3(Al,Ga)(O)_{12}$:RE, preferably of the formula $(Gd,Y)_3(Al,Ga)_5(O)_{12}$:Ce or $(Tb,Y)_3(Al,Ga)_5(O)_{12}$:Ce, having maximum excitation in the range of 435-470 nm, preferably 440-465 nm. The preferred yellow-emitting phosphor has a very high stability and conversion efficiency at high temperatures and high radiation intensities (high currents) which are typical of flash applications. A particularly preferred yellow/green-emitting phosphor is $Y_3(Al_{1-x}Ga_x)_5(O)_{12}$:Ce with a cerium content of 1.5-5 mol %, preferably 2.5-5 mol %, and a gallium content x of 0 to 0.5, preferably x of 0 to 0.1. Other element combinations within the $(Gd,Lu,Tb,Y)_3(Al,Ga)_5(O)_{12}$:Ce system having similar spectral characteristics are likewise possible.

LED lighting devices suitable for flash applications may, independently of lighting devices having just one LED, for example, at least also have two or three blue-emitting LED chips as primary radiation-emitting radiation sources, with the phosphors and phosphor mixtures already mentioned above having been incorporated in the beam path thereof. The CIE color gamut of the converted light of the LED lighting device is preferably on the line of a blackbody emitter (Planck) in the range from 6500 K to 2700 K with a deviation of 3 steps of a MacAdam ellipse, more preferably in the range from 5000 K to 3000 K.

In the case of an LED lighting device having two LED chips as radiation sources, in a further embodiment, the radiation from the first LED chips, after conversion, has a CIE color locus within a range enclosed by the following CIE color coordinates (Cx/Cy): (0.21; 0.247), (0.26; 0.24), (0.24; 0.32), (0.28; 0.31). The second LED chip as the second radiation source, after conversion, has a CIE color locus which is enclosed by the following CIE coordinates: (0.45; 0.41), (0.46; 0.39), (0.58; 0.39), and (0.58; 0.42). In such an LED lighting device, the individual radiation sources can be operated with different driver currents, advantageously with mixing of the converted light emitted in an optical element, such as a common lens, to give an overall emission radiation.

In the case of an LED lighting device which is suitable for flash applications and has three LED chips as radiation sources, in a further embodiment, the first two LED chips have the CIE color loci already described above and the third radiation source, the third LED module, after conversion, has a CIE color locus which is enclosed by the following coordinates: (0.40; 0.44), (0.39; 0.51), (0.45; 0.52), and (0.47; 0.46). In this embodiment too, the converted light emitted is mixed by a downstream optical element in the beam path, such as a lens.

The phosphor particles preferably have a median particle size $d_{50}$ of 5-30 μm, more preferably 7-17 μm. The particle size distribution can be determined, for example, via laser diffraction by means of the Fraunhofer approximation which is known to those skilled in the art.

Some inventive examples of LED lighting devices suitable for flash applications are to be elucidated in detail hereinafter. In a comparative example 1, an inventive example 1 and a comparative example 2 and an inventive example 2, different phosphor mixtures according to the prior art and phosphor mixtures comprising phosphors of the invention are incorporated in each case into a standard silicone potting material of a blue-emitting InGaN-LED chip as radiation source. The illumination area of each of the LED chips is 1 mm².

In comparative example 1, 11.5 percent by weight of phosphor based on the silicone potting material is incorporated, using $Lu_3Al_4GaO_{12}$:Ce having a cerium content of 1.5 mol % based on the rare earth metals as green-emitting phosphor. The red-emitting phosphor used is a conventional 2-5-8 phosphor $SrBaSi_5N_8$:Eu having an Eu content of 1.5 mol % based on the alkaline earth metals. The dominant wavelength of the LED chip at 350 mA is 447 nm and the ratio of the green/red phosphors is 5.7:1. As inventive example 1, the same green-emitting phosphor as used in comparative example 1 is used, and the red phosphor used is an inventive phosphor $Sr(Sr_{0.86}Ca_{0.14})Si_2Al_2N_6$:Eu having an Eu content of 0.4 mol %, based on the rare earth metals. The ratio of the green/red phosphors is 3.9:1. The dominant wavelength of the LED chip at 350 mA is again 447 nm.

Figure 49B:
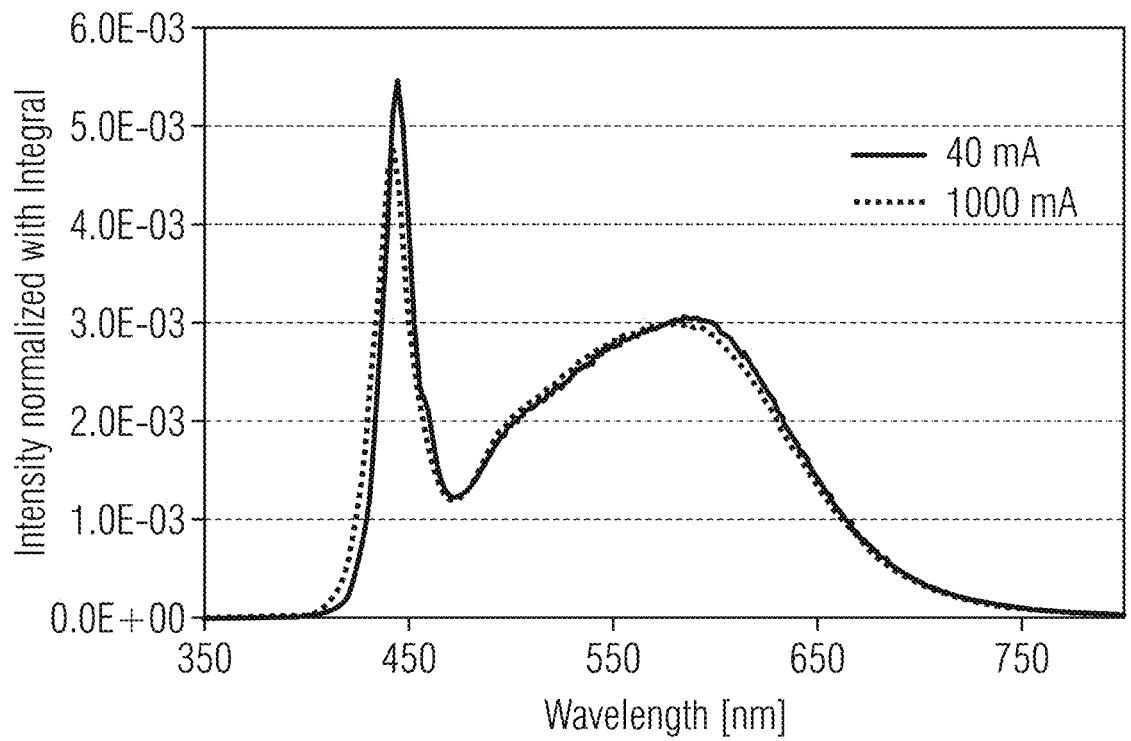

The table in FIG. 49a shows the respective x and y CIE color coordinates of comparative example 1 and of inventive example 1 at different currents (average of 4 LEDs), with comparative example 1 set at the percentage of 100% for the corresponding currents. It can be inferred from this table, but in particular also from FIGS. 49b and 49c, that, with increasing current, the phosphor mixtures comprising the phosphors of the invention are more stable than the conventional phosphor mixtures, the conventional phosphor mixtures losing some of their relative red emission intensity compared to the green-yellow emission intensity, whereas the phosphor mixtures of the invention remain virtually stable. It can additionally be inferred from the table that the LED comprising the phosphor of the invention has a higher conversion efficiency as the ratio of the luminous flux $\Phi_v$ of an LED having a potting material filled with the phosphor mixtures and the radiant power $\Phi_e$ of an LED having a clear potting material without phosphors $\Phi(v_{(filled\ potting)}/\Phi_{e(clear\ potting)})$ compared to the LED comprising the conventional phosphor mixture. The luminous efficiency LER is defined as:

$$LER = \frac{\int_{380nm}^{780nm} \Phi_{e(filled\ potting)}(\lambda)V(\lambda)d\lambda}{\int_0^\infty \Phi_{e(filled\ potting)}(\lambda)d\lambda}$$

Figure 49C:
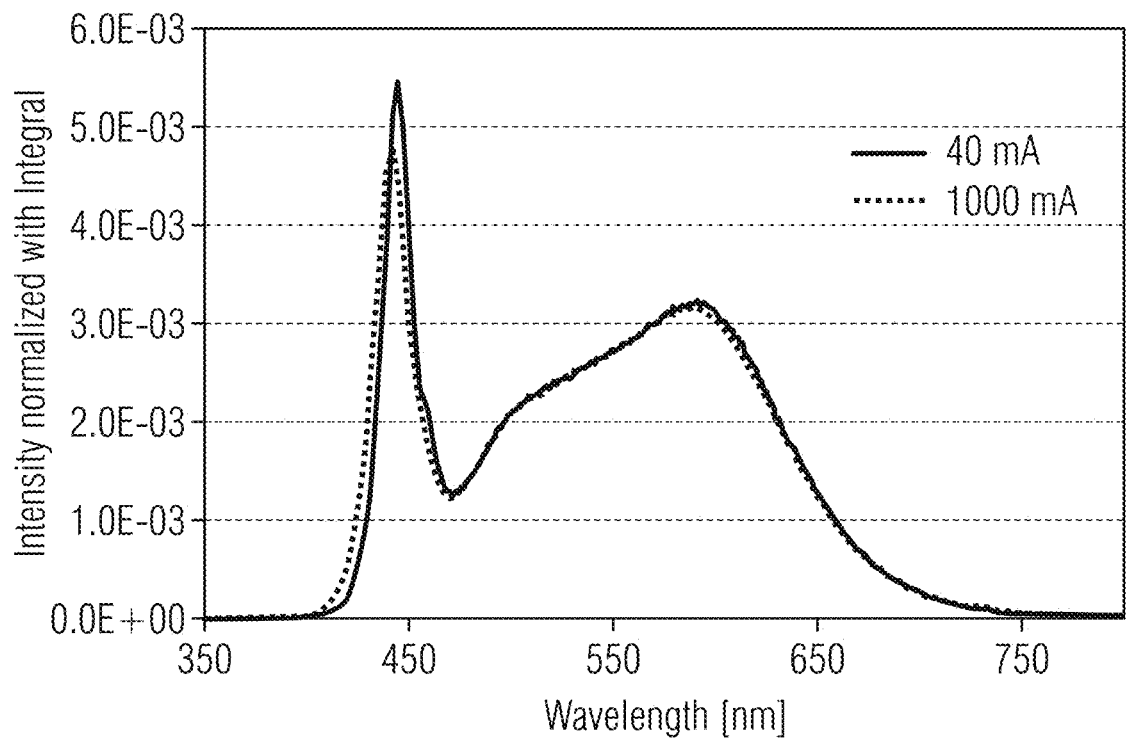

LED spectra of comparative example 1 and of inventive example 1 at currents of 40 and 1000 mA are shown in FIGS. 49b and 49c. It is clearly apparent here that the conventional phosphor mixture, with increasing current, loses emission in the red wavelength range (FIG. 49b), whereas there is only a very slight decrease in the case of the phosphor mixture of the invention (FIG. 49c).

Figure 49D:
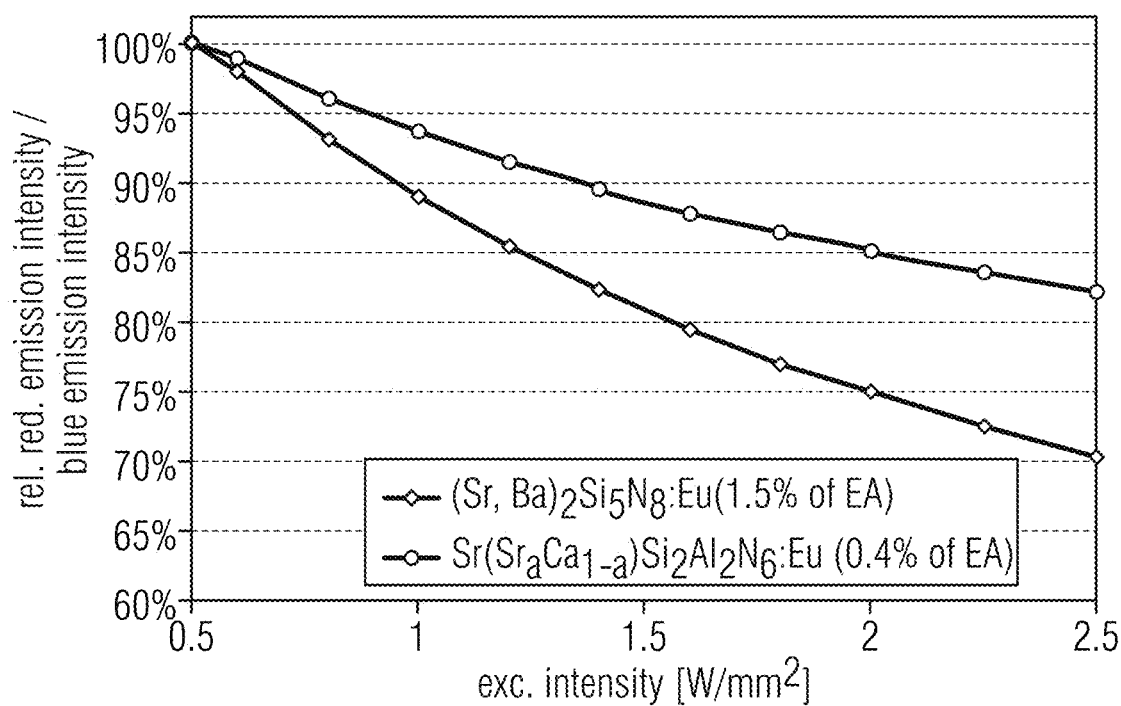

The effect observed can be attributed to the different red-emitting phosphors in the conventional and inventive phosphor mixtures. In the case of the 2-5-8 phosphors used in the conventional phosphor mixture, a decrease in the conversion efficiency with increasing current is observed, which is manifested in a decrease in the red emission in relation to the yellow/green emission in the LED spectrum in conventional phosphor mixtures with increasing current. In the case of phosphor mixtures comprising the phosphor of the invention, a distinctly reduced decrease by comparison in the conversion efficiency of the red phosphor with increasing current is observed. The relative decrease in the conversion efficiency with increasing current for a phosphor of the invention, such as for a conventional 2-5-8 phosphor, is shown in FIG. 49d.

Figure 49E:
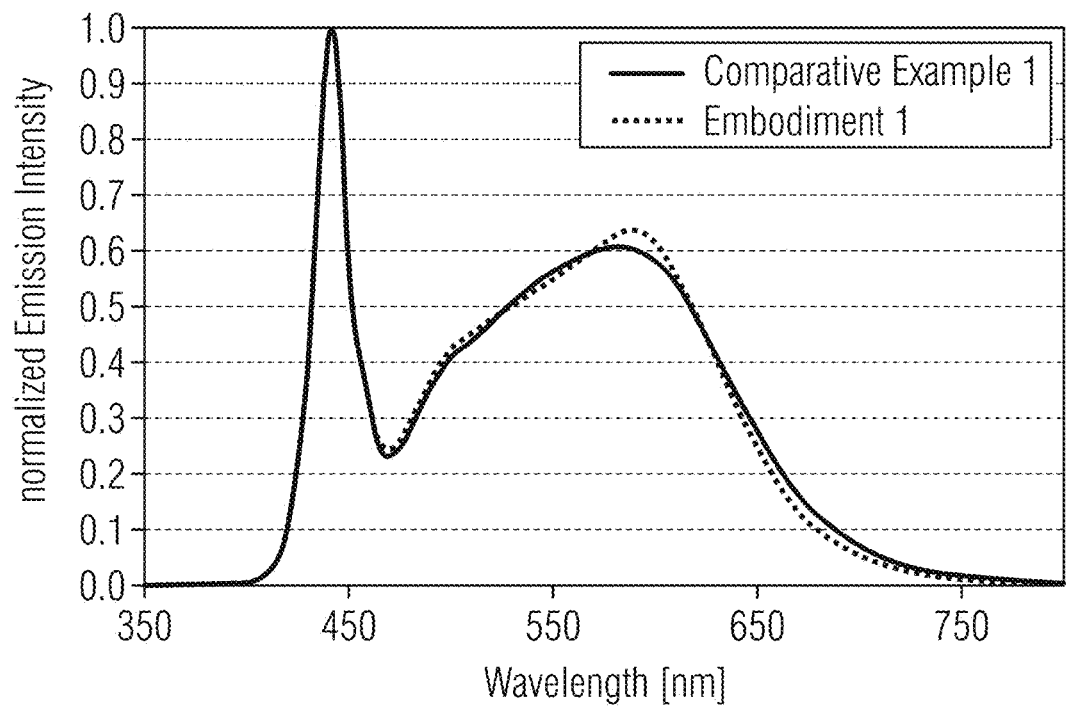

FIG. 49e shows a comparison of the LED spectra normalized to the maximum emission intensity for inventive example 1 and for comparative example 1. Inventive example 1 shows a reduced emission intensity within a wavelength range of >650 nm and simultaneously has a relative emission intensity of >12.5% in the cyan region.

Figure 49F:
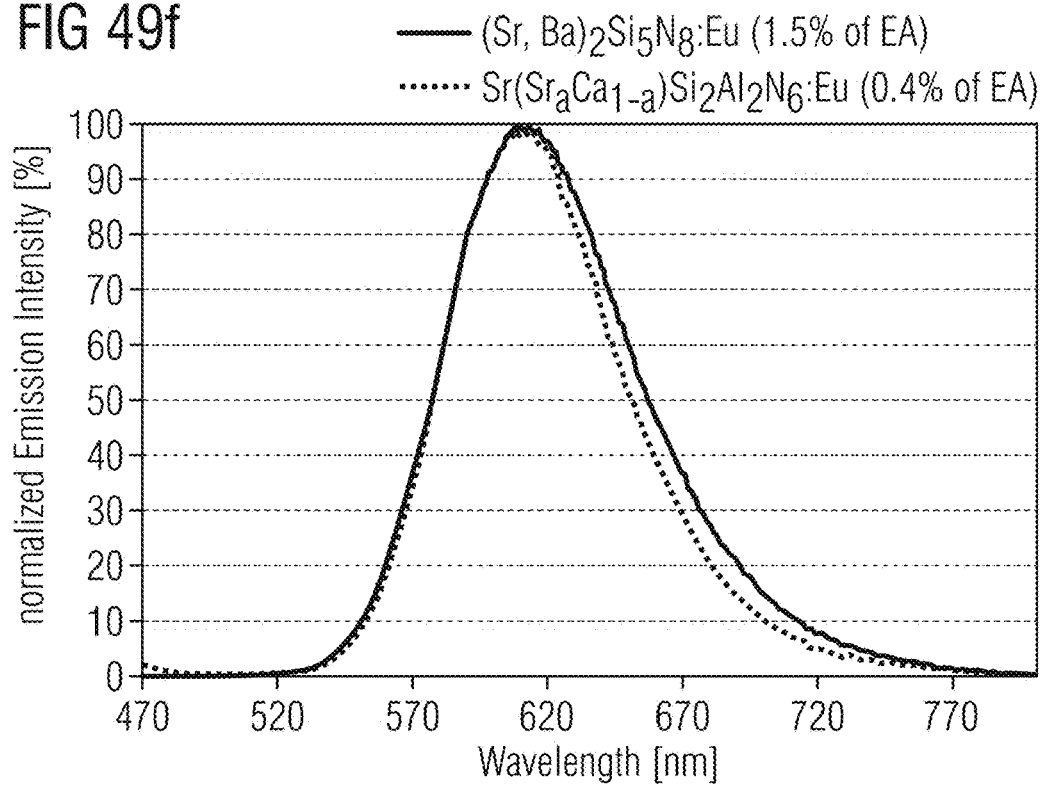

FIG. 49f shows the normalized emission intensity of a typical phosphor, by way of example a 2-5-8 phosphor, and of a phosphor of the invention. What is clearly apparent here is the reduced emission intensity of the phosphor of the invention in the wavelength range of >650 nm, which is attributable to the reduced FWHM.

Figure 49G:
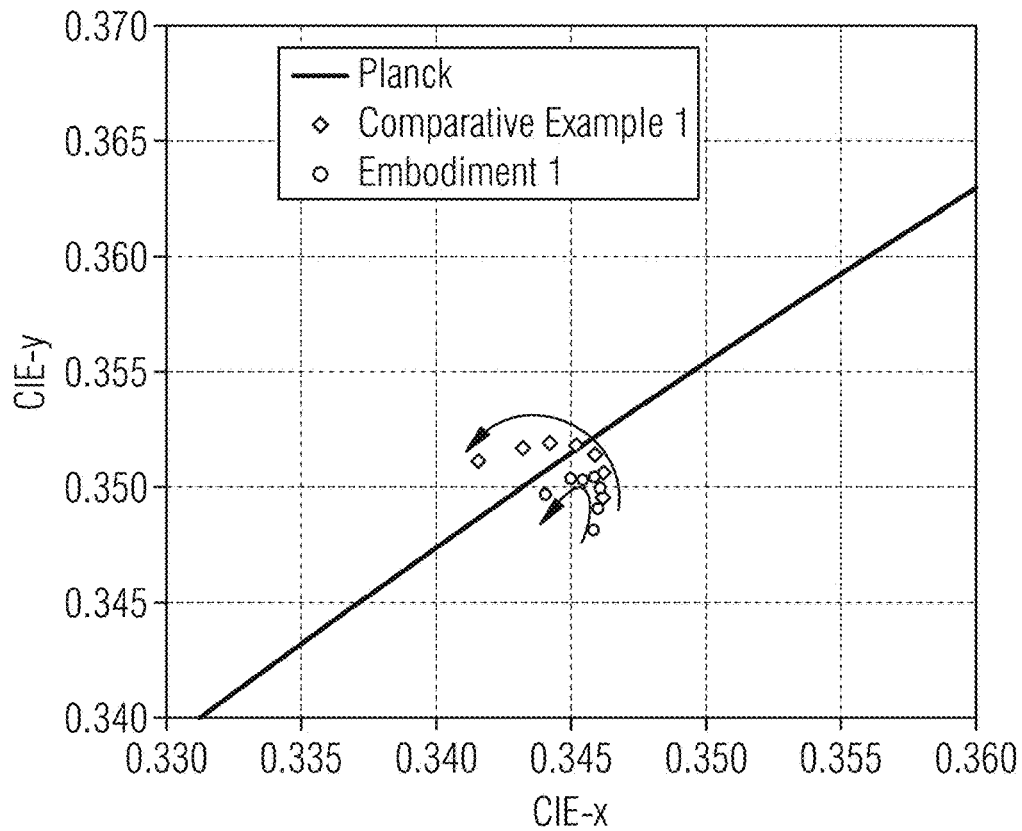

The shift in the color point of the LEDs of comparative example 1 and of inventive example 1 with increasing current is shown in FIG. 49g. There is a much smaller shift here in the color point of the LED of inventive example 1 compared to the LED of comparative example 1 because of the higher emission intensity of the phosphor of the invention.

In a further comparison of an inventive example 2 compared with a conventional comparative example 2, a phosphor mixture having an amber color point is used. Comparative example 2 comprises a cerium-activated garnet phosphor $(Y_{0.957}Ce_{0.043})_3Al_5O_{12}$ together with a conventional 2-5-8 phosphor $(Ca_{0.1}Sr_{0.4}Ba_{0.5})_2Si_5N_8$:Eu having an Eu content of 3.25 mol % based on the alkaline earth metals used. The concentration of the phosphors is 41% by weight based on the silicone potting material and the dominant wavelength of the blue LED chip at a current of 350 mA is 444.7 nm. The ratio of the yellow/red phosphors is 5.9:1 (% by weight ratios). In inventive example 2, the same garnet phosphor as in comparative example 2 is used, but in that case an $Sr(Sr_{0.86}Ca_{0.14})Si_2Al_2N_6$:Eu phosphor of the invention having an Eu content of 2 mol % based on the rare earth metals is used in a yellow/red ratio of 5:1. The dominant wavelength of the blue-emitting LED chip at a current of 350 mA is 444.5 nm, with use of 39% by weight of phosphor mixture in relation to the silicone potting material.

It can be inferred from the table in FIG. 50*a* that the LED comprising the phosphor of the invention again has a higher conversion efficiency $\Phi_{v(filled\ potting)}/\Phi_{e(clear\ potting)}$ compared to the LED comprising the conventional phosphor mixture at the respective currents. These values are reported in relation to comparative example 2 that has been normalized to 100% for the respective current (average of 4 LEDs).

In the most recent generation of mobile communications devices, it is possible to use "true-tone flashes" which, as well as a cold white light-emitting LED, also have a second LED which emits either warm white light or yellow light ("amber"). This second LED is used in situations where the ambient light has a lower color temperature than daylight (cold white), in order to produce a flash which approximates as closely as possible to the color temperature of the ambient light. In order to produce light of various color temperatures, the cold white light and the light of the yellow-emitting LED have to be mixed with one another in various ratios. This can be achieved, for example, by operating the two LEDs with different currents. When the flash has a similar color temperature to the ambient light, the colors in the image have a more natural appearance.

Similarly to inventive example 1, the inventive phosphor mixtures of inventive example 2 are also more stable with increasing current than the conventional phosphor mixtures, which lose a considerable proportion of their red emission compared to the yellow emission components, particularly at relatively high currents.

Figure 50B:
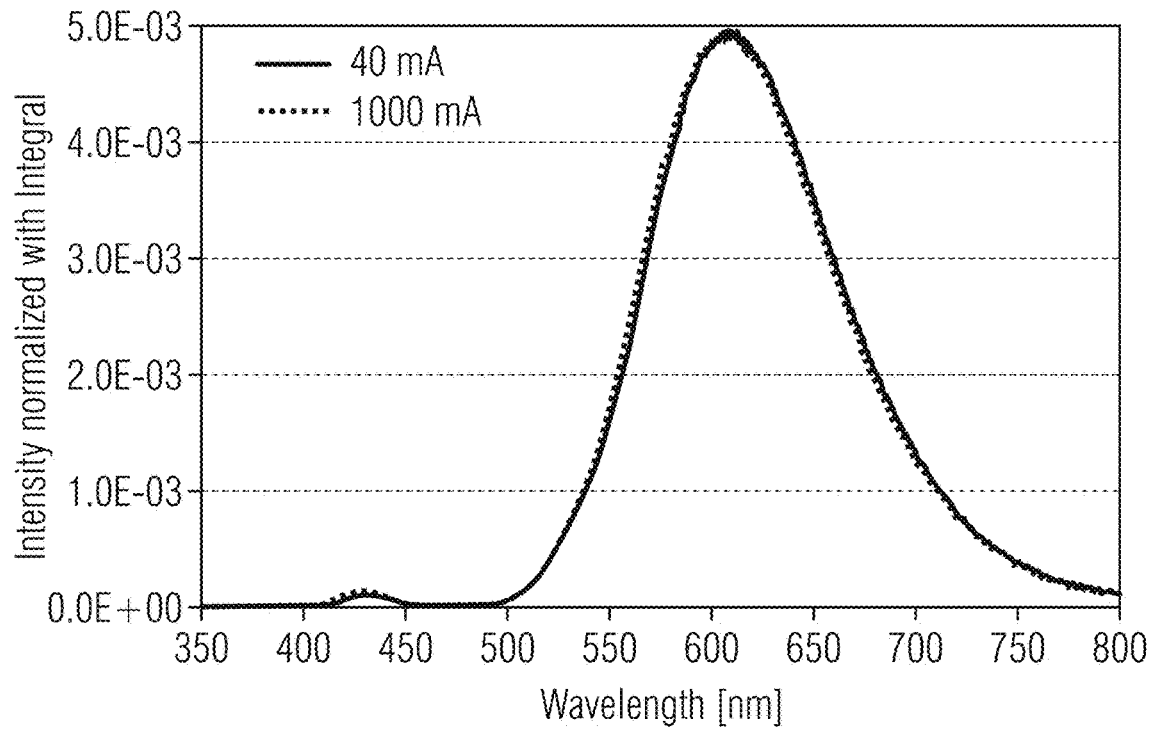
Figure 50C:
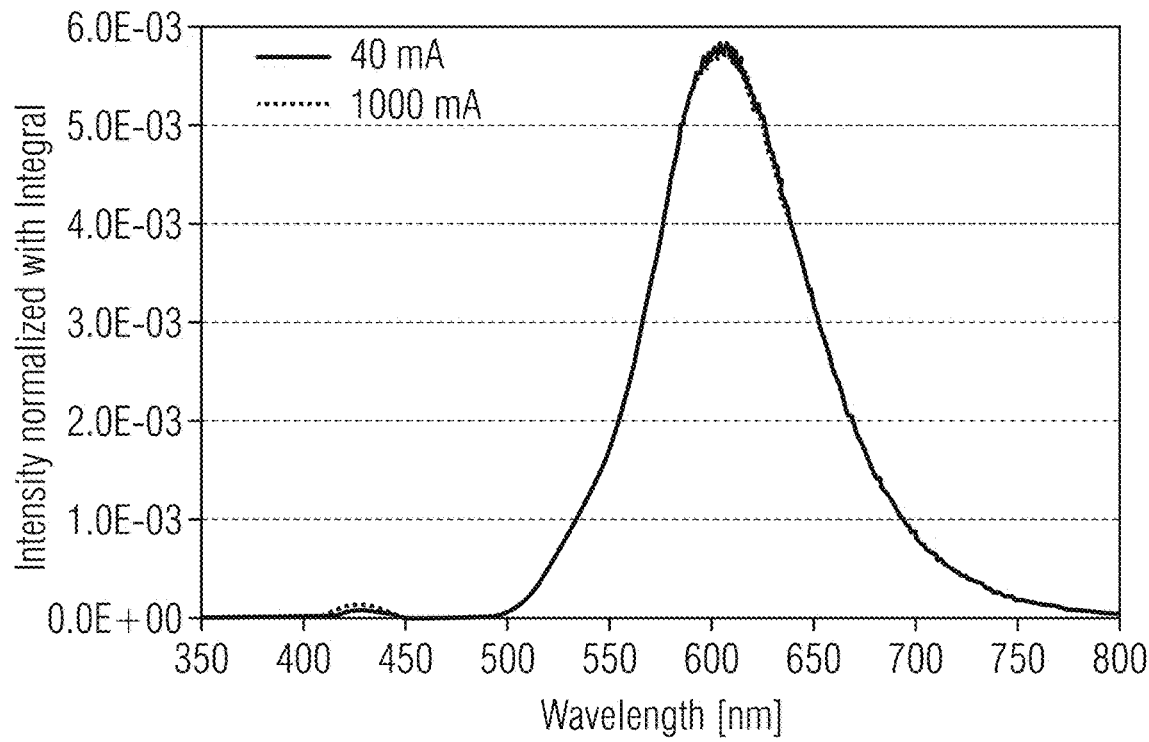

FIGS. 50*b* and 50*c* show the LED spectra of comparative example 2 (FIG. 50*b*) and of inventive example 2 (FIG. 50*c*) at currents of 40 and 1000 mA. A comparison of the two LED spectra shows that, in the case of the conventional phosphor mixture of comparative example 2, a considerable proportion of the red-emitting spectrum is lost with rising currents compared to phosphor mixtures of the invention.

Figure 50D:
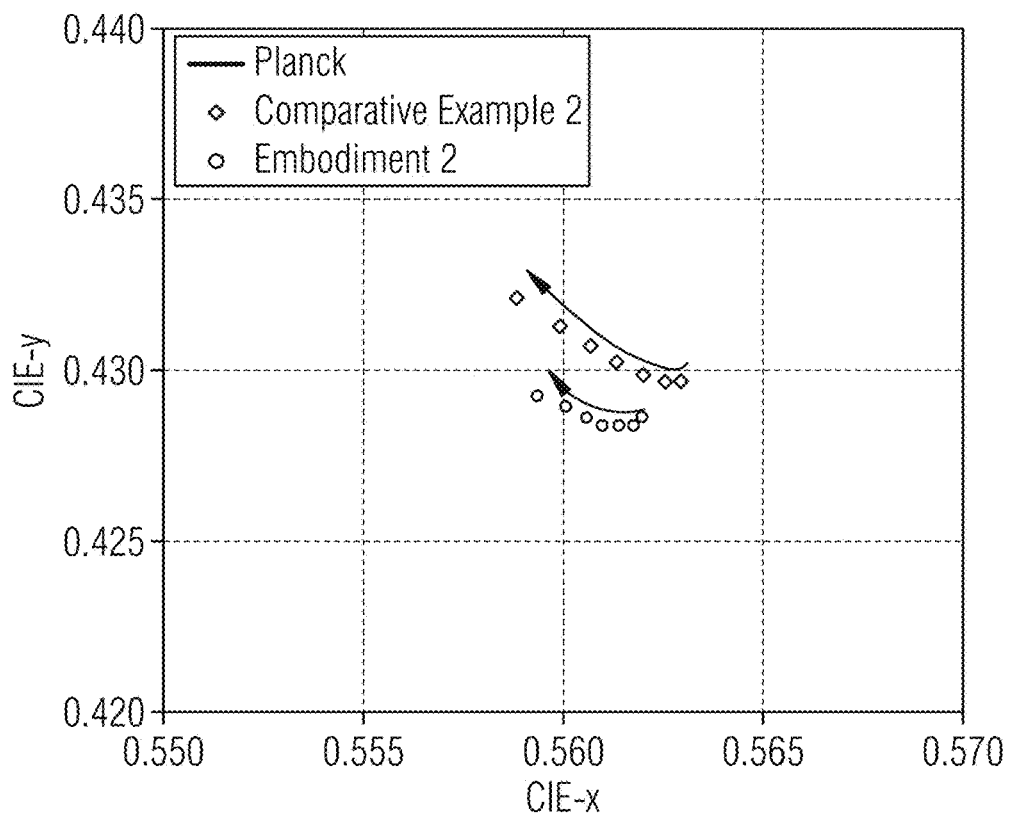
Figure 50E:
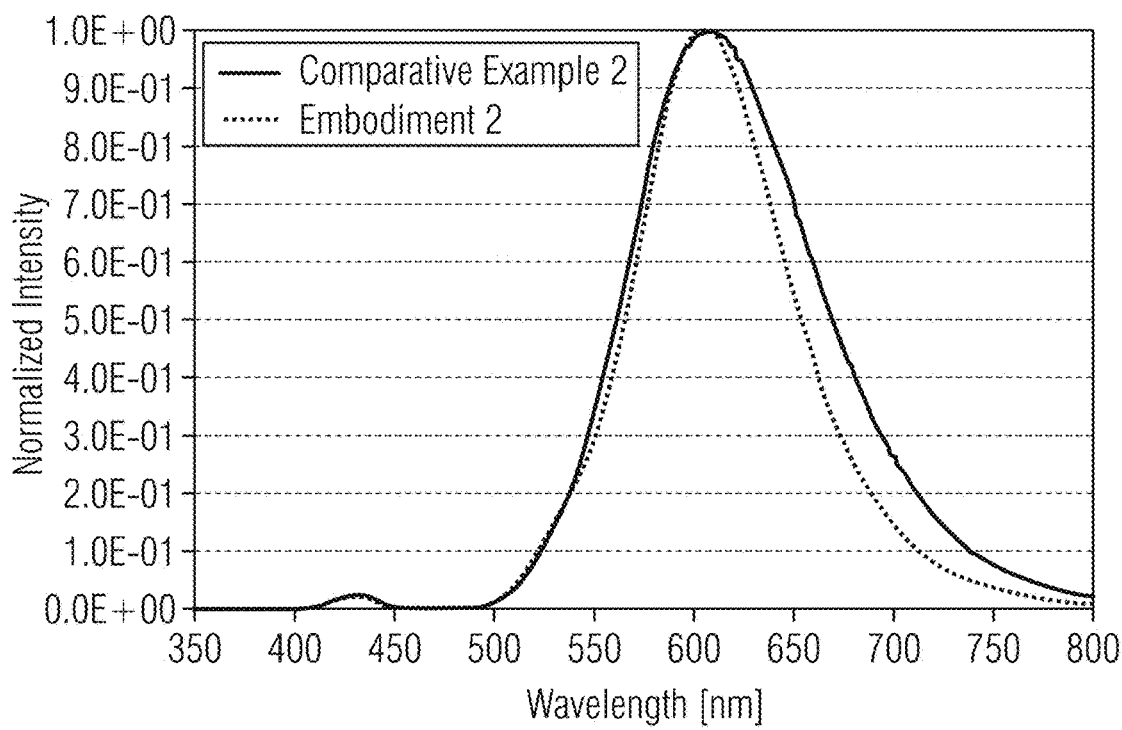

FIG. 50*d* shows the stability of the color point with increasing currents for comparative example 2 and inventive example 2. Because of the smaller decrease in emission in the red region in inventive example 2 in relation to comparative example 2, the change in the color point of the LED of inventive example 2 is much less marked than in the case of the LED of comparative example 2.

The normalized LED spectra for inventive example 2 and comparative example 2 are shown in FIG. 50*d*. The phosphor mixture of the invention, compared to the conventional phosphor mixture, shows a significant reduction in emission intensity in the wavelength range of >650 nm. This is attributable particularly to the reduced FWHM of the phosphor of the invention compared to the conventional 2-5-8 phosphor.

In summary, it can be stated that it is therefore possible to achieve an equal light yield with lower operating currents in the case of phosphor mixtures of the invention compared to conventional phosphor mixtures. Since the current consumption in mobile applications, for example mobile phones, is a crucial criterion for operating life, a low consumption is very important. In addition, brighter LEDs are possible with the phosphor mixtures of the invention, which extends the range of color points, especially for "true-tone flashes". Should a higher light yield not be desirable, it is possible to use LED chips with weaker emission of radiation compared to conventional LED chips, for example for yellow-emitting LEDs ("amber"), which reduces rejects during LED chip production and hence also enables the utilization of LED chips that are otherwise too dark.

Embodiments of warm white light with CRI≥80: in a further embodiment of the present invention, phosphors of the invention are used for production of warm white light, for example for general lighting applications. Warm white light-emitting lighting devices comprising phosphors of the invention can especially achieve a "color rendering index" (CRI) of ≥80, preferably ≥82.

Radiation sources of particularly good usability for lighting devices for production of warm white light may be blue-emitting LEDs, for example InGaN-LEDs, which emit light having a dominant emission wavelength of 430-470 nm, preferably 440-460 nm, further preferably of 445-455 nm, as primary radiation. First phosphors used for conversion of the primary radiation may be inventive phosphors of the general formula $Sr(Sr_aCa_{1-a})Si_2Al_2N_6{:}D$ where 0.7≤a, preferably 0.8≤a, further preferably 0.84≤a, where a<1 and where the proportion of activator D, preferably europium, based on the molar proportion of the alkaline earth metals, is ≥1 mol %, preferably ≥2 mol %, further preferably ≥3 mol %.

Second phosphors used may, for example, be a green/yellow-emitting garnet of the general formula $(Gd,Lu,Y,Tb)_3(Al,Ga)_5(O)_{12}{:}RE$ with RE=rare earth metal, preferably Ce. The garnet preferably has the general formula $Y_3(Al_{1-x}Ga_x)_5(O)_{12}{:}Ce$ where the proportion of Ga is 0.2≤x≤0.6, preferably 0.3≤x≤0.5, further preferably 0.35≤x≤0.45.

One advantage of using a garnet phosphor of the formula $Y_3(Al_{1-x}Ga_x)_5(O)_{12}{:}Ce$ rather than a garnet phosphor of the formula $Lu_3(Al_{1-x}Ga_x)_5(O)_{12}{:}Ce$ is that the first garnet phosphor $Y_3(Al_{1-x}Ga_x)_5(O)_{12}{:}Ce$ has a lower density of about 4.5-5 $g/cm^3$, while the second phosphor $Lu_3(Al_{1-x}Ga_x)_5(O)_{12}{:}Ce$ has a density of about 6.7-7 $g/cm^3$, and therefore a smaller mass of phosphor is consumed for a given application. In addition, therefore, the cheaper and more widely available $Y_2O_3$ can be used rather than $Lu_2O_3$ as starting material for the production of the phosphor, such that the procurement cost for the garnet phosphor is reduced.

The use of a first phosphor of the invention exhibits higher absorptions compared to phosphor mixtures containing conventional 2-5-8 phosphors or $CaAlSiN_3$ phosphors. Surprisingly, the absorption in the case of phosphors of the invention, given the same activator content, is considerably higher than in the case of conventional 2-5-8 phosphors. This enables a drastic reduction in the amount of red-emitting phosphor compared to conventional solutions and a very high conversion efficiency. At the same time, the excellent optical properties of the red-emitting phosphors of the invention enable a very high light yield and high conversion efficiency with high CRI.

Some embodiments of lighting devices of the invention for general lighting applications having a high CRI are to be described in detail hereinafter.

FIG. 51*a* shows a tabular compilation of comparative examples 1 and 2 and of inventive examples 1 and 2. In all examples, a blue-emitting InGaN-LED having a dominant wavelength of 446 nm is used, wherein the standard silicone potting material incorporates phosphor mixtures in which garnet phosphors have been mixed either with conventional red-emitting phosphors or with red-emitting phosphors of the invention in the silicone potting material.

In comparative example 1, a cerium-activated yttrium aluminum gallium garnet (abbreviated to YAGaG in the figures which follow) with a conventional $(Sr_{0.7}Ca_{0.3})AlSiN_3$ phosphor (abbreviated to SCASN in the figures which follow) is incorporated as phosphor mixture in a concentration of 15% by weight relative to the total mass of the silicone potting material of the blue LED, where the ratio of green to red phosphor is 2.0 (% by weight ratio). The absolute concentration of green phosphor is 10% by weight and that of red phosphor 5% by weight. In addition, the correlated color temperature CCT, the CRI, the R9 value for red hues and the relative conversion efficiency relative to comparative example 2 are reported.

Comparative example 2 contains a mixture of a lutetium aluminum garnet (abbreviated to LuAGaG in the figures which follow) and a conventional 2-5-8 phosphor (abbreviated to 258 in the figures which follow). In contrast, inventive examples 1 and 2 contain either an yttrium aluminum garnet or a lutetium aluminum garnet together with different phosphors of the invention (abbreviated to 226 in the figures which follow).

It can be inferred from the tabular listing in FIG. 51a that all comparative and inventive examples have a correlated color temperature CCT in the range of 2700 K±15 K with a high CRI≥80 and a high R9 of 10±1. Inventive examples 1 and 2 show an elevated conversion efficiency in relation to comparative examples 1 and 2, but smaller amounts of red-emitting phosphors are required than in the comparative examples. Particular preference is given to inventive example 1, since least red-emitting phosphor is used therein and, in addition, an yttrium aluminum gallium garnet is also used, which avoids the above-described high costs of the lutetium aluminum garnet.

FIG. 51b shows an amount in %, based on comparative example 1, of red-emitting phosphor which has to be expended for the inventive and comparative examples. It is clearly apparent here that, for inventive examples 1 and 2 of the present invention, much less red-emitting phosphor has to be used than for the comparative examples.

Figure 51C:
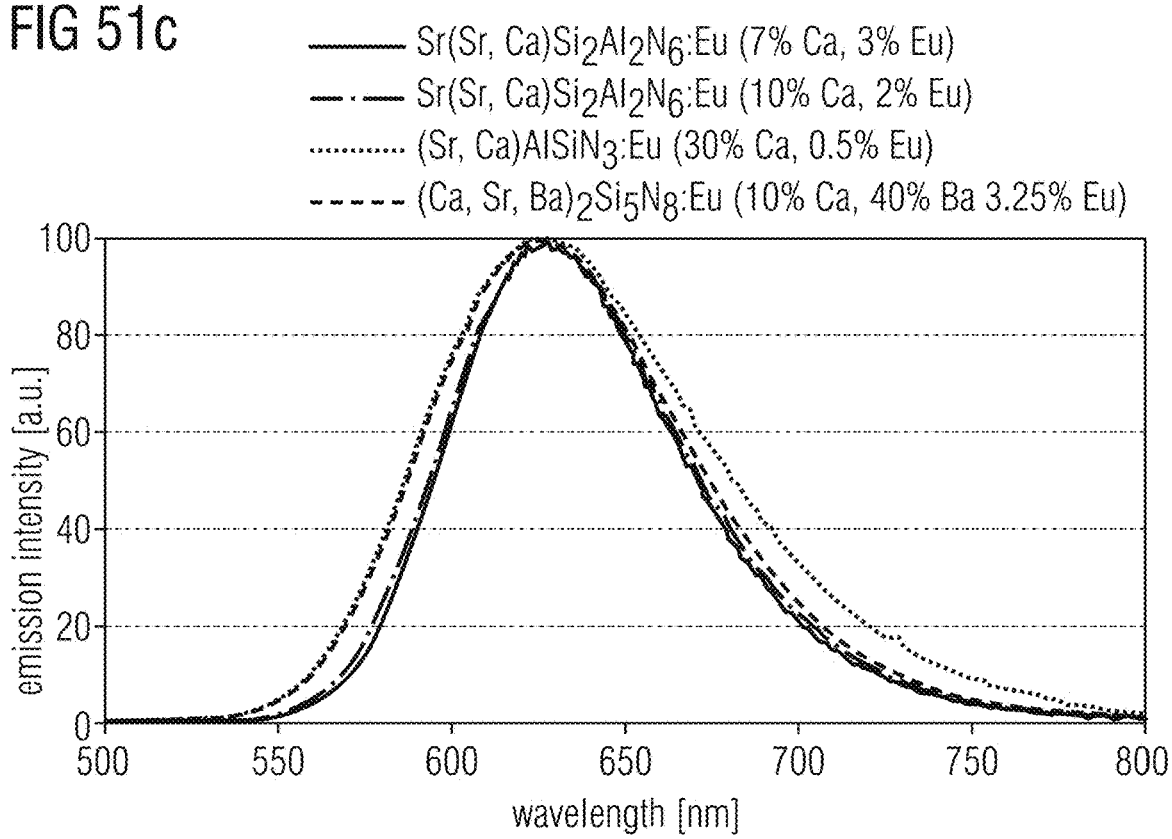

The phosphors of the invention exhibit a very low spectral half-height width at half the maximum height FWHM compared to the conventional red-emitting phosphors, as apparent from FIG. 51c.

Figure 51D:
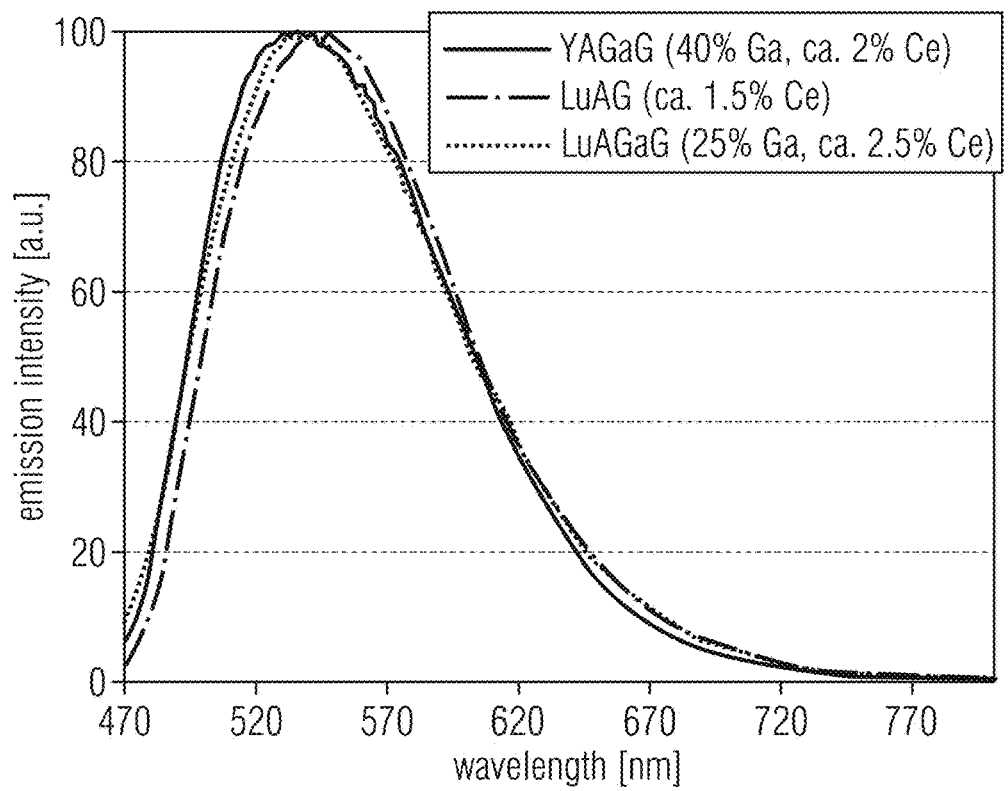

FIG. 51d shows the emission spectra of the green-emitting garnet phosphors of the present comparative and inventive examples. It is apparent here that the yttrium aluminum garnet exhibits an emission intensity in the blue/green region of the visible spectrum (470-520 nm) which is comparable to or better than with other green-emitting garnet phosphors. For this reason, it is possible with this garnet phosphor, in a particularly inexpensive manner (avoidance of lutetium), to implement warm white-emitting lighting devices having a high CRI.

Figure 51E:
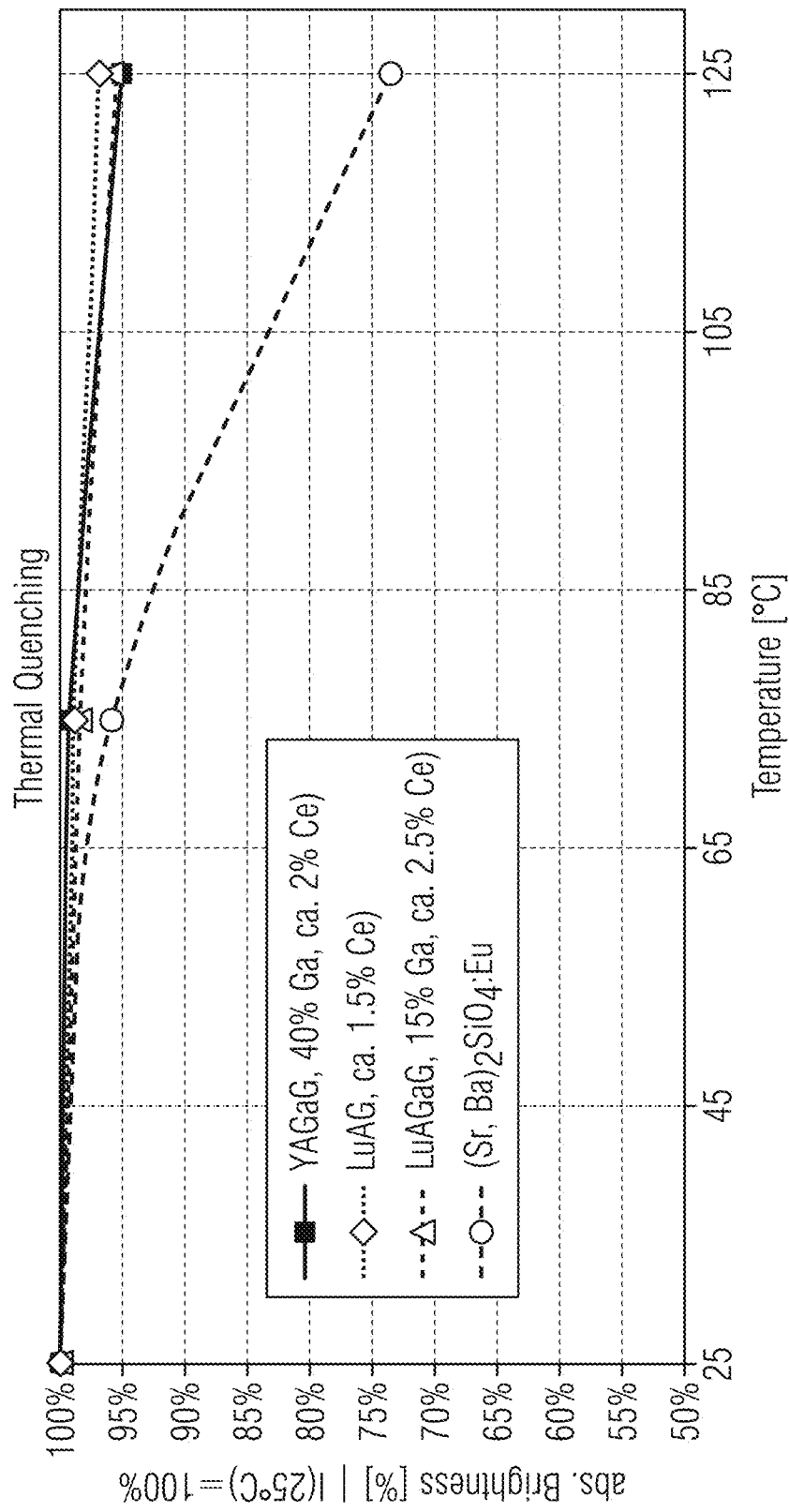

The thermal quenching of various green/yellow-emitting garnet phosphors and a green-emitting orthosilicate phosphor from room temperature to 125° C. in relation to the absolute brightness at 25° C. is shown in FIG. 51e. It can be inferred from this diagram that the preferred phosphor of the $(Lu,Y)_3(Al,Ga)_5(O)_{12}:Ce^{3+}$ type, in contrast to orthosilicate phosphors, exhibits only very low thermal quenching at relatively high temperatures.

Figure 51F:
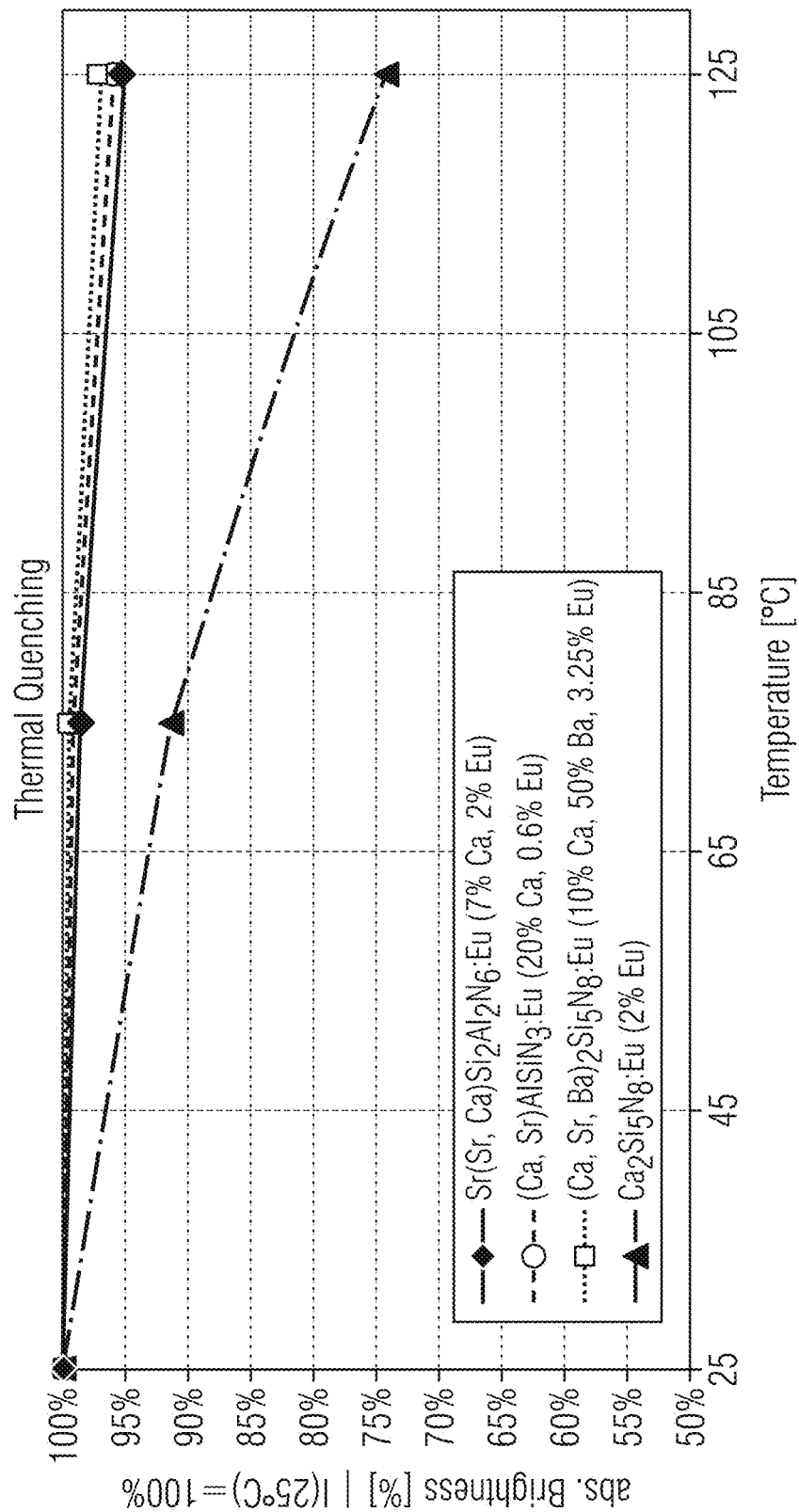

The adverse effects of the thermal quenching of the various red-emitting phosphors used in the comparative and inventive examples on the absolute brightness are shown in FIG. 51f. In this figure, the phosphors of the invention show comparable thermal quenching to the best 2-5-8-phosphors, while another 2-5-8 phosphor $Ca_2Si_5N_8:Eu^{2+}$ (2%) exhibits appreciable quenching.

Figure 51G:
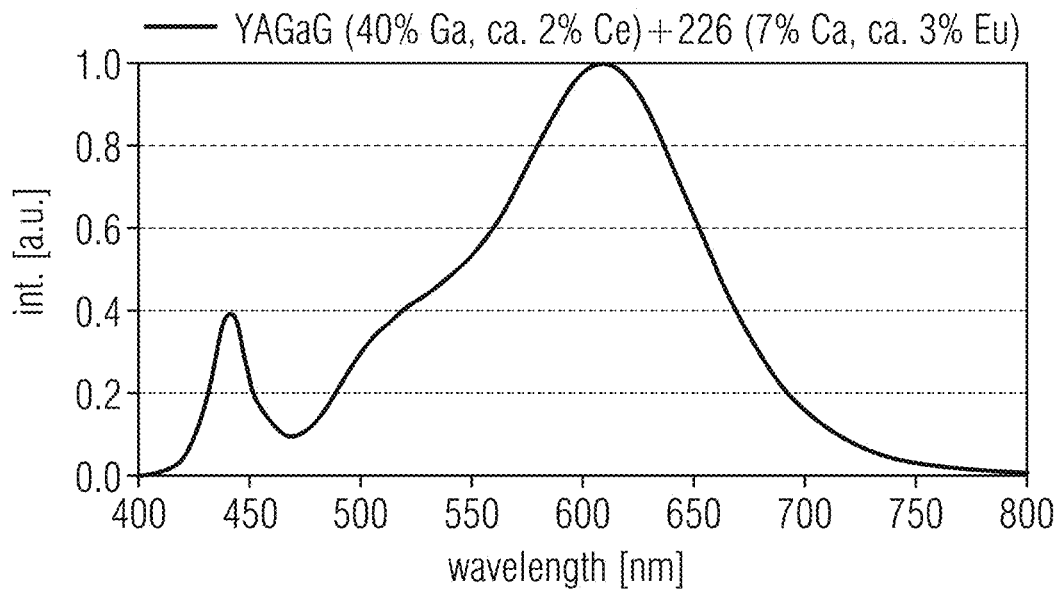
Figure 51H:
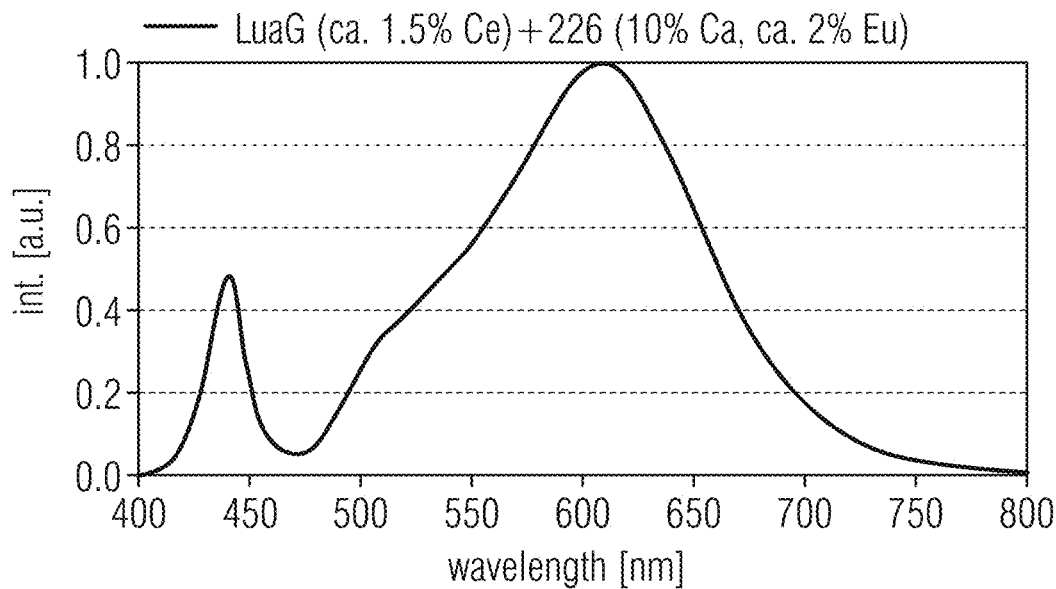

FIGS. 51g and 51h show the LED spectra of the LEDs of inventive examples 1 and 2. In these spectra, the peaks of the unconverted blue primary radiation from the LED at wavelengths between 410 and 460 nm, and the green-red components of the secondary radiation converted are clearly apparent. The additive color mixing of these primary and secondary radiation components produces warm white light with a high CRI.

In a further embodiment of the present invention, a lighting device for production of a white light having a CRI≥90 is provided, wherein the radiation source emits a primary radiation in the wavelength range between 430 nm and 470 nm, preferably 440 and 460 nm, further preferably 445 nm and 455 nm, and the second phosphor present is a garnet of the general formula $(Gd,Lu,Y,Tb)_3(Al,Ga)_5(O)_{12}$:RE, preferably $(Lu,Y)_3(Al,Ga)_5(O)_{12}$:RE with RE=rare earth metal, preferably Ce.

In this lighting device for production of a white light having a CRI≥90, in the first phosphor, which may have one of the general formulae already described above, especially $Sr(Sr_aM_{1-a})Si_2Al_2N_6$:D, the metal M is Sr and Ca, where the parameter a is as follows: 0.7≤a, preferably 0.8≤a, further preferably 0.84≤a, where the proportion of the activator D is ≥1.5%, preferably ≥3.5%, further preferably ≥4.5% mol %.

Some embodiments of phosphor mixtures of the invention having a high CRI≥90 are to be presented hereinafter.

FIG. 52a shows, in tabular overview, a comparative example 1 and inventive examples 1 to 4, which, as well as a cerium-activated yellow/green-emitting garnet phosphor, also contain phosphors of the invention. The primary radiation source used was an InGaN-LED chip having the dominant wavelengths specified, with the phosphor mixtures disposed in the beam path thereof (phosphor mixtures present in the standard silicone potting material). The measurements were conducted at a correlated color temperature (CCT) of 2700 K±30 K. It is apparent here that inventive examples 1 to 4 have an elevated conversion efficiency compared to the conventional comparative example. At the same time, less red phosphor has to be used in the phosphor mixtures of the invention.

With reference to the preceding FIG. 52a, FIG. 52b shows a comparison of the measurement data for comparative example 1 as opposed to inventive example 1 at correlated color temperatures of 2700 K and 4000 K. It is again apparent that the conversion efficiency of the inventive example is higher than the conversion efficiency of the comparative example.

FIG. 52c shows, in the left half, a graph of the reflectivity as a function of the wavelength for a conventional phosphor (Sr,Ca)AlSiN$_3$: 0.4% Eu, and for the two phosphors of the invention $Sr(Sr_{0.84}Ca_{0.16})Si_2Al_2N_6$: 4.7% Eu (labeled as Sr(Sr,Ca)Si$_2$Al$_2$N$_6$:Eu (8% Ca, 4.7% Eu) in the diagram) and $Sr(Sr_{0.8}Ca_{0.20})Si_2Al_2N_6$: 3.7% Eu (labeled as Sr(Sr,Ca)Si$_2$Al$_2$N$_6$:Eu (10% Ca, 3.7% Eu) in the diagram). What is noticeable here is the higher absorption of the phosphors of the invention in the wavelength range between 300-600 nm because of the elevated content of europium. At the same time, the phosphors of the invention exhibit an elevated conversion efficiency. The right-hand image in FIG. 52C shows the high consumption of red phosphor in comparative example 1 (left-hand bar) as compared with inventive example 1 (right-hand bar) at correlated color temperatures of 4000 and 2700 K, and it becomes particularly clear here that, in the case of phosphor mixtures of the invention containing the novel phosphor, significantly less phosphor has to be used.

A graph comparison of the temperature-dependent changes in the LED color locus of two embodiments of the present invention compared to comparative example 1 from room temperature to 85° C. is shown in FIG. 52d. It is apparent here that the shift in the LED color locus as a function of temperature is much more marked in comparative example 1 than in inventive examples 3 and 4 of the present invention.

Figure 52E:
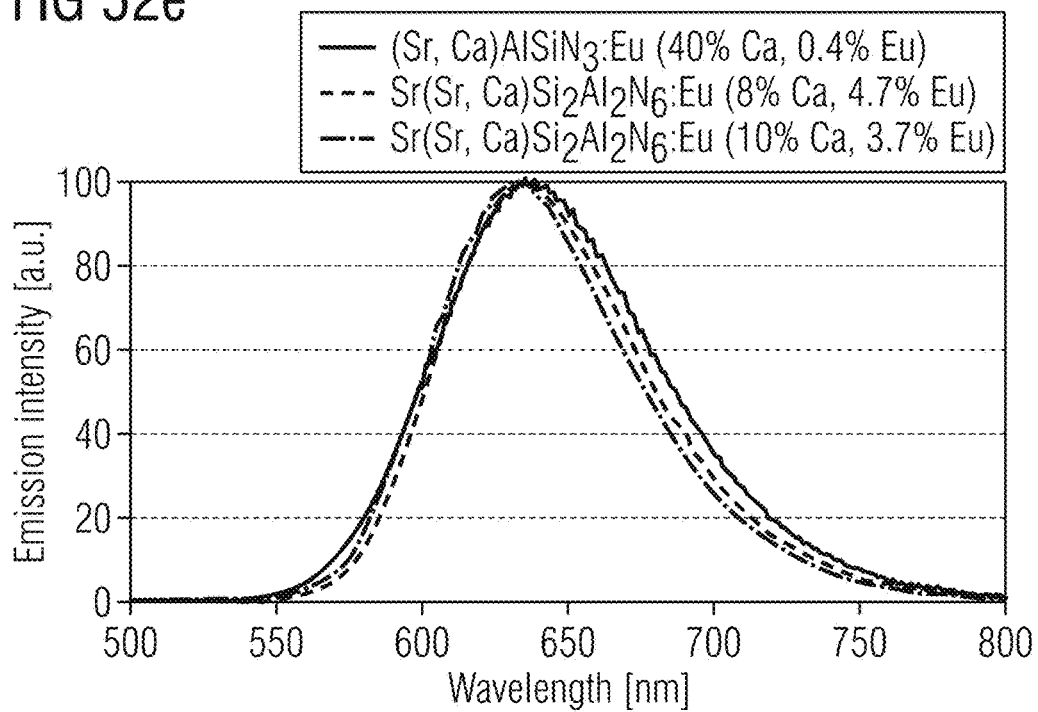

FIG. 52e shows a comparison of the emission spectra of two red-emitting phosphors of the invention compared to a conventional phosphor of the formula (Sr,Ca)AlSiN$_3$: 0.4% Eu. The phosphors of the invention, by contrast with the conventional phosphor, show lower half-height widths FWHM, which result in a high color rendering index (CRI) and in an increased efficiency.

Figure 52F:
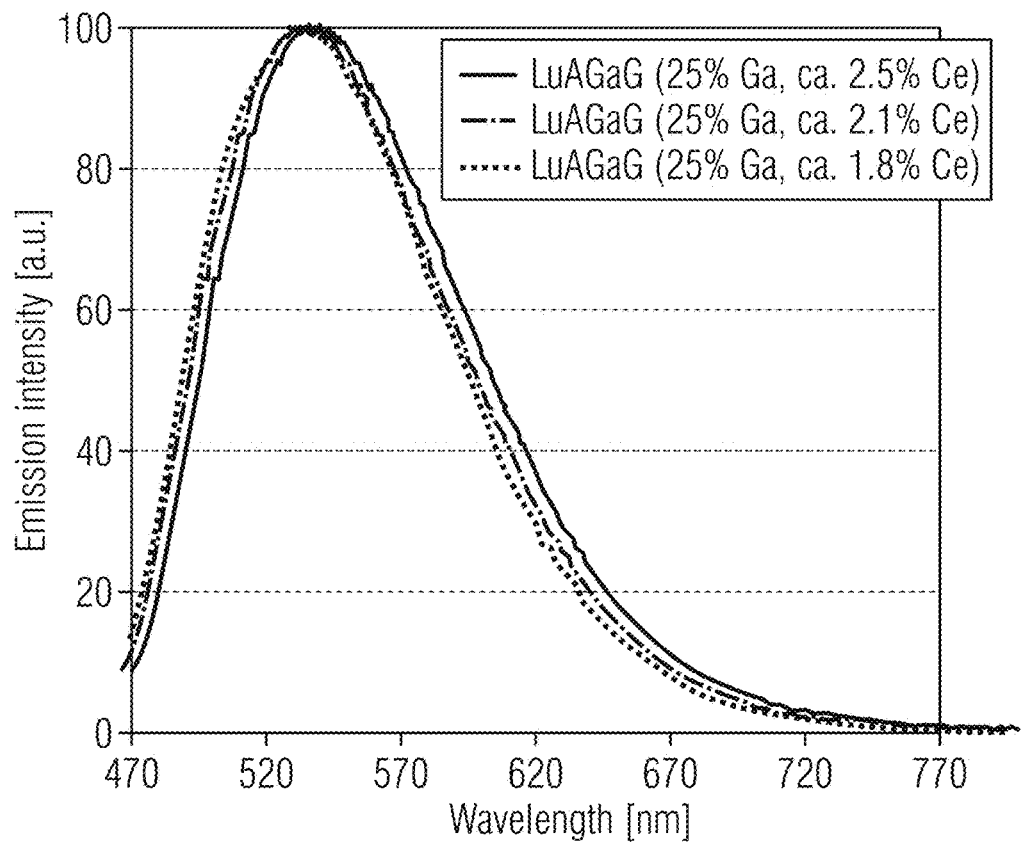

The emission spectra of various green-emitting garnet phosphors at an excitation wavelength of 460 nm, which are used in phosphor mixtures of the invention for warm white light applications, are shown in FIG. 52f. The emission intensity of these garnet phosphors in the blue/green region of the visible spectrum (470-520 nm) is either comparable to or even better compared to other green-emitting garnet phosphors. This allows a good color rendering index (high CRI).

Figure 52G:
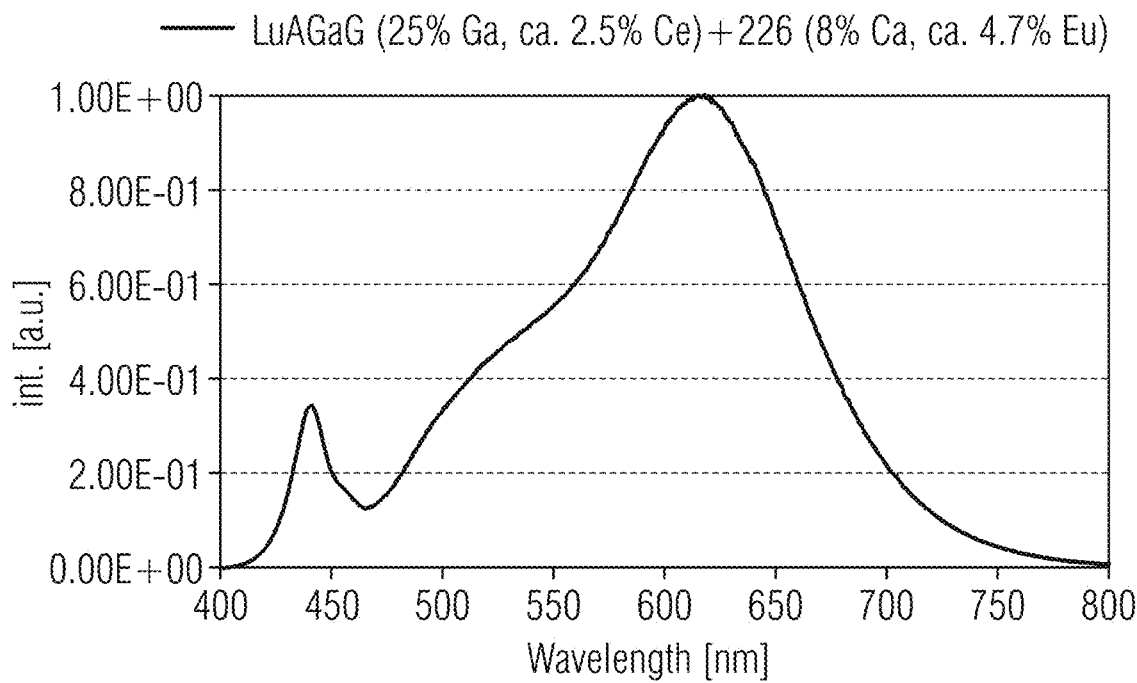
Figure 52H:
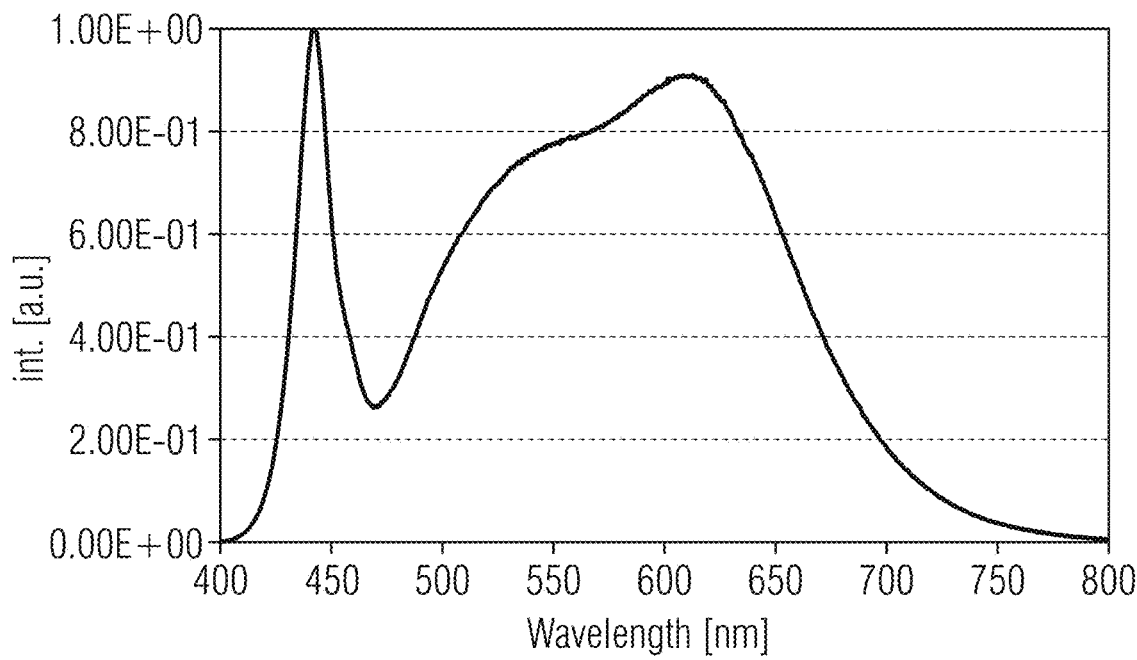

FIGS. 52g and 52h show spectra of blue-emitting LEDs with phosphor mixtures according to inventive example 1 having been introduced into potting material thereof at correlated color temperatures of 2700 K (FIG. 52g) and at 4000 K (FIG. 52h). In both spectra, the signals of the secondary radiation of the phosphors of the invention in the red and green region and also the emission of the unconverted primary radiation of the LED in the blue region are clearly apparent.

Further embodiments of the present invention are directed to phosphor mixtures or lighting devices in which at least three phosphors are disposed in the beam path of the radiation source, for example of a blue LED. In order to adjust either the CRI or the LED efficiency for a given color locus, it is possible to use phosphor mixtures having more than two phosphors. Especially in the case of use of three phosphors, for example of a green-emitting phosphor, a yellow-emitting phosphor and a red-emitting phosphor, there are several ways of obtaining an LED having a particular color point. However, one problem in the prior art is that many conventional orange/red-emitting phosphors have a broad-band emission and a considerable portion of the red light is emitted within a range to which the human eye is relatively insensitive.

What are proposed, therefore, are phosphor mixtures including at least one phosphor of the invention. Such lighting devices of the invention therefore have, as radiation source for the primary radiation, a blue LED having a dominant wavelength of 300-500 nm, preferably 400-500 nm, further preferably 420-470 nm. The phosphor mixture contains at least one red-emitting phosphor of the invention as the first phosphor having the general formula Sr(Sr$_a$M$_{1-a}$)Si$_2$Al$_2$N$_6$:D where M is selected from the group of Ca, Ba, Zn, Mg, preferably Ca, a yellow/green-emitting garnet phosphor of the general formula (Y,Lu,Gd,Tb)$_3$(Al,Ga)$_5$O$_{12}$:Ce having a peak wavelength of 500-570 nm, preferably of 510-560 nm, further preferably of 520-550 nm, as the second phosphor, and, as the third phosphor, either an orange/red-emitting inventive phosphor of the general formula Sr(Sr$_a$M$_{1-a}$)Si$_2$Al$_2$N$_6$:D where M is selected from the group of Ca, Ba, Zn, Mg, preferably Ca, or an orange/red-emitting 2-5-8 phosphor of the general formula M$_2$(Si,Al)$_5$(N,O)$_8$:Eu with M=Ca, Sr, Ba or a yellow-emitting garnet phosphor of the general formula (Y,Lu,Gd,Tb)$_3$(Al,Ga)$_5$O$_{12}$:Ce having a peak emission wavelength of 580-650 nm, preferably of 590-640 nm, further preferably of 600-625 nm for the phosphor of the invention or the 2-5-8 phosphor, and of 500 to 600 nm, preferably 525 to 575 nm, further preferably of 535 to 565 nm, for the garnet phosphor.

The red-emitting phosphor of the invention as the first phosphor is preferably selected such that it gives, in combination with the blue LED and the garnet phosphor and the yellow/red phosphor, a CRI of ≥75, preferably ≥80, further preferably ≥85 and more preferably ≥90 for a wide range of correlated color temperature CCT of at least 4000 to 2700 K, further preferably of 5000 to 2700 K, additionally preferably of 6500 to 2400 K. This is best achieved by using a phosphor of the invention having a half-height width FWHM of <85 nm, preferably <82 nm, further preferably <80 nm, having the general formula Sr(Sr$_a$Ca$_{1-a}$)Si$_2$Al$_2$N$_6$:Eu with a≥0.8 and a europium content of 0.1 to 10 mol %, preferably 2-5 mol %. The preferred phosphors of the invention have a high thermal stability and a high conversion efficiency under typical operating conditions for warm white lighting devices.

The green/yellow-emitting garnet phosphor used as the second phosphor may, for example, have the general formula Lu$_3$(Al,Ga)$_5$O$_{12}$:Ce, and it is selected so as to result in a high conversion efficiency and thermal stability. This can be done, for example, by selecting a garnet phosphor of the general formula Lu$_3$(Al,Ga)$_5$O$_{12}$:Ce having a cerium content of 1-5 mol %, preferably 1-3 mol %, and a gallium content of 0-50 mol %, preferably 0-30 mol %, so as to result in the general formula Lu$_3$(Al$_{1-x}$Ga$_x$)$_5$O$_{12}$:Ce with 0≤x≤0.5, preferably 0≤x≤0.3. Other element combinations within the general system of the garnet phosphors are likewise possible, especially variants in which at least some of the lutetium is replaced by yttrium in the general formula.

The third phosphor used may preferably be a phosphor which, in combination with the blue LED and the garnet phosphor, and also the red-emitting phosphor of the invention, gives a CRI of ≥75, preferably ≥80, further preferably ≥85 and most preferably ≥90 over a wide CCT range, for example of 4000-2700 K, further preferably of 5000-2700 K, most preferably of 6500-2400 K. For example, the third phosphor used may be a nitridosilicate phosphor of the general formula (Ca,Sr,Ba)$_2$(Si,Al)$_5$(N,O)$_8$:Eu, where the peak wavelength is 580-650 nm, preferably 590-640 nm, further preferably 600-625 nm, with a europium content of 0.1 to 10 mol %, preferably of 0.1 to 5 mol %, additionally preferably of 0.5-3 mol %, and a barium content of 30-100 mol %, preferably of 40-75 mol %, further preferably of 45-55 mol %, and a calcium content of 0-20 mol %, preferably 0-10 mol %, additionally preferably 0-5 mol %, where the strontium content is selected such that it adds up to 100 together with the alkaline earth metals and the europium.

Alternatively, the third phosphor used may also be an inventive phosphor of the general formula Sr(Sr$_a$Ca$_{1-a}$)Si$_2$Al$_2$N$_6$:Eu having a half-height width FWHM of <85 nm, preferably <80 nm, additionally preferably <78 nm, where the peak wavelength is 580-650 nm, preferably 590-640 nm, further preferably 600-625 nm. In order to achieve these spectral properties, an inventive phosphor of the general formula Sr(Sr$_a$Ca$_{1-a}$)Si$_2$Al$_2$N$_6$:Eu with a≥0.8, preferably a≥0.82, further preferably a≥0.85, with a europium content of 0.1 to 5 mol %, preferably 0.1 to 3 mol %, most preferably 0.1 to 2 mol %, is used.

The third phosphor used may additionally be a yellow-emitting garnet phosphor (Lu,Gd,Tb,Y)$_3$(Al,Ga)$_5$O$_{12}$:Ce having a peak emission wavelength of 500-600 nm, preferably 525-575 nm, further preferably of 535-565 nm. This can especially be accomplished by a garnet phosphor of the general formula Y$_3$(Al,Ga)$_5$O$_{12}$:Ce having a high conversion efficiency and thermal stability. This can be accomplished, for example, by using a garnet phosphor of the general formula having a cerium content of 1 to 6 mol %, preferably 1 to 4 mol %, and a gallium content of 0-50 mol %, preferably 0-25 mol %, so as to result in the general formula $Y_3(Al_{1-x}Ga_x)_5O_{12}$:Ce with $0 \leq x \leq 0.5$, preferably $0 \leq x \leq 0.25$, and other element combinations are additionally also possible within this system, for example at least partial replacement of yttrium by lutetium.

Particular technical advantages of such lighting devices of the invention according to inventive examples 1 and 2 compared to comparative examples 1 and 2 are to be elucidated hereinafter.

FIG. 53a shows the composition and the concentrations of the phosphor mixtures and particular ratios of the first to third phosphors in lighting devices having a standard InGaN LED with a chip area of 1 mm². FIG. 53b shows the respective CIE color coordinates and the CRI and the corresponding conversion efficiencies, these having been expressed in relation to comparative example 1 which has been set to 100%. It is again clearly apparent here that inventive examples 1 and 2 have higher LED efficiencies than the conventional comparative examples.

Figure 53C:
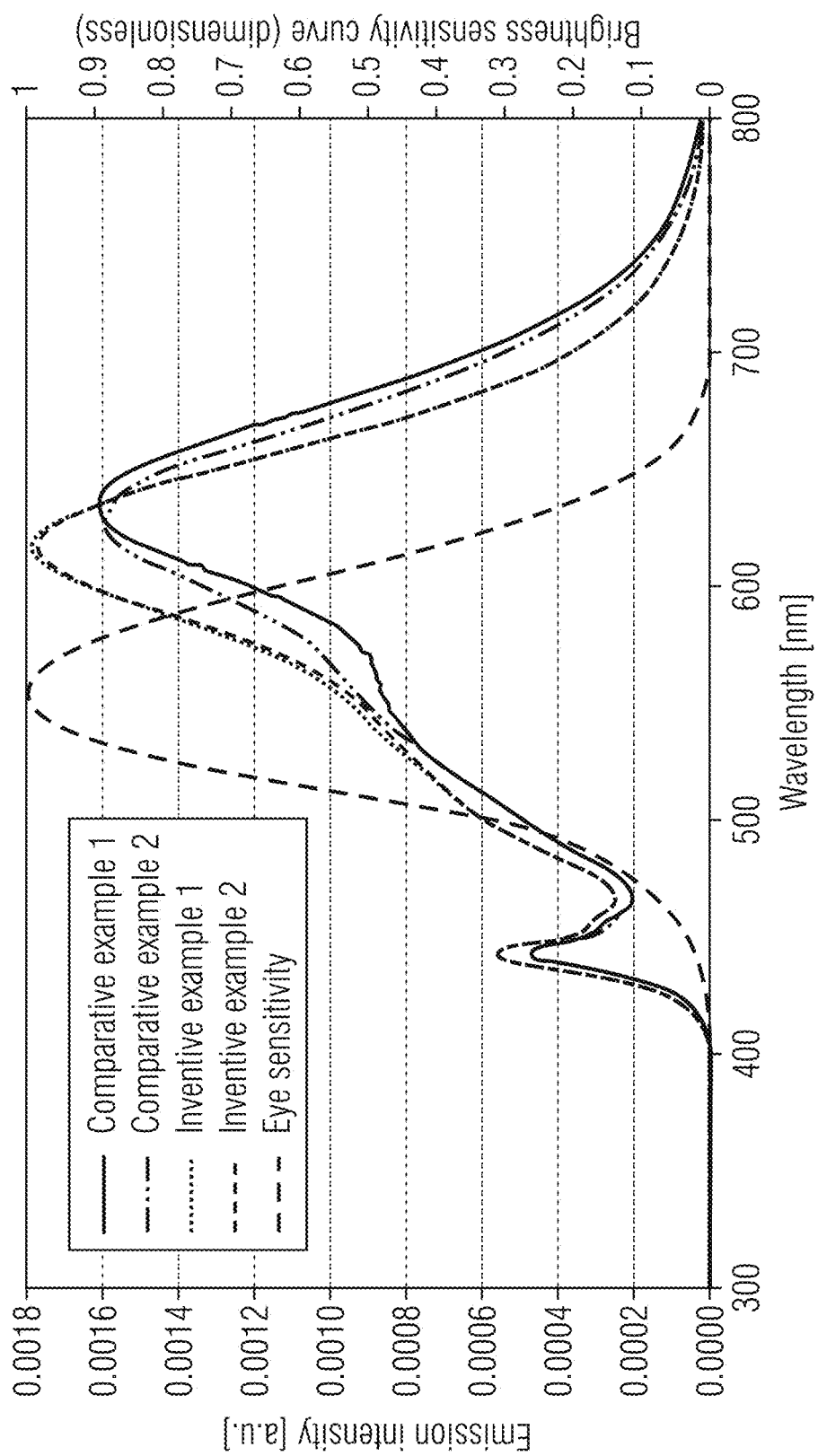
Figure 53D:
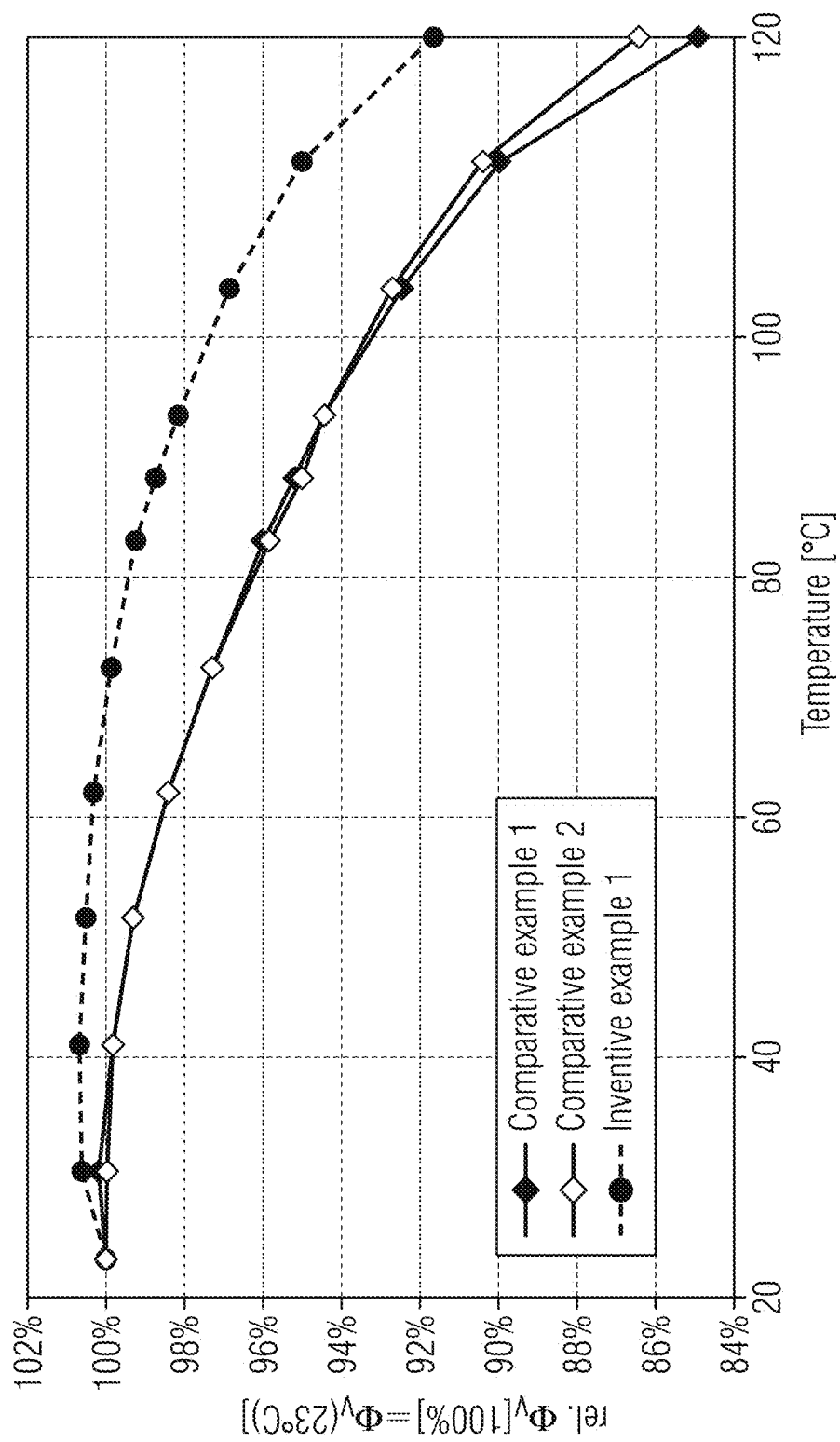

FIG. 53c shows a comparison of the LED spectra of comparative examples 1 and 2 and of inventive examples 1 and 2 together with the eye sensitivity curve for daytime vision of the human eye. It is apparent here that a high proportion of the rise in the LED efficiency is connected to the rise in the luminous efficiency which arises from the use of phosphors of the invention. More particularly, the emission intensity is reduced in a spectral region in which the human eye has barely any sensitivity to light by use of the phosphors of the invention. FIG. 53d shows the relative LED brightness for the comparative and inventive examples as a function of temperature. The lighting devices of the invention have a lower loss of brightness at high temperatures compared to the brightness at 23° C. than the comparative examples.

Embodiments of LARP applications: in a further embodiment of the present invention, the radiation source used which emits the primary light may also be a laser, for example a laser diode. In this case, it is advantageous when the first phosphor of the invention is spaced apart from the laser radiation source (LARP; "laser activated remote phosphor"). LARP applications of this kind are known, for example, from PCT patent applications WO 2012/076296 A2, WO 2011/098164 A1 and WO 2013/110495 A2, and the further patent applications DE 10 2012 209 172 A1, DE 10 2010 062 465 A1, DE 10 2011 002 961 A1 and DE 10 2012 201 790 A1, which are hereby fully incorporated by reference. With lighting devices of this kind, for example projectors, it is possible to achieve significantly higher luminances than with conventional radiation sources.

In the embodiments which follow, a blue LED laser diode having a radiation density of 8.9 W/mm² and a peak wavelength of 446 nm is used, the beam of which is directed onto either conventional or inventive phosphor grains present at the base of an Ulbricht sphere having a reflective inner surface. The converted light reflected is subsequently collected and analyzed. Such a test setup simulates the conditions in an LARP lighting device.

Figures 54, 55:
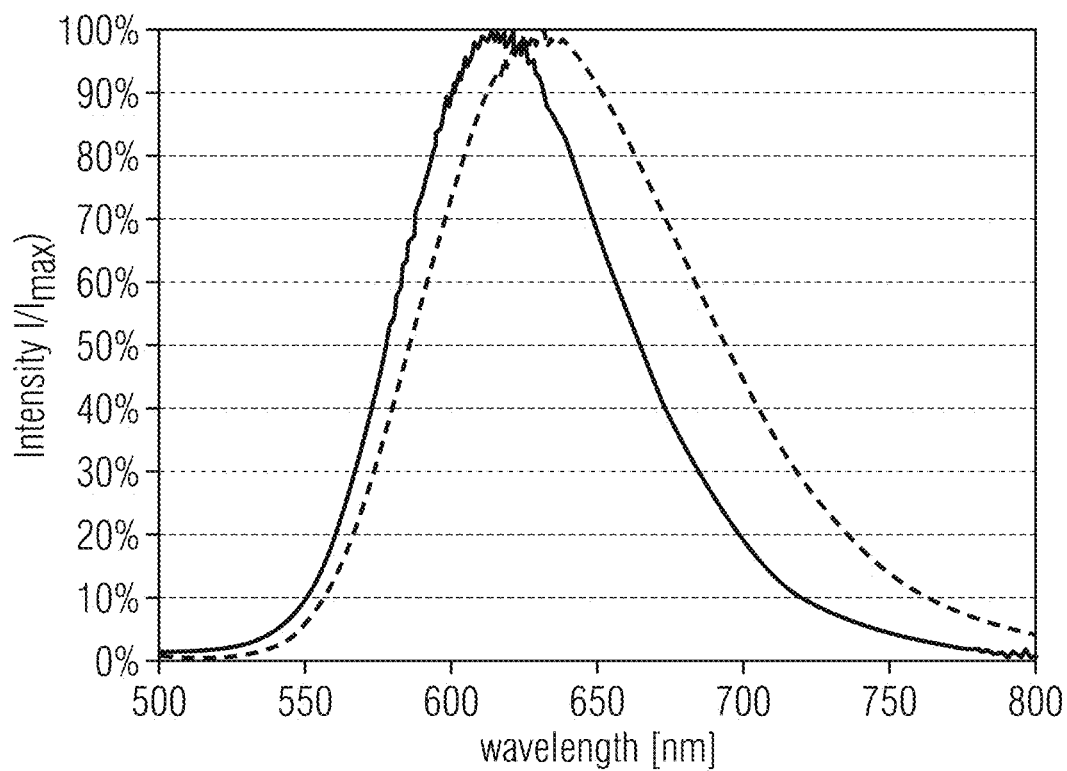
FIGS. 54-57 show the light yield and the composition of the phosphors for various LEDs in LARP applications according to comparative examples and inventive examples and the corresponding emission spectra thereof.

In the table in FIG. 54, in a comparative example 6, a conventional phosphor is irradiated with the laser light, while, in inventive example 7, an embodiment of a phosphor of the invention is irradiated with laser light. It is clearly apparent that, given similar dominant wavelengths of 601 nm and 597 nm of the converted light, the luminous efficiency in the case of the phosphor of the invention is 42% higher than in the case of the conventional phosphor. The corresponding emission spectrum is shown in FIG. 55, the dotted line corresponding to comparative example 6 and the solid line to inventive example 7.

Figures 56, 57:
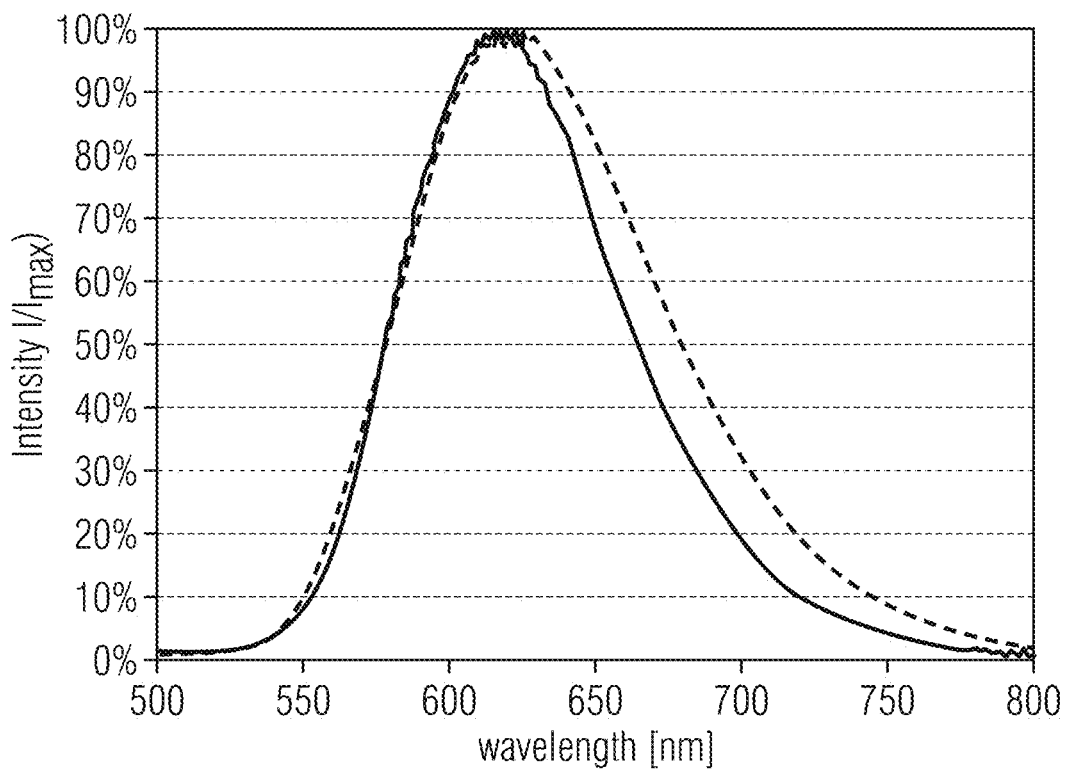

In the table in FIG. 56 and the corresponding emission spectrum in FIG. 57 too, a conventional phosphor and the same phosphor of the invention were irradiated with laser light in a comparative example 7 and an inventive example 8, as in the table in FIG. 54. In these experiments too, again, an elevated luminous efficiency is found with the phosphor of the invention compared to the conventional phosphor (increase by 13%).

More particularly, in all flash applications and also in other conversion applications of the phosphors of the invention, for example general lighting applications, and provided that the applications are not full-conversion applications, it is also possible for proportions of unconverted primary radiation from the radiation source to be present, even if this is not mentioned explicitly. Mixing of this unconverted primary radiation with the converted secondary radiation results in an overall emission of the lighting device. As already described further up, for example, it is possible to achieve warm white light-emitting lighting applications with phosphors of the invention by converting the blue primary radiation from InGaN LEDs by means of the phosphors of the invention to a red component, and by means of green/yellow-emitting phosphors to a green-yellow component, in which case additive color mixing of the blue primary radiation and the two converted secondary radiations gives warm white light as the overall emission of the lighting device.

Figure 58A:
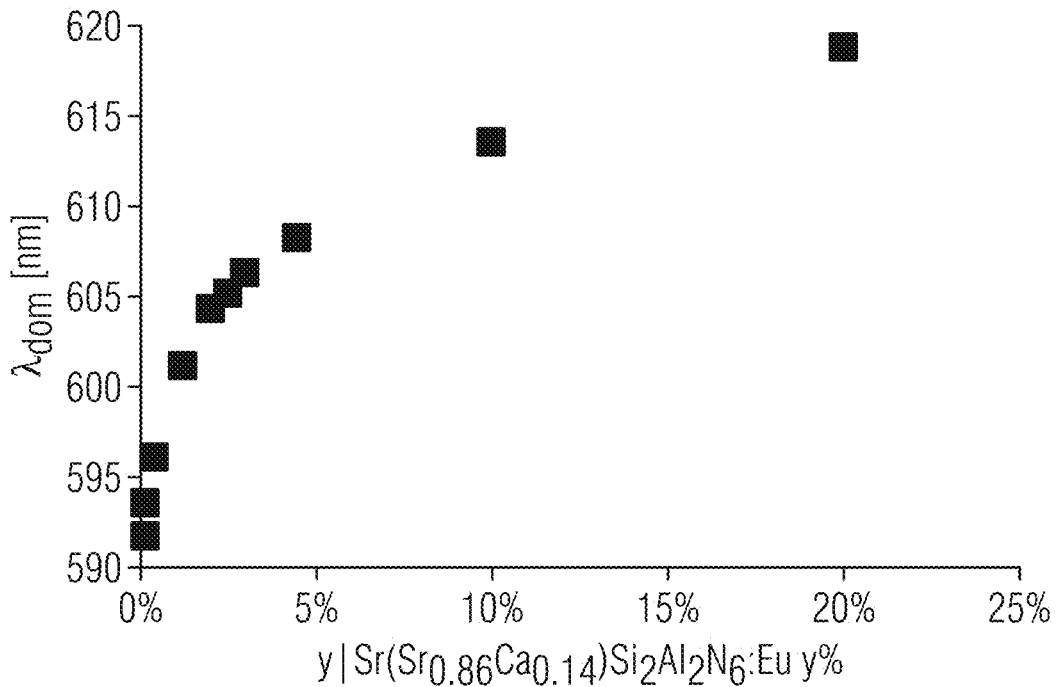
FIGS. 58a-58c show the effects of different Eu dopant concentrations on the dominant wavelength, the relative intensity of photoluminescence and the relative photoluminescence intensity assessed by eye.
Figure 58B:
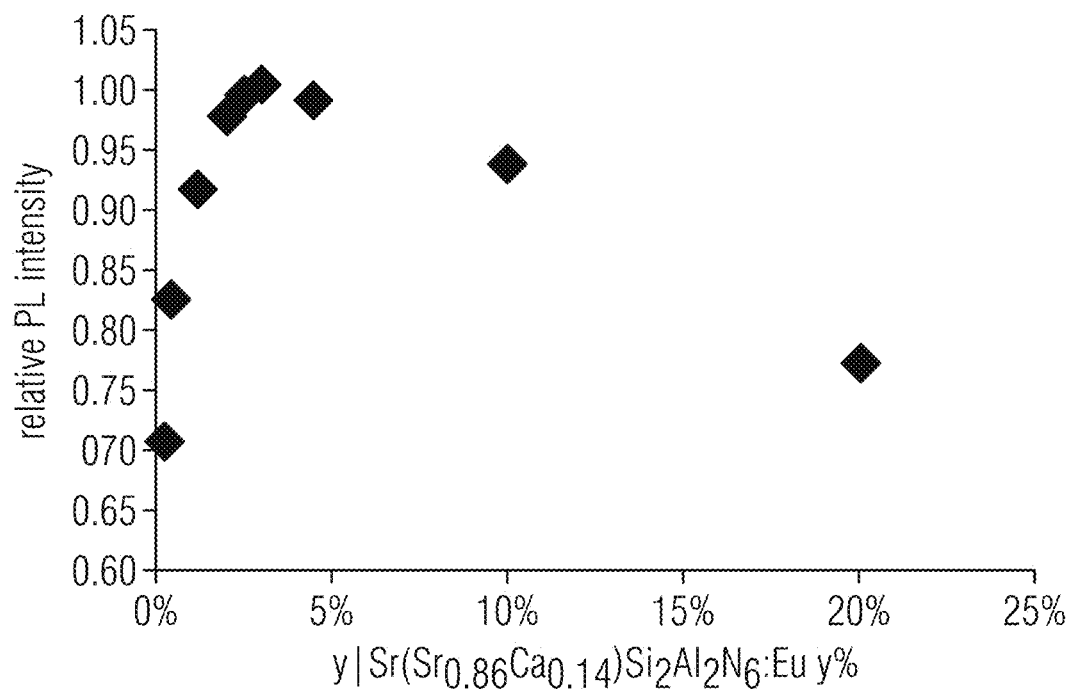
Figure 58C:
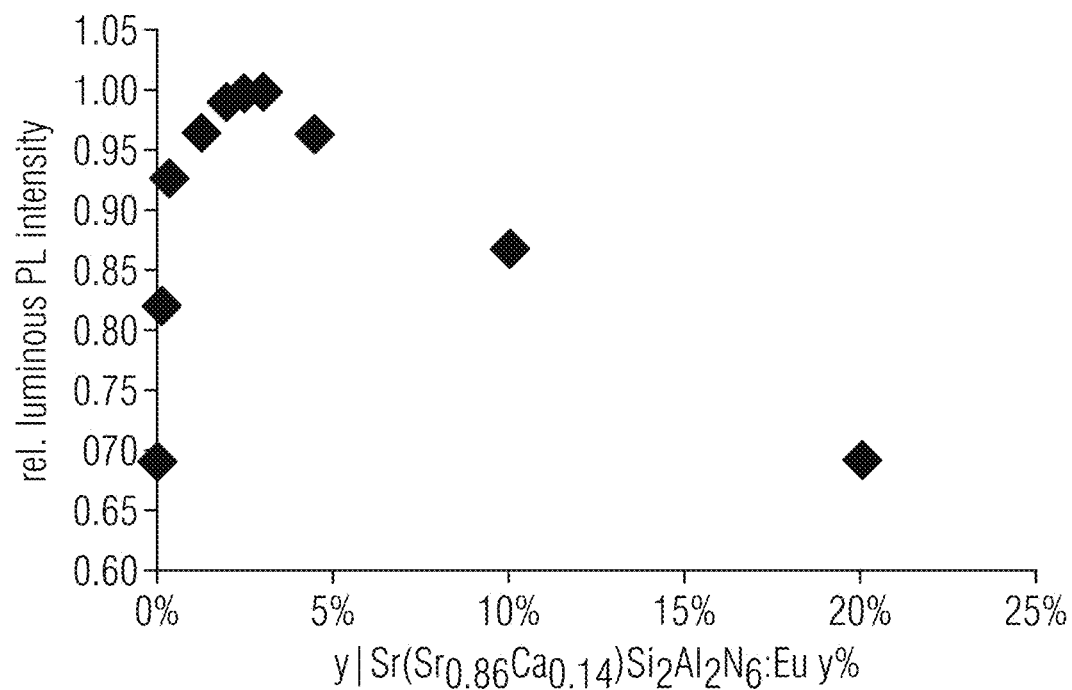

Embodiments with different Eu dopant concentrations: FIGS. 58a to 58c show the dominant wavelengths, the relative intensities of photoluminescence, and the relative photoluminescence intensities assessed by eye of various embodiments of an inventive phosphor of the formula $Sr(Sr_{0.86}Ca_{0.14})Si_2Al_2N_6$:Eu as a function of rising activator concentrations of europium. With rising concentration of europium dopant, the dominant wavelength of the emission of the phosphors of the invention moves to higher wavelengths, from the orange to the red color range (see FIG. 58a), with a rise in the relative intensity of photoluminescence of 0.1 to about 4 mol % and then a drop again as the activator concentrations of europium increase further (see FIG. 58b). Based on the relative intensity of photoluminescence, a concentration range of 1-10 mol % of Eu, or 2-5 mol %, is preferred. Substantially analogous behavior to the relative intensity of the photoluminescence is also displayed by the relative luminescent photoluminescence intensity assessed by eye sensitivity, which likewise increases with rising activator concentrations of europium and drops again from about 4 mol % to about 20 mol % (see FIG. 58c). This takes account of the sensitivity of the human eye for daytime vision. Based on the luminescent photoluminescence intensity, activator concentrations of 0.4-10 mol % of Eu, or 1-5 mol % of europium, are preferred.

Embodiments with further co-dopants or dopants other than Eu: Further embodiments of phosphors of the invention having the general formula $Sr_{(1-x-h)}(Sr_aM_{1-a})_{(1-y-i)}A_{(x+y)}B_{(h+i)/2}E_{(h+i)/2}Si_{(2-z)}G_zAl_2N_6$:D and $Sr_{(1-x)}(Sr_aM_{1-a})_{(1-y)}B_{(x+y)}Si_{2-(x+y)}Al_{2+(x+y)}N_6$:D are to be described in detail hereinafter.

Figure 59B:
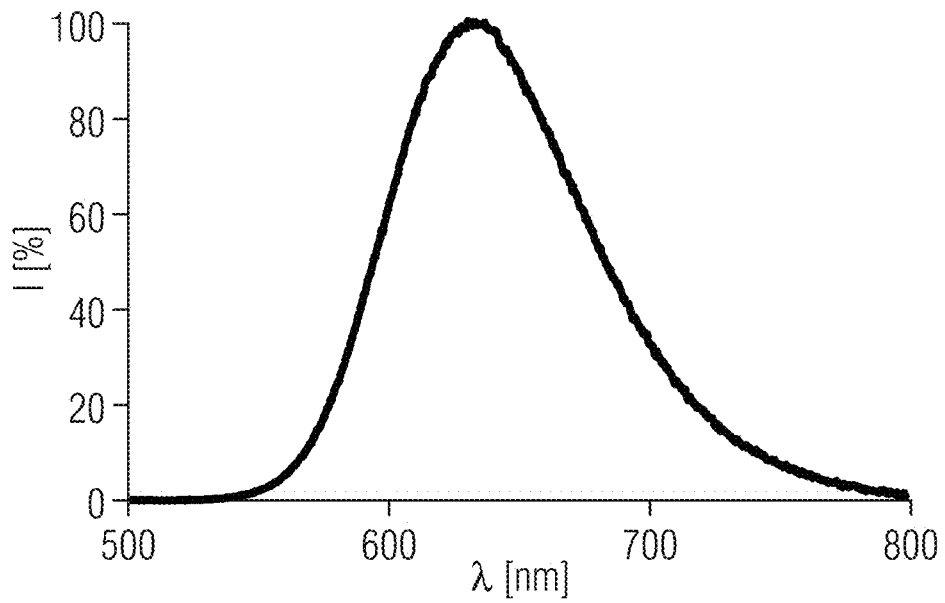
Figure 59C:
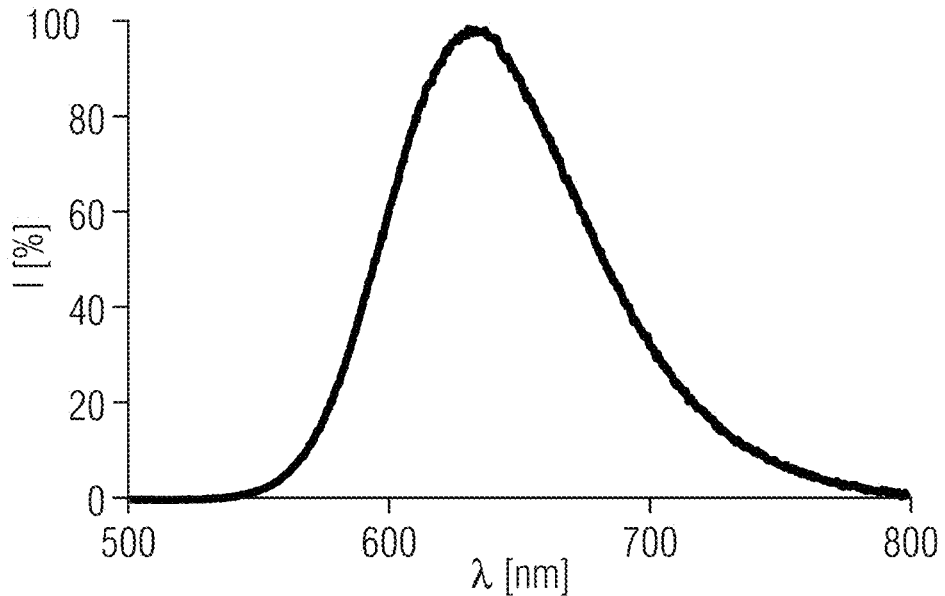
Figure 59D:
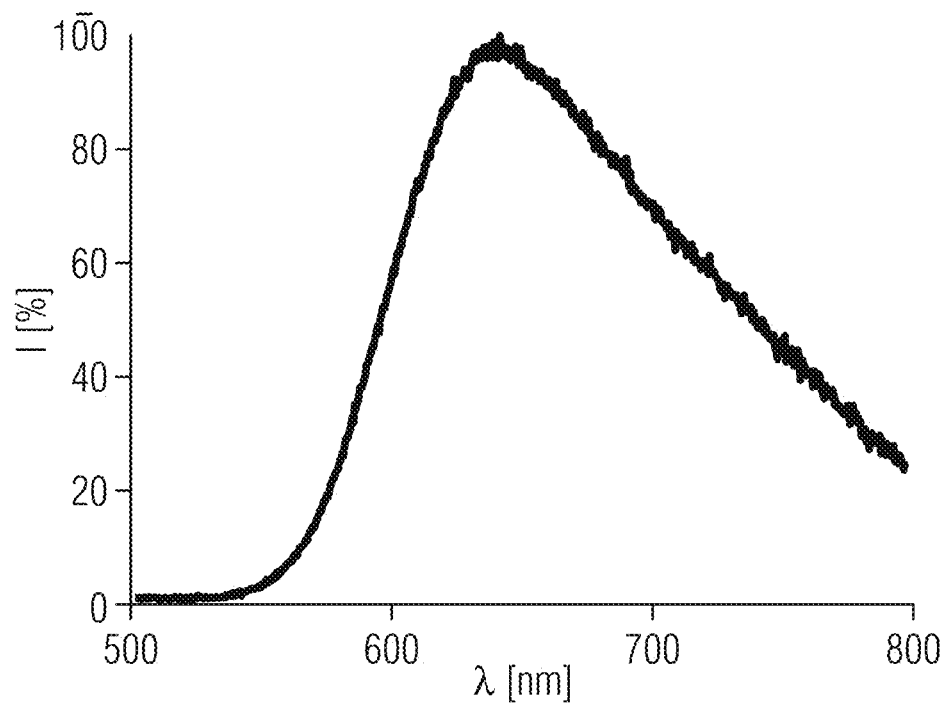
Figure 59E:
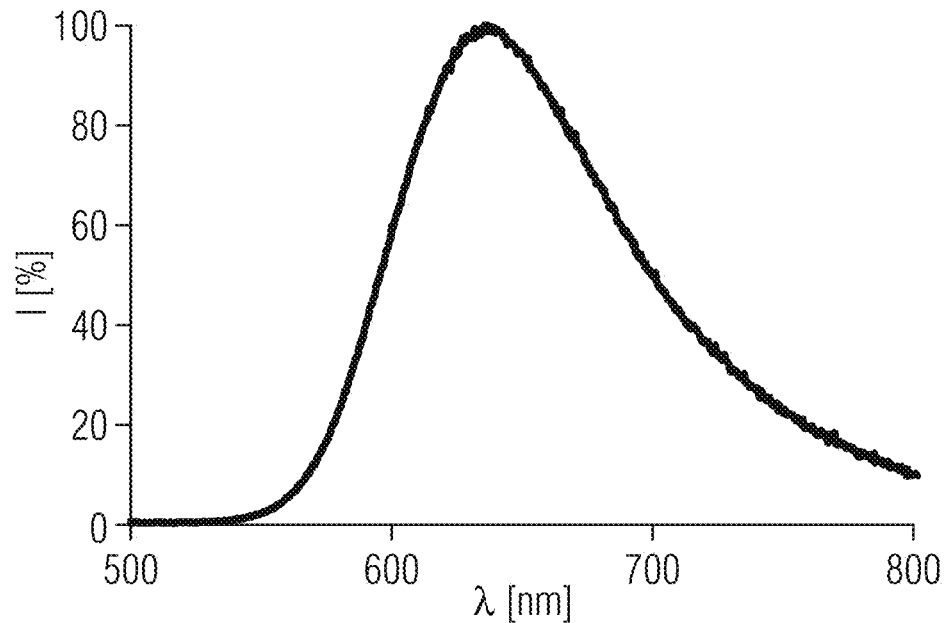
Figure 59F:
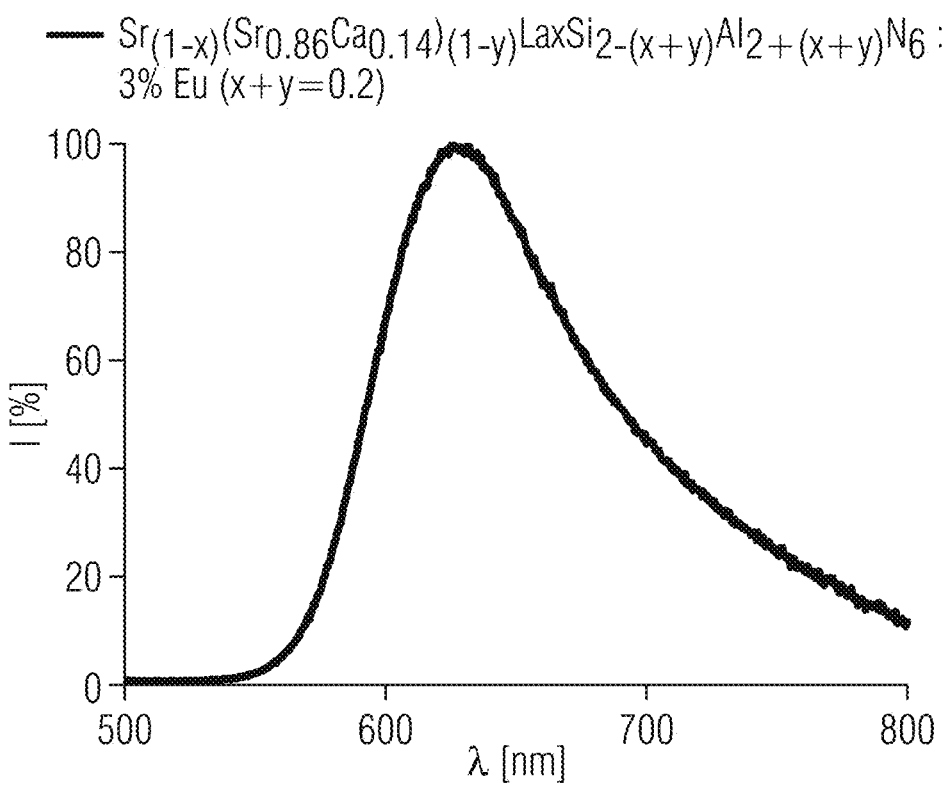

FIG. 59a shows the nominal composition of five different embodiments of a phosphor of the invention, the first phosphor having Cu co-doping and the second phosphor having Zn co-doping, and with replacement of the alkaline earth metals Sr and Ca by a mixture of La and Li in the third and fourth phosphors. In the last phosphor, La and Al replace the alkaline earth metals Sr and Ca, and also Si. The table reports the spectral properties of the various phosphors, especially the color locus in the CIE color space, the average reflectance between 450 and 470 nm (R(450-470)), the luminous efficiency LE (LE=LER/683 [lm/W] where LER=luminous efficacy), the dominant wavelength λdom and the spectral width at half the maximum height FWHM. It is clearly apparent how the co-doping with different metals affects the luminous efficiency and also all other spectral properties of these phosphors. FIGS. 59b to 59f which follow show the emission spectra of these phosphors of the invention.

Figure 59G:
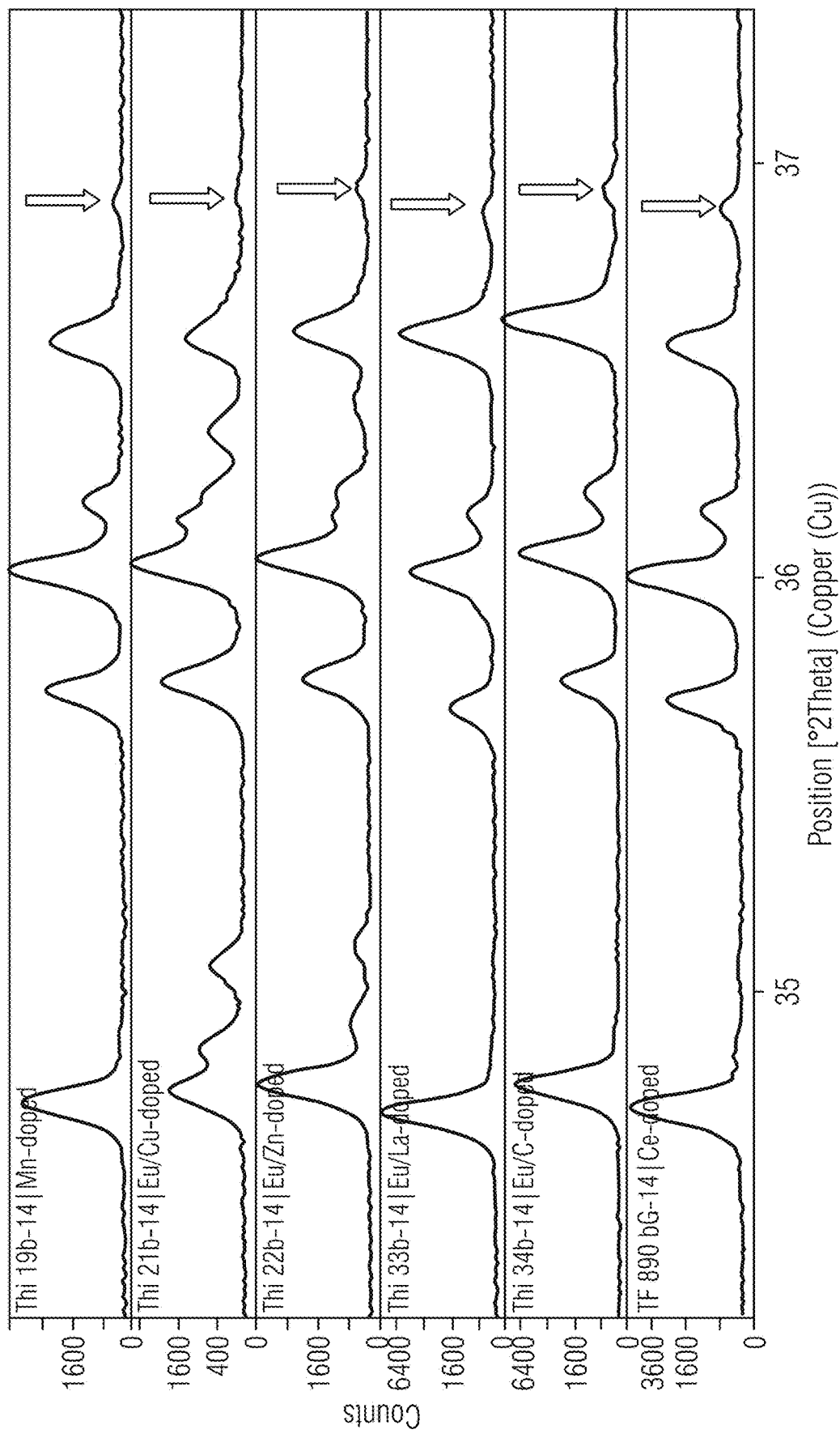

FIG. 59g shows a collation of the x-ray diffractograms of the above-described co-doped phosphors of the invention. An arrow in each case marks the characteristic x-ray reflection which is one of the factors responsible for the assignment of the crystal structure of these co-doped phosphors of the invention too into the monoclinic $P2_1$ space group.

Figure 60B:
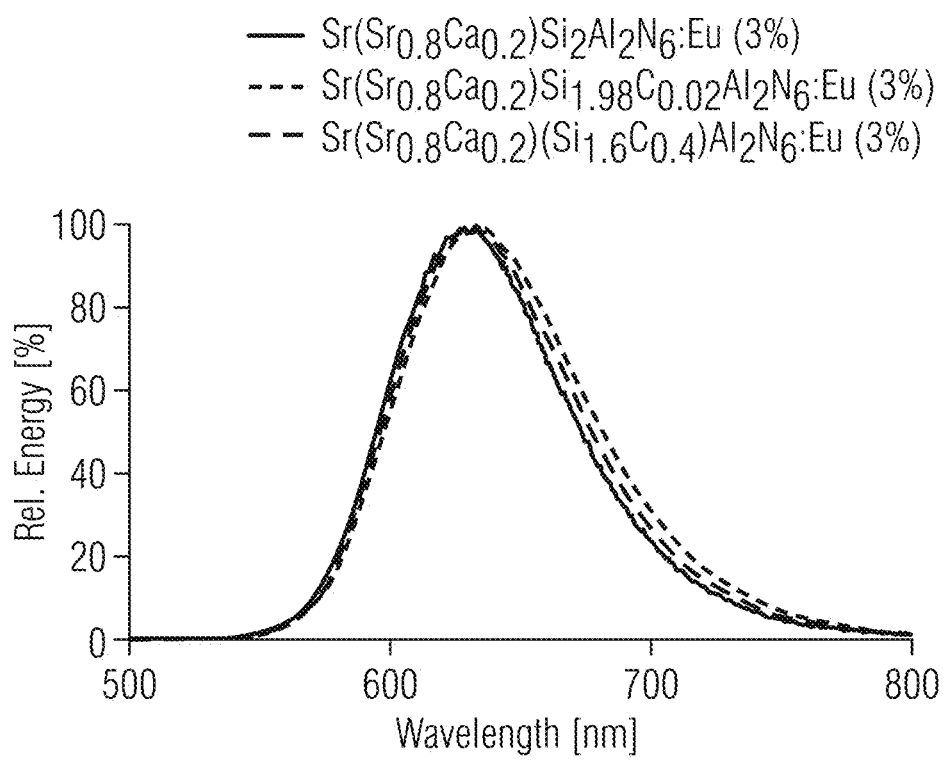

FIG. 60a shows, in tabular overview, various embodiments of phosphors of the invention in which no carbon is present and, in the two other cases, different amounts of carbon are present for co-doping. The phosphors each have the same activator concentration of 3 mol % of Eu based on the alkaline earth metals. Analogously to FIG. 59a, the spectral properties of the various phosphors are listed here again too, "centroid WL" referring to the centroid wavelength of the emission spectrum, which is a weighted average of the frequencies present in the emission spectrum. The table shows that co-doping with carbon causes a red shift in the emission spectrum of the phosphors, which can be used, for example, to improve the color rendering index of lighting devices of the invention. FIG. 60b which follows shows the emission spectra of the various phosphors in the table in FIG. 60a. What is clearly apparent here is the red shift on account of the co-doping with carbon.

Figure 61B:
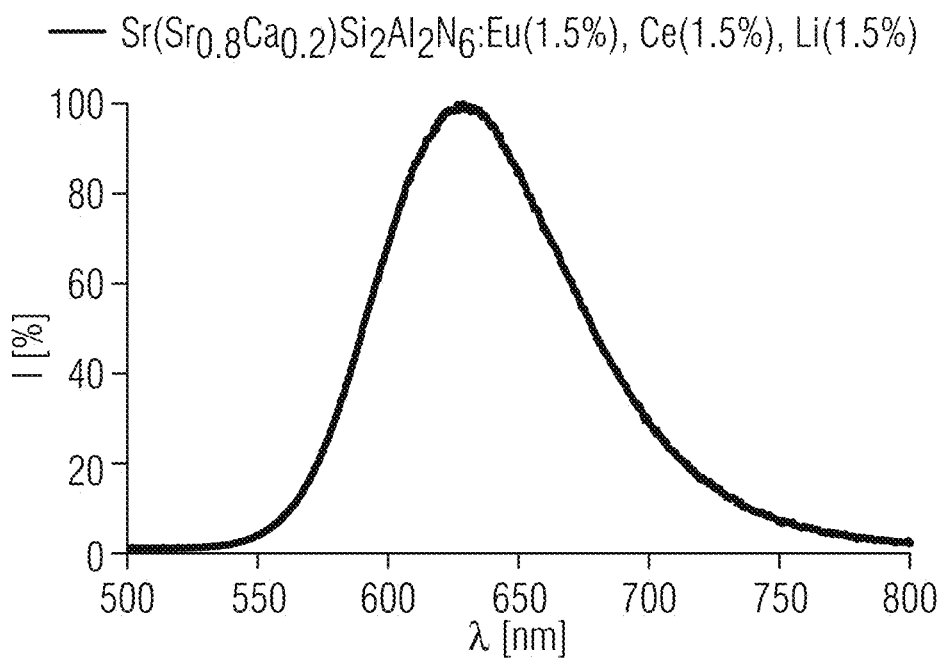
Figure 61C:
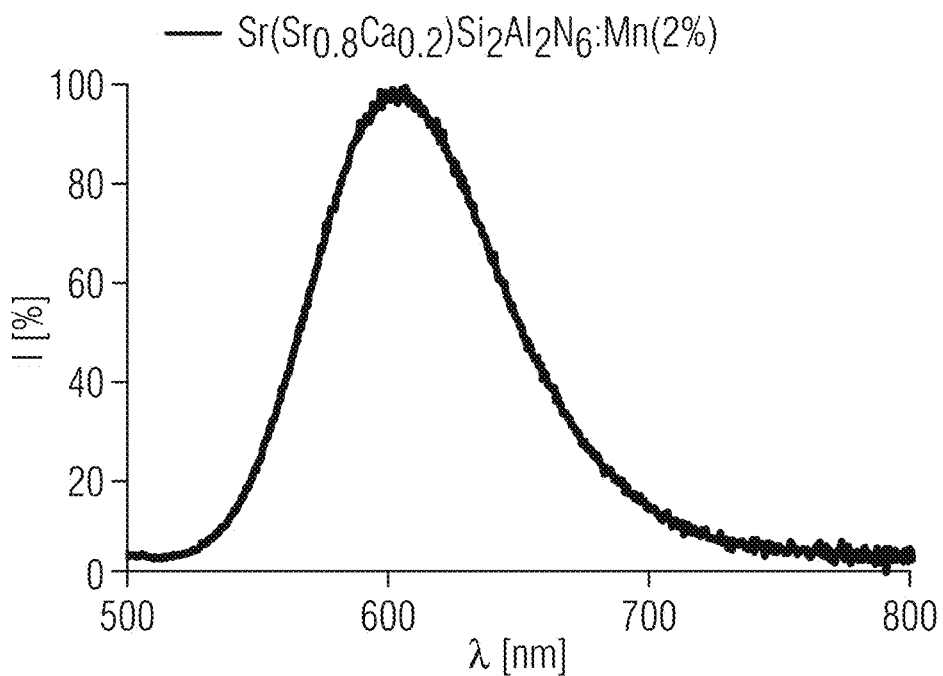
Figure 61D:
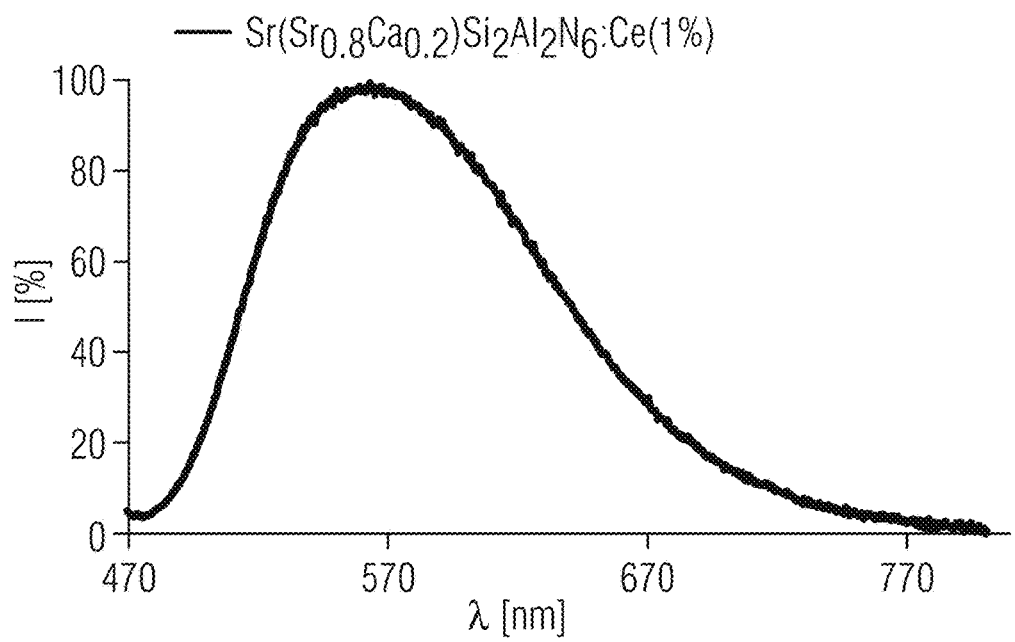

The table in FIG. 61a shows various embodiments of phosphors of the invention with different activators. In the first phosphor in the table, a mixture of Eu, Ce and Li is used, while either manganese Mn or cerium Ce serves as activator in the case of the other phosphors. It is clearly apparent that the different activators result in different color loci of the phosphors in the CIE color space and that the luminous efficiency also depends greatly on the nature of the activators. Large differences can also be observed in the dominant wavelength and in FWHM. FIGS. 61b to 61d which follow show the emission spectra of these phosphors with different activators.

FIGS. 62a to 62e show various properties of phosphors of the invention having only europium as activator compared to phosphors having a mixture of lithium and europium as activators.

Figure 62A:
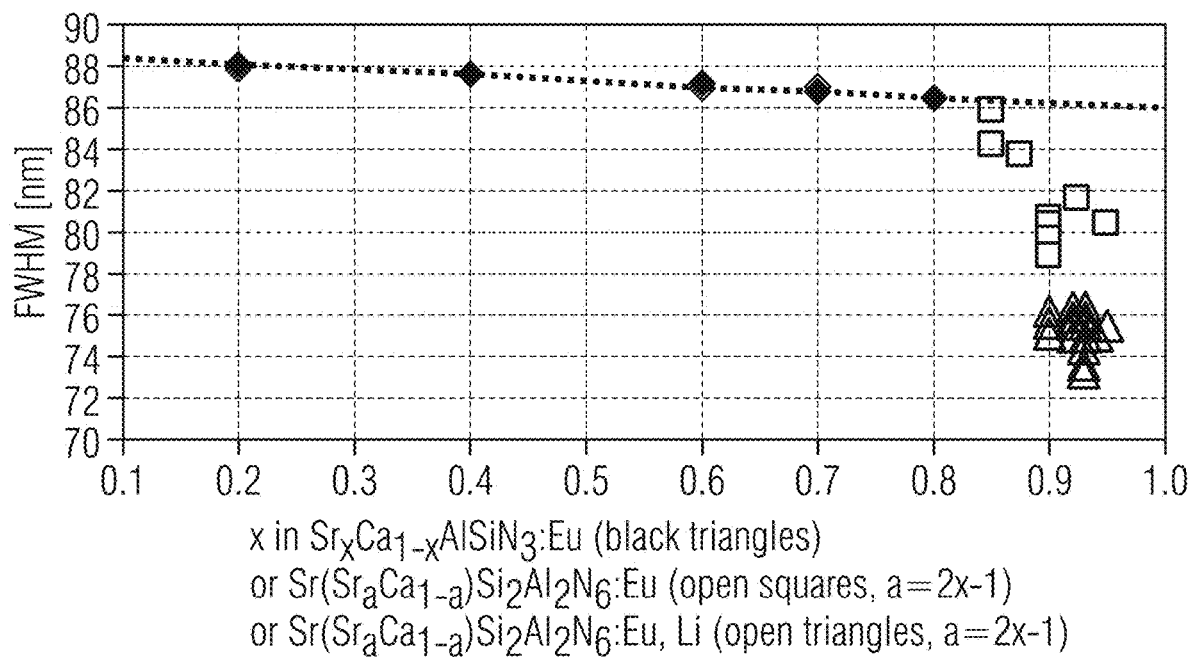

FIG. 62a shows a graph with the breadth at the half maximum FWHM for a conventional phosphor of the formula $Sr_xCa_{1-x}AlSiN_3$:Eu compared to two different phosphors of the invention $Sr(Sr_aCa_{1-a})Si_2Al_2N_6$:Eu and $Sr(Sr_aCa_{1-a})Si_2Al_2N_6$:Eu,Li for various values of x and a for Sr (a=2x−1). It is clearly apparent that the conventional phosphor has a greater half-height width, while both phosphors of the invention have smaller half-height widths, it being possible to reduce the half-height width further especially by the co-doping with Li.

Figure 62B:
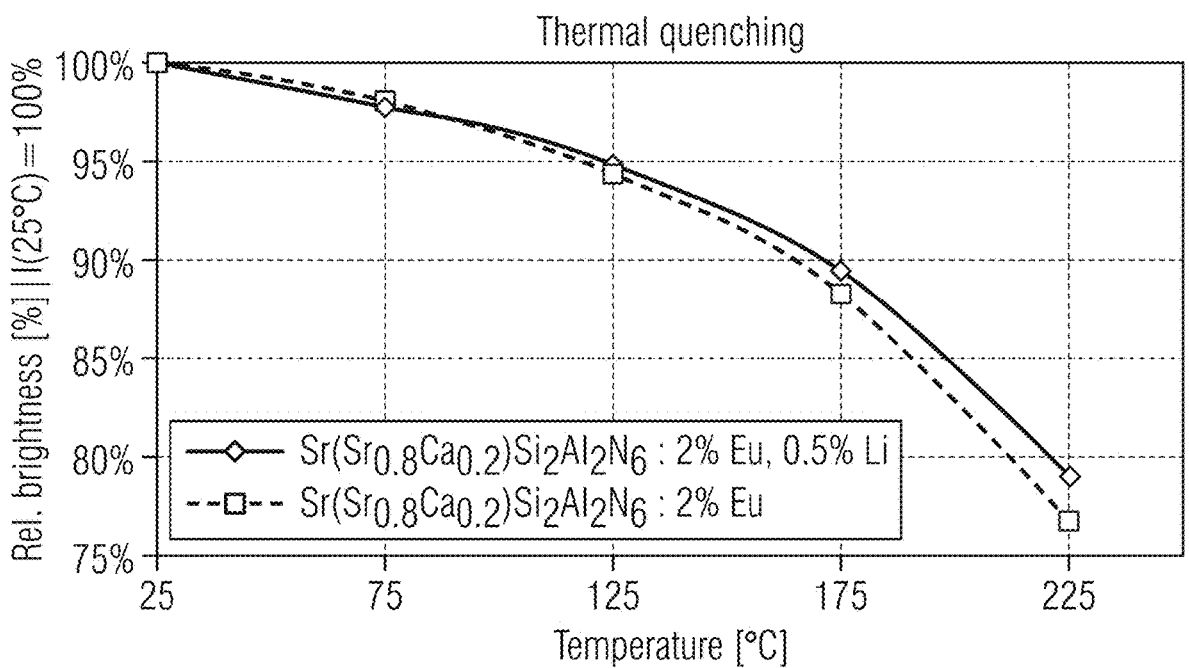

The thermal quenching of two phosphors of the invention is shown in FIG. 62b, with the integral emission intensity plotted against the temperature. Co-doping with lithium here reduces thermal quenching compared to a phosphor of the invention having only europium as the sole activator.

Figure 62C:
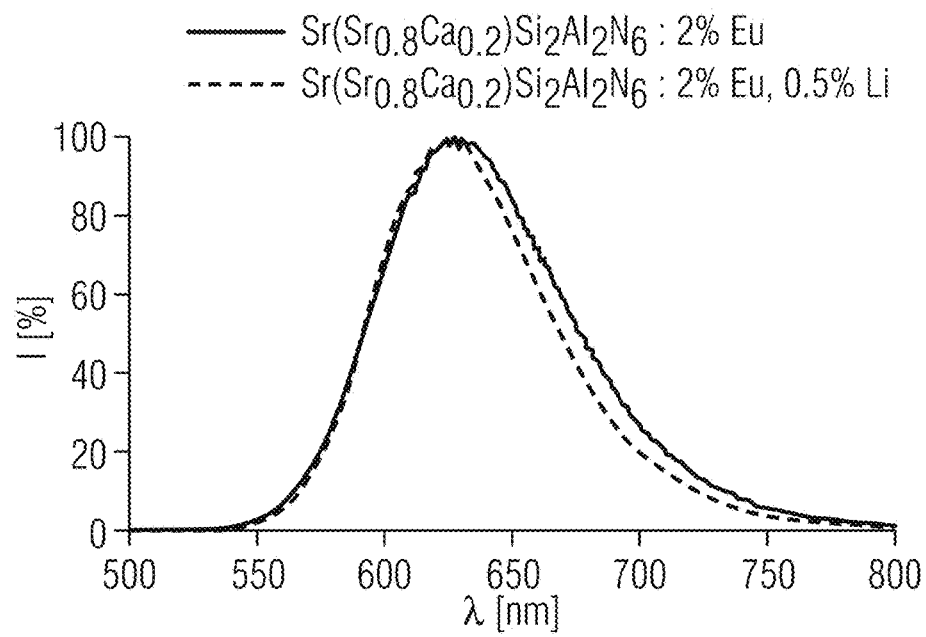

FIG. 62c shows the comparison of the emission spectra of two phosphors of the invention, with one phosphor having been doped only with europium and the second phosphor with a mixture of europium and lithium. Both phosphors exhibit a dominant wavelength of about 604.5 nm, but the half-height width of the emission of the phosphor of the invention is reduced once again with the Eu,Li activator mixture.

An overview of the most important spectral properties, especially the color locus in the CIE color space, the luminous efficiency LER, the dominant wavelength λdom and the half-height width of the emission FWHM is given in tabular form in FIG. 62d for various phosphors of the invention. As already described above, it becomes clear that the half-height width of the emission of a phosphor of the invention that has been doped with europium and lithium is lower than that of a phosphor of the invention that has been doped with europium only. In addition, the elevated quantum efficiency of the phosphor co-doped with europium and lithium is also apparent compared to the other phosphor of the invention.

Figure 62E:
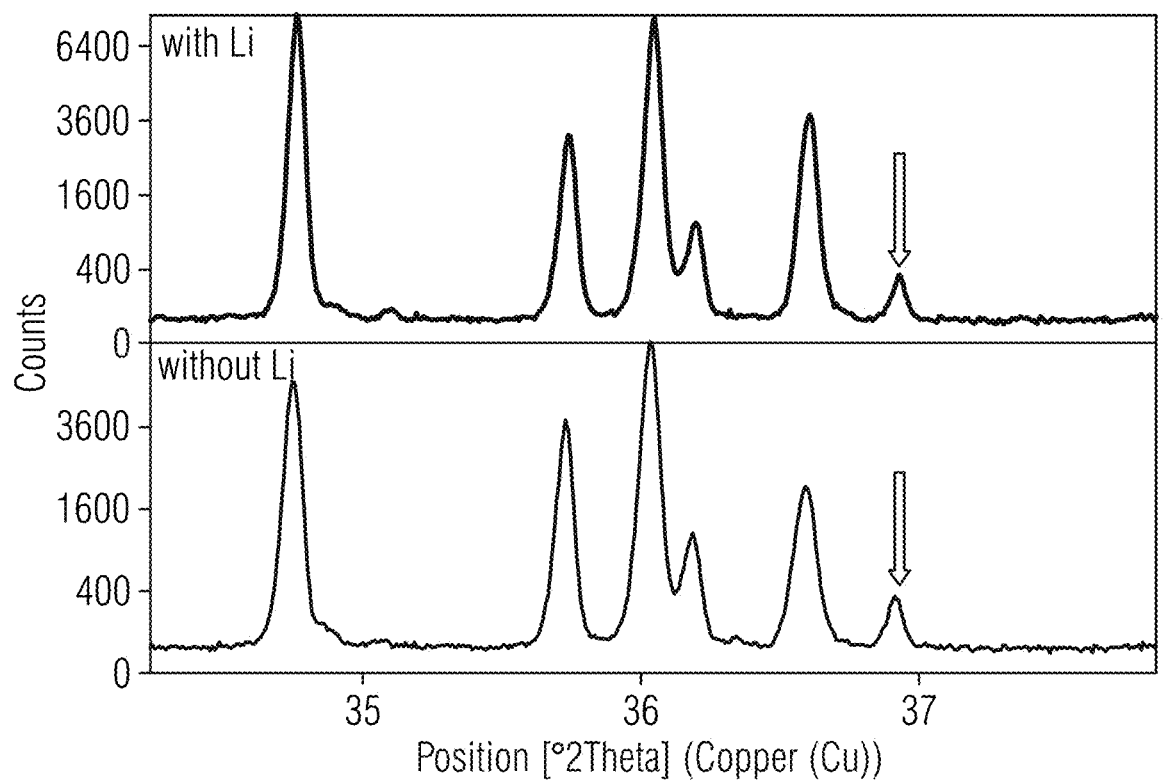

The x-ray diffractograms of the phosphors $Sr(Sr_aCa_{1-a})Si_2Al_2N_6$:Eu (bottom) and $Sr(Sr_aCa_{1-a})Si_2Al_2N_6$:Eu,Li (top) are shown in FIG. 62e. An arrow highlights the characteristic x-ray diffraction reflection of the novel crystal structure of the $Sr(Sr_aCa_{1-a})Si_2Al_2N_6$ phosphor family. Both phosphors of the invention thus have the same monoclinic crystal structure in the $P2_1$ space group.

FIGS. 63 to 73b show various illustrative embodiments of lighting devices 30 comprising the phosphor of the invention in cross section. The lighting devices may, for example, be white light-emitting, especially warm and/or cold white-emitting lighting devices, or red-emitting or red/orange-emitting lighting devices. These may especially be used in the automotive sector, for example as indicators or brake lights. Other possible uses are in traffic signals, in RGB applications or for "color on demand" applications, for general lighting applications, for example streetlighting or room lighting, and flash applications. These lighting devices can each be implemented with and without a reflector dish, and multi-chip arrangements are also possible, for example for flash applications where two or more primary radiation sources are combined in one lighting device. The primary radiation sources used may, for example, be LEDs, laser diodes or else OLEDs.

Figure 63:
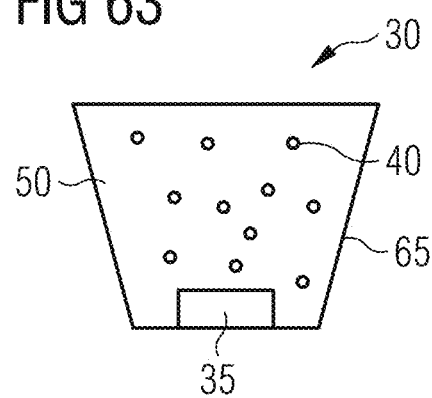
FIGS. 63-67 show various embodiments of lighting devices comprising the phosphors of the invention in cross section.

FIG. 63 shows a radiation source 35, for example an LED in the form of an InGaN LED disposed in a reflector dish 65 which can reflect the radiation from the radiation source 35. Disposed above this radiation source is a first matrix material 50 with a phosphor of the invention embedded therein as first phosphor 40. This phosphor is capable of absorbing the primary radiation emitted by the radiation source 35, for example blue light in the wavelength range from 300 nm to 570 nm, preferably 300 nm to 500 nm, and emitting secondary radiation in the orange/red wavelength range within a wavelength range from 570 nm to 800 nm, preferably 580 nm to 700 nm, further preferably 590 nm to 650 nm. The secondary radiation can also be emitted within a wavelength range from 580 nm to 630 nm, or 590 nm to 620 nm. Phosphors of the invention can therefore be used alone for full conversion or partial conversion of primary light to red secondary radiation, and it is also possible to use phosphors of the invention in combination with other phosphors, as described above, for production of white light, for example.

The first matrix material may comprise a multitude of materials that are transparent both to the primary radiation and to the secondary radiation that has arisen through conversion. More particularly, the first matrix material may be selected from a group of materials consisting of: glass, silicone, epoxy resin, polysilazane, polymethacrylate and polycarbonate, and combinations thereof. The polymethacrylate used may especially be polymethylmethacrylate (PMMA). In addition, the phosphor may also be in the form of a ceramic converter element.

Figure 64:
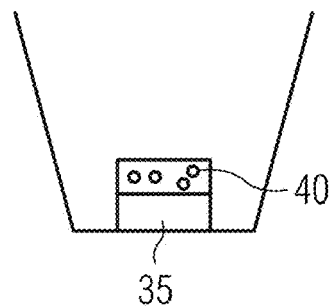

FIG. 64 shows a further embodiment of a lighting device in which the first phosphor 40 of the invention is disposed directly above the radiation source 35 in a separate layer. This layer may be, for example, a ceramic, a phosphor-in-glass or a silicone converter element with the first phosphor embedded therein. This embodiment too assures efficient conversion of the primary radiation to secondary radiation.

Figure 65:
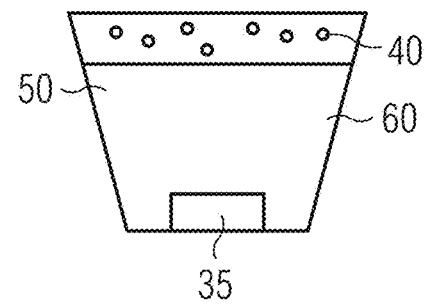

The lighting device in FIG. 65 is what is called a "remote phosphor" configuration in which the layer comprising the first matrix material 50 containing the first phosphor 40 of the invention is spaced apart from the radiation source 35 by an intervening space 60. In the case of such an arrangement, it is especially also possible to ensure that the conversion of the primary radiation to secondary radiation is not impaired by the heat emitted by the radiation source.

Figure 66:
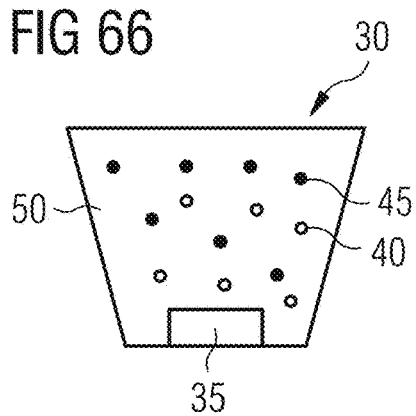

However, another alternative option is an embodiment according to FIG. 66 in which a volume potting material has been produced above the radiation source 35, wherein the first matrix material 35 contains a mixture of the first and second phosphor particles 40 and 45.

Figure 67:
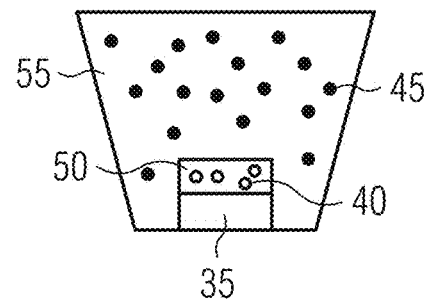

In addition, it is possible that the first phosphor 40 of the invention is disposed directly upon the radiation source 35, for example in the form of a silicone, phosphor-in-glass converter element, or ceramic converter element (see FIG. 67). The first phosphor 40 is again embedded here in a first matrix material 50 or is in the form of a ceramic converter element. The second phosphor 45 is embedded in a potting material which surrounds the radiation source and comprises a second matrix material 55. An arrangement of this kind may be advantageous especially when the second phosphor absorbs wavelength ranges of the secondary radiation produced by the first phosphor and emits them again as light having a longer wavelength. The second matrix material here may again comprise the same materials and combinations thereof as the first matrix material. Conversely, the first phosphor may also be disposed in the surrounding potting material and the second phosphor directly upon the radiation source as converter element.

Figure 68A:
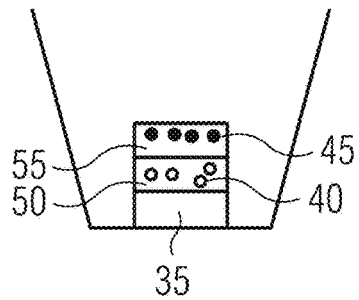
FIGS. 68a and 68b show further embodiments of lighting devices comprising the phosphors of the invention in cross section.
Figure 68B:
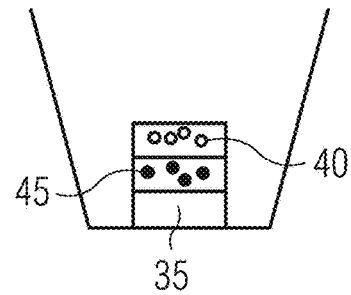

FIGS. 68a and 68b show alternative embodiments in which either the first or second phosphor is arranged downstream with respect to the respective other phosphor in the beam path of the primary radiation from the radiation source 35. Arrangements of this kind, and also the arrangement according to FIG. 67, are advantageous when the downstream phosphor is to reabsorb or convert the primary radiation produced by conversion in the upstream phosphor, or are advantageous when the upstream phosphor would absorb portions of the radiation from the downstream phosphor in the beam path of the radiation source in the case of the reverse arrangement, but this is undesirable.

Figure 69:
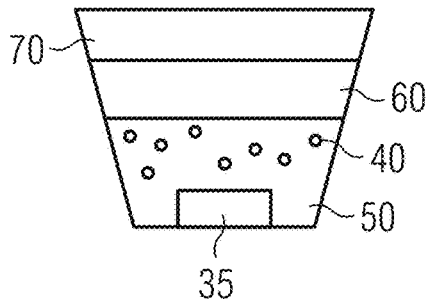
FIGS. 69-73b show various other embodiments of lighting devices comprising the phosphors of the invention in cross section.
Figure 70:
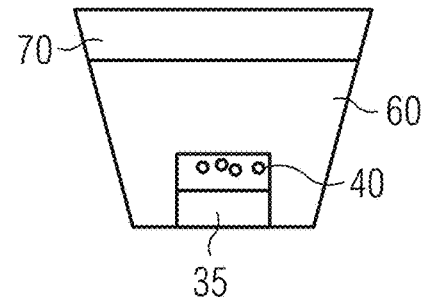

FIGS. 69 and 70 depict various embodiments of lighting devices comprising the first phosphor 40 of the invention, in which the first matrix material 50 is disposed above the radiation source 35 either as a potting material or as a platelet. This arrangement is separated from an interference filter or filter glass 70 by means of an intervening space 60. The filter glass, which may take the form of a glass plate, filter glass particles in a potting material or a filtering, radiation-absorbing second phosphor, may serve, for example, to absorb particular wavelength ranges of the light converted or unconverted components of the primary radiation, such that lighting devices of this kind can be used for substantially complete conversion of primary radiation to secondary radiation. In relation to combinations of a first phosphor with filter particles which may also include a second phosphor, reference is hereby made completely to German patent application DE 10 2014 105 588.8 filed on Apr. 17, 2014.

Figure 71:
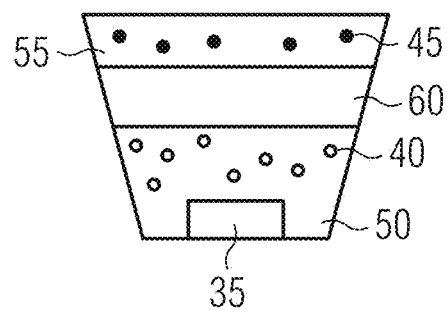
Figure 72:
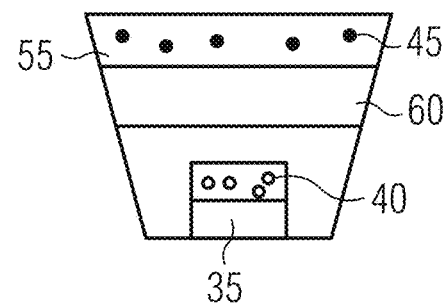

FIGS. 71 and 72 show further embodiments of lighting devices comprising the phosphor of the invention, in which the layers containing the phosphors are spaced apart from one another by an intervening space 60. In each of the individual devices in these two Figures, it is also possible for the first phosphors 40 and the second phosphors 45 to be interchanged.

Figure 73A:
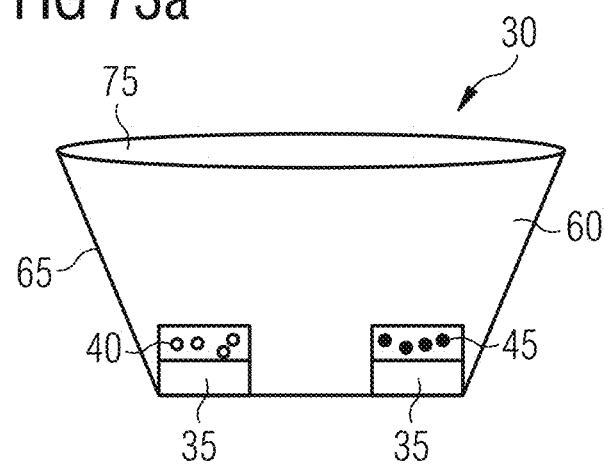
Figure 73B:
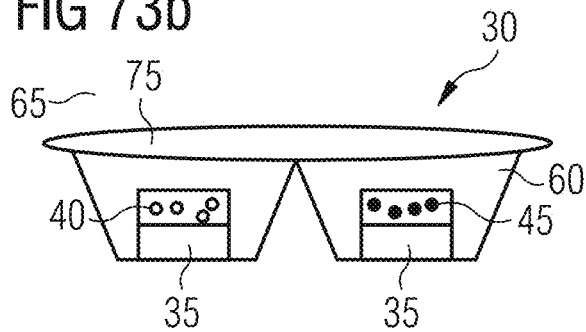

FIG. 73a and FIG. 73b each show, in cross section, a possible embodiment of a lighting device 30 suitable for flash applications. In this case, two radiation sources 35 are arranged as LED chips in a reflector dish 65 (FIG. 73a) or are present in two separate reflector dishes 65 (FIG. 73b). Phosphor particles 40 and 45 are disposed upon both LED chips, the LED chips having different phosphor mixtures/phosphors disposed in their beam paths. In this way, it is possible, for example, for two LEDs or LED modules to be present within the lighting device, which emit light of different color temperature and/or color (for example cold white and warm white or amber). A lens 75 disposed downstream of the phosphors/phosphor mixtures in the beam path serves to mix the radiation emitted by the two LEDs or LED modules, such that an overall emission of the lighting device that results from the mixing of the radiation from the two LEDs or LED modules is perceived by an outside observer. By operating the two LEDs or LED modules with different driver currents, it is thus possible to individually adjust the overall emission emitted by the lighting device in terms of the color and/or color temperature thereof.

There follows a description of embodiments of phosphors of the invention by an alternative characterization compared to the above disclosure, but one which is consistent with the above disclosure.

A phosphor is specified. Additionally specified are a process for producing such a phosphor and a use of such a phosphor.

One problem to be addressed is that of specifying a phosphor which has comparatively narrow-band spectral emission in the red spectral region.

This problem is solved inter alia by a phosphor, by a process and by a use having the features of the independent claims. Preferred developments are the subject of the dependent claims.

In at least one embodiment, the phosphor is set up to emit red light. Red light means that the phosphor emits radiation having a dominant wavelength between 585 nm and 640 nm inclusive, especially between 590 nm and 615 nm inclusive.

The dominant wavelength is especially that wavelength which is found to be the point of intersection of the spectral color line of the CIE standard chromaticity diagram with a straight line, this straight line proceeding from the white point in the CIE standard chromaticity diagram and running through the actual color locus of the radiation. In general, the dominant wavelength differs from a wavelength of maximum intensity. More particularly, the dominant wavelength in the red spectral region is at smaller wavelengths than the wavelength of maximum intensity.

In at least one embodiment, the phosphor has the general empirical formula $Sr_xCa_{1-x}AlSiN_3$:Eu. It is possible that the phosphor includes further elements, for instance in the form of impurities, in which case these impurities taken together preferably have a maximum proportion by weight in the phosphor of not more than 0.1 permille or 10 ppm, parts per million.

In at least one embodiment of the phosphor, $x>0.8$ or $x\geq0.82$ or $x\geq0.85$ or $x\geq0.89$. Alternatively or additionally, $x\leq1$ or $x<1$ or $x\leq0.98$ or $x\leq0.95$ or $x\leq0.92$.

In at least one embodiment, the proportion of the Sr lattice sites which have been replaced by Eu is at least 0.01% or 0.1% or 0.35% or 0.5%. Alternatively or additionally, this proportion is at most 10% or 5% or 3% or 2.2% or 1.8%.

In at least one embodiment, the phosphor, in an x-ray structure analysis, has a reflection having the Miller indices: 1 $\bar{2}$ 1 when an orthorhombic description is used as the basis of the crystallographic cell. This statement includes descriptions of equivalent symmetry such as 1 $\bar{2}$ $\bar{1}$.

In at least one embodiment, the phosphor is set up to emit red light and preferably to be excited by blue light and has the general empirical formula $Sr_xCa_{1-x}AlSiN_3$:Eu with $0.8<x\leq1$. A proportion of the Sr lattice sites between 0.1% and 5% inclusive has been replaced by europium. In an x-ray structure analysis, the phosphor in orthorhombic description has a reflection having the Miller indices 1 $\bar{2}$ 1.

Phosphors which can be excited in the ultraviolet spectral range up to the blue/green spectral range and which emit red light are of great significance for the production of white light-emitting diodes. Specifically in the case of light-emitting diodes having low color temperatures, called warm white light-emitting diodes, and/or in the case of light-emitting diodes having a high color rendering index, phosphors of this kind are required. Phosphors of this kind are also required in a multitude of other applications, for instance for display backlighting, what are called color-on-demand applications or else for orange and red full conversion light-emitting diodes. Use in combination with an organic light-emitting diode, OLED for short, is likewise possible. The phosphor described here is usable for such applications.

In at least one embodiment, the phosphor in a powder diffractogram on irradiation with monochromatic Cu—$K_{\alpha 1}$ radiation has a reflection at an angle 2θ between 36.7° and 37.0°, according to the composition of the phosphor. The exact position of this reflection depends on the parameter x in the general empirical formula of the phosphor. An intensity of this reflection, especially based on a main reflection, is preferably at least 0.3% or 0.5% and/or at most 10% or 8% or 5% or 4%.

In at least one embodiment, the dominant wavelength of the phosphor is at least 596 nm or 598 nm. Alternatively or additionally, the dominant wavelength is at most 606 nm or 604 nm. The wavelength of maximum intensity is, for example, at least 605 nm or 610 nm and/or at most 630 nm or 625 nm.

In at least one embodiment, the phosphor has a spectral half-height width at half the maximum height, FWHM or full-width at half maximum for short, of at least 70 nm or 75 nm or 78 nm. The maximum of this spectral range is preferably 90 nm or 87 nm or 84 nm or 82 nm.

In at least one embodiment, the phosphor has an absorption maximum in the blue spectral region, especially a relative absorption maximum. The blue spectral region especially refers to wavelengths of at least 400 nm and/or of at most 480 nm. For example, the absorption maximum is at least 410 nm or 420 nm and/or at most 450 nm or 440 nm.

The abovementioned values relating to the spectral properties of the phosphor especially apply at room temperature, i.e. at about 300 K.

Additionally specified is a process for producing such a phosphor. Features of the phosphor are therefore also disclosed for the process, and vice versa.

In at least one embodiment, the process has at least the following steps, preferably in the sequence specified: A) providing reactants in the solid state for Sr, Al, Si and Eu and optionally for Ca, B) mixing the reactants, C) heating the reactants under a forming gas atmosphere to at least 1500° C. and forming a calcined cake, and D) comminuting the calcined cake to give the phosphor.

In at least one embodiment of the process, at least step C) or else all steps are effected at atmospheric pressure. More particularly, the process in that case is not effected under high pressure conditions. Preferably, the atmospheric pressure and/or a total pressure is between 0.9 bar and 1.5 bar or 0.95 bar and 1.05 bar inclusive.

Reactants and sources used for strontium, aluminum and/or calcium may be the respective pure metals or else metal alloys with the appropriate metals. Reactants used may likewise be silicides, nitrides, oxynitrides, halides and/or oxides of these metals. In addition, it is possible to use mixtures of these compounds.

Reactants or sources used for silicon for the production of the phosphor may be a silicon-metal compound, a silicon nitride, an alkaline earth metal silicide, silicon diimide, or a mixture of these compounds. Preference is given to using silicon nitrides and/or silicon metals.

Reactants or sources used for Eu may be metallic europium, a europium alloy, a europium oxide, a europium nitride or a europium halide. It is likewise possible to use mixtures of these compounds. Preference is given to using europium oxide as reactant for europium.

In at least one embodiment, a melting agent and/or a flux is used for the improvement of crystallinity and/or to promote crystal growth. For this purpose, preferably chlorides, fluorides, halides and/or boron compounds of the alkaline earth metals used are employed. Combinations of two or more melting agents or fluxes may also be used. Melting agents and/or fluxes used are especially at least one of the following substances: LiF, LiCl, NaF, NaCl, $SrCl_2$, $SrF_2$, $CaCl_2$, $CaF_2$, $BaCl_2$, $BaF_2$, $NH_4Cl$, $NH_4F$, KF, KCl, $MgF_2$, $MgCl_2$, $AlF_3$, $H_3BO_3$, $B_2O_3$, $Li_2B_4O_7$, $NaBO_2$, $Na_2B_4O_7$, $LiBF_4$.

In at least one embodiment, the starting substances, especially for Sr, Ca, Al and/or Si and also Eu, are weighed out according to the general empirical formula of the phosphor. It is possible that the alkaline earth metal components are also weighed out with an excess, in order to compensate for any evaporation losses that occur during the synthesis.

In at least one embodiment, step D) is followed by a step E). In step E), the phosphor is calcined further, which can also be referred to as heat treatment. The calcination is especially effected at a temperature of at least 1500° C. and preferably under a nitrogen atmosphere or forming gas atmosphere. Forming gas refers to a mixture of $N_2$ and $H_2$. The temperature of at least 1500° C. in steps C) and/or E) is preferably employed for at least four hours or six hours. For example, in each of steps C) and E), a temperature of 1650° C.±50° C. is employed.

In at least one embodiment, the reactants are mixed in a ball mill or in a tumbling mixer. In the mixing operation, it may be advantageous to choose the conditions such that a large amount of energy is introduced into the mixture, which results in grinding of the reactants. The resultant increase in homogeneity and reactivity of the mixture can have a positive influence on the properties of the resulting phosphor.

By controlled alteration of the bulk density or by modification of the agglomeration of the reactant mixture, it is possible to reduce the formation of secondary phases. In addition, a particle size distribution, a particle morphology and/or a yield of the resulting phosphor can be affected. Techniques of particular suitability for the purpose are sieving and pelletizing operations, including use of suitable additives.

In at least one embodiment, a tempering is effected, especially in a crucible made from tungsten, molybdenum or boron nitride. The tempering is preferably effected in a gas-tight oven in a nitrogen atmosphere or in a nitrogen/hydrogen atmosphere. The atmosphere may be flowing or stationary. It is additionally possible for carbon in finely divided form to be present in the oven space. Also possible are multiple tempering steps of the phosphor, in order to improve the crystallinity or particle size distribution. Further advantages may be a lower defect density, associated with improved optical properties of the phosphor and/or a higher stability of the phosphor. Between the tempering steps, the phosphor may be treated in a wide variety of different ways, or it is possible to add substances such as melting agents to the phosphor.

For grinding of the phosphor, it is possible, for instance, to use a mortar mill, a fluidized bed mill or a ball mill. In the grinding operation, it is to be ensured that the proportion of splintered grains produced is kept to a minimum, since these can worsen the optical properties of the phosphor.

The phosphor can additionally be washed. For this purpose, the phosphor can be washed in water or in aqueous acids such as hydrochloric acid, nitric acid, hydrofluoric acid, sulfuric acid, organic acids or a mixture of these. The phosphor may alternatively or additionally be washed in an alkali such as sodium hydroxide solution, potassium hydroxide solution, an aqueous ammonia solution or mixtures thereof. Alternatively or additionally, washing in organic solvents such as acetone, propanol and/or phenol is possible. The washing preferably follows after the grinding.

In at least one embodiment, for instance, the tempering, further calcining, grinding, sieving and/or washing result in removal of secondary phases, glass phases or other contamination and hence an improvement in the optical properties of the phosphor. It is also possible by this treatment to selectively remove or dissolve small phosphor particles and to optimize the particle size distribution for the application. In addition, such a treatment can alter a surface of the phosphor particles in a controlled manner, for example the removal of particular constituents from the particle surface. This treatment can, also in conjunction with a downstream treatment, lead to improved stability of the phosphor.

Additionally specified is the use of such a phosphor. Features relating to use are therefore also disclosed for the process and the phosphor, and vice versa.

In at least one embodiment, the phosphor is used in a light-emitting diode. The light-emitting diode comprises at least one semiconductor chip that emits in the blue spectral region in operation. The phosphor is arranged downstream of the semiconductor chip along a beam path.

The blue light produced by the semiconductor chip is partly or fully absorbed by the phosphor and converted to red light. It is possible that further phosphors are present, especially for generation of green and/or yellow light. In addition, the light-emitting diode preferably emits mixed radiation including blue light from the semiconductor chip and converted radiation from the phosphor, and also green and/or yellow light from the further phosphor.

One embodiment of a phosphor described here can be prepared as follows: reactants used for the synthesis of the phosphor of the general empirical formula $Sr_xCa_{1-x}AlSiN_3$:Eu are the binary nitrides of the constituent elements, i.e. $Ca_3N_2$, $Sr_3N_2$, AlN and $Si_3N_4$. Since these are highly oxidation-sensitive and hydrolysis-sensitive substances, what is called a glovebox is employed, under an $N_2$ atmosphere with $O_2$<1 ppm and $H_2O$<1 ppm. In addition, doping with $Eu^{2+}$ is accomplished using $Eu_2O_3$. The reactants are weighted out such that the following atomic ratio is present:

Ca:Sr:Al:Si:Eu=(1−x):x:1:1:y, where y corresponds to the degree of doping, i.e. the proportion of Sr lattice sites which are substituted by Eu. In addition, various fluxes are added; see the table in FIGS. 74a-74c. A reactant mixture is scaled up to a total starting weight of 50-100 g with retention of the atomic ratios described above; see the table in FIGS. 74a-74c likewise.

The reactant mixture is introduced into a PET mixing vessel together with $ZrO_2$ balls and mixed on a roller table in a glovebox for 6 h. Subsequently, the balls are removed from the mixture and the powder is transferred into a closed molybdenum crucible. This crucible is placed into an outer tungsten crucible, a semicircular open tungsten tube, and transferred into a tube furnace. There is a flow of 3 L/min of forming gas with 92.5% $N_2$ and 7.5% $H_2$ through the tubular furnace during the run time. In the tubular furnace, the mixture is heated at a rate of 250 K/h to 1650° C., kept at this temperature for 4 h and then cooled down at 250 K/h to 50° C. The calcined cake formed is taken out after the furnace has cooled, comminuted with a mortar mill and sieved through a sieve having a mesh size of 31 µm. The sieve fraction<31 µm is the phosphor used.

The sieving may optionally be followed by a further calcining, tempering and/or washing operation.

Illustrative starting weights m in g and resulting color loci CIE x, CIE y, also referred to as chromaticity coordinates, of the emission spectrum of the particular phosphor in the CIE standard chromaticity diagram on excitation with blue light at 460 nm and on complete absorption of the blue light are also listed in the table in FIGS. 74a-74c. For each of the embodiments in the table, 0.8≤x≤1.

FIGS. 75 to 78 show the properties of radiation emitted by the phosphor.

Figure 75:
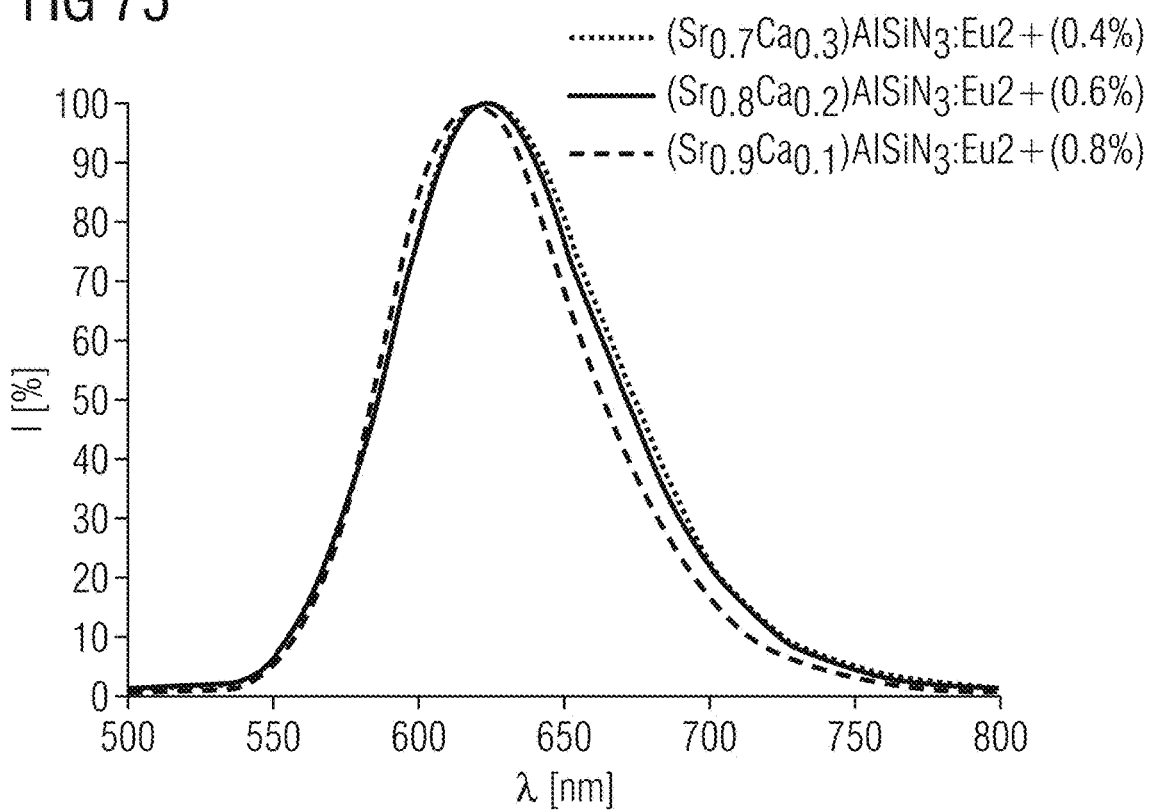
FIGS. 75-79 show schematic diagrams of properties of phosphors on excitation with blue light according to embodiments.
Figure 76:
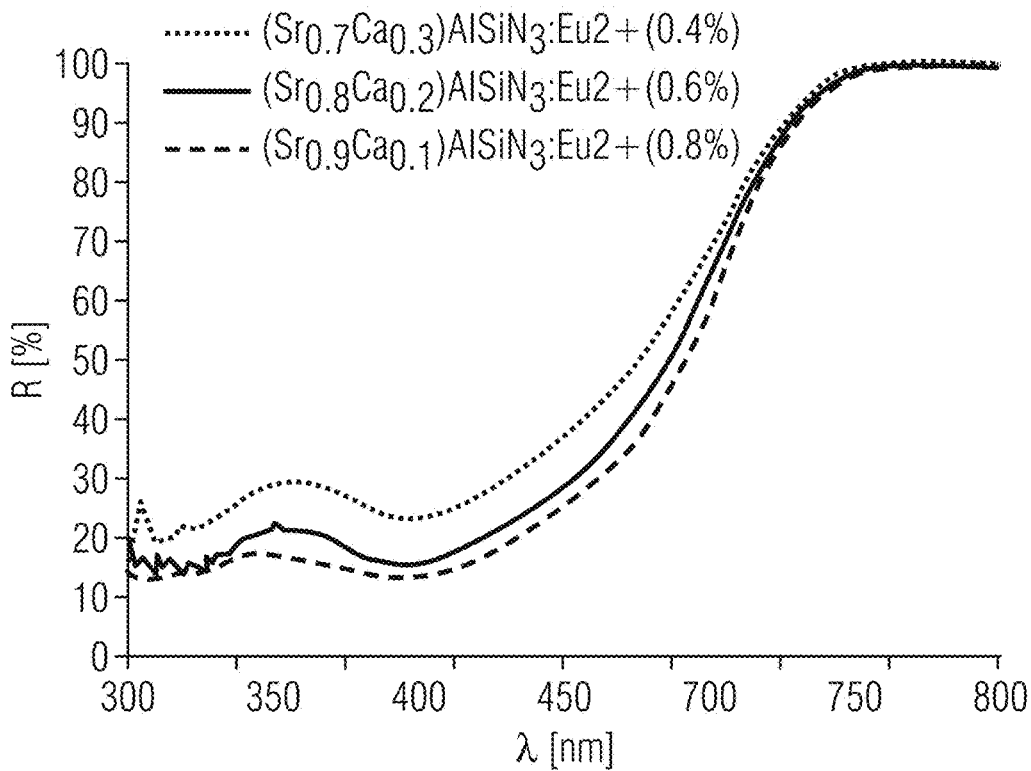

FIG. 75 shows emission spectra and FIG. 76 reflectance spectra of $SrxCa_{1-x}AlSiN_3$:Eu phosphors. The wavelength λ is plotted against the intensity I and the reflectivity R. The emission spectra show an unexpectedly narrow spectral emission of the phosphor with x=0.9. At the same time, the phosphor with x=0.9 features a strong absorption; see FIG. 3. The absorption is found to be approximately 1-R.

Figure 77:
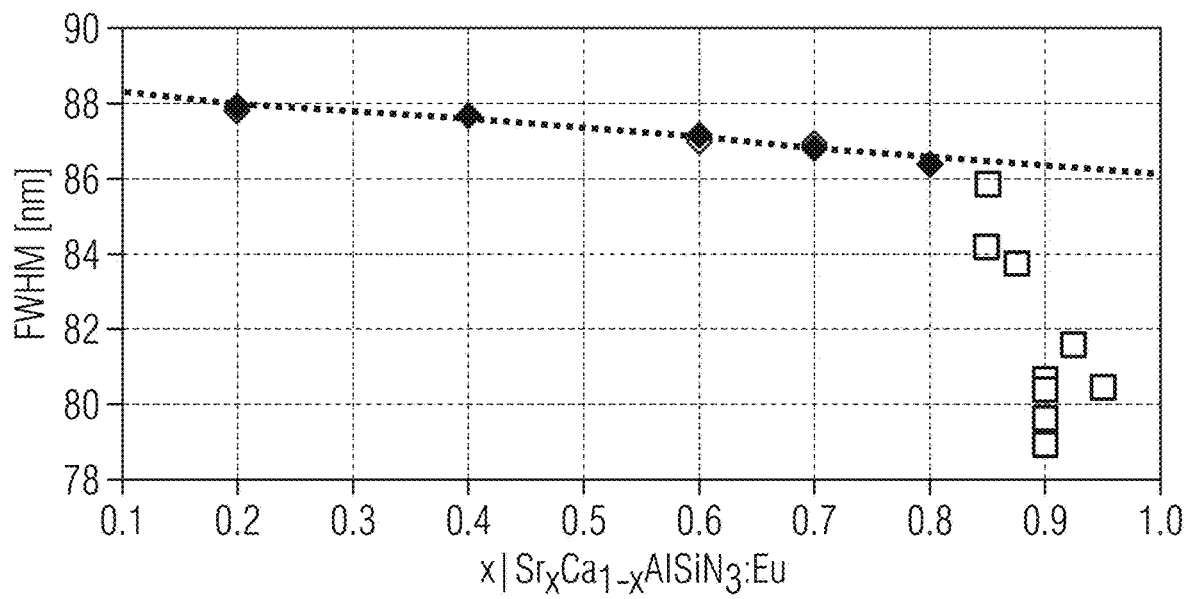

FIG. 77 shows a dependence of a spectral half-height width FWHM of the emission on the Sr content, i.e. the parameter x in $Sr_xCa_{1-x}AlSiN_3$:Eu. Up to an Sr content of 80%, i.e. x=0.8, a very small change in the half-height width FWHM with rising x is observed. Surprisingly, from an Sr content of >80% onward, an abrupt decrease in the half-height width FWHM is suddenly observed.

Figure 78:
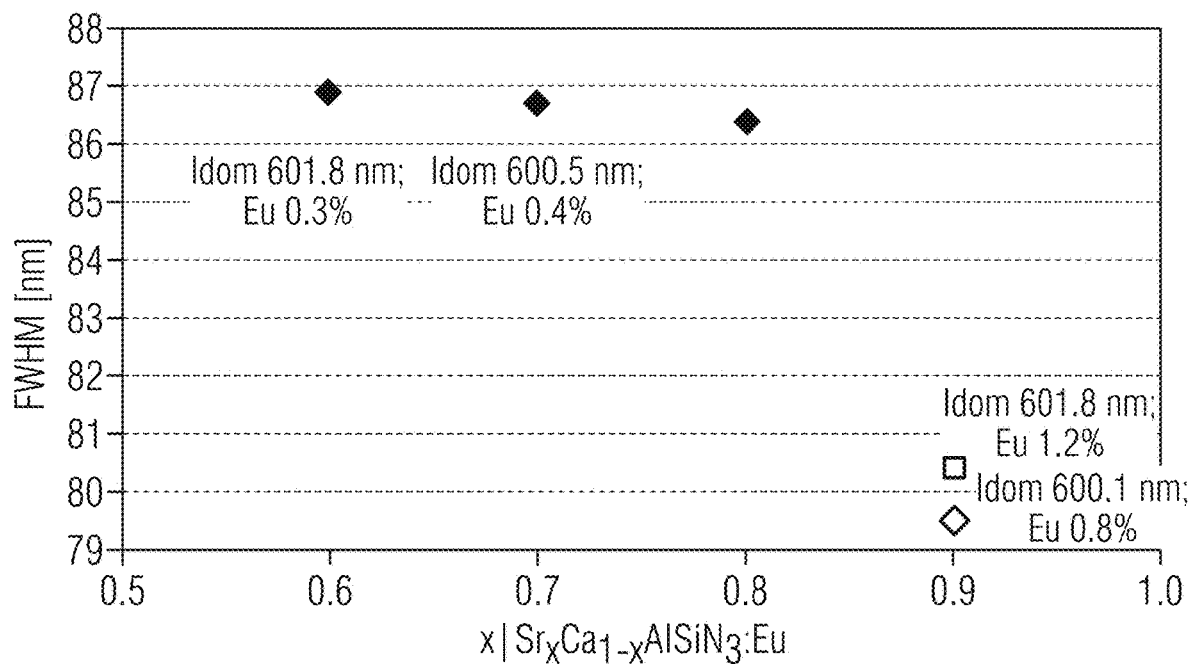

FIG. 78, analogously to FIG. 77, shows the spectral half-height width FWHM as a function of the parameter x. Also stated are a dominant wavelength ldom of the spectrum emitted by the phosphor and the Eu content. Surprisingly, a phosphor having 90% Sr, with a comparable dominant wavelength ldom, has a much smaller half-height width FWHM compared to conventional phosphors having only a relatively low Sr content. The abrupt decrease in the half-height width FWHM is virtually independent of the Eu content used in the sample.

Figures 79, 80:
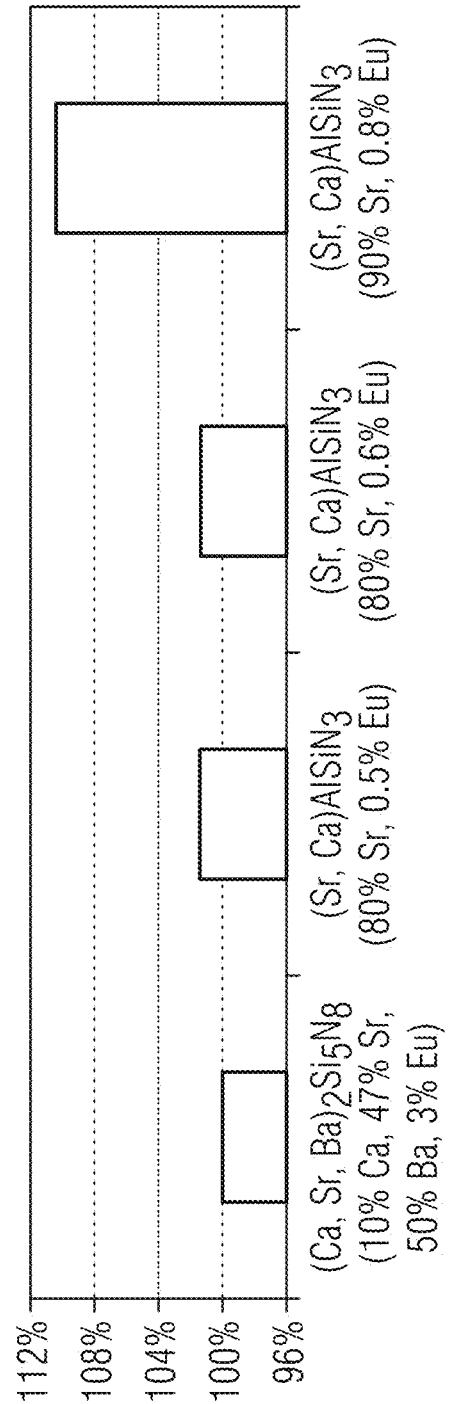
FIG. 80 shows LED efficiencies for various phosphors or phosphor mixtures according to embodiments.

The phosphor with x≥0.8 thus features a small half-height width FWHM of the emission and a very high luminous efficiency LER with simultaneously high internal quantum efficiency QI and external quantum efficiency QE; see the table in FIG. 79. In addition, a relative brightness B is stated. To calculate the external quantum efficiency QE, the mean reflectance within the range from 450 nm to 470 nm was employed; measurement was effected in pressed powder tablets at an excitation wavelength of 460 nm.

FIG. 80 shows a comparison of conversion efficiencies of various warm white light-emitting diodes, LEDs for short. A mixture of two phosphors was used in each case, with the green light-emitting phosphor G remaining the same and the red-emitting phosphor R being varied. Stated on the abscissa axis is the type of red-emitting phosphor R. The ordinate axis states the relative efficiency E. The phosphors were excited with a blue-emitting semiconductor chip having a dominant wavelength of 446 nm.

All phosphor mixtures were adjusted so as to achieve, in the CIE standard chromaticity diagram, a color locus close to Planck with a correlated color temperature CCT of about 2700 K. The color rendering index CRI of all LEDs measured is 80±1. All red phosphors R used show a comparable dominant wavelength of about 600.5 nm±1 nm.

Further details of the phosphor mixtures as shown in FIG. 80 can also be found in the table in FIG. 81. Additionally stated are the relative efficiency E, a phosphor concentration c and a ratio V of the green phosphor G and the red phosphor R.

Figure 82:
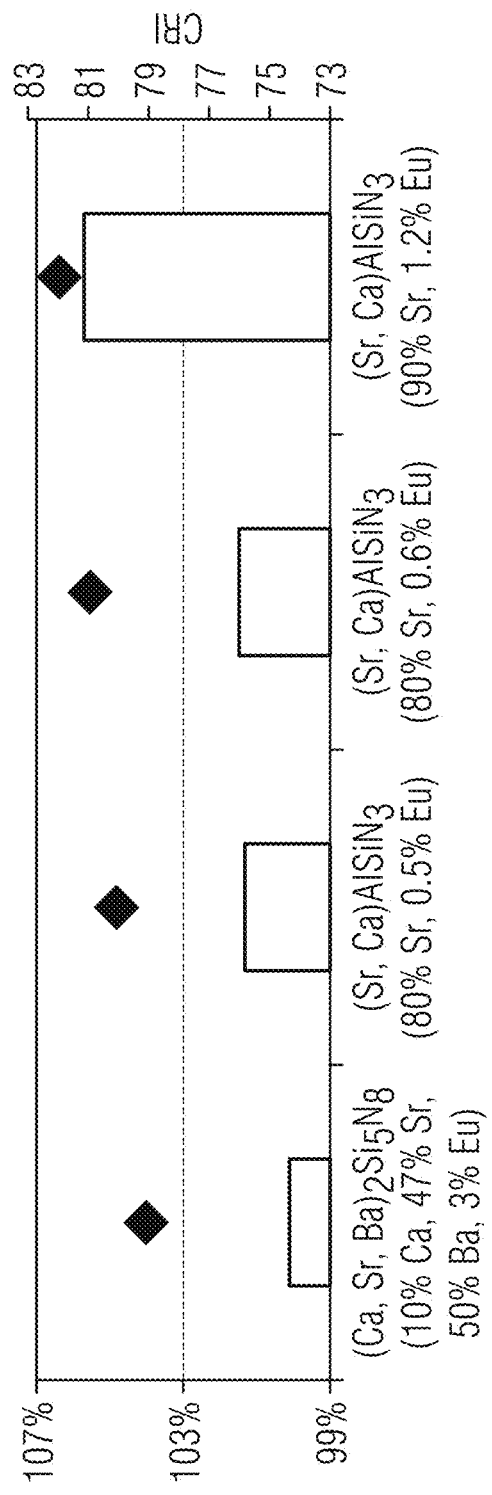
FIG. 82 shows a table with conversion efficiencies and color rendering indices for various warm white light-producing LEDs.

FIG. 82 shows a comparison of conversion efficiency and color rendering index for various warm white light-producing LEDs. A mixture of two phosphors was used in each case, with the green phosphor G being kept constant and the red phosphor R being varied, analogously to the table in FIG. 81. All phosphor mixtures were adjusted so as to achieve a color locus close to Planck with a correlated color temperature CCT of about 2700 K. The efficiency E, illustrated by the bar, of a warm white light-producing LED comprising the novel phosphor with 90% Sr shows a much higher efficiency and simultaneously an improved color rendering index CRI, symbolized as rhombuses, compared to LEDs comprising a red phosphor with only 80% Sr.

Further data relating to the LED measurements from FIG. 82 can be found in the table in FIG. 83, analogously to the table in FIG. 81. The efficiency E of a warm white light-producing LED at correlated color temperature CCT of about 2700 K comprising a novel red phosphor with 90% Sr is distinctly higher here as well and, moreover, an elevated color rendering index CRI is achievable.

Figure 84:
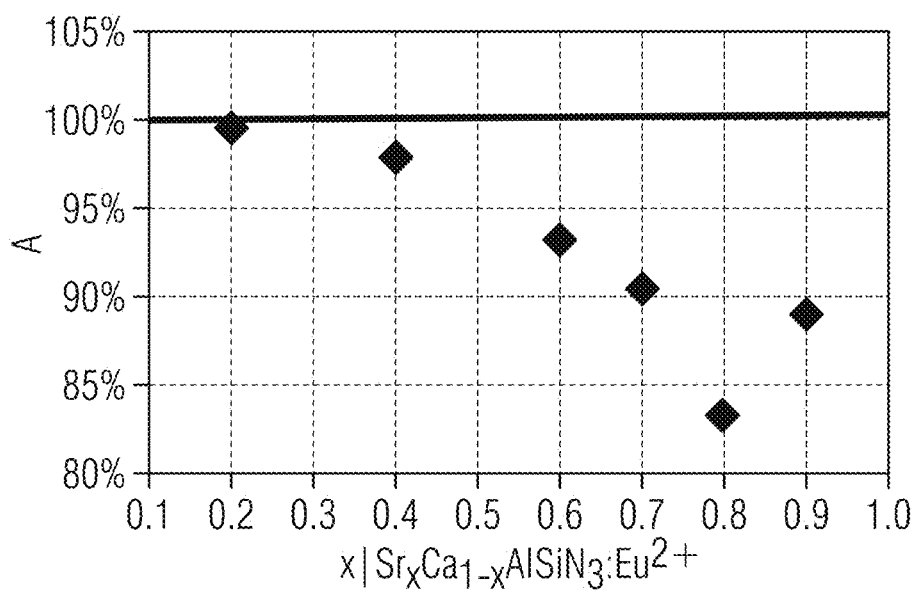

Red phosphors composed of the $Sr_xCa_{1-x}AlSiN_3$:Eu material system were subjected to a hydrolysis test, in order to assess an aging stability of the phosphor with respect to air humidity; see FIG. 84. For this purpose, the corresponding phosphor powders were stored at 130° C. and 100% relative air humidity for 40 h. The absorption A of the phosphors in the blue spectral region between 450 nm and 470 nm was measured both before and after this treatment. A measure of the stability of a phosphor with respect to hydrolysis, i.e. the decomposition of the phosphor in the presence of water, is considered to be the decrease in the absorption capacity in the blue spectral region. With increasing Sr content, a significant increase in hydrolysis sensitivity is at first observed. Surprisingly, however, the novel phosphor with 90% Sr is more hydrolysis-stable than a phosphor with only 80% Sr content.

Figure 85:
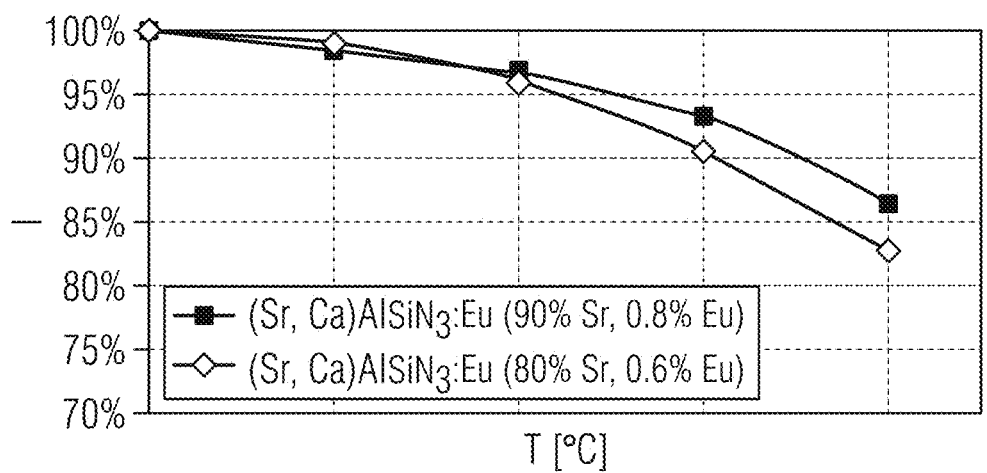

FIG. 85 shows thermal quenching characteristics of two red phosphors compared to one another. The two phosphors have a comparable emission color with a dominant wavelength of around 600 nm. Surprisingly, the novel phosphor having high Sr content, in spite of a higher Eu content, has a smaller decrease in emission intensity I with rising temperature compared to the reference phosphor.

Figure 86:
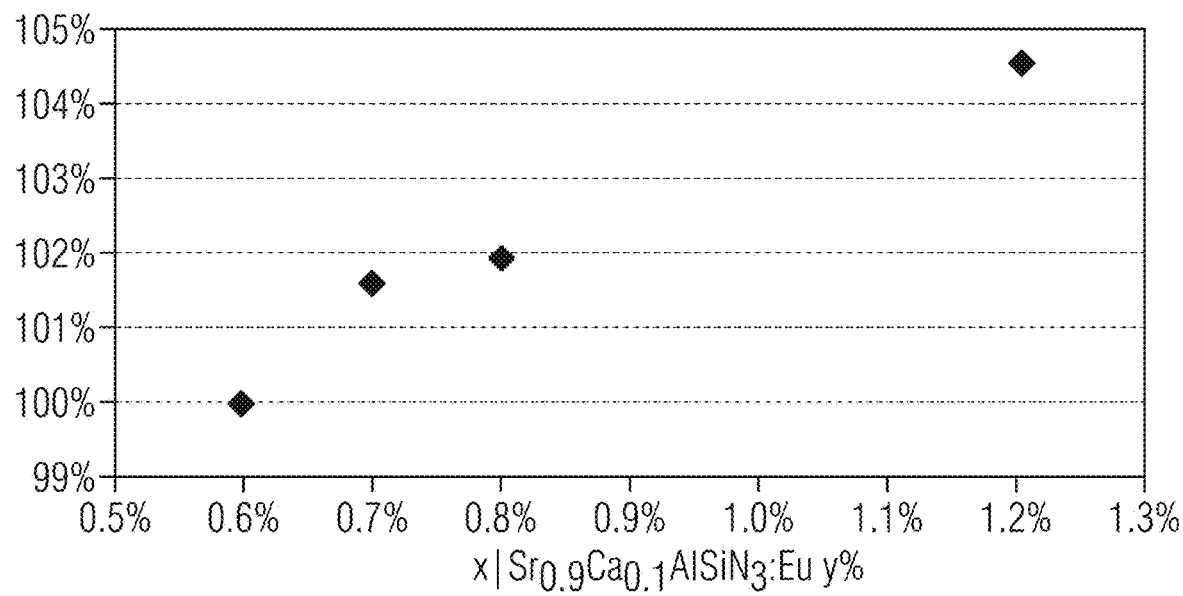

FIG. 86 illustrates the relative emission intensity I as a function of the content of Eu as activator. The Eu content is reported in percent.

With regard to phosphors composed of the $CaAlSiN_3$:Eu system, the literature reports that, with rising activator content, especially >0.8% Eu, a conversion efficiency stagnates; see table 1 in EP 2 135 920 A1.

Surprisingly, the novel phosphor with a high Sr content shows different behavior. With rising Eu content, the emission intensity I, even in the case of an Eu content >1%, continues to increase in an approximately linear manner. This property offers various technical advantages for application, especially lower phosphor demand and the possibility of achieving color loci with greater CIE x.

Figure 87:
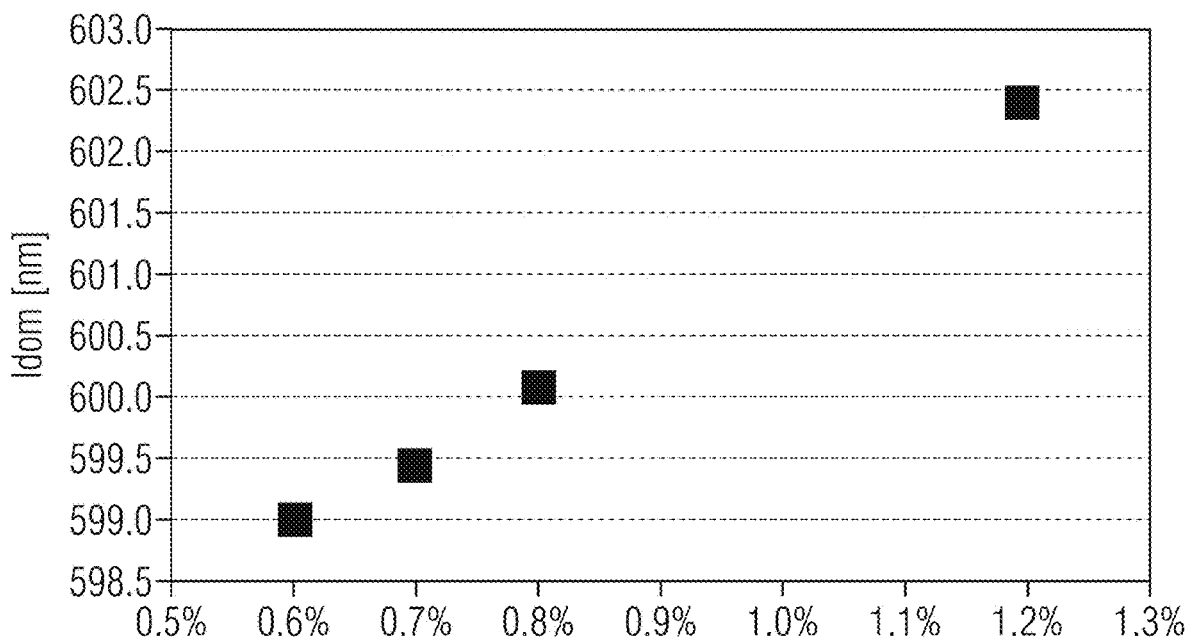

FIG. 87 shows a dependence of the dominant wavelength ldom of the emission on the activator content y for the novel phosphor $Sr_xCa_{1-x}AlSiN_3$:Eu with X=0.9. With rising activator content, the luminescence signal moves toward higher wavelengths in an approximately linear manner. This allows, for example, the color rendering index CRI of a warm white light-emitting LED to be increased; see also the LED embodiments according to FIGS. 80 to 82.

Figure 88:
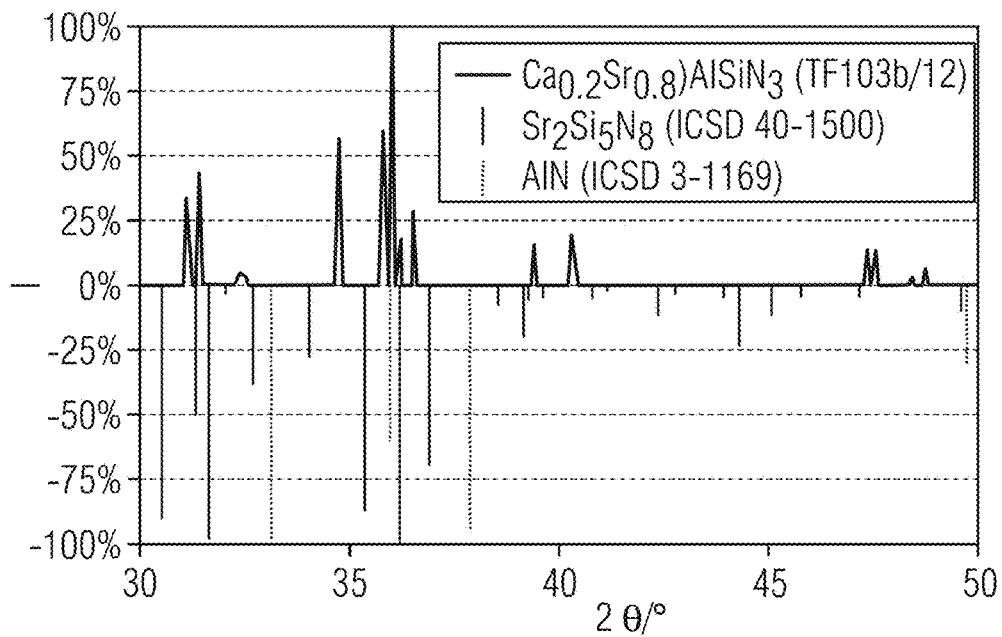

FIG. 88 shows an x-ray powder diffractogram of the phosphor $Sr_{0.8}Ca_{0.2}AlSiN_3$:Eu, which has been produced by means of the synthesis described here. Surprisingly, the phosphor produced from Sr nitride, Ca nitride, AlN, $Si_3N_4$ and $Eu_2O_3$ under atmospheric pressure consists of a pure phase by x-ray crystallography. No reflections of secondary phases such as AlN or $(Sr,Ca)_2Si_5N_8$ are observed.

Figure 89:
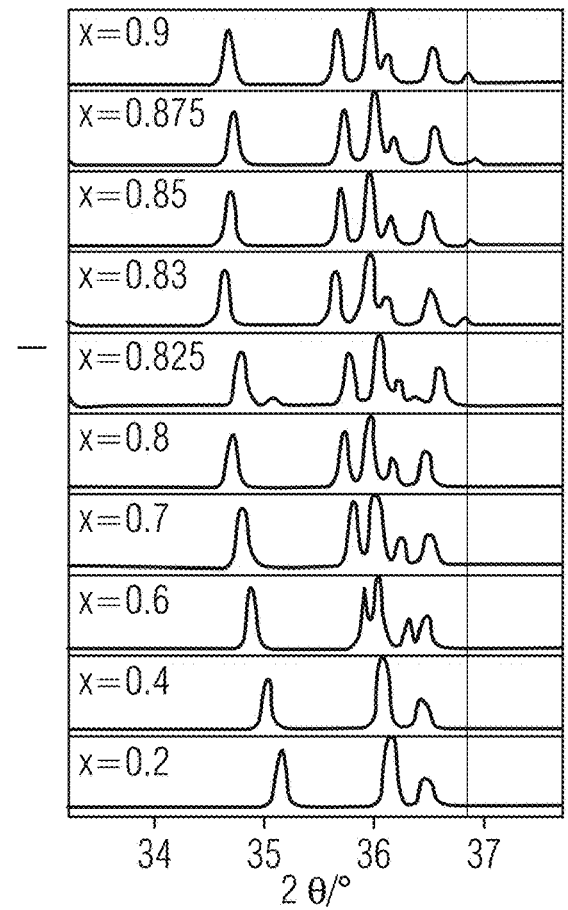

FIG. 89 shows x-ray powder diffractograms of phosphors $Ca_{1-x}Sr_xAlSiN_3$:Eu with various values of x, which have been prepared by means of the synthesis described here. From a substitution level of x>0.8 upward, the occurrence of an additional reflection R at 2θ of 36.7° to 37.0° is observed. This reflection cannot be explained by the structure model of known $(Sr,Ca)AlSiN_3$. Nor was it possible to assign the reflection R to any compounds from databases.

In orthorhombic description, this reflection R originates from the 1 $\bar{2}$ 1 lattice plane. The exact position of this reflection depends on the substitution level x. If it were a reflection R from any unidentified extraneous phase, this shift would not be expected.

In order to describe the structure of the novel phosphor described here, the following steps were conducted in order. A summary of the results, important R values and the fundamental refined parameters can be found in the table in FIG. 90.

1) A Rietveld refinement was conducted with the known phases $Sr_{0.99}Eu_{0.01}AlSiN_3$ from ICSD 98-041-9410, AlN from ICSD 98-060-8626 and $SrF_2$ from ICSD 98-004-1402. The crystal structure data of $Sr_{0.99}Eu_{0.01}AlSiN_3$ were fitted as $Ca_{0.1}Sr_{0.89}Eu_{0.01}AlSiN_3$.

2) All reflections were fitted by means of a profile parameter fit, with equal FWHM for all reflections. Any reflections which were assigned to extraneous phases, for instance $SrF_2$ and AlN, were eliminated from the search. The other reflections were used for a lattice parameter search.

This lattice parameter search found that almost all reflections can be described with the original cell, but without quenching conditions. For this reason, in the next step, a Rietveld refinement was conducted with the original structure, but transferred to the P1 space group.

3) A trial refinement of the experimental data was conducted on the basis of the structure model for $Sr_xCa_{1-x}AlSiN_3$ known from the literature, except that it had been transferred to the lower-symmetry P1 space group; see also the preceding step 2. This refinement likewise converged, but does not explain the reflection R observed.

4) In order to explain the additional reflections observed, a new structure model different than the known $CaAlSiN_3$ structure was set up. The new structure model of the phosphor described here is distinctly different than the $CaAlSiN_3$ structure already known. In the crystallographic sense, this is a superstructure variant. This structure can be derived formally from that of $CaAlSiN_3$ by a reduction in symmetry. In the structure model thus derived for the novel phosphor, there is a good explanation and description of the at least one reflection R additionally observed.

This structure model of the novel phosphor differs from the structure model from the above-elucidated step 3). In step 3), the known structure model of $CaAlSiN_3$ was merely described in an alternative, lower-symmetry space group. Only through the actual introduction of a new structure model different than $CaAlSiN_3$ is a good description of the experimentally observed reflections possible, especially of the new reflection R.

For this purpose, it is necessary in particular to split up the position having a mixed Sr/Ca population, which has a mixed population in the original $Cmc2_1$ space group and describes four alkaline earth metal atoms simultaneously for reasons of symmetry, into four individual positions. In the model of the conventional phosphor, all four positions have mixed populations of Sr and Ca. In the model of the novel phosphor, three of the positions are populated only by Sr, and just one of the positions has mixed population both with Sr and with Ca.

The new reflection R shown is thus a superstructure reflection which can be described in P1, but not in $Cmc2_1$, since it infringes the quenching conditions for this space group.

The refinement of the powder x-ray data observed, based on the known structure model in space group $Cmc2_1$, leads to the goodness factors in the first column in FIG. 17, corresponding to the above step 1. An alternative description of the same known structure model in the lower-symmetry P1 space group leads to comparable goodness factors, reported in the third column in FIG. 90, corresponding to the above step 3. Only with the aid of the description with the novel structure model different than $CaAlSiN_3$ are a complete description of all the reflections observed and hence significantly improved goodness factors achieved, corresponding to the above step 4.

Figure 91:
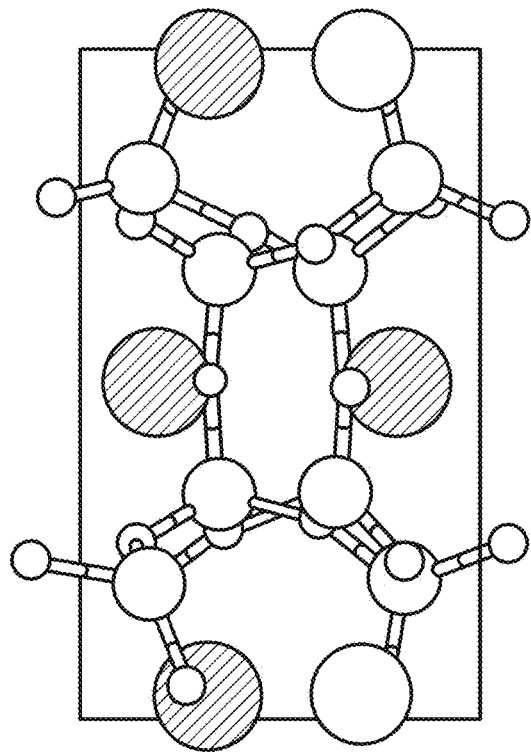
FIG. 91 shows a schematic diagram of a structure of a phosphor according to embodiments.

FIG. 91 shows a schematic perspective view of the structure model of the novel phosphor with x≥0.8. The positions shown in a dark color are populated only by Sr. The position shown in white color has a mixed Ca/Sr population.

Figure 92:
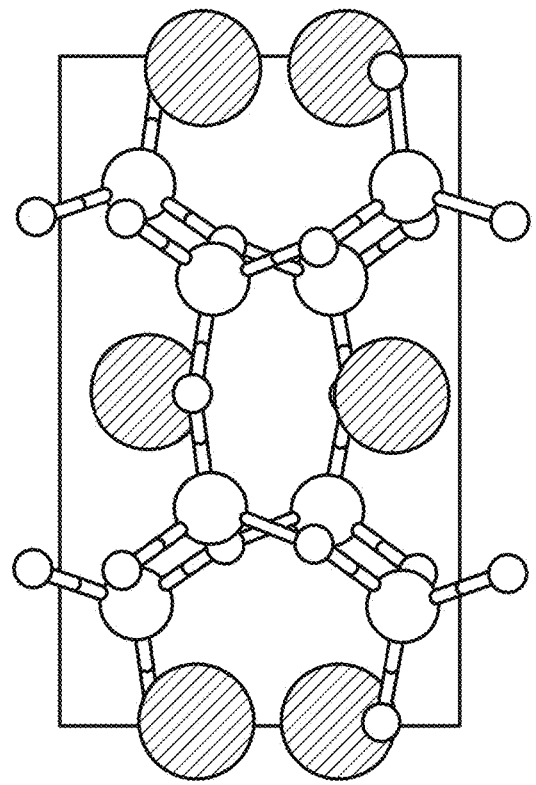
FIG. 92 shows a further schematic diagram of a structure of a modification of a phosphor according to embodiments.

In comparison, the perspective diagram according to FIG. 92 illustrates the structure of the $CaAlSiN_3$ phosphor with small x in the $Cmc2_1$ space group. Shown in a dark color are the four positions having a mixed Ca/Sr population.

The novel phosphor described here offers the following particular advantages: lower half-height width of emission, associated with higher luminous efficiency at the same dominant wavelength, the possibility of achieving higher activator concentrations of Eu at >0.8% with simultaneously high quantum efficiency and conversion efficiency, associated with a lower phosphor requirement in LED applications and simplified processibility, improved aging stability with respect to moisture compared to conventional (Sr,Ca)$AlSiN_3$:Eu having a low Sr content, and improvement in the thermal stability.

The invention described here is not restricted by the description with reference to the embodiments. Instead, the invention encompasses every new feature and every combination of features, which especially includes every combination of features in the claims, even if this feature or this combination itself is not explicitly specified in the claims or embodiments.

What is claimed is:

1. A lighting device comprising:
a primary radiation source configured to emit primary radiation in a wavelength range between 300 nm and 570 nm; and
a first phosphor disposed in a beam path of the primary radiation source, the first phosphor configured to convert at least a portion of the primary radiation to secondary radiation within an orange to red wavelength range from 570 nm to 800 nm,
wherein the first phosphor has the formula:

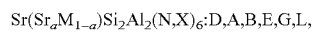

$Sr(Sr_aM_{1-a})Si_2Al_2(N,X)_6$:D,A,B,E,G,L, wherein element M is selected from the group consisting of Ca, Ba, Mg and combinations thereof,
wherein element D is one or more elements selected from the group consisting of Mn, Ce, Pr, Nd, Sm, Eu, Tb, Dy, Ho, Er, Tm, alkali metals and Yb,
wherein element A is selected from divalent metals different than those of the elements M and D,
wherein element B is selected from trivalent metals,
wherein element E is selected from monovalent metals,
wherein element G is selected from tetravalent elements,
wherein element L is selected from trivalent elements,
wherein element X is selected from 0 or halogen,
wherein a parameter a is between 0.6 and 1.0, and
wherein the first phosphor crystallizes in space groups P1, P2, $P\overline{1}$ or $P2_1$.

2. The lighting device according to claim 1, further comprising a second phosphor which is disposed in the beam path of the primary radiation source and has a different emission than the first phosphor.

3. The lighting device according to claim 1, further comprising a second phosphor disposed in a beam path of the secondary radiation and wherein the second phosphor is configured to absorb and convert at least a portion of the secondary radiation.

4. The lighting device according to claim 2, wherein the second phosphor includes the elements M, A, D, E, and X,
wherein the element M is one or more elements selected from the group consisting of Mn, Ce, Pr, Nd, Sm, Eu, Tb, Dy, Ho, Er, Tm, and Yb,
wherein the element A is one or more elements selected from divalent metal elements other than those of the element M,
wherein the element D is one or more elements selected from tetravalent metal elements,
wherein the element E is one or more elements selected from trivalent metal elements,
wherein the element X is one or more elements selected from the group consisting of O, N, and F, and wherein the second phosphor has the same crystal structure as CaAlSiN$_3$.

5. The lighting device according to claim 2, wherein the second phosphor has the formula:

(Gd,Lu,Tb,Y)$_3$(Al,Ga,D)$_5$(O,X)$_{12}$:RE or (Gd,Lu,Tb,Y)$_3$(Al,Ga,D)$_5$(O,X)$_{12}$:RE, wherein the element X is selected from a halide, N or a divalent element,
wherein the element D is selected from a trivalent element or a tetravalent element, and
wherein RE is selected from rare earth metals as activators.

6. The lighting device according to claim 2, wherein the second phosphor has the formula:

(Gd,Lu,Tb,Y)$_3$(Al,Ga,D)$_5$(O,X)$_{12}$:RE, wherein the element X is selected from a halide or a divalent element,
wherein the element D is selected from a trivalent element or a tetravalent element,
wherein RE is selected from rare earth metals as activators,
wherein the second phosphor is disposed in the beam path of the primary radiation source, and
wherein the lighting device comprises a flash.

7. The lighting device according to claim 6, wherein the second phosphor has the formula:

Lu$_3$(Al$_{1-x}$Ga$_x$)$_5$O$_{12}$:Ce or (Lu,Y)$_3$(Al$_{1-x}$Ga$_x$)$_5$(O)$_{12}$:Ce, wherein a cerium content is of 0.5-5 mol % based on the rare earth metals, and
wherein a gallium content x is between 0 and 0.5.

8. The lighting device according to claim 2, wherein the second phosphor has the formula:

(Gd,Y)$_3$(Al$_{1-x}$Ga$_x$)$_5$O$_{12}$:Ce or (Tb,Y)$_3$(Al$_{1-x}$Ga$_x$)$_5$(O)$_{12}$:Ce, wherein a cerium content is of 1.5-5 mol %,
wherein a gallium content x is of 0 to 0.5, and
wherein the lighting device comprises a flash.

9. The lighting device according to claim 5, further comprising a secondary radiation source with phosphors disposed in the beam path thereof and configured to convert primary radiation to secondary radiation, wherein mixing the secondary radiation of the primary and secondary radiation sources results in an overall emission of radiation from the lighting device, and wherein the lighting device comprises a flash.

10. The lighting device according to claim 9, wherein a color range of the converted radiation from the secondary radiation source is different than a color range of the converted radiation from the primary radiation source.

11. The lighting device according to claim 10, wherein the primary and secondary radiation sources are operable with different currents and a color range of the overall emission radiation from the lighting device is selectable via different currents for the primary and secondary radiation sources.

12. The lighting device according to claim 10, further comprising an optical element arranged downstream of the phosphors of the primary and secondary radiation sources, wherein the optical element mixes the secondary radiation from the primary and secondary radiation sources to produce the overall emission of radiation.

13. The lighting device according to claim 2, wherein the primary radiation source emits the primary radiation in the wavelength range between 430 nm and 470 nm, wherein the second phosphor is a garnet of the formula:

(Gd,Lu,Y,Tb)$_3$(Al,Ga)$_5$(O)$_{12}$:RE or (Lu,Y)$_3$(Al,Ga)$_5$(O)$_{12}$:RE, wherein RE is selected from a rare earth metal, and
wherein the lighting device is configured to produce a white light having a CRI≥90.

14. The lighting device according to claim 13, wherein the element M in the first phosphor is Sr and Ca and the parameter a is as follows: 0.7≤a, and wherein a proportion of an activator D is ≥1.5%.

15. The lighting device according to claim 2, wherein the second phosphor is selected from at least one phosphor from the following phosphors:
a beta-SiAlON of the formula: Si$_{6-z}$Al$_z$O$_z$N$_{8-z}$:Eu with 0<z≤4,
nano-semiconductor materials as quantum dots,
nitridoorthosilicates of a general composition AE$_{2-x}$RE$_x$SiO$_{4-x}$N$_x$:Eu,
wherein AE is selected from the group consisting of Sr, Ca, Ba and Mg,
wherein RE is selected from rare earth metals, or
of the general composition AE$_{2-x}$RE$_x$Si$_{1-y}$O$_{4-x-2y}$N$_x$:Eu.

16. The lighting device according to claim 1, wherein the primary radiation source comprises an LED, an OLED or a laser.

17. A light-emitting diode comprising:
at least one semiconductor chip configured to emit blue light; and
a phosphor arranged downstream of the semiconductor chip along a beam path,
wherein the phosphor is capable for emission of red light and has the formula: SrxCa1-xAlSiN$_3$:Eu,
wherein x is 0.8<x≤1, wherein between 0.1% and 5% inclusive of Sr, Ca and/or Sr/Ca lattice sites have been replaced by Eu,
wherein a full-width at half maximum is between at least 70 nm and at most 90 nm, and
wherein, if an x-ray structure analysis were to be performed, the phosphor in orthorhombic description exhibits a reflection (R) having the Miller indices 1 $\bar{2}$ 1.

18. A phosphor configured to emit red light,
wherein the phosphor has the formula: SrxCa1-xAlSiN3:Eu,
wherein x is: 0.8<x≤1,
wherein between 0.1% and 5% inclusive of Sr, Ca and/or Sr/Ca lattice sites are replaced by Eu,
wherein a full-width at half maximum is between 70 nm and 90 nm, and
wherein, if an a x-ray structure analysis were to be performed, the phosphor in orthorhombic description exhibits a reflection (R) having the Miller indices 1 $\bar{2}$ 1.

* * * * *